(12) United States Patent
Liu et al.

(10) Patent No.: US 9,768,059 B1
(45) Date of Patent: Sep. 19, 2017

(54) HIGH-CHI BLOCK COPOLYMERS FOR INTERCONNECT STRUCTURES BY DIRECTED SELF-ASSEMBLY

(71) Applicant: International Business Machines Corporation, Armonk, NY (US)

(72) Inventors: Chi-Chun Liu, Altamont, NY (US); Teddie P. Magbitang, San Jose, CA (US); Daniel P. Sanders, San Jose, CA (US); Kristin Schmidt, Mountain View, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/092,693

(22) Filed: Apr. 7, 2016

(51) Int. Cl.
| | | |
|---|---|---|
| G03F 7/004 | (2006.01) |
| H01L 21/768 | (2006.01) |
| C08G 81/02 | (2006.01) |
| C23F 1/00 | (2006.01) |
| G03F 7/20 | (2006.01) |

(Continued)

(52) U.S. Cl.
CPC ........ *H01L 21/76802* (2013.01); *B82Y 10/00* (2013.01); *B82Y 40/00* (2013.01); *C08G 81/027* (2013.01); *C23F 1/00* (2013.01); *G03F 7/002* (2013.01); *G03F 7/165* (2013.01); *G03F 7/20* (2013.01); *G03F 7/2022* (2013.01); *G03F 7/2059* (2013.01); *G03F 7/32* (2013.01);

(Continued)

(58) Field of Classification Search
CPC . G03F 7/002; G03F 7/165; G03F 7/20; G03F 7/32; G03F 7/40; G03F 7/2059; G03F 7/2022; H01L 21/0274; H01L 21/02112; H01L 21/3065; B82Y 10/00; B82Y 40/00
USPC .... 430/270.1, 311, 313, 314, 317, 322, 325, 430/329, 330, 331; 438/700, 689, 699, 438/781; 216/47, 51
See application file for complete search history.

(56) References Cited

U.S. PATENT DOCUMENTS

| | | |
|---|---|---|
| 3,547,861 A | 12/1970 | Anello |
| 5,391,667 A | 2/1995 | Dellinger |

(Continued)

FOREIGN PATENT DOCUMENTS

| | | |
|---|---|---|
| WO | 2014139793 A1 | 9/2014 |
| WO | 2015109224 A1 | 7/2015 |

OTHER PUBLICATIONS

U.S. Appl. No. 14/628,002, filed Feb. 20, 2015.

(Continued)

*Primary Examiner* — Amanda C Walke
(74) *Attorney, Agent, or Firm* — Michael R. Roberts

(57) ABSTRACT

High-chi diblock copolymers are disclosed whose self-assembly properties are suitable for forming hole and bar openings for conductive interconnects in a multi-layered structure. The hole and bar openings have reduced critical dimension, improved uniformity, and improved placement error compared to the industry standard poly(styrene)-b-poly(methyl methacrylate) block copolymer (PS-b-PMMA). The BCPs comprise a poly(styrene) block, which can optionally include repeat units derived from trimethylsilyl styrene, and a second block that can be a polycarbonate block or a polyester block. Block copolymers comprising a fluorinated linking group L' comprising 1-25 fluorines between the blocks can provide further improvement in uniformity of the openings.

32 Claims, 70 Drawing Sheets

(51) Int. Cl.

| | |
|---|---|
| *G03F 7/40* | (2006.01) |
| *G03F 7/00* | (2006.01) |
| *G03F 7/16* | (2006.01) |
| *G03F 7/32* | (2006.01) |
| *B82Y 40/00* | (2011.01) |
| *H01L 21/3065* | (2006.01) |
| *H01L 21/027* | (2006.01) |
| *B82Y 10/00* | (2011.01) |
| *H01L 21/02* | (2006.01) |

(52) U.S. Cl.
CPC ............ *G03F 7/40* (2013.01); *H01L 21/0274* (2013.01); *H01L 21/3065* (2013.01); *H01L 21/02112* (2013.01)

(56) References Cited

U.S. PATENT DOCUMENTS

| | | | |
|---|---|---|---|
| 6,403,744 | B1 | 6/2002 | Akama et al. |
| 8,114,306 | B2 | 2/2012 | Cheng et al. |
| 8,778,201 | B2 | 7/2014 | Asakawa et al. |
| 8,822,588 | B2 | 9/2014 | Terui et al. |
| 8,856,693 | B2 | 10/2014 | Cheng et al. |
| 8,900,467 | B1 | 12/2014 | Chapuis et al. |
| 8,900,562 | B2 | 12/2014 | Mecozzi et al. |
| 2004/0092686 | A1 | 5/2004 | Feiring et al. |
| 2008/0093743 | A1 | 4/2008 | Yang et al. |
| 2010/0297847 | A1* | 11/2010 | Cheng ................. B81C 1/00031 438/694 |
| 2011/0151566 | A1 | 6/2011 | Hedrick et al. |
| 2014/0091435 | A1 | 4/2014 | Chan et al. |
| 2014/0148012 | A1 | 5/2014 | Guillorn et al. |
| 2015/0018476 | A1 | 1/2015 | Thomson et al. |
| 2015/0197594 | A1 | 7/2015 | Xu et al. |
| 2015/0197607 | A1* | 7/2015 | Montarnal ................. G03F 1/00 216/49 |
| 2015/0329664 | A1 | 11/2015 | Cheng et al. |
| 2016/0064216 | A1* | 3/2016 | Nakaoka ............... G03F 1/0046 438/700 |
| 2016/0178999 | A1* | 6/2016 | Wuister .................... G03F 1/70 716/51 |
| 2016/0244557 | A1* | 8/2016 | Vora ........................ C08G 63/08 |
| 2016/0362513 | A1* | 12/2016 | Cheng ................. C09D 169/00 |

OTHER PUBLICATIONS

U.S. Appl. No. 14/919,070, filed Oct. 21, 2015.
U.S. Appl. No. 15/041,095, filed Feb. 11, 2016.
Pratt, et al., "Exploration, Optimization, and Application of Supramolecular Thiourea-Amine Catalysts for the Synthesis of Lactide (Co)polymers", Macromolecules 2006, 39, 7863-7871.
Rathore, et al., "A Photocurable, Photoluminescent, Polycarbosilane Obtained by Acyclic Diene Metathesis (ADMET) Polymerization", Macromolecules, 2009, 42, 4614-4621.
Thongsomboon, et al., "Thermally Induced Nanoimprinting of Biodegradable Polycarbonates Using Dynamic Covalent Cross-Links", ACS Macro Lett. 2013, 2, 19-22.
Zhou, et al., "Synthesis and properties of novel biodegradable triblock copolymers of poly(5-methyl-5-methoxycarbonyl-1,3-dioxan-2-one) and poly(ethylene glycol)", Polymer 45 (2004) 5459-5463.

* cited by examiner

Transfer

1. Coat BCP
2. DSA

Selective removal

Example 67
Contact Hole: 10 nm DSA process window
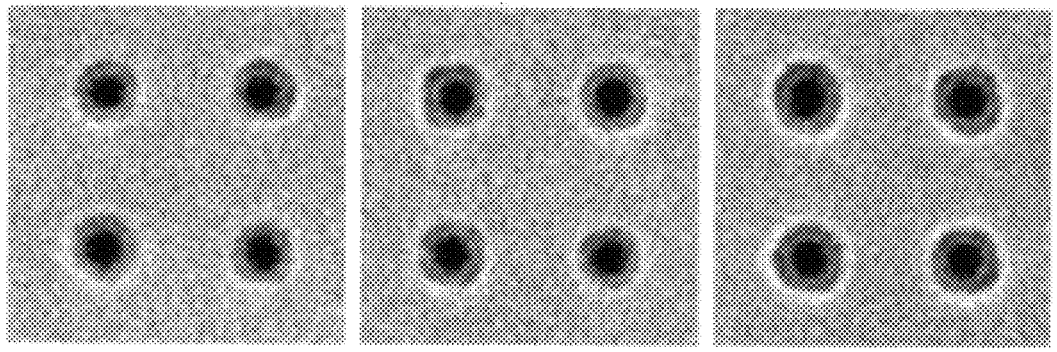
GP CD 46 nm     48 nm     50 nm
FIG. 4A     FIG. 4B     FIG. 4C
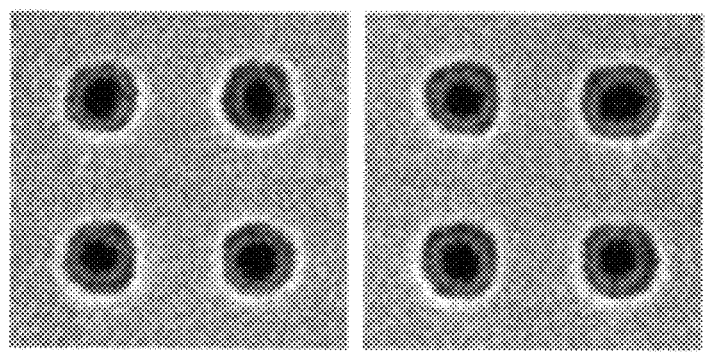
52 nm     54 nm
FIG. 4D     FIG. 4E
Example 67
Contact Bar: multiplication pattern, no shrink
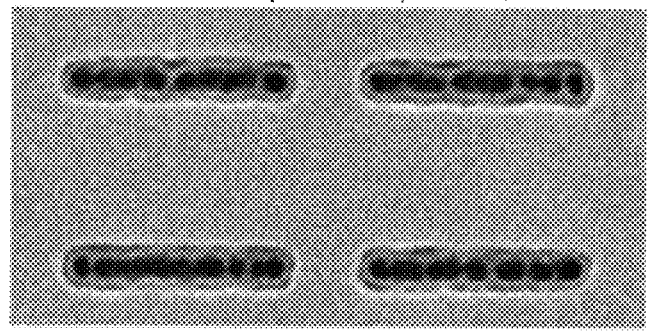
GP CD 52 nm
FIG. 5

Example 68
Contact Hole: 6 nm DSA process window
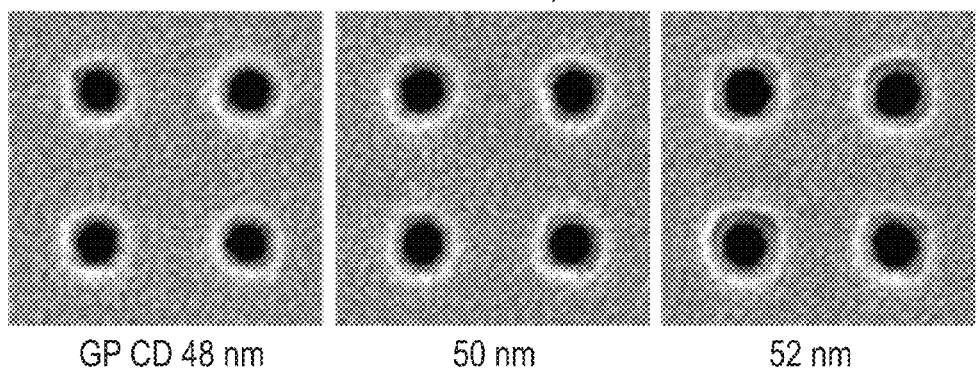
GP CD 48 nm      50 nm     52 nm
FIG. 6A     FIG. 6B     FIG. 6C
Example 68
Contact Bar: 10 nm DSA process window
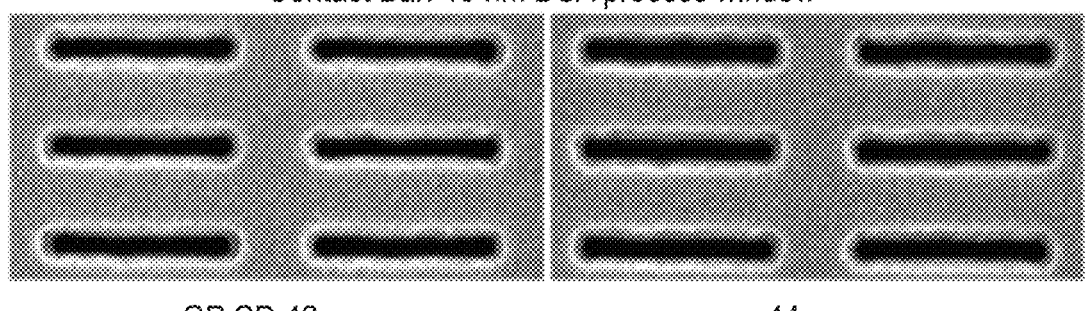
GP CD 42 nm     44 nm
FIG. 7A     FIG. 7B
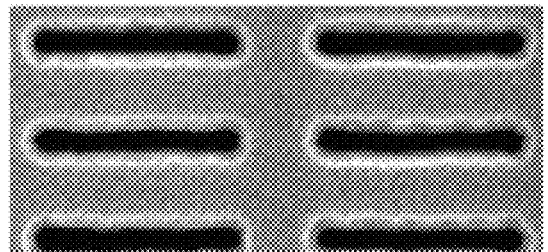
46 nm
FIG. 7C

Example 69
Contact Hole: 6 nm DSA process window
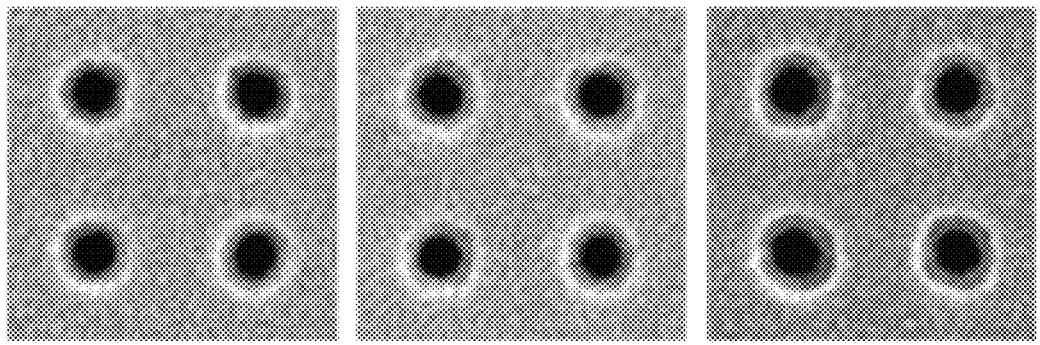
GP CD 46 nm      48 nm      50 nm
FIG. 8A      FIG. 8B      FIG. 8C
Example 69
Contact Bar: 8 nm DSA process window
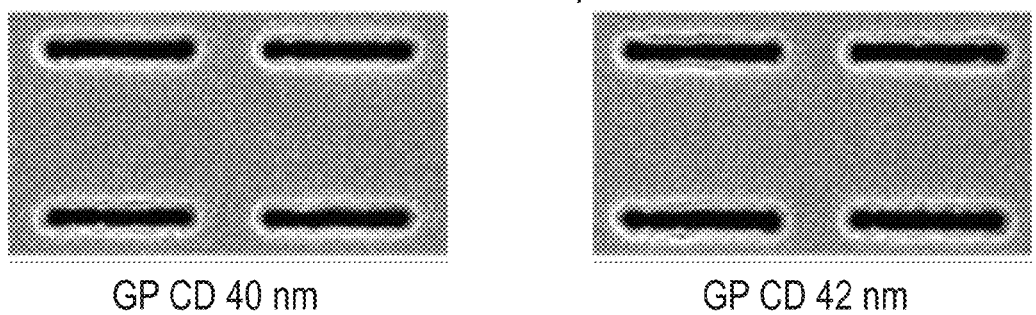
GP CD 40 nm      GP CD 42 nm
FIG. 9A      FIG. 9B
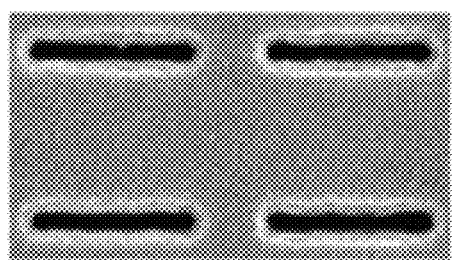 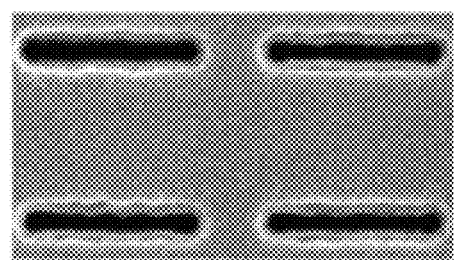
GP CD 44 nm      GP CD 46 nm
FIG. 9C      FIG. 9D

Example 70
Contact Hole: 12 nm DSA process window
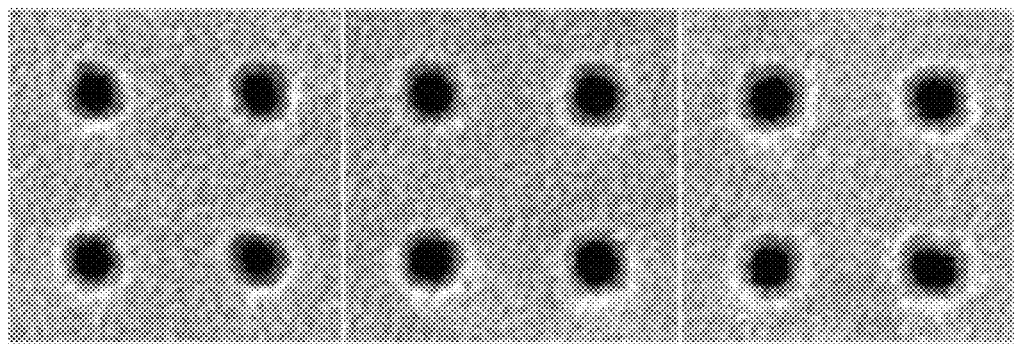
GP CD 44 nm      46 nm      48 nm
FIG. 10A      FIG. 10B      FIG. 10C
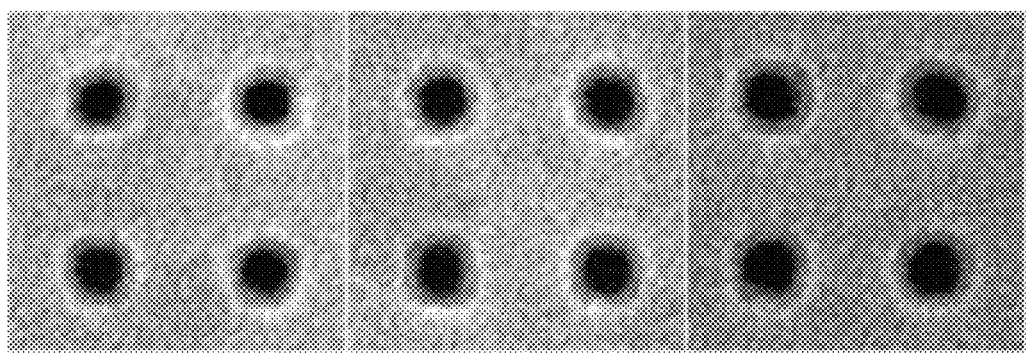
50 nm      52 nm      54 nm
FIG. 10D      FIG. 10E      FIG. 10F
Example 70
Contact Bar: no bar shrink
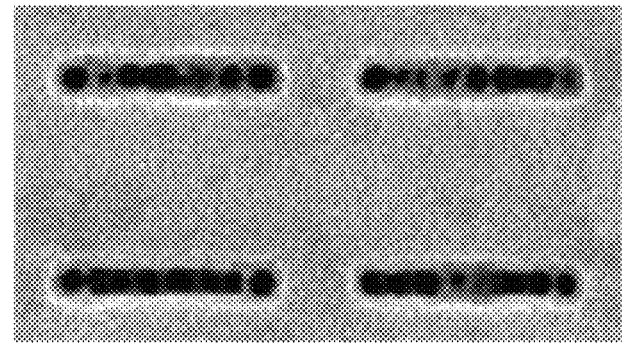
GP CD 48 nm
FIG. 11

Example 71
Contact Bar: 14 nm DSA process window

GP CD 40 nm 42 nm 44 nm 46 nm 48 nm 50 nm 52 nm

Example 71
Contact Bar: no shrink

GP CD 46 nm

Example 72
Contact Hole: no DSA process window with more than 80% open holes

GP CD 46 nm

Example 72
Contact Bar: no shrink
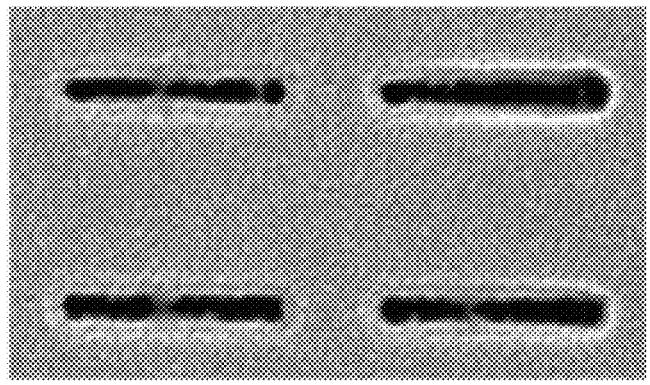
GP CD 46 nm
FIG. 15
Example 73
Contact Hole: 14 nm DSA process window
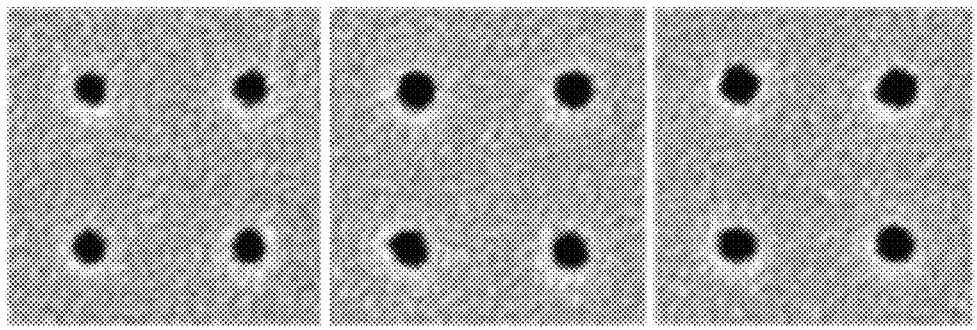
| GP CD 36 nm | 38 nm | 40 nm |
|---|---|---|
| FIG. 16A | FIG. 16B | FIG. 16C |
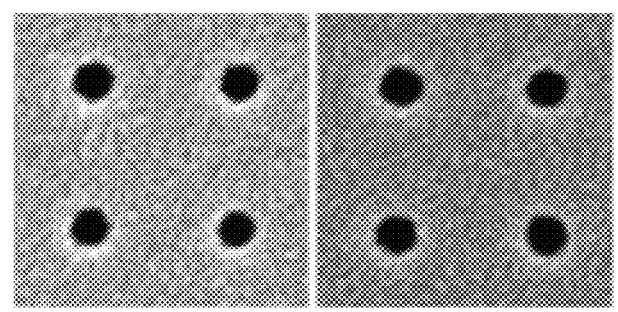
| 42 nm | 44 nm |
|---|---|
| FIG. 16D | FIG. 16E |

Example 73
Contact Hole: 14 nm DSA process window
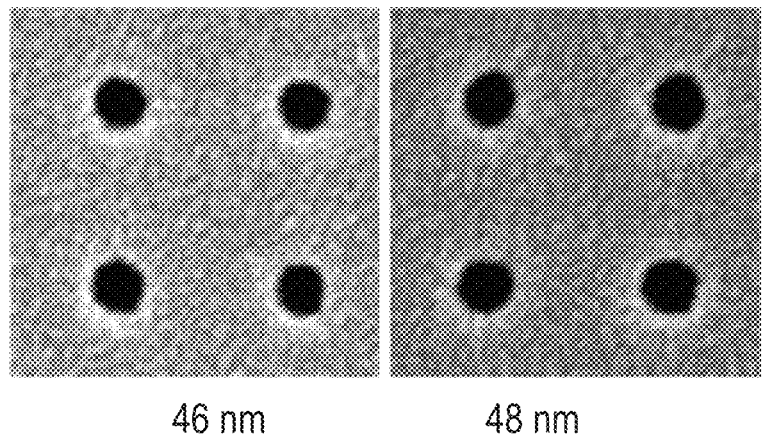
46 nm    48 nm
FIG. 16F    FIG. 16G
Example 73
Contact Bar: no shrink
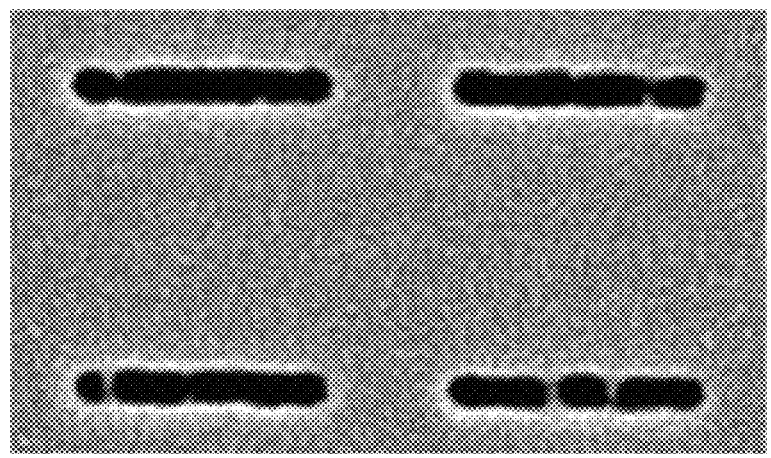
GP CD 38 nm
FIG. 17

Example 74
Contact Hole: 8 nm DSA process window
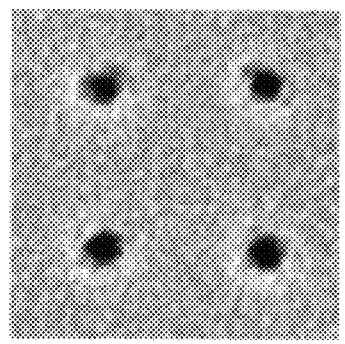
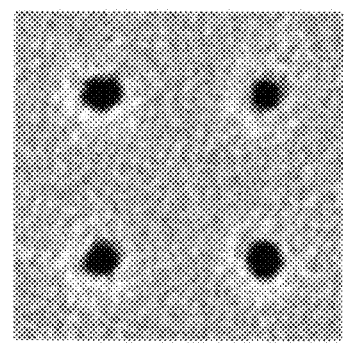
GP CD 42 nm
FIG. 18A
44 nm
FIG. 18B
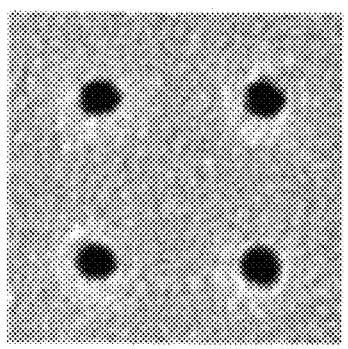
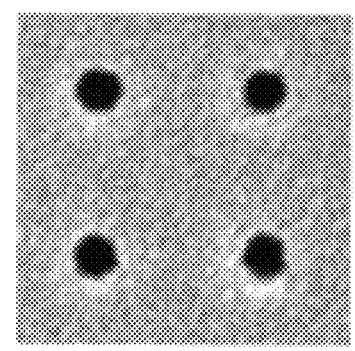
46 nm
FIG. 18C
48 nm
FIG. 18D
Example 74
Contact Bar: No shrink
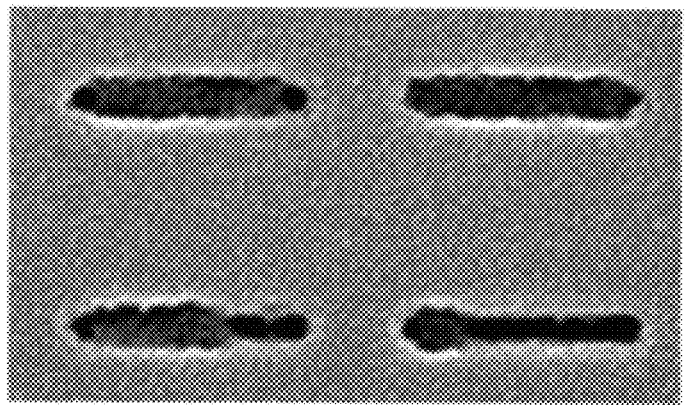
GP CD 46 nm
FIG. 19

Example 75
Contact Hole: 4 nm DSA process window

GP CD 48 nm 50 nm

Example 75
Contact Bar: no shrink

GP CD 50 nm

Example 76
Contact Hole: 12 nm DSA process window
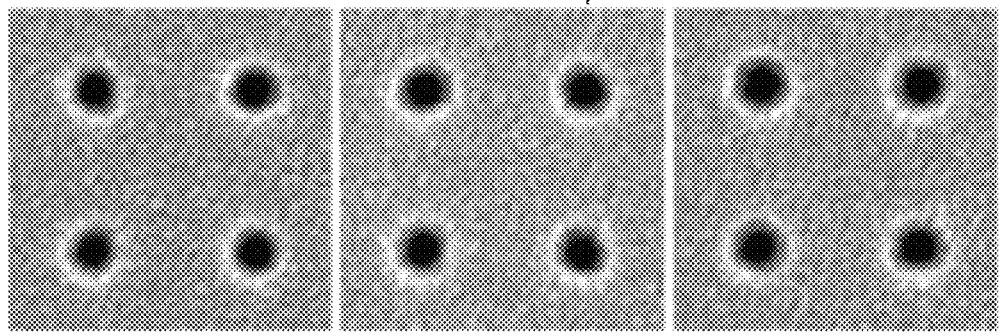
| GP CD 36 nm | 38 nm | 40 nm |
| FIG. 22A | FIG. 22B | FIG. 22C |
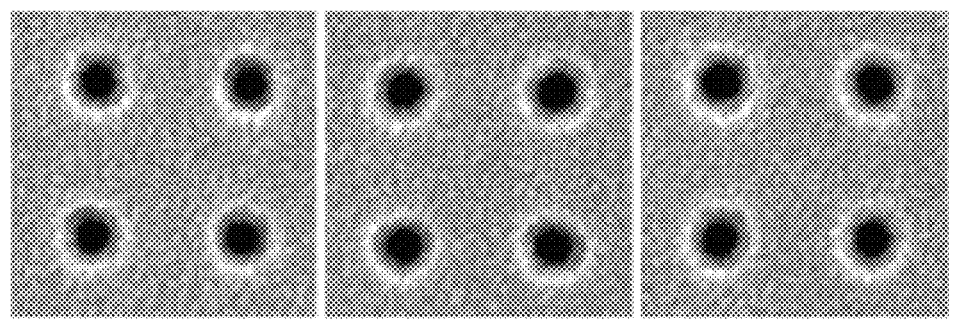
| 42 nm | 44 nm | 46 nm |
| FIG. 22D | FIG. 22E | FIG. 22F |
Example 76
Contact Bar: no shrink
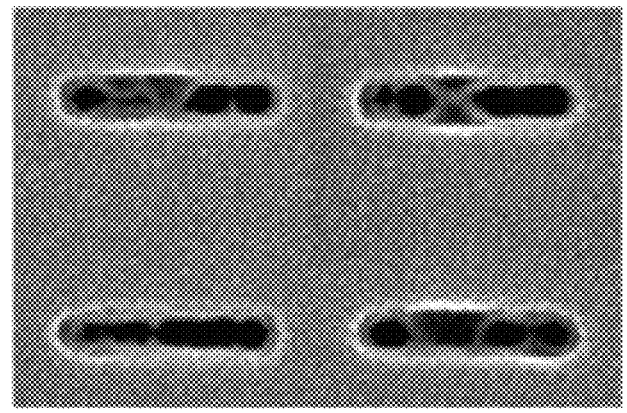
GP CD 40 nm
FIG. 23

Example 77
Contact Hole: no shrink
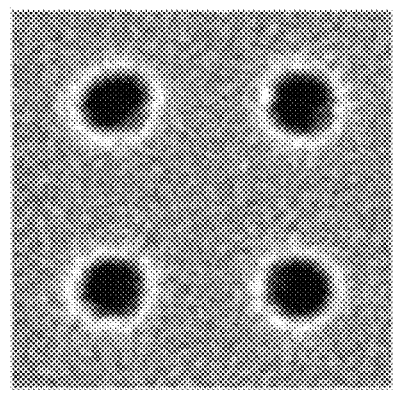
GP CD 36 nm
FIG. 24
Example 77
Contact Bar: 8 nm DSA process window
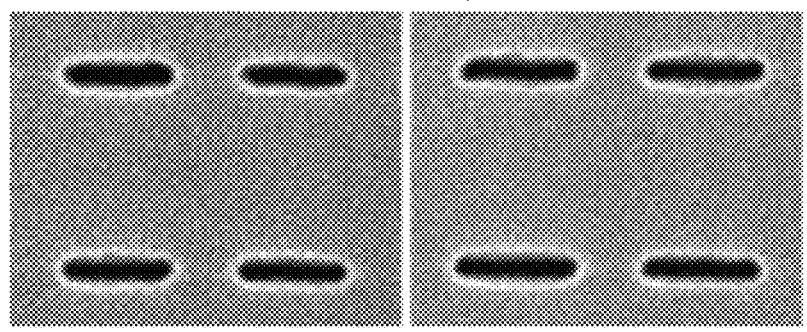
GP CD 24 nm          26 nm
FIG. 25A          FIG. 25B
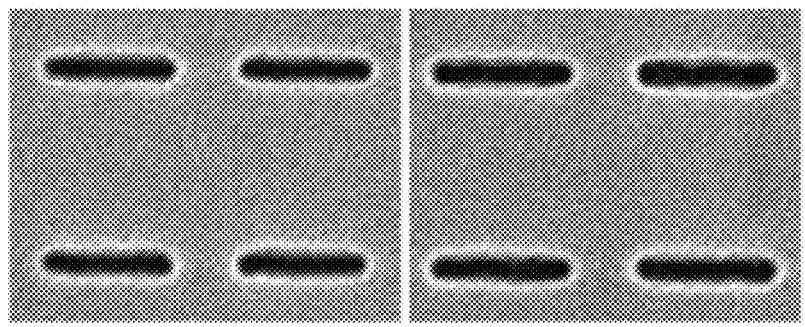
28 nm          30 nm
FIG. 25C          FIG. 25D

Example 78
Contact Hole: 10 nm DSA process window
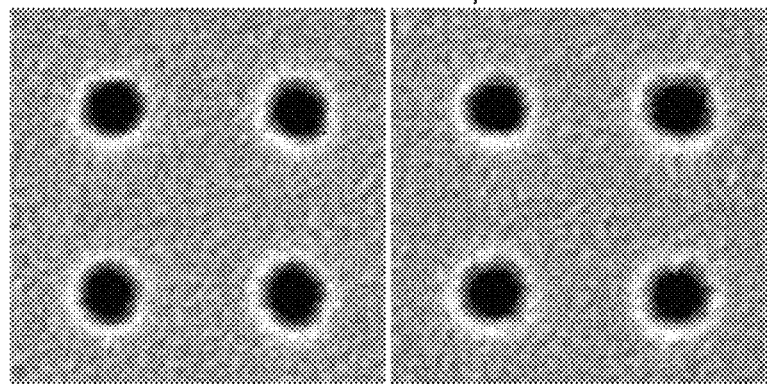
GP CD 42 nm
FIG. 26A
44 nm
FIG. 26B
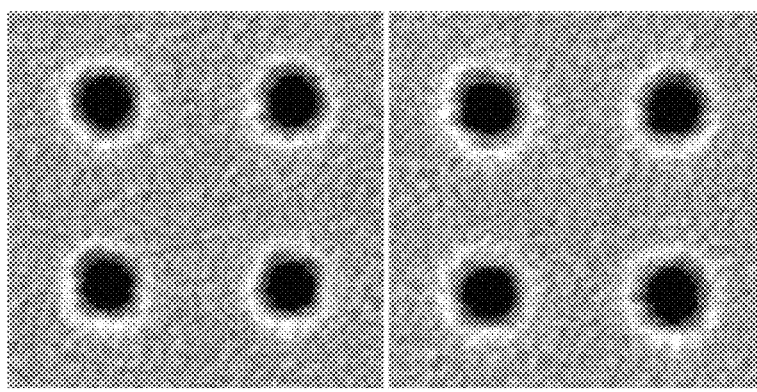
46 nm
FIG. 26C
48 nm
FIG. 26D
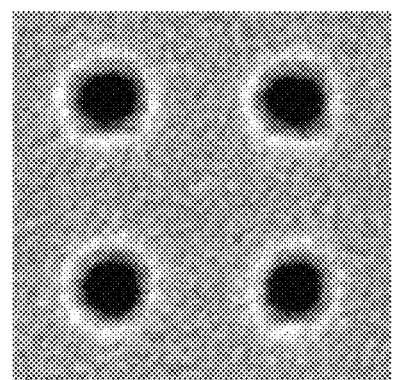
50 nm
FIG. 26E

Example 78
Contact Bar: 10 nm DSA process window

GP CD 40 nm 42 nm 44 nm 46 nm 48 nm

Example 79
Contact Hole: 18 nm DSA process window
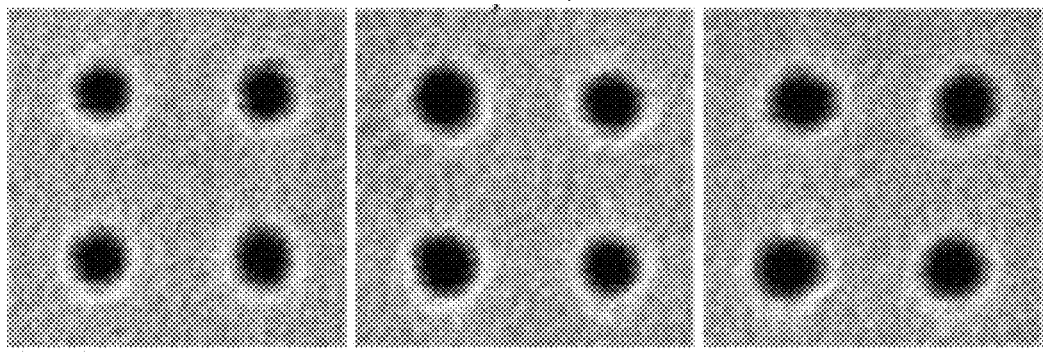
GP CD 26 nm    28 nm    30 nm
FIG. 28A   FIG. 28B   FIG. 28C
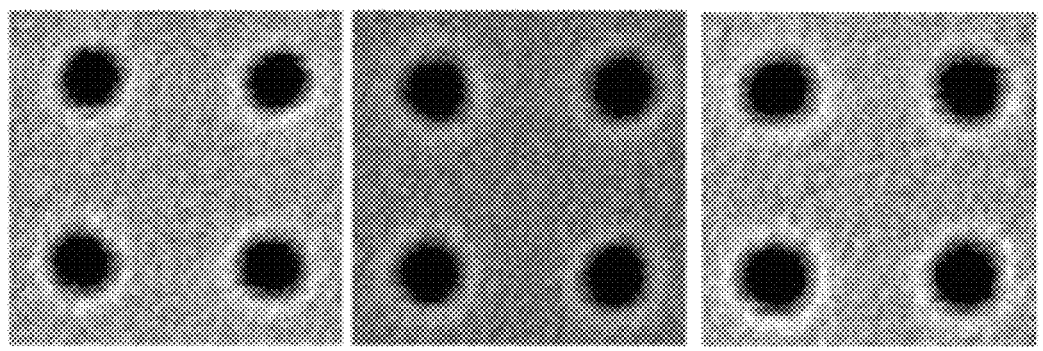
32 nm    34 nm    36 nm
FIG. 28D   FIG. 28E   FIG. 28F
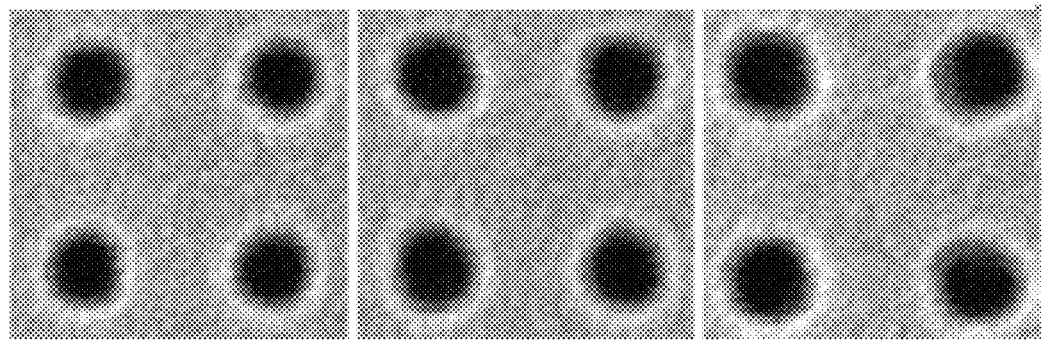
38 nm    40 nm    42 nm
FIG. 28G   FIG. 28H   FIG. 28I

Example 79
Contact Bar: 6 nm DSA process window
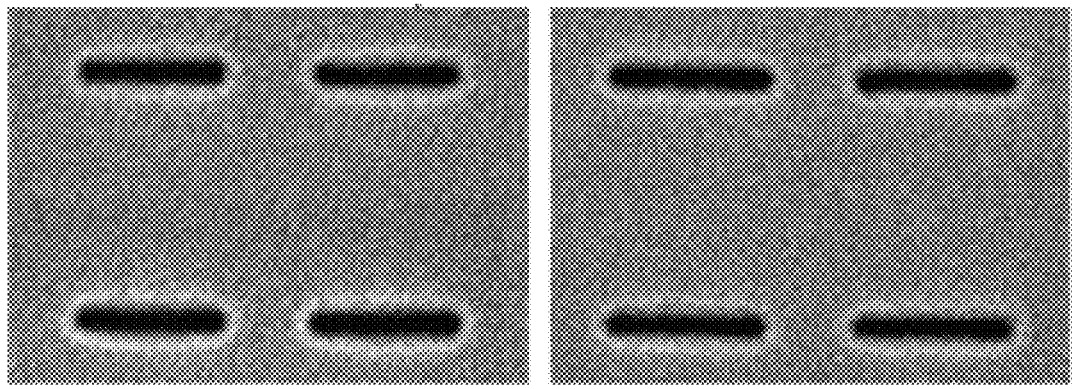
GP CD 26 nm
FIG. 29A
28 nm
FIG. 29B
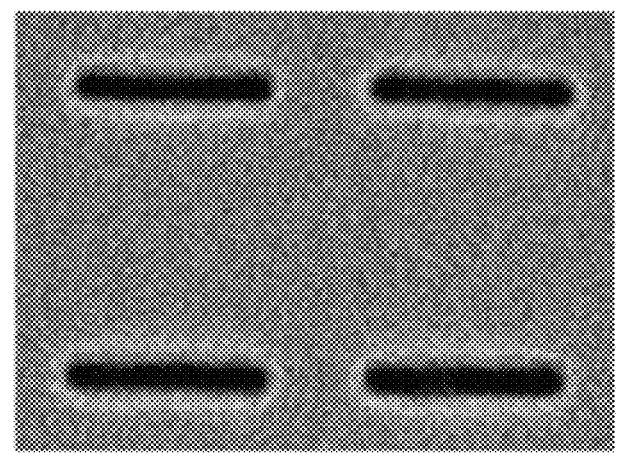
30 nm
FIG. 29C

Example 80
Contact Hole: 12 nm DSA process window

GP CD 34 nm 36 nm 38 nm 40 nm 42 nm 44 nm

Example 80
Contact Bar: Multiplication

GP CD 40 nm

Example 81
Contact Bar: no DSA process window with more than 80% open holes

GP CD 40 nm

Example 81
Contact Bar: no shrink
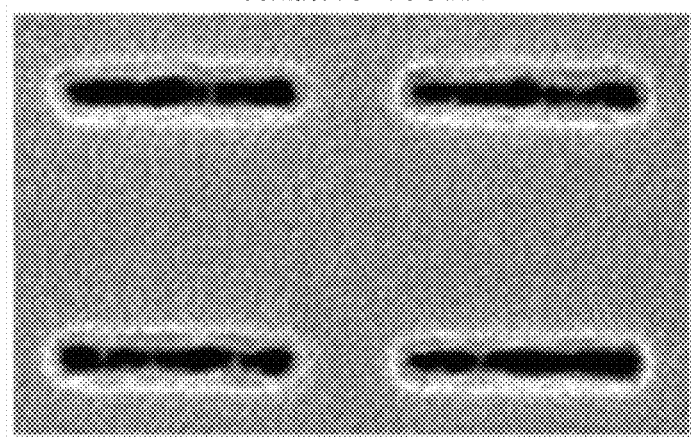
GP CD 40 nm
FIG. 33
Example 82
Contact Hole: 14 nm DSA process window
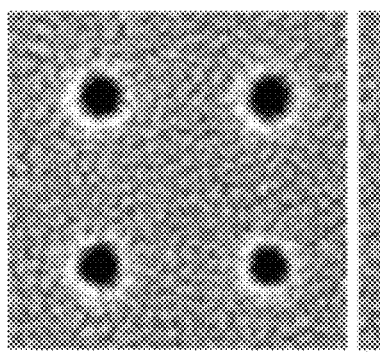 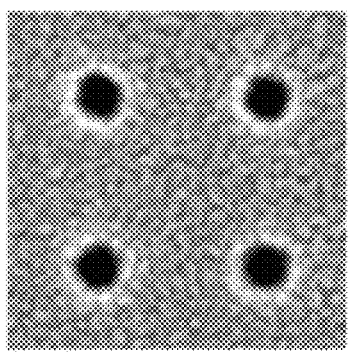 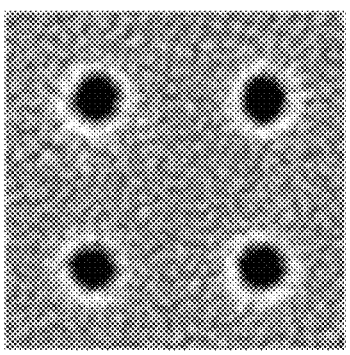
GP CD 28 nm             30 nm              32 nm
FIG. 34A         FIG. 34B        FIG. 34C

Example 82
Contact Hole: 14 nm DSA process window
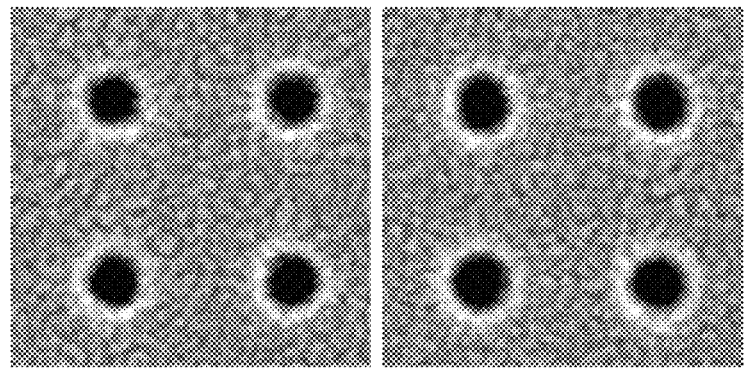
34 nm
FIG. 34D
36 nm
FIG. 34E
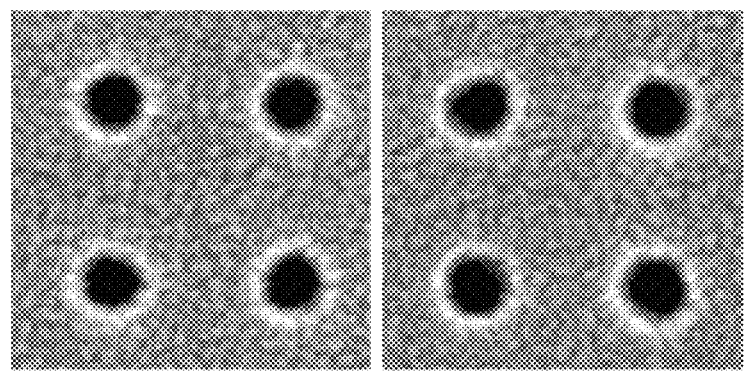
38 nm
FIG. 34F
40 nm
FIG. 34G
Example 82
Contact Bar: no shrink
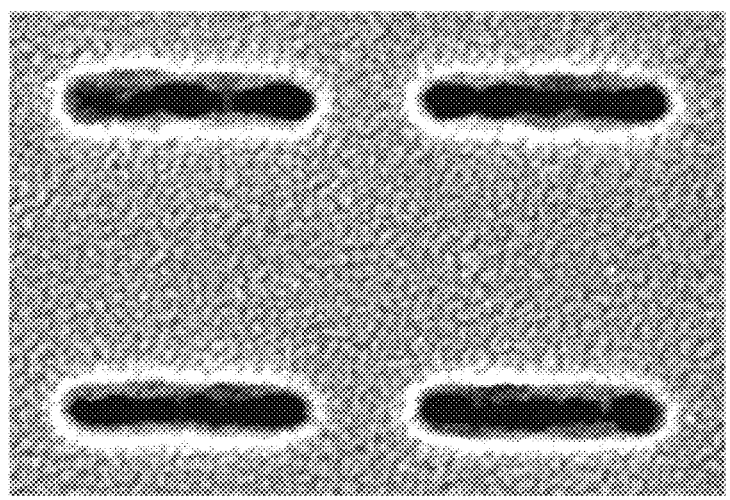
GP CD 34 nm
FIG. 35

Example 83
Contact Hole: 14 nm DSA process window

GP CD 30 nm 32 nm 34 nm 36 nm 38 nm 40 nm 42 nm 44 nm

Example 83
Contact Bar: 6 nm DSA process window

GP CD 28 nm 30 nm 32 nm

Example 84
Contact Hole: 14 nm DSA process window
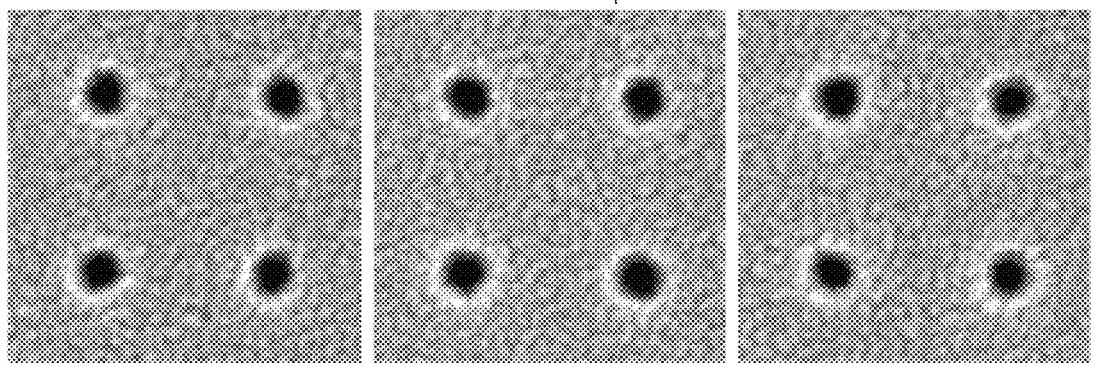
GP CD 28 nm
FIG. 38A
30 nm
FIG. 38B
32 nm
FIG. 38C
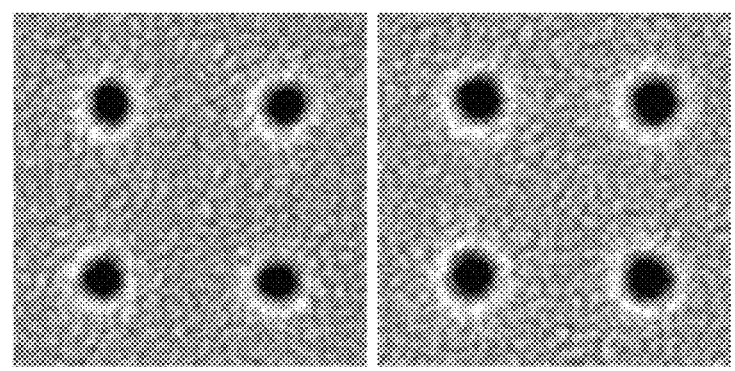
34 nm
FIG. 38D
36 nm
FIG. 38E
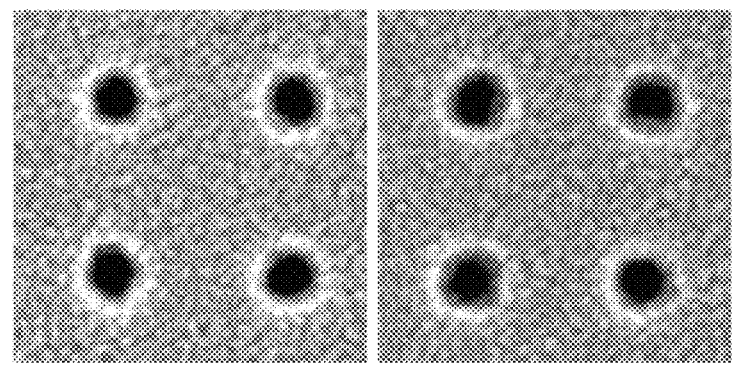
38 nm
FIG. 38F
40 nm
FIG. 38G

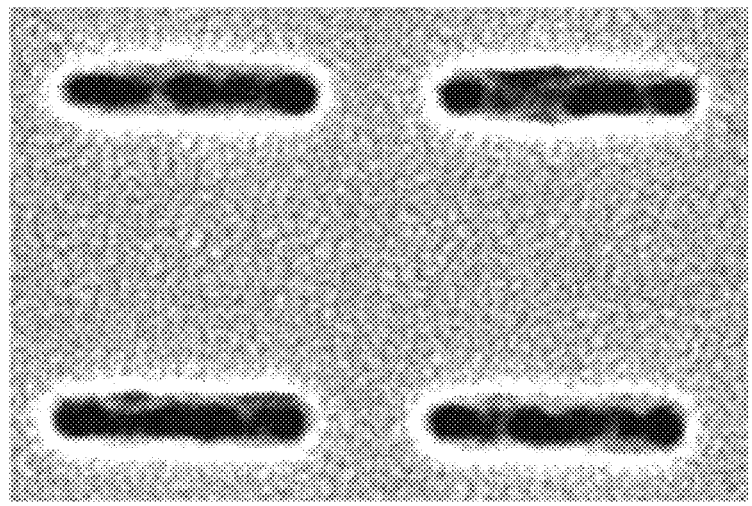
Example 84
Contact Bar: no shrink
GP CD 34 nm
FIG. 39
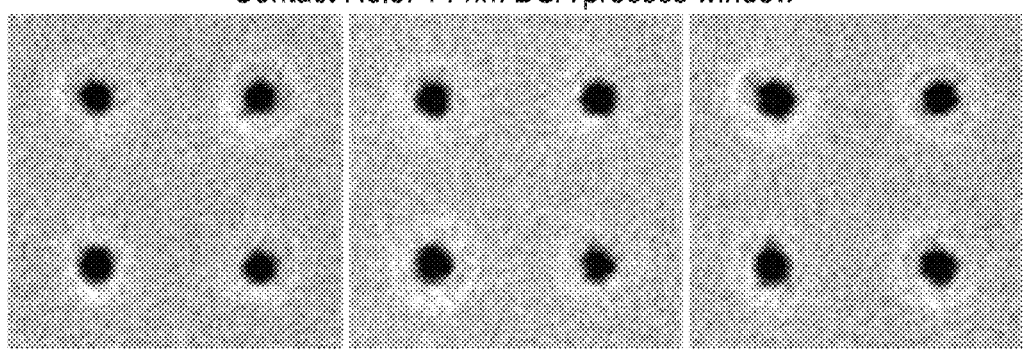
Example 85
Contact Hole: 14 nm DSA process window
| GP CD 40 nm | 42 nm | 44 nm |
| --- | --- | --- |
| FIG. 40A | FIG. 40B | FIG. 40C |

Example 85
Contact Hole: 14 nm DSA process window
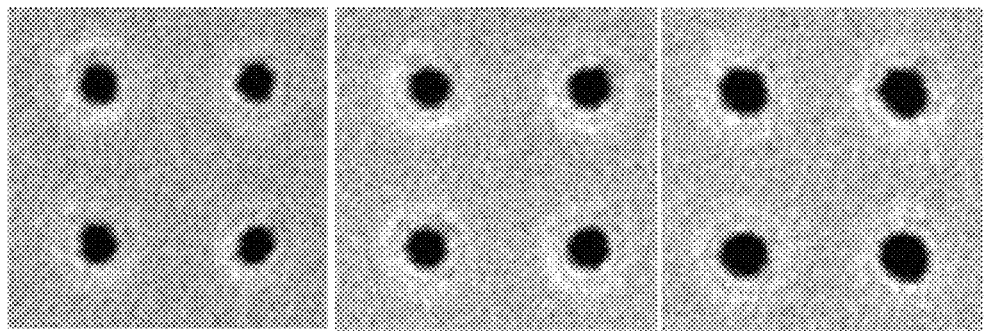
46 nm
FIG. 40D
48 nm
FIG. 40E
50 nm
FIG. 40F
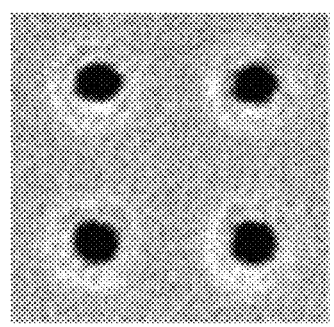
52 nm
FIG. 40G
Example 85
Contact Bar: 10 nm DSA process window
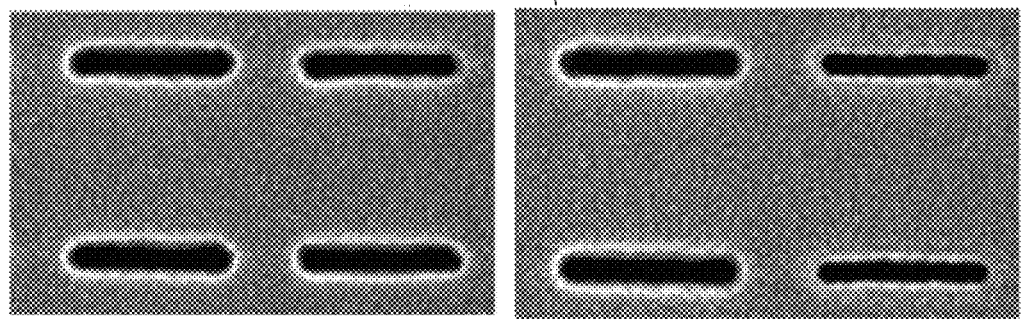
GP CD 36 nm
FIG. 41A
38 nm
FIG. 41B

Example 85
Contact Bar: 10 nm DSA process window 40 nm 42 nm 44 nm

Example 86
Contact Hole: 18 nm DSA process window
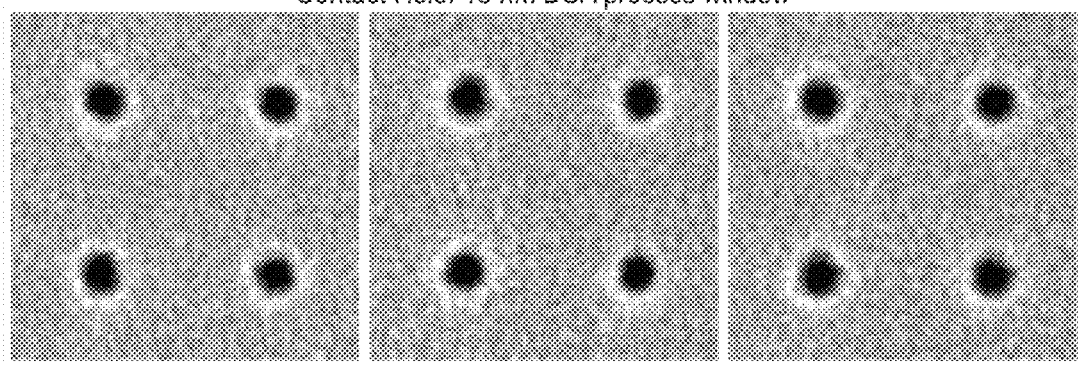
GP CD 26 nm
FIG. 42A
28 nm
FIG. 42B
30 nm
FIG. 42C
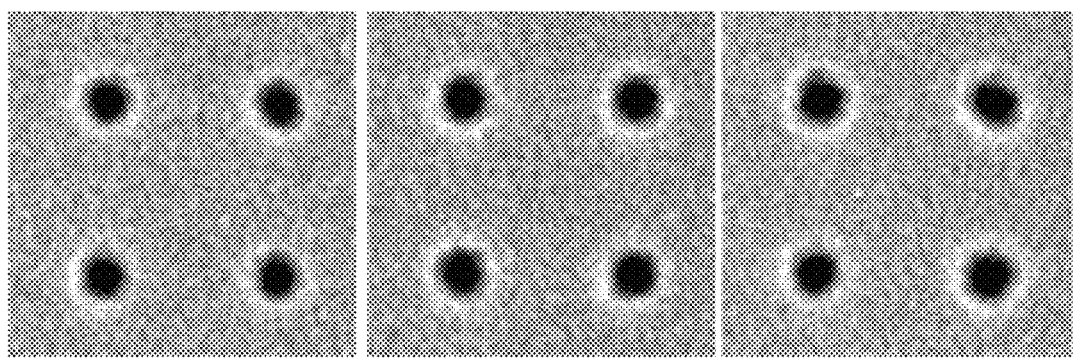
32 nm
FIG. 42D
34 nm
FIG. 42E
36 nm
FIG. 42F
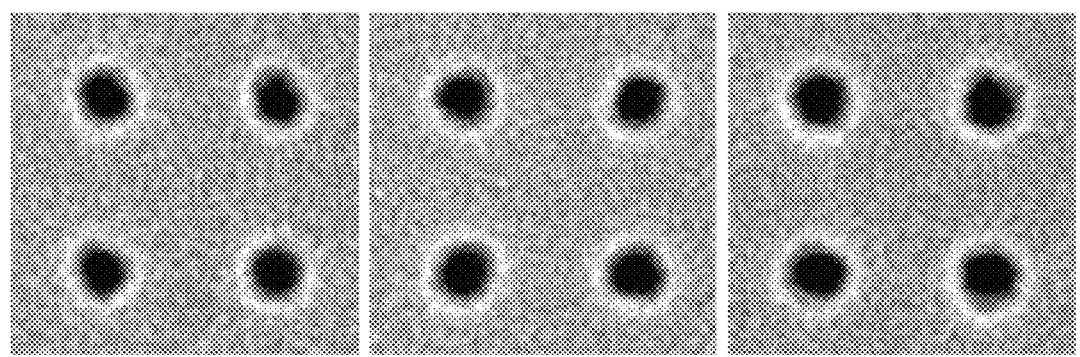
38 nm
FIG. 42G
40 nm
FIG. 42H
42 nm
FIG. 42I

Example 86
Contact Bar: 6 nm DSA process window

GP CD 26 nm 28 nm 30 nm

Example 87
Contact Hole: 14 nm DSA process window
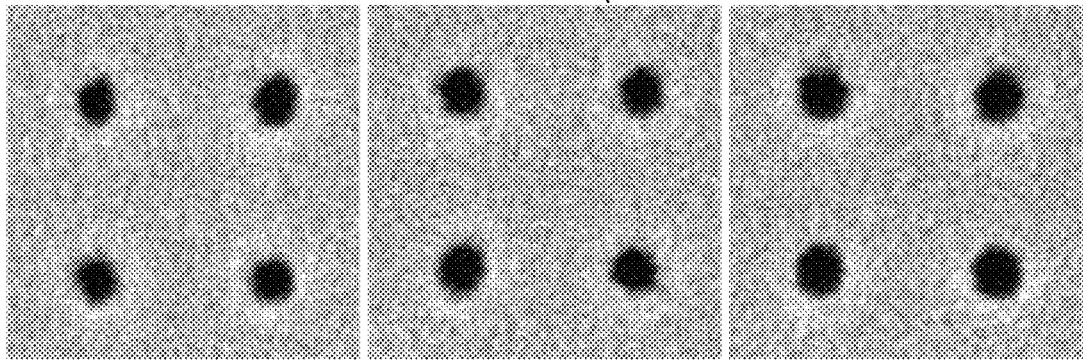
GP CD 42 nm
FIG. 44A
44 nm
FIG. 44B
46 nm
FIG. 44C
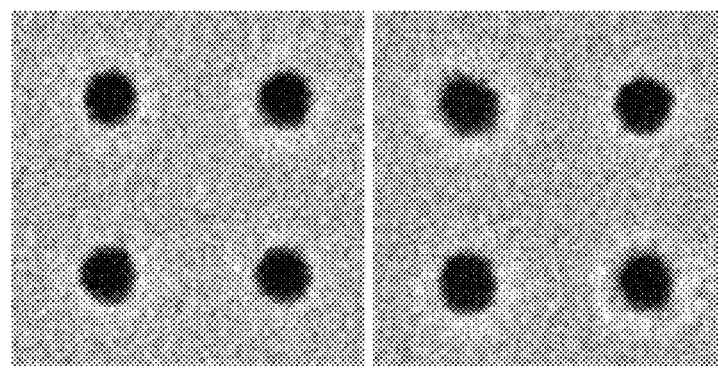
48 nm
FIG. 44D
50 nm
FIG. 44E
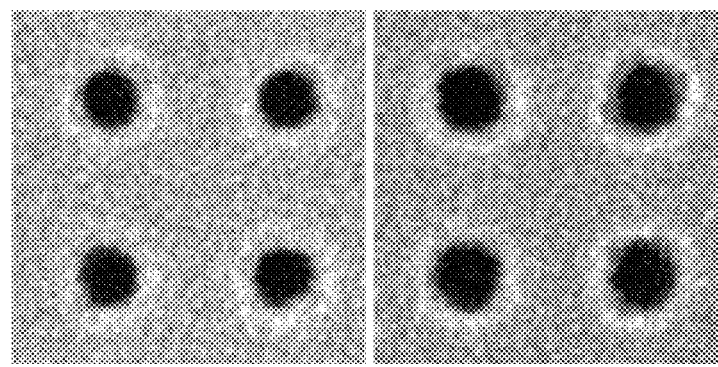
52 nm
FIG. 44F
54 nm
FIG. 44G

Example 87
Contact Bar: no bar shrink

GP CD 48 nm

Example 88
Contact Hole: no DSA process window with more than 80% open holes

GP CD 42 nm

Example 88
Contact Bar: no bar shrink

GP CD 42 nm

Example 89
Contact Hole: no DSA process window with more than 80% open holes

GP CD 40 nm

Example 89
Contact Bar: no DSA process window with more than 80% open holes
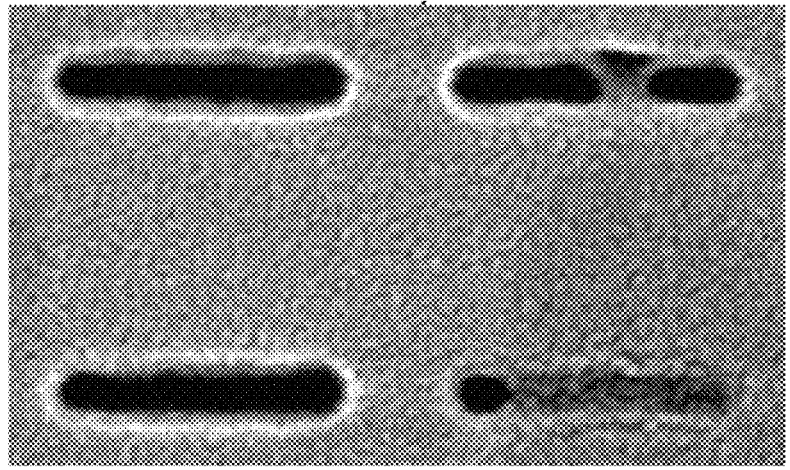
GP CD 40 nm
FIG. 49
Example 91
Contact Hole: 14 nm DSA process window
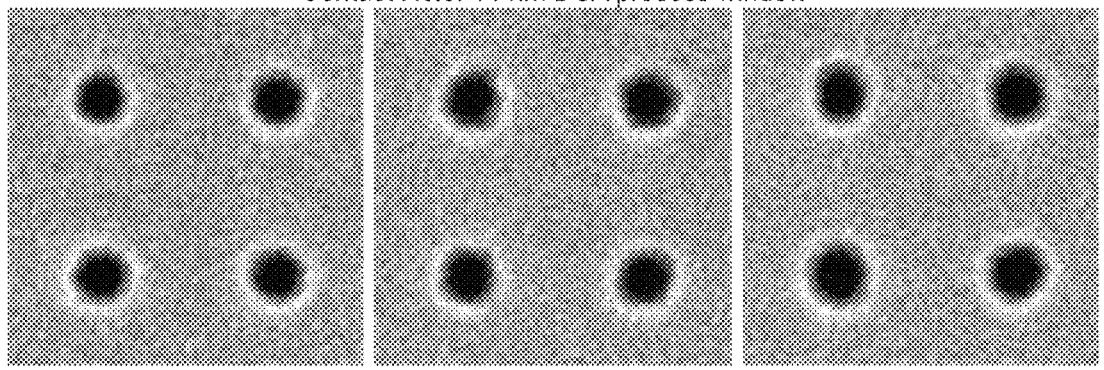
| GP CD 36 nm | 38 nm | 40 nm |
| --- | --- | --- |
| FIG. 50A | FIG. 50B | FIG. 50C |

Example 91
Contact Hole: 14 nm DSA process window
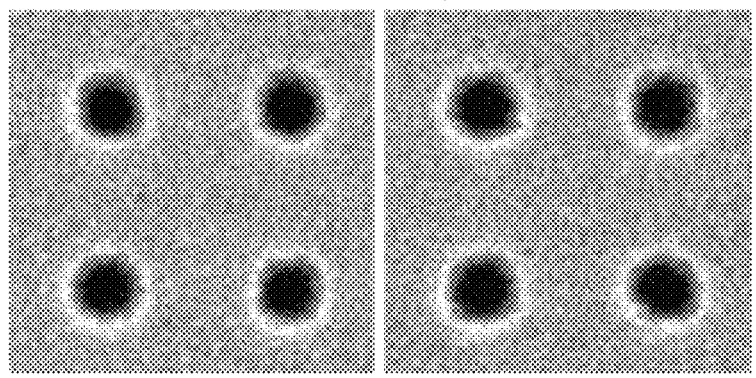
42 nm
FIG. 50D
44 nm
FIG. 50E
46 nm
FIG. 50F
48 nm
FIG. 50G
Example 91
Contact Bar: 10 nm DSA process window
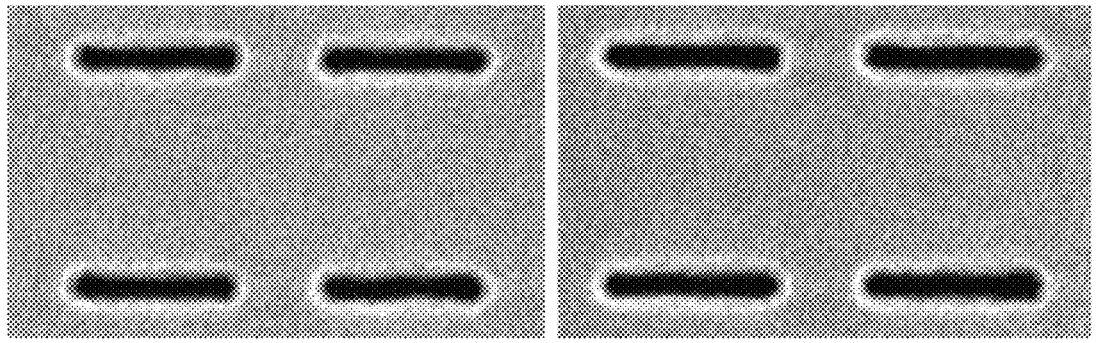
GP CD 32 nm
FIG. 51A
34 nm
FIG. 51B

Example 91
Contact Bar: 10 nm DSA process window
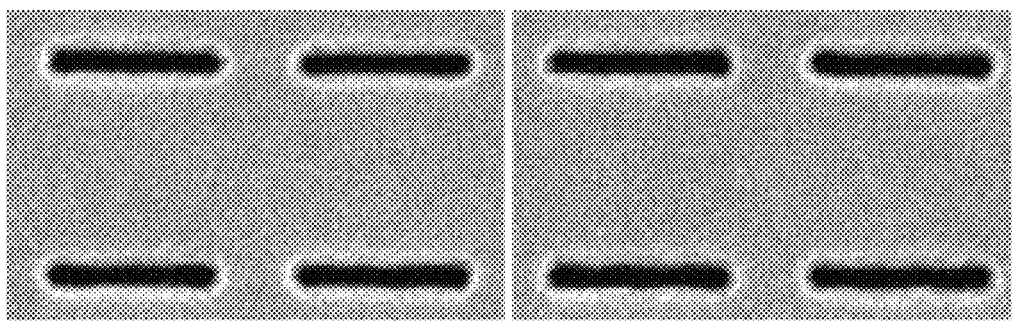
36 nm
FIG. 51C
38 nm
FIG. 51D
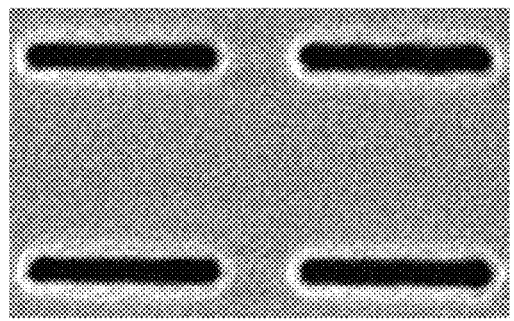
40 nm
FIG. 51E
Example 92
Contact Hole: 10 nm DSA process window
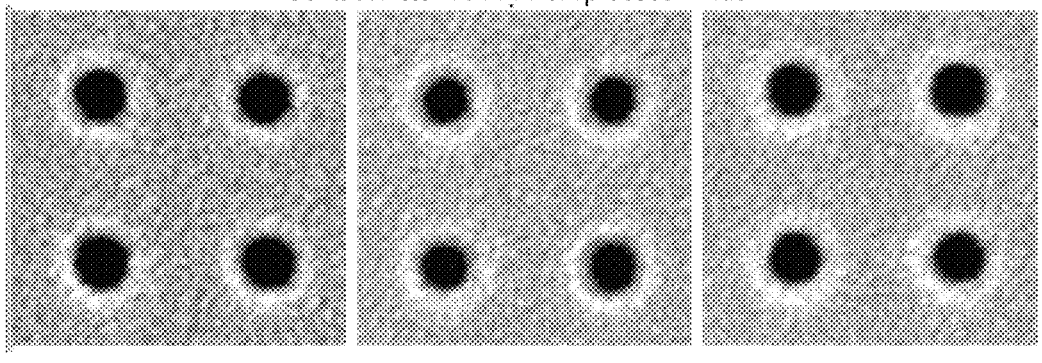
GP CD 46 nm
FIG. 52A
48 nm
FIG. 52B
50 nm
FIG. 52C

Example 92
Contact Hole: 10 nm DSA process window 52 nm 54 nm

Example 92
Contact Bar: 16 nm DSA process window 46 nm 48 nm 50 nm 52 nm

Example 92
Contact Bar: 16 nm DSA process window 54 nm 56 nm 58 nm 60 nm

Example 93
Contact Hole: 12 nm DSA process window
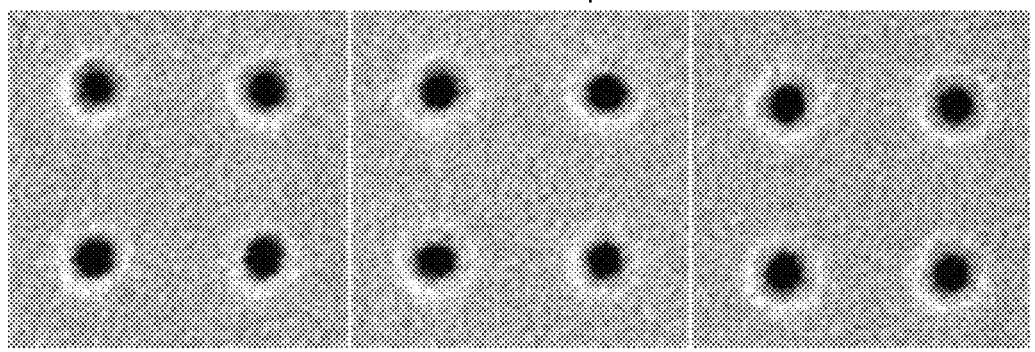
GP CD 38 nm
FIG. 54A
40 nm
FIG. 54B
42 nm
FIG. 54C
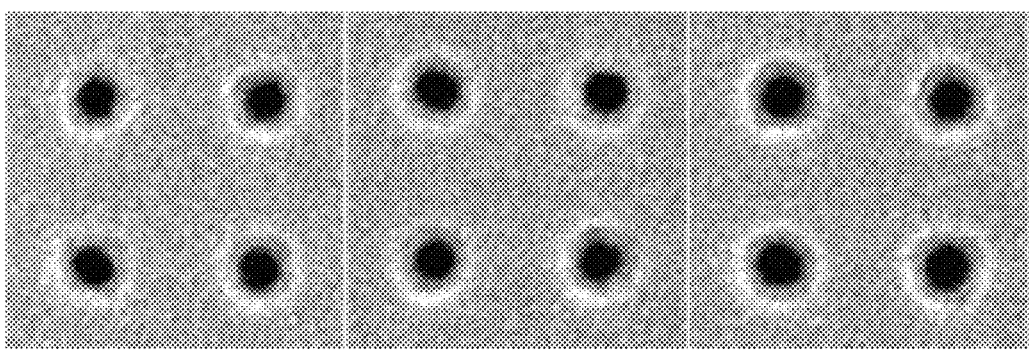
44 nm
FIG. 54D
46 nm
FIG. 54E
48 nm
FIG. 54F
Example 93
Contact Bar: no shrink
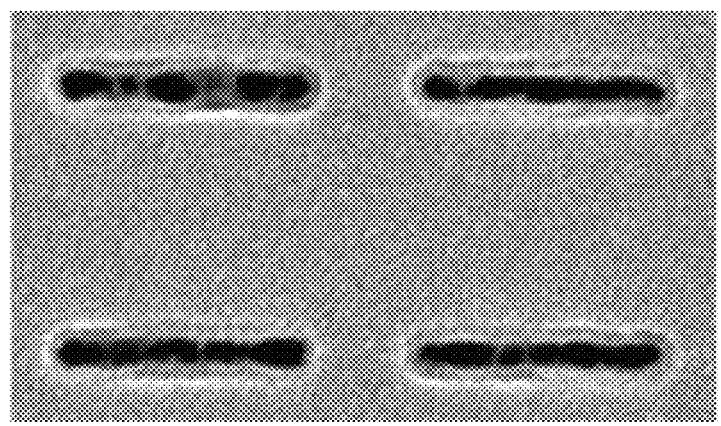
GP CD 42 nm
FIG. 55

Example 94
Contact Hole: 14 nm DSA process window

GP CD 34 nm 36 nm 38 nm 40 nm 42 nm 44 nm 46 nm

Example 94
Contact Bar: no shrink

GP CD 42 nm

Example 95
Contact Hole: no DSA process window with more than 80% open holes

GP CD 48 nm

Example 95
Contact Bar: 12 nm DSA process window
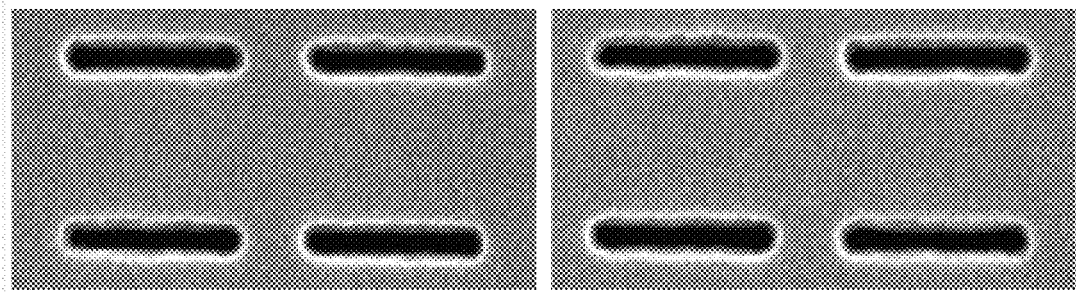
GP CD 42 nm
FIG. 59A
44 nm
FIG. 59B
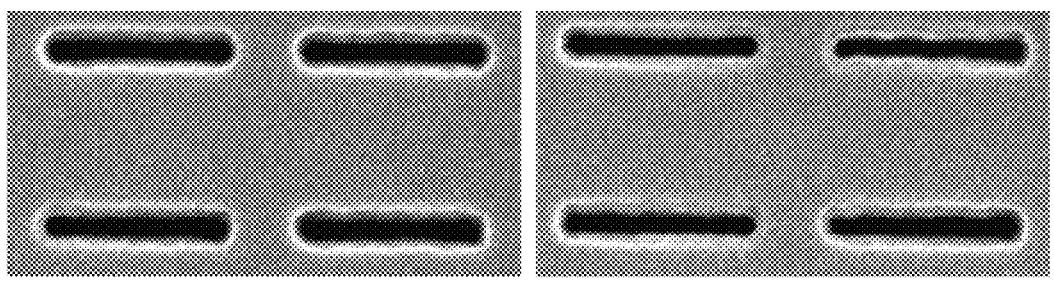
46 nm
FIG. 59C
48 nm
FIG. 59D
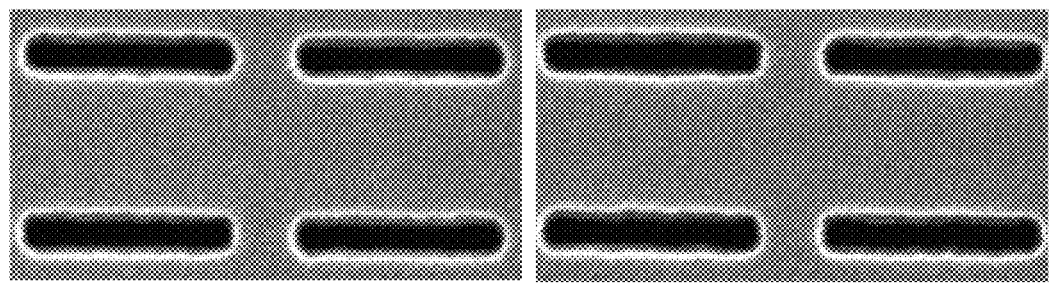
50 nm
FIG. 59E
52 nm
FIG. 59F

Example 96
Contact Hole: no shrink

GP CD 30 nm

Example 96
Contact Bar: no DSA process window with more than 80% open holes

GP CD 30 nm

Example 97
Contact Hole: 10 nm DSA process window
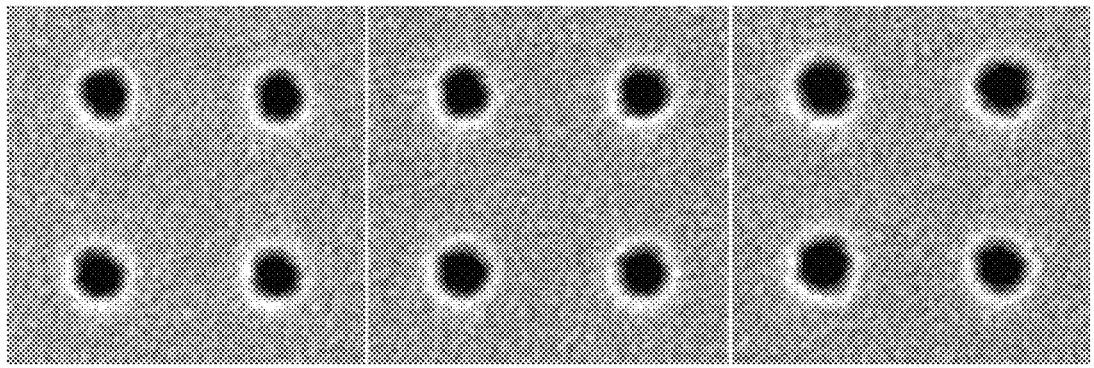
GP CD 38 nm  
FIG. 62A
40 nm  
FIG. 62B
42 nm  
FIG. 62C
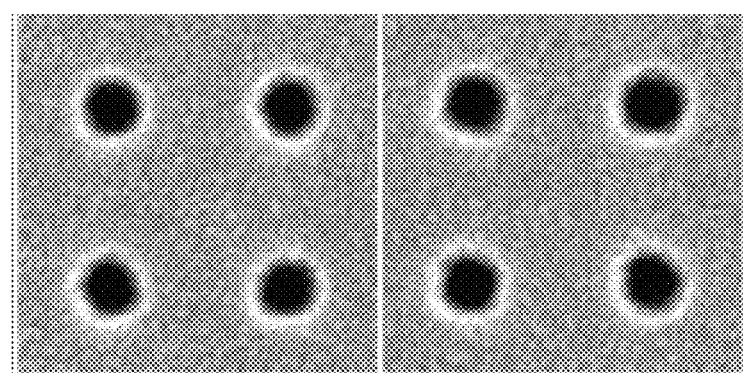
44 nm  
FIG. 62D
46 nm  
FIG. 62E
Example 96
Contact Bar: no DSA process window with more than 80% open holes
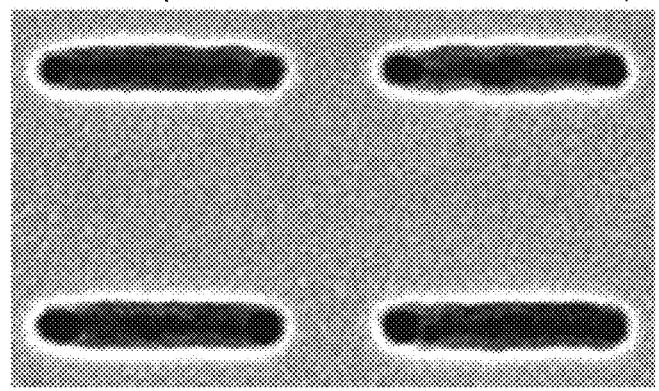
GP CD 42 nm  
FIG. 63

Example 98
Contact Hole: 6 nm DSA process window

GP CD 50 nm 52 nm 54 nm

Example 98
Contact Bar: no shrink

GP CD 52 nm

Example 99
Contact Hole: no DSA process window with more than 80% open holes

GP CD 44 nm

Example 99
Contact Bar: Multiplication pattern

GP CD 44 nm

Example 100
Contact Hole: no shrink

GP CD 46 nm

Example 100
Contact Bar: no shrink

GP CD 46 nm

Example 101
Contact Hole: 12 nm DSA process window
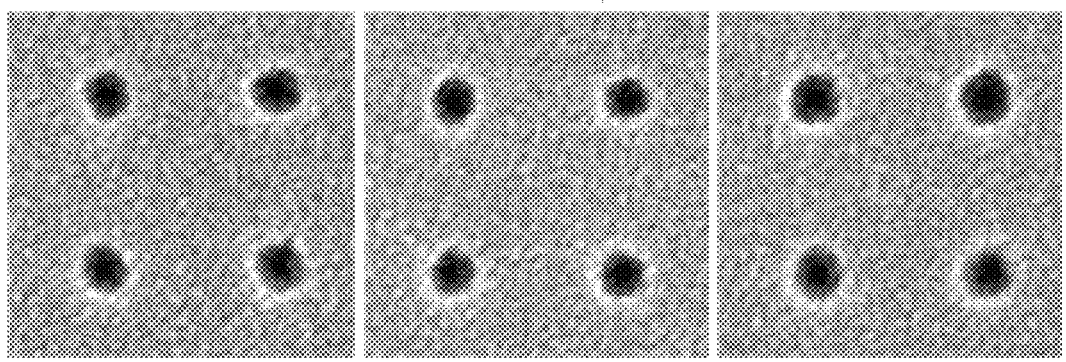
GP CD 28 nm  
FIG. 70A
30 nm  
FIG. 70B
32 nm  
FIG. 70C
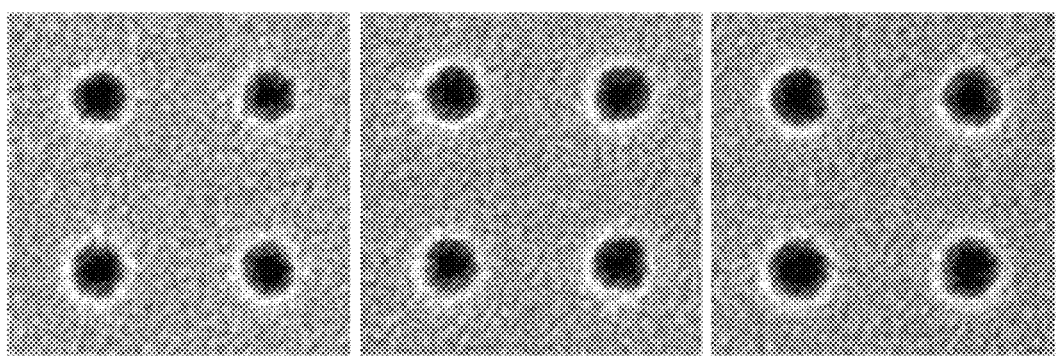
34 nm  
FIG. 70D
36 nm  
FIG. 70E
38 nm  
FIG. 70F
Example 101
Contact Bar: no shrink
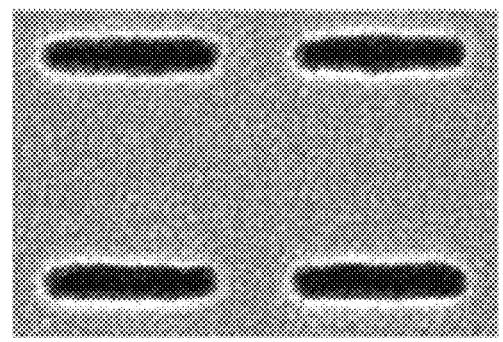
GP CD 32 nm  
FIG. 71

Example 102
Contact Hole: 12 nm DSA process window
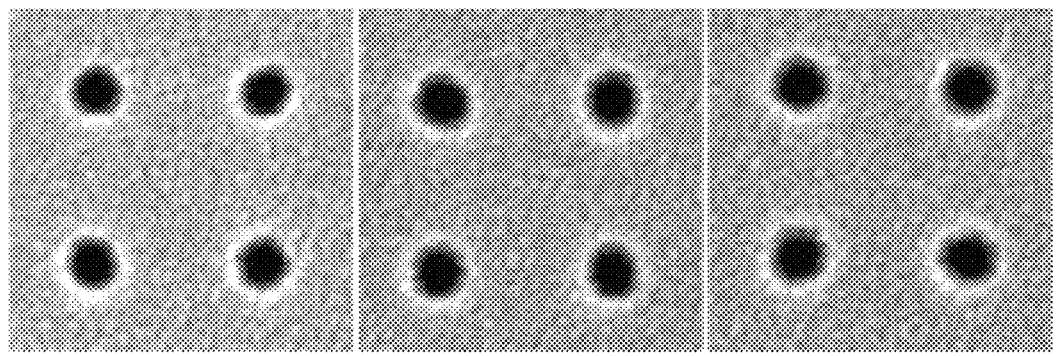
GP CD 36 nm
FIG. 72A
38 nm
FIG. 72B
40 nm
FIG. 72C
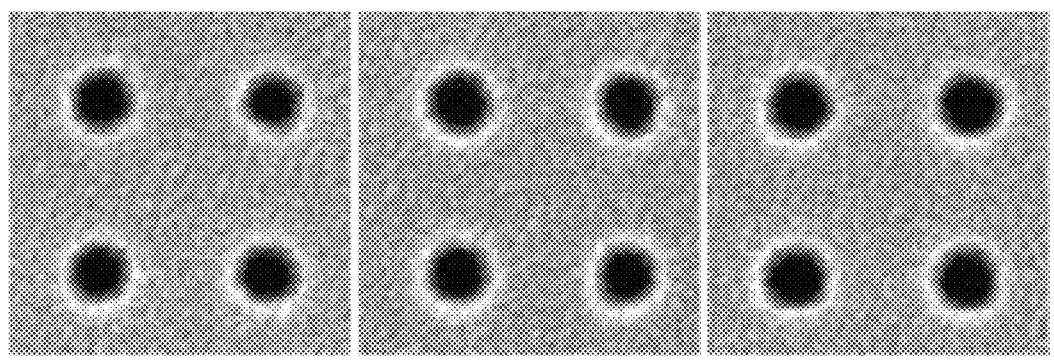
42 nm
FIG. 72D
44 nm
FIG. 72E
46 nm
FIG. 72F
Example 102
Contact Bar: no shrink
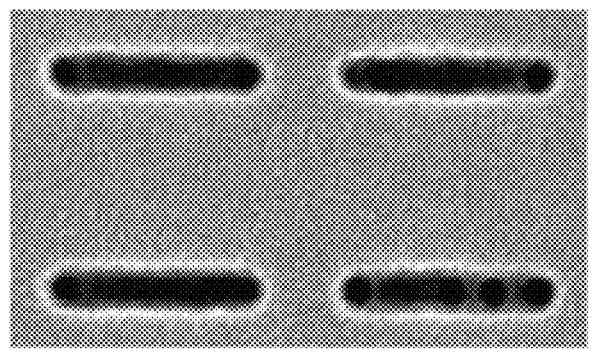
GP CD 42 nm
FIG. 73

Example 103
Contact Hole: no DSA process window with more than 80% open holes

GP CD 40 nm

Example 103
Contact Bar: no shrink

GP CD 40 nm

Example 104
Contact Hole: no DSA process window with more than 80% open holes

GP CD 42 nm

Example 104
Contact Bar: no shrink

GP CD 42 nm

Example 105
Contact Hole: no DSA process window with more than 80% open holes

GP CD 40 nm

Example 105
Contact Bar: no shrink

GP CD 40 nm

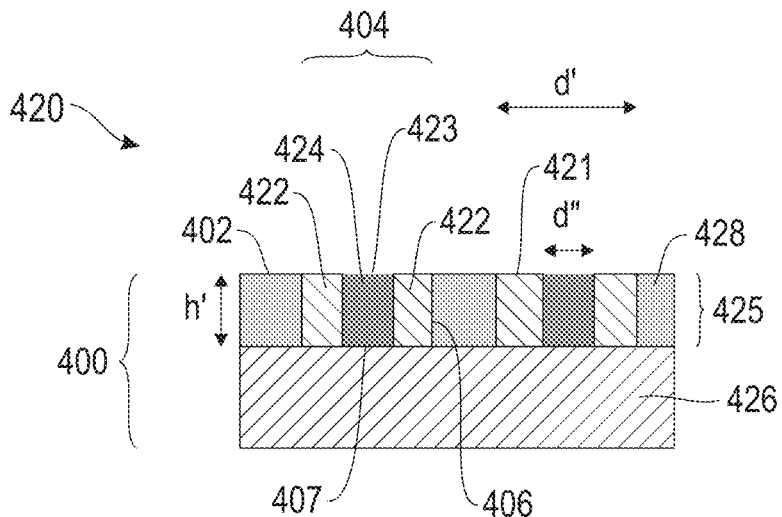
FIG. 82C
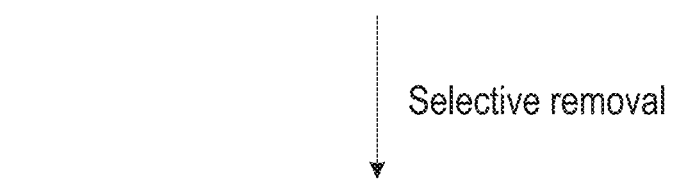
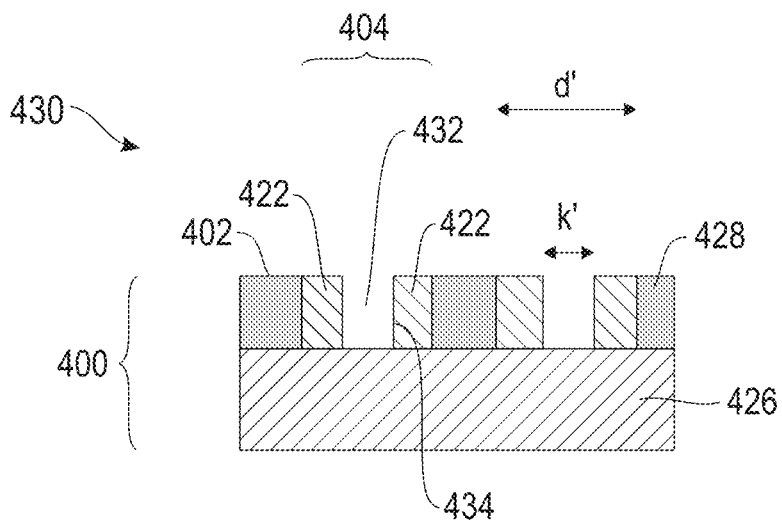
FIG. 82D

HIGH-CHI BLOCK COPOLYMERS FOR INTERCONNECT STRUCTURES BY DIRECTED SELF-ASSEMBLY

BACKGROUND

The present invention relates to high-chi block copolymers for forming interconnect structures by directed self-assembly, and more specifically to methods of forming contact holes and contact bars of small critical dimension (CD) and good uniformity.

A semiconductor device typically includes a network of circuits that are formed over a substrate. The device can consist of several layers of circuit wiring, with various interconnects being used to connect these layers to each other and any underlying transistors. Generally, the interconnects of the patterning layer can have the form of contact holes (vias) or contact bars. The contact holes and/or bars are transferred to an underlying layer and filled with a metal to form the interconnects that allow the various layers of circuitry to be in electrical communication with each other.

Methods of forming interconnects generally rely on a series of lithographic and etching steps to define the positions and dimensions of openings (e.g., holes, bars), which in turn define the positions and dimensions of the corresponding interconnects. To this end, photoresists and hard masks can be employed. However, the dimensions of features formed using conventional optical lithography techniques for volume manufacturing (e.g., 193 nm dry and immersion lithography) have reached the resolution limit of the lithographic tools. For example, the creation of vias with adequate CD uniformity at smaller pitch is one of the major challenges for future technology nodes. The International Technology Roadmap for Semiconductors (ITRS) requires an overall CD variation (i.e., 3 sigma ($3\sigma$) variation, where sigma is the standard deviation of the critical dimension) of less than 10% of the CD to ensure reasonable device performance. However, this is expected to be difficult for contact hole diameters less than 20 nm using conventional optical lithography, even with expensive and complicated double patterning processes, resolution enhancement technology (computational lithography), and severe layout design restrictions.

Block copolymers (BCPs) find many applications in solution, bulk and thin films. BCPs for directed self-assembly (DSA) applications comprise two or three polymer blocks that can phase-segregate into domains characterized by ordered nanoscopic arrays of spheres, cylinders, gyroids, and lamellae, which can have a feature size from about 5 nm to about 50 nm. When utilized with existing photolithographic techniques, thin-film self-assembly properties of BCPs potentially provide a unique approach to creating domain patterns having long range order and smaller dimensions than the patterning capabilities of conventional lithography.

One DSA technique is grapho-epitaxy, in which self-assembly of a BCP is guided by the topography and surface properties of the features of a lithographically pre-patterned substrate. In pre-patterns comprising holes and bars having sidewalls descending into a layer of a substrate, the sidewall surfaces can guide BCP self-assembly.

The ability of a BCP to phase-segregate depends on the Flory Huggins interaction parameter chi ($\chi$). Poly(styrene)-block-poly(methyl methacrylate), abbreviated as PS-b-PMMA, is the most widely used block copolymer for DSA. However, the minimum pitch of PS-b-PMMA is limited to about 20 nm because of lower interaction and interaction parameter ($\chi$) between the PS and PMMA blocks.

To achieve further feature miniaturization of interconnects, a block copolymer having a high interaction parameter between two blocks (higher chi) is desired, which self-assembles to form uniform cylindrical or lamellar domains of smaller dimension compared to the pre-pattern opening in which DSA takes place.

SUMMARY

Accordingly, a method is disclosed, comprising:

providing a substrate having a top surface comprising a topographic pre-pattern of discrete initial openings, the initial openings comprising respective sidewalls and bottom surfaces, the initial openings having a critical dimension $CD_{Init}$;

forming a film layer disposed within each of the initial openings, the film layer having a top surface in contact with an atmosphere, the film layer comprising a linear diblock copolymer (BCP) comprising a block A and a block B, wherein i) block A comprises a styrene repeat unit (A-2a):

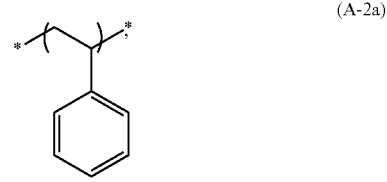

(A-2a)

ii) block B is an aliphatic polycarbonate or an aliphatic polyester, iii) block A and block B are covalently linked by respective end repeat units to a divalent linking group L', wherein L' is a single bond or a group comprising at least one carbon, iv) the BCP is capable of self-assembling to form a phase-segregated domain pattern comprising alternating domains of respective chemically distinct blocks of the block copolymer, and v) the sidewalls of the initial openings are preferentially wetted by block B;

allowing or inducing the BCP disposed in the initial openings to self-assemble, thereby forming the domain pattern within each of the initial openings, the domain pattern comprising: a) a central block B domain comprising block B which is centrally located within the initial openings and b) a peripheral block B domain comprising block B which is in contact with the sidewalls, wherein the central block B domain and the peripheral block B domain are separated by, and in contact with, a block A domain comprising block A, and wherein the domain pattern within the initial openings has a top surface in contact with the atmosphere; and selectively removing the central block B domain without substantially removing the block A domain and without substantially removing the peripheral block B domain, thereby forming an etched domain pattern comprising second openings, the second openings centrally located within the initial openings and having sidewalls comprising the block A domain, the second openings having a critical dimension $CD_{2nd}$ corresponding to $CD_{Init}$ and smaller than $CD_{Init}$;

wherein the method is suitable for forming openings for conductive interconnects that contact two or more layers of a multi-layered structure.

Further disclosed is another method, comprising:

providing a substrate having a top surface comprising a topographic pre-pattern of discrete initial openings, the initial openings comprising respective sidewalls and bottom surfaces, the initial openings having a critical dimension $CD_{Init}$;

forming a film layer disposed within each of the initial openings, the film layer having a top surface in contact with an atmosphere, the film layer comprising a linear diblock copolymer (BCP) comprising a block A, a block B, and a divalent linking group L', wherein i) block A comprises a styrene repeat unit (A-2a):

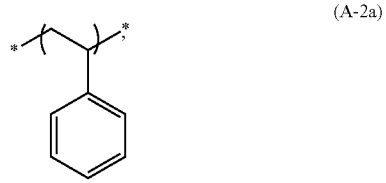

and ii) block B comprises a repeat unit selected from the group consisting of carbonate repeat unit (A-4):

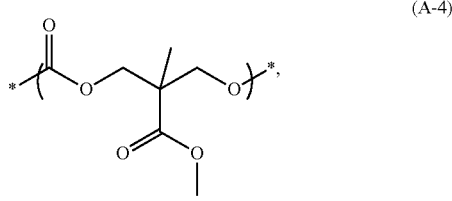

and
ester repeat unit (A-8):

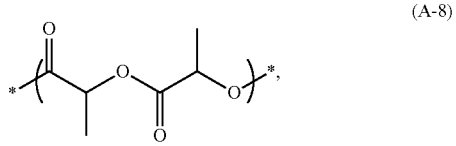

iii) L' comprises at least one carbon and 1-25 fluorines, iv) block A and block B are covalently linked by respective end repeat units to L', v) the BCP is capable of self-assembling to form a phase-segregated domain pattern comprising alternating domains of respective chemically distinct blocks of the block copolymer, and vi) the sidewalls of the initial openings are preferentially wetted by block B;

allowing or inducing the BCP disposed in the initial openings to self-assemble, thereby forming the domain pattern within each of the initial openings, the domain pattern comprising: a) a central block B domain comprising block B which is centrally located within the initial openings and b) a peripheral block B domain comprising block B which is in contact with the sidewalls, wherein the central block B domain and the peripheral block B domain are separated by, and in contact with, a block A domain comprising block A, and wherein the domain pattern within the initial openings has a top surface in contact with the atmosphere; and selectively removing the central block B domain without substantially removing the block A domain and without substantially removing the peripheral block B domain, thereby forming an etched domain pattern comprising second openings, the second openings centrally located within the initial openings and having sidewalls comprising the block A domain, the second openings having a critical dimension $CD_{2nd}$ corresponding to $CD_{Init}$ and smaller than $CD_{Init}$;

wherein the method is suitable for forming openings for conductive interconnects that contact two or more layers of a multi-layered structure.

Another method is disclosed, comprising:

providing a substrate having a top surface comprising a topographic pre-pattern of discrete initial openings, the initial openings comprising respective sidewalls and bottom surfaces, the initial openings having a critical dimension $CD_{Init}$;

forming a film layer disposed within each of the initial openings, the film layer having a top surface in contact with an atmosphere, the film layer comprising a linear diblock copolymer (BCP) comprising a block A, a block B, and a divalent linking group L', wherein i) block A comprises an styrene repeat unit (A-2a):

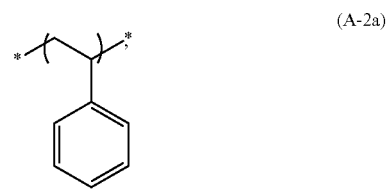

and ii) block B comprises a repeat unit selected from the group consisting of carbonate repeat unit (A-4):

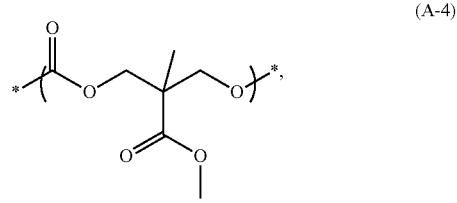

and
ester repeat unit (A-8):

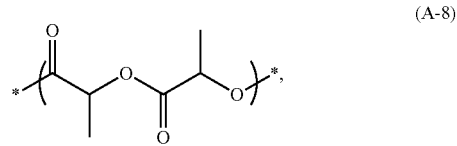

iii) L' comprises at least one carbon and 1-25 fluorines, iv) block A and block B are covalently linked by respective end repeat units to L', v) the BCP is capable of self-assembling to form a phase-segregated domain pattern comprising alternating domains of respective chemically distinct blocks of the block copolymer, and vi) the sidewalls of the initial openings are preferentially wetted by block A;

allowing or inducing the BCP disposed in the initial openings to self-assemble, thereby forming the domain pattern within each of the initial openings, the domain pattern comprising a central block B domain which is centrally located within the initial openings and a peripheral block A domain which is in contact with the sidewalls and the central block B domain, wherein the central block B domain and the peripheral block A domain have respective top surfaces in contact with the atmosphere; and selectively removing the central block B domain without substantially removing the peripheral block A domain, thereby forming an etched domain pattern comprising second openings, the second openings centrally located within the initial openings and having sidewalls comprising the block A domain, the second openings having a critical dimension $CD_{2nd}$ corresponding to $CD_{Init}$ and smaller than $CD_{Init}$;

wherein the method is suitable for forming openings for conductive interconnects that contact two or more layers of a multi-layered structure.

Yet another method is disclosed, comprising:

providing a substrate having a top surface comprising a topographic pre-pattern of discrete initial openings, the initial openings comprising respective sidewalls and bottom surfaces, the initial openings having a critical dimension $CD_{Init}$;

forming a film layer disposed within each of the initial openings, the film layer having a top surface in contact with an atmosphere, the film layer comprising a linear block copolymer (BCP) comprising a block A and a block B, wherein i) block A and block B are covalently linked by respective end repeat units to a divalent linking group L', wherein L' is a single bond or a group comprising at least one carbon, ii) the BCP is capable of self-assembling to form a phase-segregated domain pattern comprising alternating domains of respective chemically distinct blocks of the block copolymer, and iii) the sidewalls of the initial openings are preferentially wetted by block B;

allowing or inducing the BCP disposed in the initial openings to self-assemble, thereby forming the domain pattern within each of the initial openings, the domain pattern comprising: a) a central block B domain comprising block B which is centrally located within the initial openings and b) a peripheral block B domain comprising block B which is in contact with the sidewalls, wherein the central block B domain and the peripheral block B domain are separated by, and in contact with, a block A domain comprising block A, and wherein the domain pattern within the initial openings has a top surface in contact with the atmosphere; and selectively removing the central block B domain without substantially removing the block A domain and without substantially removing the peripheral block B domain, thereby forming an etched domain pattern comprising second openings, the second openings centrally located within the initial openings and having sidewalls comprising the block A domain, the second openings having a critical dimension $CD_{2nd}$ corresponding to $CD_{Init}$ and smaller than $CD_{Init}$;

wherein the method is suitable for forming openings for conductive interconnects that contact two or more layers of a multi-layered structure.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 4A-4E are scanning electron micrographs (SEMs) of the contact holes formed in Example 67 (PS-b-PMMA control), where the CD of the initial circular holes of the guiding pattern (GP) was varied from 46-54 nm. Hole shrink was observed. The DSA process window was 10 nm.

FIG. 5 is an SEM of the bar openings formed with Example 67, where the CD of the guiding pattern was 52 nm (i.e., the width or short axis of the bar). A multiplication pattern and no bar shrink was observed (which is undesirable).

FIGS. 6A-6C are SEMs of the contact holes formed in Example 68, where the CD of the initial circular holes of the guiding pattern was varied from 48-52 nm. Hole shrink was observed. The DSA process window was 6 nm.

FIGS. 7A-7C are SEMs of the bar openings formed with Example 68, where the CD of the guiding pattern is in the range of 42-46 nm. Bar shrink was observed. The DSA process window was 10 nm.

FIGS. 8A-8C are SEMs of the contact holes formed in Example 69, where the CD of the initial circular holes of the guiding pattern was varied from 46-50 nm. Hole shrink was observed. The DSA process window was 6 nm.

FIGS. 9A-9D are SEMs of the bar openings formed with Example 69, where the CD of the guiding pattern is in the range of 40-46 nm. Bar shrink was observed. The DSA process window was 8 nm.

FIGS. 10A-10F are SEMs of the contact holes formed in Example 70, where the CD of the initial circular holes of the guiding pattern was varied from 44-54 nm. Hole shrink was observed. The DSA process window was 12 nm.

FIG. 11 is an SEM of the bar openings formed with Example 70, where the CD of the guiding pattern was 48 nm. No bar shrink was observed (which is undesirable).

FIG. 15 is an SEM of the bar openings formed with Example 72, where the CD of the guiding pattern was 46 nm. No bar shrink was observed.

FIGS. 16A-16G are SEMs of the contact holes formed in Example 73, where the CD of the initial circular holes of the guiding pattern was varied from 36-48 nm. Hole shrink was observed. The DSA process window was 14 nm.

FIG. 17 is an SEM of the bar openings formed with Example 73, where the CD of the guiding pattern was 38 nm. No bar shrink was observed.

FIGS. 18A-18D are SEMs of the contact holes formed in Example 74, where the CD of the initial circular holes of the guiding pattern was varied from 42-48 nm. Hole shrink was observed. The DSA process window was 8 nm.

FIG. 19 is an SEM of the bar openings formed with Example 74, where the CD of the guiding pattern was 46 nm. No bar shrink was observed.

FIGS. 22A-22F are SEMs of the contact holes formed in Example 76, where the CD of the initial circular holes of the guiding pattern was varied from 36-46 nm. Hole shrink was observed. The DSA process window was 12 nm.

FIG. 23 is an SEM of the bar openings formed with Example 76, where the CD of the guiding pattern was 40 nm. No bar shrink was observed.

FIG. 24 is an SEM of the contact hole formed in Example 77, where the critical dimension (CD) of the initial circular holes of the guiding pattern is 36 nm (diameter). No hole shrink was observed (which is undesirable).

FIGS. 25A-25D are SEMs of the bar openings formed with Example 77, where the CD of the guiding pattern is in the range of 24-30 nm. Bar shrink was observed. The DSA process window was 8 nm.

FIGS. 26A-26E are SEMs of the contact holes formed in Example 78, where the CD of the initial circular holes was varied from 42-50 nm. Hole shrink was observed. The DSA process window was 10 nm.

FIGS. 28A-28I are SEMs of the contact holes formed in Example 79, where the CD of the initial circular holes was varied from 26-42 nm. Hole shrink was observed. The DSA process window was 18 nm.

FIGS. 29A-29C are SEMs of the bar openings formed with Example 79, where the CD of the guiding pattern is in the range of 26-30 nm. Bar shrink was observed. The DSA process window was 6 nm.

FIG. 33 is an SEM of the bar openings formed with Example 81, where the CD of the guiding pattern was 40 nm. No shrink was observed.

FIGS. 34A-34G are SEMs of the hole openings formed with Example 82, where the CD of the guiding pattern is in the range of 28-40 nm. Hole shrink was observed. The DSA process window was 14 nm.

FIG. 35 is an SEM of the bar openings formed with Example 82, where the CD of the guiding pattern was 34 nm. No bar shrink was observed.

FIGS. 38A-38G are SEMs of the hole openings formed with Example 84, where the CD of the guiding pattern is in the range of 28-44 nm. Hole shrink was observed. The DSA process window was 14 nm.

FIG. 39 is an SEM of the bar openings formed with Example 84, where the CD of the guiding pattern was 34 nm. No bar shrink was observed.

FIGS. 40A-40G are SEMs of the hole openings formed with Example 85, where the CD of the guiding pattern is in the range of 40-52 nm. Hole shrink was observed. The DSA process window was 14 nm.

FIGS. 41A-41E are SEMs of the bar openings formed with Example 85, where the CD of the guiding pattern is in the range of 36-44 nm. Bar shrink was observed. The DSA process window was 10 nm.

FIGS. 42A-42I are SEMs of the hole openings formed with Example 86, where the CD of the guiding pattern is in the range of 26-42 nm. Hole shrink was observed. The DSA process window was 18 nm.

FIGS. 44A-44G are SEMs of the hole openings formed with Example 87, where the CD of the guiding pattern is in the range of 42-54 nm. Hole shrink was observed. The DSA process window was 14 nm.

FIG. 49 is an SEM of the bar openings formed with Example 89, where the CD of the guiding pattern was 40 nm. There was no DSA process window with more than 80% open holes.

FIGS. 50A-50G are SEMs of the hole openings formed with Example 91, where the CD of the guiding pattern is in the range of 36-48 nm. Hole shrink was observed. The DSA process window was 14 nm.

FIGS. 51A-51E are SEMs of the bar openings formed with Example 91, where the CD of the guiding pattern is in the range of 32-40 nm. Bar shrink was observed. The DSA process window was 10 nm.

FIGS. 52A-52E are SEMs of the hole openings formed with Example 92, where the CD of the guiding pattern is in the range of 46-54 nm. Hole shrink was observed. The DSA process window was 10 nm.

FIGS. 54A-54F are SEMs of the hole openings formed with Example 93, where the CD of the guiding pattern is in the range of 38-48 nm. Hole shrink was observed. The DSA process window was 12 nm.

FIG. 55 is an SEM of the bar openings formed with Example 93, where the CD of the guiding pattern was 42 nm. No bar shrink was observed.

FIGS. 59A-59F are SEMs of the bar openings formed with Example 95, where the CD of the guiding pattern is in the range of 42-52 nm. Bar shrink was observed. The DSA process window was 12 nm.

FIGS. 62A-62E are SEMs of the hole openings formed with Example 97, where the CD of the guiding pattern is in the range of 38-46 nm. Hole shrink was observed. The DSA process window was 10 nm.

FIG. 63 is an SEM of the bar openings formed with Example 97, where the CD of the guiding pattern was 42 nm. There was no DSA process window with more than 80% open holes.

FIGS. 70A-70F are SEMs of the hole openings formed with Example 101, where the CD of the guiding pattern is in the range of 28-38 nm. Hole shrink was observed. The DSA process window was 12 nm.

FIG. 71 is an SEM of the bar openings formed with Example 101, where the CD of the guiding pattern was 32 nm. No bar shrink was observed.

FIGS. 72A-72F are SEMs of the hole openings formed with Example 102, where the CD of the guiding pattern is in the range of 36-46 nm. Hole shrink was observed. The DSA process window was 12 nm.

FIG. 73 is an SEM of the bar openings formed with Example 102, where the CD of the guiding pattern was 42 nm. No bar shrink was observed.

FIGS. 82A-82G are schematic diagrams showing a process of preparing transfer openings of reduced size using directed self-assembly of a BCP within initial openings of a topographically pre-patterned substrate, where the initial openings of the topographic pre-pattern are circular shaped and the sidewalls are preferentially wetted by the more etch resistant styrene-containing block A domain.

DETAILED DESCRIPTION

Figure 1A:
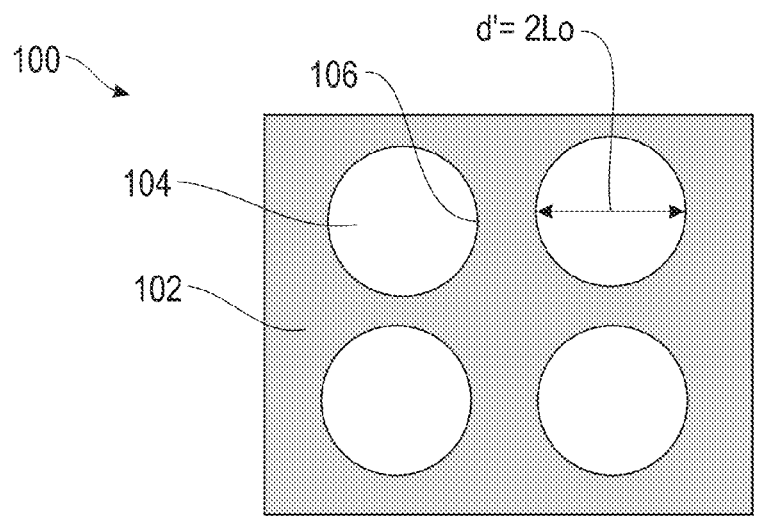
FIGS. 1A-1G are schematic diagrams showing a process of preparing transfer openings of reduced size using directed self-assembly of a BCP within initial openings of a topographically pre-patterned substrate, where the initial openings of the topographic pre-pattern are circular shaped and the sidewalls are preferentially wetted by the more easily etched block B (i.e., polycarbonate or polyestercarbonate block).

Disclosed are high-chi block copolymers (BCPs) for forming interconnect openings (e.g., contact holes and bars, also referred to as vias) by directed self-assembly (DSA) Also disclosed are methods for forming interconnect openings that utilize a topographic pre-pattern whose recessed areas serve as precursors for forming interconnect openings of smaller critical dimension. The recessed areas of the pre-pattern are also referred to herein as "initial openings". Further disclosed is a method of selectively removing a first domain region of the self-assembled block copolymer while leaving behind a second domain region, wherein the first and second domain regions contain the same block component of the self-assembled block copolymer).

The BCPs are linear polymers, meaning a given BCP has one polymer branch rather than intersecting polymer branches, and the one polymer branch has two peripheral dangling ends (i.e., the polymer backbone is not a macrocycle). The block copolymer comprises two chemically distinct polymer blocks, designated block A and block B, which are immiscible with one another. Each polymer block is a polymer chain segment containing a plurality of covalently linked repeat units. Respective end repeat units of block A and block B are covalently linked by way of a divalent linking group L'. L' is also referred to herein as a "junction group". Block A is a polymer chain comprising a styrenic repeat unit, meaning a polymer repeat unit formed by polymerization of a substituted or unsubstituted styrene monomer (e.g., styrene, 4-methyl styrene, 4-fluoro-styrene, 4-trimethylsilyl styrene, and the like). In a preferred embodiment, block A is a homopolymer of styrene. Preferably, block B is a polymer chain comprising an aliphatic carbonate and/or aliphatic ester repeat unit. In an embodiment block B is a homopolycarbonate or a homopolyester. L' can be a single bond or a group comprising at least one carbon. In an embodiment, L' comprises 1-25 fluorines. In another embodiment, L' comprises 6-25 fluorines. BCPs having fluorinated junction groups provide contact holes and bars by DSA that can have improved critical dimension uniformity (CDU) and wider process windows compared to an otherwise identical BCP in which the fluorines are replaced with hydrogen. When present, the fluorines of L' can be pendent to the polymer backbone and/or linked to respective carbons of the polymer backbone. Preferably, L' is a non-charged group that provides orientation control of phase-segregated domains formed during self-assembly of the block copolymer. Preferably, L' has a lower surface energy than each block of the block copolymer. In an embodiment, L' has a surface energy between 0 and 30 mN/m.

The block copolymer has a polymer backbone that consists of the covalently linked atomic centers representing the shortest path (i.e., smallest number) of covalent bonds joining a first repeat unit at a first end of the block copolymer to a last repeat unit at an opposing end of the block copolymer. The polymer backbone includes atomic centers of the linking group L' joining blocks A and B. The block copolymer backbone can include carbon atomic centers (backbone carbons), oxygen atomic centers (backbone oxygens), nitrogen atomic centers (backbone nitrogens), silicon atomic centers (backbone silicons), and so on.

As an example, the block copolymer HBP-1 exemplifies a non-fluorinated junction group L'.

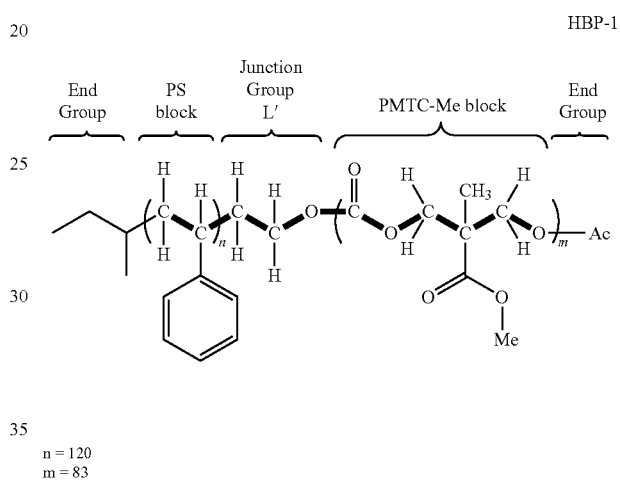

HBP-1 n = 120
m = 83

HBP-1 is a high-chi polymer that shows improved performance in generating hole and bar patterns by DSA compared to the industry standard PS-b-PMMA (see Table 9 further below). HBP-1 has a poly(styrene) block (PS block) and a polycarbonate block (PMTC-Me block). The PMTC-Me block can be obtained by a ring opening polymerization of cyclic carbonate monomer MTC-Me (described further below). These PS and PMTC-Me blocks are linked by an ethylene oxide linking group (junction group L'). The polymer backbone carbons and backbone oxygens of HBP-1 are shown in bold font linked by bold bonds. The carbons and oxygen of the junction group of HBP-1 are atomic centers of the block copolymer backbone. The hydrogens of the linking group are not backbone atomic centers.

When present, the flourines of L' can be linked to one or more carbons of the polymer backbone, one or more carbons of a side chain group pendent to the polymer backbone, or combinations thereof.

As an example, fluorinated diblock polymer FBP-3 shown below is a high-chi block copolymer that also shows improved performance in generating hole and bar patterns by DSA compared to the industry standard PS-b-PMMA (Table 10 further below).

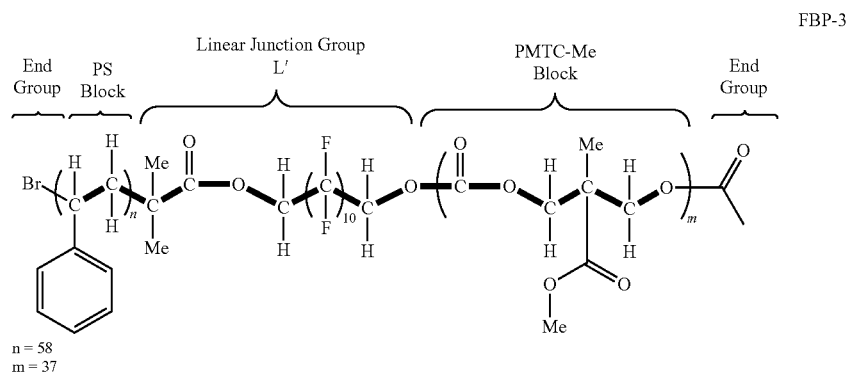

FBP-3

FBP-3 exemplifies what is referred to herein as a "linear junction group", meaning each fluorine of the junction group is bonded to a carbon of the block copolymer backbone. The carbons and oxygens of the polymer backbone of FBP-3 are shown in bold font linked by bold bonds. The fluorine groups of the linear junction group are linked to carbons of the polymer backbone. The fluorines, hydrogens, oxygen of the carbonyl group, and methyl carbons of the junction group are not backbone atomic centers of FBP-3.

As another example, fluorinated diblock polymer FBP-14 is a high-chi block copolymer that also shows improved performance in generating hole and bar patterns by DSA compared to the industry standard PS-b-PMMA (Table 11 further below).

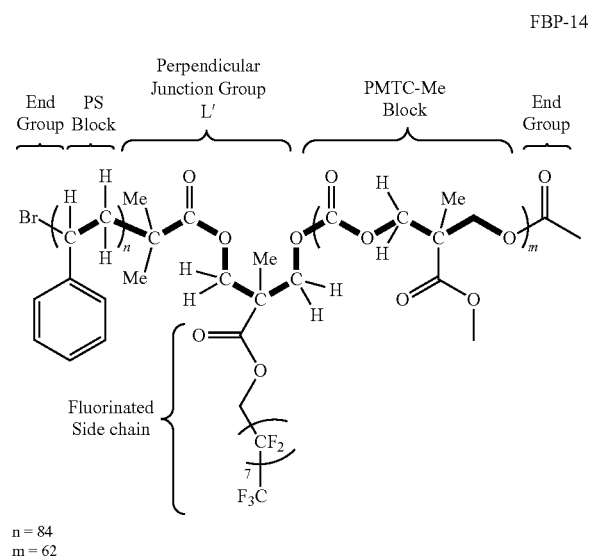

FBP-14

FBP-14 exemplifies a "perpendicular junction group", meaning that each fluorine of the junction group is bound to a carbon of a side chain pendent to the block copolymer backbone. In this instance, none of the fluorines of the junction group is linked to an atomic center of the polymer backbone. The backbone carbons and oxygens of FBP-14 are shown in bold font linked with bold bonds. The fluorine groups of the junction group are linked to a pendent ester side chain. The hydrogens, oxygens of the carbonyl groups, methyl carbons, and the atomic centers of the fluorinated ester side chain are not atomic centers of the FBP-13 polymer backbone.

The bulk periodicity Lo of a given self-assembled BCP increases with molecular weight of the BCP due to the increase in volume of each block as the molecular weight increases. Thus, a lower molecular weight BCP potentially allows for smaller features to be formed by self-assembly of the BCP. However, the useful molecular weight range of a BCP for self-assembly is limited by the chi parameter of the BCP blocks. As the molecular weight of the blocks decreases, a higher chi parameter is needed for a given BCP to self-assemble cleanly (i.e., with sharp phase boundaries and minimal defects and distortions of the self-assembled features). Thus, the chi parameter limits the Lo of a given composition of BCP, and also limits the smallest critical dimension obtainable by a given composition of BCP.

Herein, a "high-chi" (high-$\chi$) BCP is one in which adjacent blocks have a Flory-Huggins interaction parameter chi greater than the chi parameter of a poly(styrene)-b-poly (methyl methacrylate) diblock copolymer (PS-b-PMMA) that self-assembles to form the same domain morphology (i.e., lamellae, cylinders, and so on).

Other factors such as BCP polydispersity and purity can also influence the useful range of critical dimensions of a given composition of BCP. As a result, the BCPs of the examples further below are purified using Method 1 described further below.

Herein, "non-fluorinated" means the chemical formula of a referenced material contains no fluorine. The referenced material can be a polymer, a sub-structure of a polymer such as a repeat unit, functional group, linking group, and so on. A material is "fluorinated" if the chemical formula of the referenced material contains one or more fluorine groups. A material described as containing one or more "fluorines", "fluorine groups", or "fluoride groups" herein means the material has a chemical structure in which one or more monovalent fluorine atoms are covalently bound to carbon(s) of the chemical structure.

Self-Assembly

The term "interface" refers to a contact boundary between two substantially immiscible phases. Each phase can, independently, be a solid, a liquid, or a gas.

The term "disposed" refers to a layer in contact with a surface of another layer. "Disposing" and "applying" refer to forming a layer so that it is in contact with a surface of another layer, without limitation as to the method employed unless otherwise stated, with the proviso that the desirable characteristics of the disposed or applied layer are obtained, such as uniformity and thickness.

The term "casting" refers to forming a layer of a material by disposing on a surface a solution of the material dissolved in a solvent, and removing the solvent.

An "SA material" is a material capable of self-assembling into compositionally different phase-segregated domains. Self-assembly (SA) refers to a process in which the SA material undergoes phase-segregation to produce a pattern of immiscible solid phase domains under suitable conditions. Herein, the SA material is a BCP.

An "SA layer" is a layer comprising an SA material. In this invention, the SA layer is disposed in the initial openings of a topographical pre-pattern that serve as precursors to contact holes and bars used to form conductive interconnects. The SA layer can comprise one or more of the disclosed BCPs for self-assembly. The SA layer can further comprise additives (e.g., surfactants, auxiliary polymers, thermal acid generators, photo-acid generators) with the proviso that the additives do not adversely affect phase-segregation and orientation of the BCP domains. It should be understood that an SA layer containing only a disclosed BCP is capable of forming a self-assembled domain pattern suitable for formation of conductive interconnects having smaller critical dimension than the critical dimension of the initial opening of the pre-pattern.

The SA layer has contact with the sidewalls and bottom surfaces of the initial openings of the pre-pattern. The sidewalls of the pre-pattern are preferentially wetted by one domain of the self-assembled BCP. The bottom surface of the initial openings of the pre-pattern can be preferential or non-preferential to the domains of the self-assembled BCP.

The substrate is the layered structure on which the SA layer is disposed. The substrate has a main plane, which is parallel to the bottom-most layer of the substrate (e.g., a silicon wafer). The substrate can comprise one or more layers of materials arranged in a stack, more specifically materials used in the fabrication of semiconductor devices. As non-limiting examples, the substrate can include a bottom layer (e.g., silicon wafer, metal foil), hard mask layer, dielectric layer, metal oxide layer, silicon oxide layer, silicon nitride, titanium nitride, hafnium oxide, anti-reflection layer (ARC), and/or a surface-modified layer for self-assembly. When a resist is used to form a topographical pre-pattern, the substrate includes the patterned resist layer.

The top surface of the substrate comprises a "grapho-epitaxial pre-pattern" (i.e., a topographical patterned layer) suitable for forming interconnect features. A grapho-epitaxial pre-pattern can influence self-assembly by the sidewall height, spacing, shape, and surface properties of the pre-pattern features. For example, the pre-pattern sidewall surfaces can comprise a resist material, a hardmask material, and/or a brush polymer used to modify the surface properties of a sidewall material. In general, when grapho-epitaxial pre-patterns are used, the thickness of the SA layer is less than or equal to the height of the topographical features of the pre-pattern (i.e., the SA layer is substantially or fully confined to the recessed areas of the topographic pre-pattern). Optionally, the SA layer can be disposed on the top surfaces (i.e., mesas) of the pre-pattern features. For example, the pre-pattern can be overcoated with an SA layer having a thickness greater than pre-pattern sidewall height, and the resulting SA layer can then be "etched back", thereby forming a more uniform and planarized SA layer before and/or after self-assembly.

Herein, an "atmosphere" is a gas, which can include air and/or one or more other gases at any suitable pressure in contact with the top surface of the SA layer. Preferably, the atmosphere is air. Air is composed of about 21% oxygen ($O_2$) and about 78% nitrogen ($N_2$) by volume. Preferably, the SA layer has a top surface in contact with an atmosphere (e.g., air).

Herein, a surface and/or an atmosphere interface is said to be "non-preferential to", or "non-preferentially wetted by", the domains of a material for self-assembly (SA material) if each domain of the self-assembled SA material has contact with the surface and/or the atmosphere interface after self-assembly. Otherwise, the surface and/or atmosphere interface is said to be "preferential to", or "preferentially wetted by", one of the domains of the self-assembled SA material.

It should be understood that a given surface can be non-preferential to the domains of a disclosed block copolymer comprising a fluorinated L' group, but be preferential to a domain of an otherwise identical self-assembled block copolymer in which all fluorines of L' are replaced by hydrogen. That is, the fluorinated L' group potentially allows both block A and block B to wet the bottom surface of the initial openings and the atmosphere interface that would otherwise be wetted only by block A or only by block B if the fluorines of L' were replaced by hydrogens. Regardless of this property, the sidewalls of the pre-pattern are wetted by the domain of block A or block B, but not both. The atmosphere interface is generally preferential to one domain of a BCP lacking a suitable L' group.

The specific structural units formed by self-assembly of the block copolymer are determined by the volume ratio of the first block to the second block. The volume of a given block means the volume occupied by the block, which depends on molecular mass of the block. In general, when the volume ratio of the first block to the second block is in the range of about 20:80 to about 10:90, the block copolymer can form an ordered array of spheres of the first block in a matrix composed of the second block. In general, when the volume ratio of the first block to the second block is in the range of about 20:80 to about 40:60, the block copolymer can form an ordered array of cylinders composed of the first block in a matrix composed of the second block. In general, when the volume ratio of the first block to the second block is about 40:60 to about 60:40, the block copolymer can form alternating lamellae (i.e., an array of lamellae composed of the first block alternating with lamellae composed of the second block). As an example, a poly(styrene)-b-poly(methyl methacrylate) block copolymer (PS-b-PMMA) comprising 20% or less by volume of the polystyrene (PS) block can self-assemble to form PS spheres in a poly(methyl methacrylate) (PMMA) matrix. As another example, a PS-b-PMMA block copolymer comprising about 20% to about 40% PS by volume can self-assemble to form PS cylinders in a PMMA matrix. The volume ratio between the first block and the second block can be adjusted by controlling the average molecular weight of each block.

The block copolymer preferably is capable of forming a lamellar domain pattern by self-assembly. The lamellar domain pattern can have a bulk periodicity (i.e., characteristic pitch Lo of the block copolymer) of 4 nm or more, preferably in the range of 4 nm to 100 nm. The lamellar domain pattern can have a half-pitch of 2 nm or more, preferably in the range of 2 nm to 50 nm. The half-pitch can correspond to a critical dimension of one domain of the self-assembled BCP. More particularly, the lamellar domain pattern can have a half-pitch in the range of 2 nm to 25 nm, 2 nm to 20 nm, 2 nm to 15 nm, 2 nm to 10 nm, or 2 nm to 9 nm.

A lamellar or cylindrical domain can be oriented parallel or perpendicular to a plane of a referenced surface or layer (e.g., the main plane of the SA layer, bottom layer of the substrate, bottom surface of recessed features, sidewall surfaces). A lamellar domain has a parallel orientation when the main plane or plate of the lamella is oriented parallel to the main plane of the referenced surface. A lamellar domain has a perpendicular orientation when the main plane or plate of the lamella is oriented perpendicular to the main plane of the referenced surface. A cylindrical domain has a parallel orientation when the cylinder axis is oriented parallel to the main plane of the referenced surface. A cylindrical domain has a perpendicular orientation when the cylinder axis is oriented perpendicular to the main plane of the referenced layer.

Due of the spatial confinement of the circular initial openings, both cylinder-forming and lamellae-forming BCPs can form cylinders in a circular initial opening. However, simulations indicate that lamellae-forming BCPs are preferred as they are less likely to form a residual layer of the more etch resistant domain (e.g., PS domain) underneath the cylinder of the more etchable domain (e.g., polycarbonate, polyester domain) located at the center of the initial opening. That is, the cylinders of the more etchable central block B domain of lamellae-forming BCPs can extend all the way to the bottom of the initial opening, whereas cylinder-forming BCPs tend form a layer of etch-resistant block A domain underneath the cylinder-shaped central block B domain, which causes subsequent etch problems. Lamellae-forming BCPs are also preferred for forming contact bars of smaller CD because cylinder-forming BCPs tend to form "multiplication" patterns (i.e., several cylinders within one initial opening), which are undesirable for forming contact bars of smaller CD.

For purposes of making contact holes of smaller CD, the volume ratio of the block A to block B can be about 15:85 to about 85:15, more preferably 40:60 to 60:40, and most preferably 45:55 to 55:45, based on the average total volume of the block copolymer macromolecule. The domain pattern formed by DSA of the BCP within the initial openings comprises a block A domain surrounding a central block B domain. The central block B domain can have a lamellar or cylindrical morphology depending on the shape of the initial opening. Circular initial openings (holes) produce a central block B domain that is cylinder-shaped due to the confinement space, whereas bar-shaped openings produce a central block B domain that has a lamellar structure, which is bar-shaped. L' can be immiscible with each domain (i.e., L' can reside at the interface of the domains after self-assembly) or mix with the polycarbonate/polyester domain.

Self-assembly of the SA layer can be spontaneous upon formation of an SA layer, or can be induced/assisted by an annealing process. Non-limiting annealing processes include thermal treatments (i.e., heating the SA layer at an elevated temperature for a suitable period of time), solvent vapor treatments of the SA layer, and combinations thereof. In an embodiment, self-assembly is induced by a thermal treatment of the SA layer.

Herein, the block A domain is the more etch-resistant domain. The block B domain can be selectively removed in the presence of the block A domain. The centrally located domain of the self-assembled block copolymer can be selectively removed relative to the other domain(s) using known dry and/or wet etching techniques. This allows formation of second openings within the remaining domain pattern. The second openings can have any shape suitable for an interconnect feature.

The reduction in critical dimension of the second openings relative to the critical dimension of the initial opening is referred to as "hole shrink" or "bar shrink" depending on the shape of the initial opening. Hole shrink and bar shrink of 10% or more is desired.

It should be understood that the BCP can stretch or compress depending on the pre-pattern opening (e.g., diameter). The CD of the DSA-generated openings usually follows the pre-pattern CD by a factor of 0.5 within the process window. At some point, the pre-pattern CD can get either too large or too small, forcing the BCP to form another morphology as the BCP cannot stretch or compress to accommodate the pre-pattern opening.

Interconnect Openings

The initial openings have a geometric shape suitable for formation of conductive interconnect features (e.g., contact holes and contact bars) between layers of a semiconductor device, wherein a targeted critical dimension of the interconnect features is smaller than a corresponding critical dimension of the initial openings. No restriction is placed on the particular shape of the initial openings. Exemplary, non-limiting geometric shapes include circular shapes, oval shapes, bar shapes, irregular shaped openings, and so on. The geometric shapes can be present singularly or in combination, in any suitable number, and in any suitable arrangement including regular arrays and/or arbitrary arrangements. The topographic pre-pattern can be created using well-established lithographic methods such as, for example, patterning methods utilizing positive and/or negative tone resists. The initial openings comprise vertical or substantially vertical sidewalls that can include materials of one or more layers of the substrate. The initial openings also have a bottom surface that comprises a material of a substrate layer (e.g., silicon wafer, underlayer material, hardmask layer, planarization layer). The sidewall and bottom surfaces of the initial openings can comprise a suitable polymer brush material. The initial openings can have one or more preselected critical dimensions (CDs) (e.g., a diameter if the opening is circular, a long axis and a short axis if the initial opening is oval or bar-shaped).

The BCP is applied to the pre-pattern top surface, thereby forming a BCP film layer for self-assembly. The BCP film layer can be substantially or fully confined to the initial openings (e.g., the recessed areas of the pre-pattern). Alternatively, the BCP film layer can be disposed on the top surfaces of the pre-pattern and have a thickness greater than the sidewall height of the pre-pattern. This allows the BCP film layer to be etched back, thereby forming a more uniform and planarized BCP film layer having a thickness approximating the sidewall height.

The BCP film layer can spontaneously self-assemble or be induced to self-assemble (e.g., thermal treatment, solvent vapor treatment), thereby forming a pattern of phase-segregated domains of the block copolymer within the initial openings.

The sidewalls of the pre-patterns used to form interconnects are preferentially wetted by one of the domains of the self-assembled BCP. The domains adjacent to the sidewalls has a lamellar form whose main plane is oriented parallel to and follows the curvature of the sidewall surface (i.e., the lamella is a curved sheet). A domain containing the more easily etched block B (the polycarbonate or polyester block) is centrally located in the initial openings (central block B domain). The central block B domain is surrounded by a domain comprising the less etchable block A (block A domain).

The domain adjacent to the sidewalls is referred to as the peripheral domain. In the examples further below, the domain that preferentially wets the sidewall contains block B. This domain is designated the peripheral block B domain, in order to differentiate it from the central block B domain. The block A domain is located between, and in contact with, the central block B domain and the peripheral block B domain. Alternatively, the sidewalls can be preferentially wetted by the block A domain, in which case the block A domain is called the peripheral block A domain. The peripheral block A domain is in contact with the sidewalls and the central block B domain. This is illustrated in more detail in the schematic diagrams described further below.

Selective removal of the central block B domain can occur without substantially removing the peripheral block B domain and the block A domain. This results in a pattern of second openings having the same size and shape or substantially the same size and shape as the central block B domain. The second openings comprise sidewalls composed of the more etch-resistant domain (e.g., block A) and a bottom surface that can be a substrate material. The second openings have a critical dimension $CD_{2nd}$ (e.g., diameter) that is smaller than the corresponding $CD_{Init}$ of the initial openings (e.g., if the initial opening is circular, the second openings can be a circle having a smaller diameter). The percentage variation in the CD of the second openings can be the same or less than the percentage variation of the CD of the initial openings.

The second openings can be transferred into one or more underlying substrate layers using known etching techniques. The pre-pattern and residual BCP domains can be removed subsequently or concomitantly, thereby forming a layered structure comprising a pattern of transfer openings having a critical dimension (e.g., diameter, width) corresponding to $CD_{Init}$ but smaller than $CD_{Init}$. The transfer opening can then be backfilled with material such as a metallic conductor, forming a conductive interconnect that is in contact with two or more layers of the substrate.

Figure 82A:
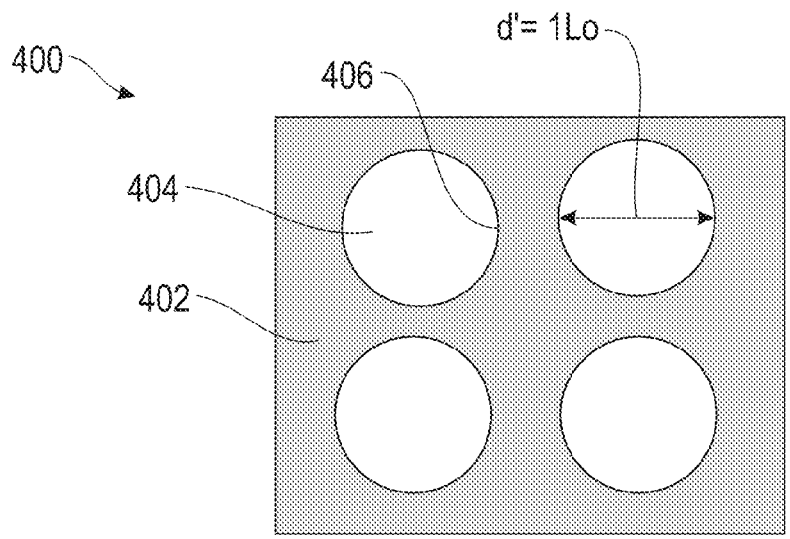
Figure 82B:
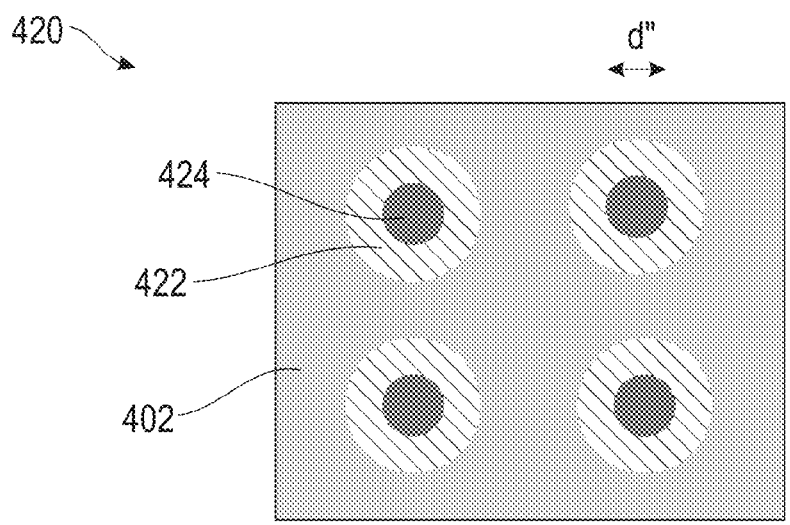
Figure 83:
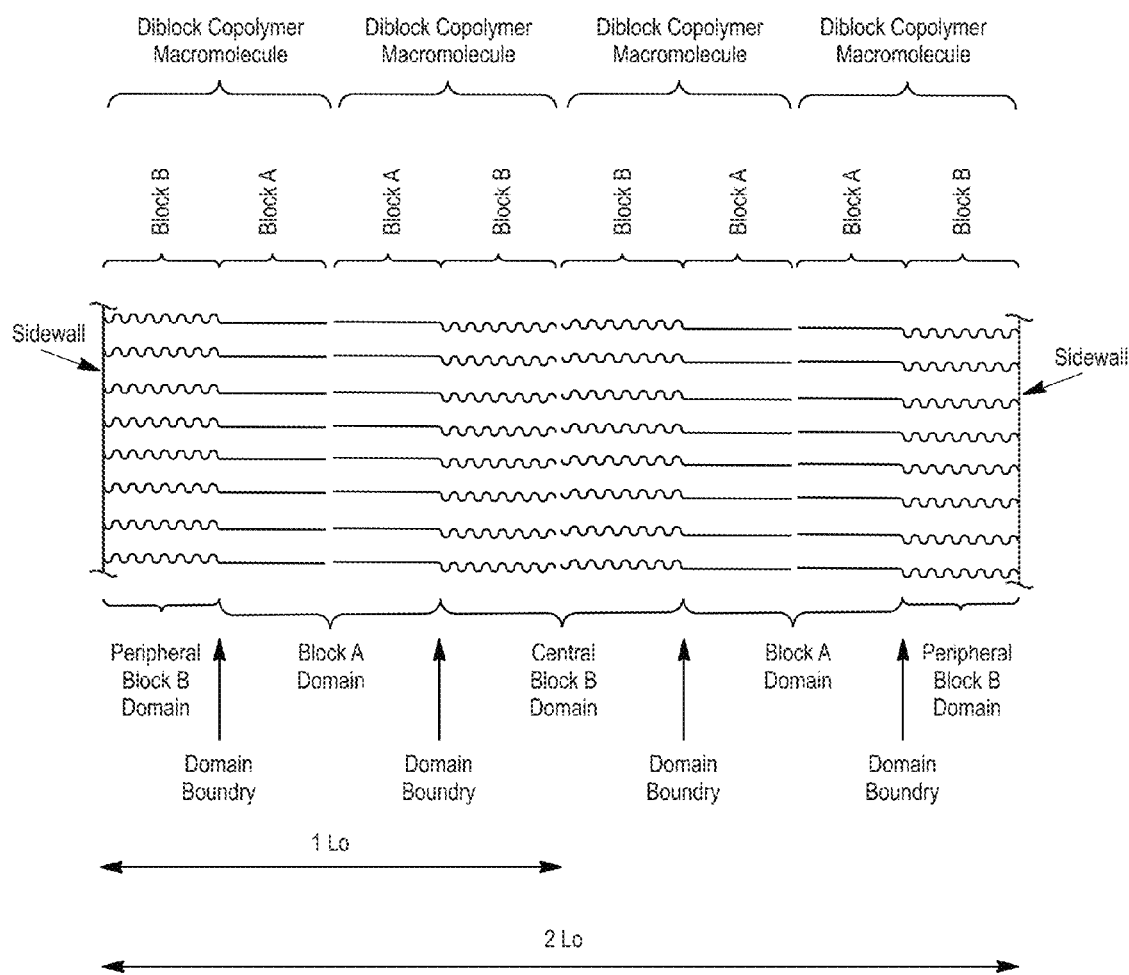
FIG. 83 is a schematic diagram showing the arrangement of blocks of a lamellae-forming self-assembled BCP within a portion of an initial opening of a topographically pre-patterned substrate, where the sidewalls of the initial openings are preferentially wetted by the more easily etched block B domain.
Figure 84:
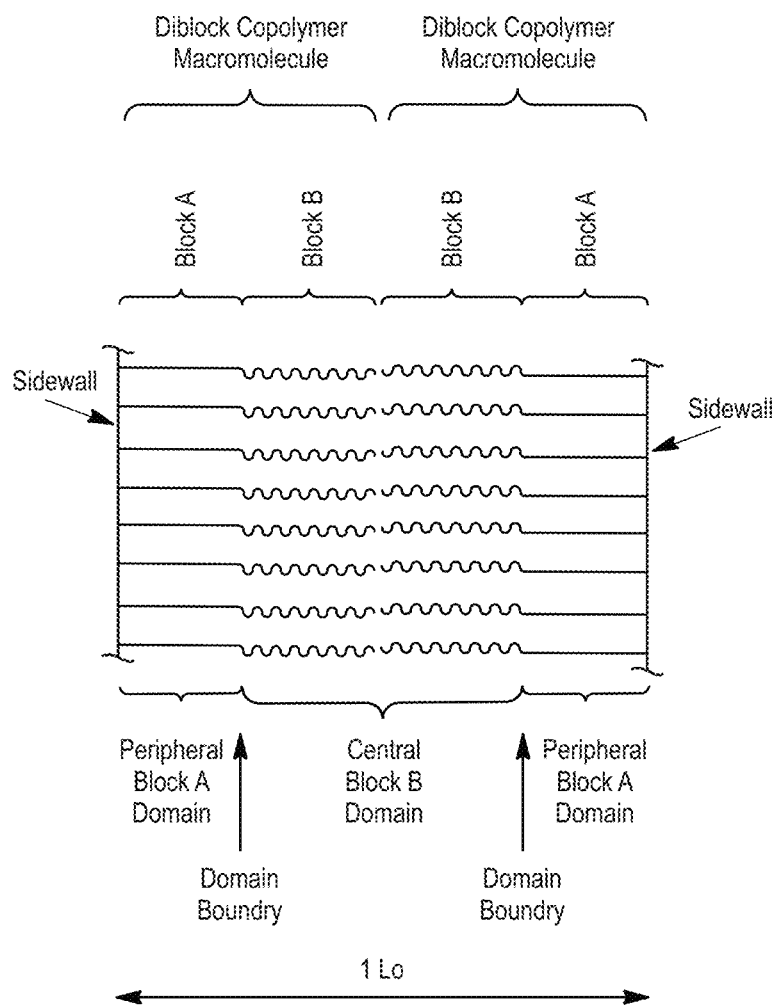
FIG. 84 is a schematic diagram showing the arrangement of blocks of a lamellae-forming self-assembled BCP within a portion of an initial opening of a topographically pre-patterned substrate, where the sidewalls of the initial openings are preferentially wetted by the more etch resistant styrene-containing block A domain.

The invention is illustrated in more detail by the following schematic layer diagrams of FIGS. 1A-1G, FIGS. 2A-2G, FIGS. 3A-3G, FIGS. 82A-82G, FIG. 83, and FIG. 84. It should be understood that the diagrams are not drawn to scale and are for illustration purposes. The initial openings of the topographic pre-patterns of FIGS. 1A-1G, FIGS. 2A-2G, and FIGS. 3A-3G have sidewall surfaces that are preferentially wetted by the block B domain (the polycarbonate or polyester block). In this instance, the critical dimension of the initial openings (diameter for circular openings, short axis for oval or bar-shaped openings), referred to as $CD_{init}$, can be about 2Lo (2 times Lo), where Lo is the bulk periodicity of the domain pattern formed by the BCP. FIG. 83 provides a diagram showing the arrangement of domains and polymer blocks for sidewalls wetted by the block B domain. FIGS. 82A-82G illustrate a process using a pre-pattern whose sidewall surfaces are preferentially wetted by the more etch-resistant block A domain (styrene-containing block). This can occur, for example, when a resist pre-pattern is surface-modified using a poly (styrene) brush polymer. In this instance, $CD_{init}$ can be about 1Lo (1 times Lo). FIG. 84 provides a diagram showing the arrangement of domains and polymer blocks for sidewalls wetted by the block A domain.

The first example illustrates a substrate having a pre-pattern comprising a circular initial openings. FIG. 1A shows a plan view of a substrate 100 having a top surface 102 and circular initial openings 104 therein. The term substrate can be any physical structure suitable for use with any of the methods described herein, including but not necessarily limited to substrates used in the semiconductor industry. For the sake of clarity, only four initial openings 104 are shown in FIG. 1A, although in practice, many more initial openings would typically be used (e.g., hundreds, thousands, or even more). The initial openings 104 have sidewalls 106 that are vertical or substantially vertical relative to a main plane of the substrate (i.e., perpendicular to the top surface 102 of the substrate). Initial openings also have a bottom surface 107 (shown in FIG. 1C). Sidewalls 106 are non-neutral wetting to the domains of the self-assembled BCP (i.e., sidewalls 106 are preferentially wetted by one domain of the self-assembled BCP). Top surface 102 can comprise a resist or another topographically patterned material. Substrate 100 can comprise multiple layers (not shown) that can include a topographically patterned resist layer as a top layer having top surface 102. The material of bottom surface 107 of initial openings 104 can be the same material as top surface 102 or a different material (i.e., material of another layer of substrate 100). The bottom surface of the initial openings can be preferential or non-preferential to the domains of the self-assembled BCP.

Initial openings 104 have a critical dimension $CD_{Init}$ that is compatible with the self-assembly properties of the BCP. In this example, sidewalls 106 have surfaces that are preferentially wetted by block B (i.e., the polycarbonate or polyester block, the component of the more etchable domain), and $CD_{Init}$ is the diameter d'. In this instance, $CD_{Init}$ is about 2Lo (FIG. 1A). Alternatively, sidewalls 106 can have a surface that is preferentially wetted by block A (i.e., the styrene-containing block, the less etchable domain). In this instance, the circular holes can have a critical dimension $CD_{init}$ (diameter d') of 1Lo (see FIGS. 82A-82G). Thus, topographic pre-patterns having a sidewall surface preferentially wetted by the less etchable domain (block A) allow smaller openings to be formed by DSA. It should be understood that this also applies to irregular shaped and bar-shaped openings of pre-patterns discussed below.

Multiple initial openings 104 have a statistical distribution of their CDs (e.g., diameters in this example of circular openings). The statistical distribution of CDs can be represented by the average (mean) CD and the sample standard deviation (σ). The sample standard deviation (σ) is a measure of how widely the individual CD values vary from the average value (the mean). The sample standard deviation (σ) is determined by the following formula:

$$\sigma = \sqrt{\frac{\sum_{i=j}^{x}(CD_i - CD_{AVERAGE})^2}{(n-1)}}$$

where $CD_{AVERAGE}$ is the sample mean, n is the sample size, and $CD_i$ is the CD of an individual sample i where $1 \le i \le n$.

When fabricating structures for integrated circuits, the size and the size uniformity of features are critical to proper functioning of the device. During the device design, a targeted critical dimension of a feature and a tolerance value are specified. Typically, the allowed tolerance is 10% of the average CD and is commonly expressed as an integral multiple of G (usually 3σ). That is, three times the sample standard deviation of CD should be less than 10% of the targeted CD. As an example, the initial openings can have a targeted CD (e.g., diameter of circular hole), designated $CD_{Init}$, which is characterized by a standard deviation $\sigma_{Init}$ and average CD, designated $CD_{InitAve}$, wherein $3\sigma_{Init}$ is between 0 and 30%, preferably 0 and 10%, of $CD_{InitAve}$.

Although initial openings 104 have a targeted critical dimension (in the case of FIG. 1A, a targeted diameter d'), initial openings 104 nevertheless can have significant size variation (e.g., 3σ can be between 0 and 30% of the average CD of the openings). This situation can arise, for example, when the openings are formed using optical lithography, and the openings are so small that the lithographic tool cannot produce openings with adequate CD uniformity (e.g., when working at or near the resolution limit). The initial openings can have a targeted critical dimension (CD) less than 100 nm.

A directed self-assembly (DSA) formulation containing a disclosed block copolymer (and possibly other additives, as described below) is coated on substrate 100, followed by removal of any solvent, forming a BCP film layer within the initial openings. In this example, the BCP is substantially or wholly confined to the initial openings. Self-assembly produces layered structure 120 (FIG. IB, plan view). Because the sidewalls are preferentially wetted by the more easily etched block B (polycarbonate or polyester block), the block copolymer phase-segregates within each initial opening 104 to form a lamellar domain pattern comprising a peripheral block B domain 127 (polycarbonate or polyester block), which is in contact with sidewalls 106, followed by a block A domain 122 (styrene-containing block), followed by central block B domain 124 (polycarbonate or polyester block, second domain), which has a cylinder shape and is centrally located in the initial openings 104.

Optionally, sidewalls 106 can be preferentially wetted by the styrene-containing domain (block A). In this instance, phase-segregation occurs without formation of thin peripheral block B domain 127. Instead, phase-segregation occurs to form a peripheral block A domain 122 in contact with sidewalls 106 surrounding a cylinder-shaped central block B domain 124 centrally located in the initial openings 104 (not shown).

The main planes of peripheral block B domain 127 and block A domain 122 are oriented parallel to the main plane of sidewalls 106. Central block B domain 124 has a critical dimension (diameter d"), which is less than diameter d'. The main axis of the cylinder-shaped central block B domain is oriented parallel to the sidewalls 106 (not shown).

Figure 1B:
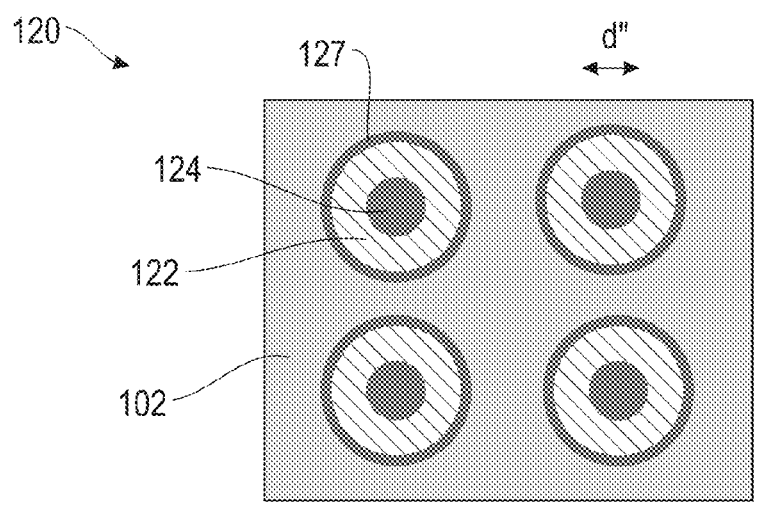
Figure 1C:
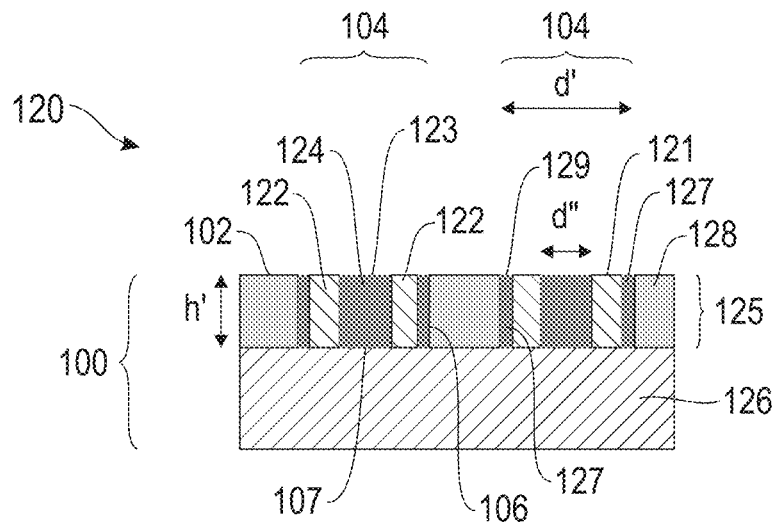

FIG. 1C is a cross-sectional view of FIG. 1B through the center of initial openings 104, showing peripheral block B domain 127, block A domain 122, and central block B domain 124 located in initial openings 104. Peripheral block B domain 127 is in contact with sidewalls 106, and block A domain 122 is in contact with peripheral block B domain 127 and central block B domain 124. Also shown is bottom layer 126 of substrate 100, which can comprise one or more layers, and top layer 125 of substrate 100. Top layer 125 comprises topographical features 128 (e.g., patterned resist features) having top surface 102. Diameter d" of central block B domain 124 is the critical dimension of central block B domain 124, and d" is less than diameter d' of initial openings 104. The sidewall height h' can be about 60 nm or more, preferably about 60 nm to about 100 nm. The domain pattern within initial openings 104 has a top surface in contact with the atmosphere. In this example, peripheral block B domain 127 has top surface 129, block A domain 122 has top surface 121, and central block B domain 124 has top surface 123, which are in contact with an atmosphere (e.g., air). Bottom surface 107 of initial openings 104 is also indicated.

Optionally, block A domain 122 can extend over peripheral block B domain 127 at the atmosphere interface, thereby providing an etch resistant topcoat over peripheral block B domain (not shown). In other words, top surface 121 of block A domain 122 can extend over peripheral block B domain 127 at the atmosphere interface.

Figure 1D:
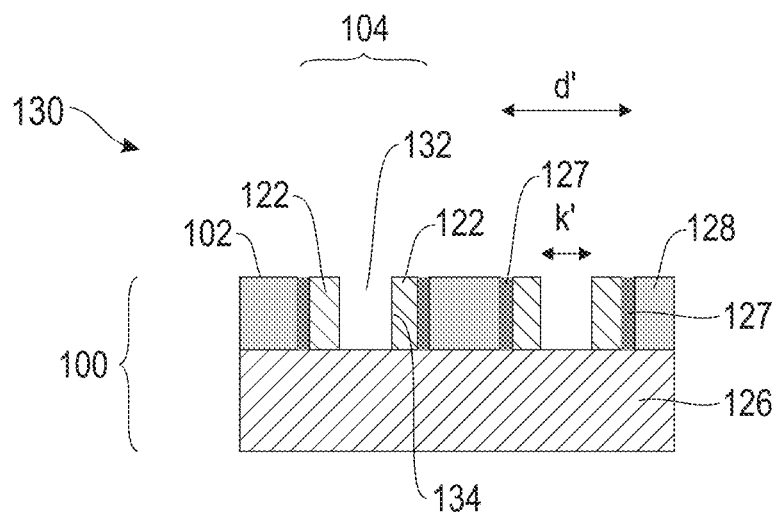
Figure 1E:
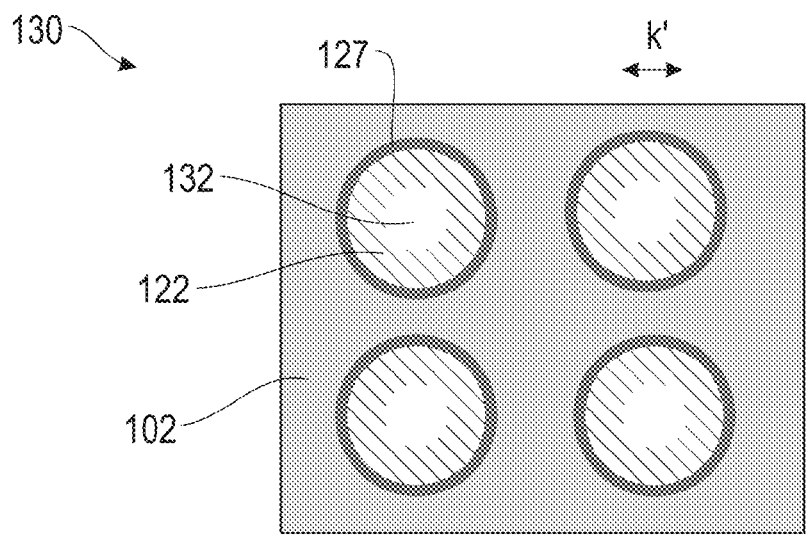

In this example, central block B domain 124 can be selectively removed leaving behind block A domain 122 and peripheral block B domain 127, forming layered structure 130 of FIG. 1D (cross-sectional view) and FIG. 1E (plan view). Peripheral block B domain 127 is a thin layer that is not selectively removed at the same rate as central block B domain 124, despite containing the same block (block B). As a result in the difference in etch rates, structure 130 comprises a single opening formed within each initial opening 104 as a result of the selective removal process. Layered structure 130 comprises second openings 132 whose critical dimension is diameter k'. Diameter k' is less than d' of initial openings 104. In this example, second openings 132 are cylindrically shaped and have vertical or substantially vertical sidewalls comprising block A domain 122. Central block B domain 124 can be removed, for example, by using a development process (such as developing domain pattern in aqueous base developer), by dissolving in solvent, or by etching with a plasma.

The resulting second openings 132 can have a smaller percentage variation in their average diameters (the critical dimension, in this example) than do the initial openings 104. This is referred to as a "self-healing effect" (i.e., a reduction in the percentage variation in the CD of the resulting openings with respect to the percentage variation in the CD of the initial openings).

Figure 1F:
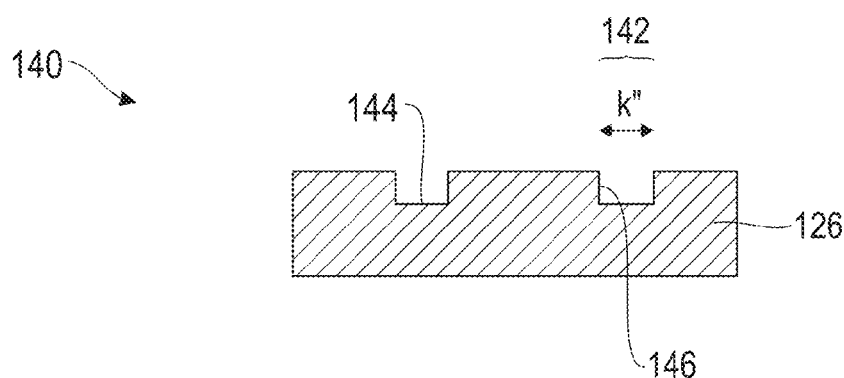
Figure 1G:
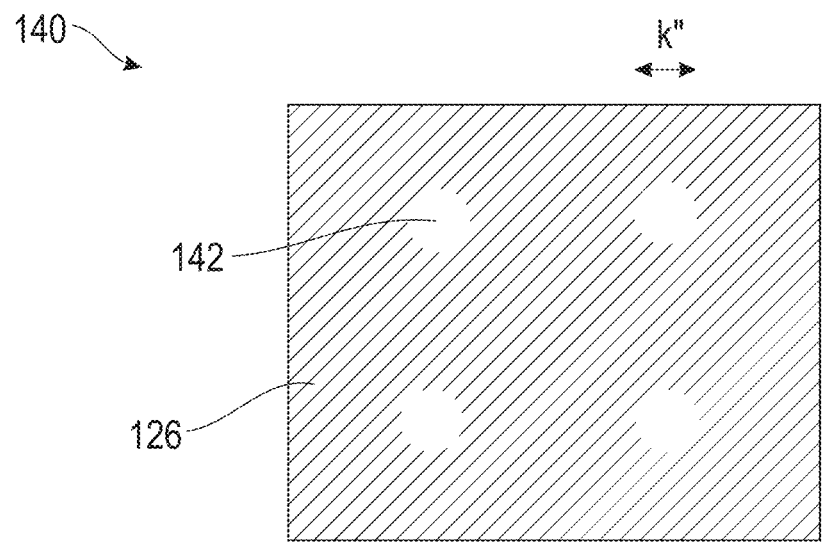

Second openings 132 can then be transferred to the underlying substrate 100, with concomitant or subsequent removal of topographic features 128, block A domain 122, and peripheral block B domain 127 using one or more steps, forming layered structure 140 of FIG. 1F (cross-sectional view) and FIG. 1G (plan view). Layered structure 140 comprises a pattern of transfer openings 142 having critical dimension k" (diameter) and having bottom surface 144 comprising material of bottom layer 126 of substrate 100. Diameter k" is less than diameter d' of initial openings 104. Transfer openings 142 also have sidewalls 146 comprising material of bottom layer 126. It should be understood that bottom layer 126 can comprise one or more layers (not shown), and therefore sidewalls 146 can comprise materials from one or more layers of substrate 100.

It is non-trivial to measure the critical dimension of the central block B domain directly. The critical dimension of the second openings and transfer openings are measured instead. It should be understood that the critical dimension of the second openings can be significantly impacted by the choice of method used to selectively remove the central block B domain 124. For pattern transfer, a wet etch, which only removes polycarbonate or polyester domain, is preferred. A short oxygen plasma can be used to remove a portion of the polycarbonate or polyester domain (but not the whole domain) in order to improve contrast in the scanning electron micrograph (SEM). Oxygen plasma is not completely selective (i.e., the oxygen plasma can also etch the PS domain, although slower than the polycarbonate domain; therefore a short etch is used in order to leave the block B domain intact).

Various metrology and image analysis tools are available to determine the CD of the initial openings, second openings, and transfer openings. For example, the critical dimensions can be determined by analyzing the SEM images. The CD of nearly circular holes and the lengths of major and minor axes of oval holes and bars can be determined using the SuMMIT contact analysis tool box (developed and licensed by the software division of EUV Technology, Martinez, Calif.).

The statistical variation of the targeted CD (e.g., diameters of circular holes) of the initial openings, second openings, and transfer openings, is referred to as the critical dimension uniformity (CDU) of referenced openings. The CDU is characterized by the standard deviation of the targeted CD of the referenced openings ($\sigma$), and the average of the targeted CD of the referenced openings, referred to as "$CD_{Ave}$". The CDU is the ratio of these quantities and is expressed as a percentage. A CDU<5% is desired.

$$CDU = \sigma/CD_{Ave} \times 100\%$$

For example, the second openings can have a targeted critical dimension designated $CD_{2nd}$ corresponding to $CD_{Init}$ of the initial openings but smaller than $CD_{Init}$, and having a statistical variation in $CD_{2nd}$ characterized by a standard deviation ($\sigma_{2nd}$) and an average of $CD_{2nd}$, designated $CD_{2ndAve}$, wherein the $CDU = \sigma_{2nd}/CD_{2ndAve} \times 100\%$ of the second openings, and CDU is less than 5.8%. Preferably the CDU of the second openings is less than 5%. In an embodiment, the CDU of the second openings is between 3% and 4%.

Process window (PW) is a measure of the range of variability of a given process parameter while staying within the specifications of a targeted result. Herein, the process window of a given block copolymer is a measure of the range of a critical dimension of the initial opening (e.g., diameter of an initial circular opening) for which second openings can be formed using the above-described process, preferably with a CDU<5%. A larger PW is desirable, and indicates the block copolymer has greater tolerance for variability in the CD of the initial openings.

Placement error (PE) is a measure of variability in the positioning of the second openings after the selective removal process. Herein, PE is measured as the standard deviation of the spacing between second openings for regular pre-pattern geometries. For example, if the pre-pattern has a pitch of $P_{init}$ and the second openings have spacings of $P_{2nd}$, then the PE is the statistical variation in $P_{2nd}$ characterized by the standard deviation $\sigma_{2nd}$. A placement error<1 nm is desirable.

For interconnect features less than 22 nm in CD, optical lithography is not capable of the resolution required to create discrete initial openings that would lead to the formation of single second openings within each initial opening. In practice, overlapping discrete openings can merge to form one or more segmented pre-pattern openings within a substrate. For example, such merging can occur when the positive resist is overexposed or the negative resist is underexposed. A segmented pre-patterned opening has a number of directing features or "protrusions" that direct and control the position of each self-assembled domain to achieve the desired placement accuracy. A segmented initial opening can be considered to be the result of combining a number of overlapping discrete (typically circular) holes, each of which is of a dimension that can be resolved by optical lithography. As for discrete circular initial openings, the diameter of the segmented overlapping initial openings should be about 2Lo when the sidewalls are preferential to block B, where Lo is the bulk periodicity of the domain pattern formed by the block copolymer. A self-healing effect (i.e., a reduction in the percentage variation in the CD of the resulting openings with respect to the percentage variation in the CD of the initial openings) can also occur with segmented openings.

Figure 2A:
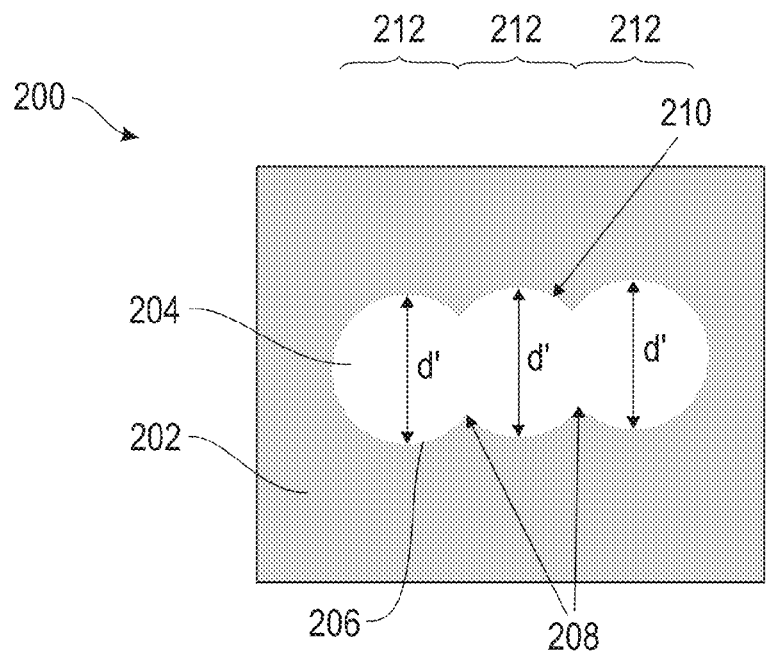
FIGS. 2A-2G are schematic diagrams showing a process of preparing transfer openings of reduced size using directed self-assembly of a BCP within initial openings of a topographically pre-patterned substrate, where the initial openings of the topographic pre-pattern are irregular shaped segmented openings.

The next example illustrates a substrate having a pre-pattern comprising an irregular segmented opening. The geometry of the segmented opening is compatible with the self-assembly properties of the block copolymer, facilitating good placement accuracy of the self-assembled domains. FIG. 2A shows a plan view of a substrate 200 having a topographical top surface 202 that includes a segmented initial opening 204 therein, whose geometry can be thought of as arising from three partially overlapping circular holes 212 of critical dimension d' (diameter), in which the walls of the circular holes are removed in the overlap areas. In this example $CD_{Init}$ is d'. The intersection points of the walls of the circular holes are indicated by protrusions 208. Sidewalls 206 of initial opening 204 are vertical or substantially vertical (i.e., perpendicular to the main plane of the bottom layer of the substrate) and can comprise material of one or more layers of substrate 200. Initial opening 204 also has a bottom surface 207 (see FIG. 2C). The boundary of initial opening 204 (at the surface of the substrate 200) thus can be viewed as the overlap of circular holes that, in the case of cylinders (which have vertical sidewalls), are the projection of the cylindrical holes onto the plane of the top surface 202 of substrate 200. The perimeter of the initial opening 204 (at the surface of the substrate 200) is therefore defined by the circular arcs 210 associated with these overlapping cylinders, each of which has a radius d'/2, which is compatible with the self-assembly properties of the block copolymer. A given protrusion 208 can be viewed as part of, and formed from, two adjacent arc portions of sidewalls 206. In other words, FIG. 2A can be regarded as showing a planar cross-section of sidewalls 206 taken at the top of the sidewalls 206 (i.e., at the top surface 202 of substrate 200). As in the previous example, sidewalls 206 are preferential to the more etchable domain containing the polycarbonate or polyester block (block B), and therefore each diameter d' can have a value of about 2Lo. When sidewalls 206 are preferential to the more etch-resistant styrene-containing domain (block A), the diameter d' of initial opening 204 can be about 1Lo. Sidewalls 206 can have a height (not shown) of about 60 nm or more, preferably about 60 nm to about 100 nm.

While the segmented initial opening shown in FIG. 2A arises from the overlap of circular holes 212, in practice the actual circles of a given circular opening are not ideally circular due to limitations of the lithography, including the non-ideal response of the resist or other processing steps. More generally, the overlapping circular holes 212 of FIG. 2A can deviate from circles, and the sidewalls can be sloped (conical openings) or have more complex shapes (e.g., as with a teardrop shaped openings). For these more complex cases, the average radius of curvature can be taken as the radius of the equivalent cylindrical openings having the same displacement volume. It should be understood that such deviations from an ideal shape are considered to be within the scope of this invention. For any segment having a non-circular contour, its average radius of curvature can be determined using an algorithm based on the Hough transform.

For the sake of clarity, the initial opening 204 of FIG. 2A is formed from only three circular holes 212, although in practice, the opening could be formed from many more than just three circular holes (e.g., it could be formed from hundreds, thousands, or even more circular holes). Each of the component circular holes that makes up the initial opening 204 has the same targeted CD (in this case, a target diameter d'). Nevertheless, the component circular holes can have significant size variation (e.g., of at least 10% ($3\sigma$>10% CD).

A formulation containing the block copolymer (and possibly other additives, as described below) is applied over the substrate 200, thereby forming a film layer comprising the BCP. As in the previous example, the BCP is substantially or fully confined to the initial opening 204. The block copolymer is then allowed or induced to self-assemble, thereby forming layered structure 220 (FIG. 2B, plan view) comprising a pattern of self-assembled lamellar domains of the BCP within initial opening 204. The domain pattern comprises a cylinder-shaped central block B domain 224 centrally located in each component circle, surrounded by and in contact with a block A domain 222. A thin peripheral block B domain 227 is in contact with sidewalls 206 and block A domain 222.

Optionally, sidewalls 206 can be preferentially wetted by the styrene-containing domain (block A). In this instance, phase-segregation occurs without formation of thin peripheral block B domain 227. Instead, phase-segregation occurs to form a peripheral block A domain 222 in contact with sidewall 206 surrounding a cylinder-shaped central block B domain 224 at the center of each overlapping component circle of the segmented opening (not shown).

The morphology of central block B domain 224 has a respective geometric center whose position is determined by at least one sidewall 206 and its corresponding protrusion(s) 208. Central block B domain 224 is located at the center of each overlapping circle making up initial opening 204, and has a critical dimension diameter d". Sidewalls 206 with their protrusions 208 can be viewed as "directing features", since they predetermine the location of (or direct) block A domain 222, peripheral block B domain 227, and central block B domain 224 at points where their respective free energies are minimized.

Figure 2B:
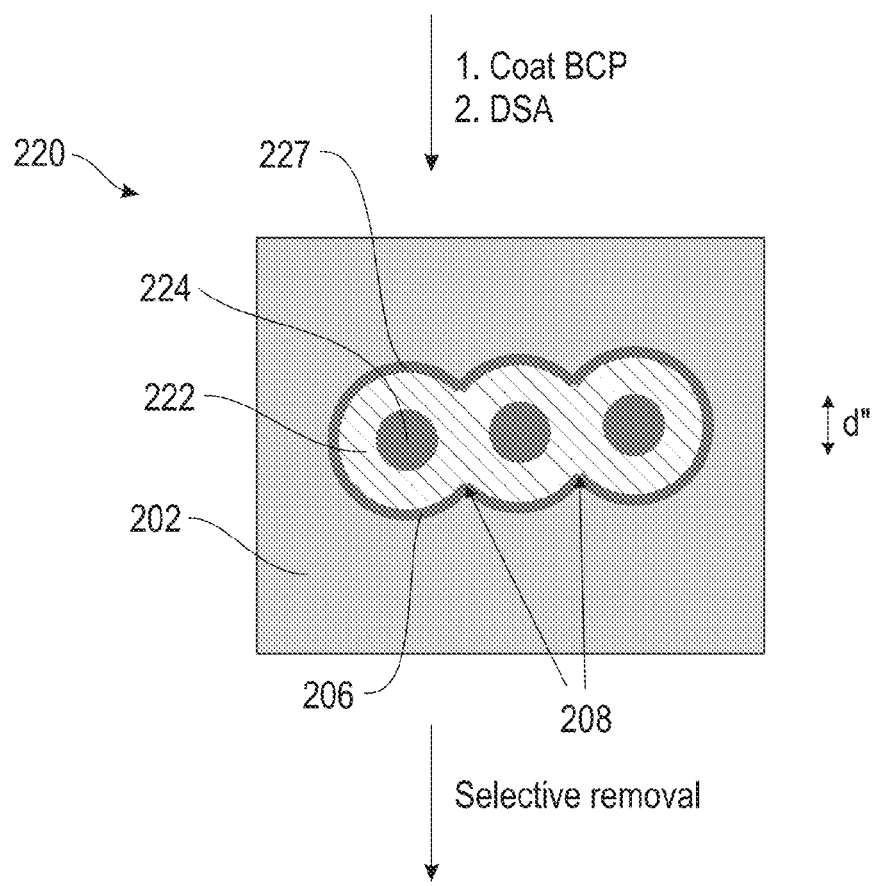
Figure 2C:
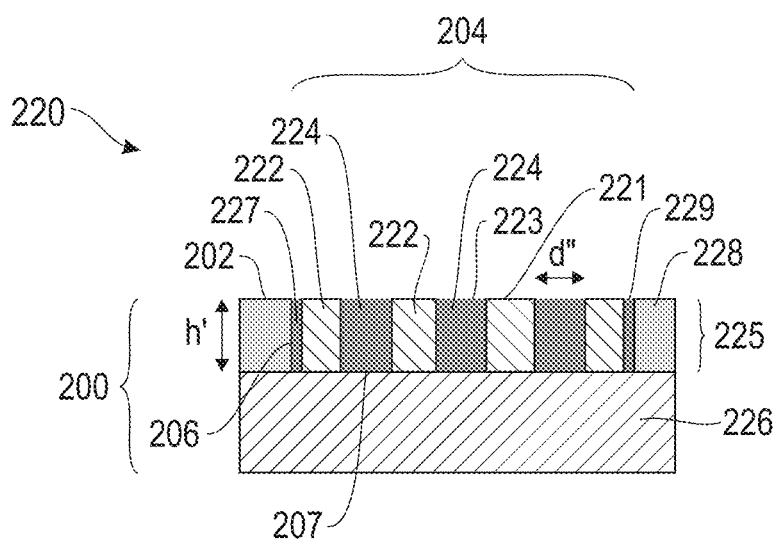

FIG. 2C is a cross-sectional view of FIG. 2B through the center of initial opening 204, showing block A domain 222, peripheral block B domain 227, and central block B domain 224 in initial opening 204. Peripheral block B domain 227 is in contact with sidewalls 206, and block A domain 222 is in contact with peripheral block B domain 227 and central block B domain 224. Also shown is bottom layer 226 of substrate 200 (e.g., a silicon wafer), and topographical features 228 (e.g., resist) of top layer 225 of substrate 200. Topographic features 228 have top surface 202. Central block B domain 224 has critical dimension d" (diameter), which is less than diameter d' of a given overlapping circular hole 212 of initial opening 204. Sidewalls 206 can have height h' of about 60 nm or more, preferably about 60 nm to about 100 nm. The domain pattern within initial opening 104 has a top surface in contact with the atmosphere. In this example, peripheral block B domain 227 has top surface 229, block A domain 222 has top surface 221, and central Block B domain 224 has top surface 223, which are in contact with an atmosphere (e.g., air). Bottom surface 207 of initial openings 204 is also indicated.

Optionally, block A domain 222 can extend over peripheral block B domain 227 at the atmosphere interface, thereby providing an etch resistant topcoat over peripheral block B domain (not shown). In other words, top surface 221 of block A domain 222 can extend over peripheral block B domain 227 at the atmosphere interface.

Figure 2D:
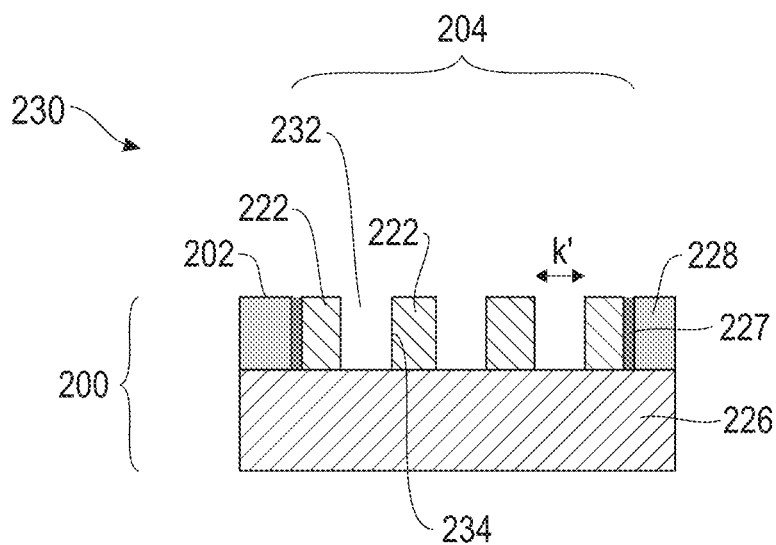
Figure 2E:
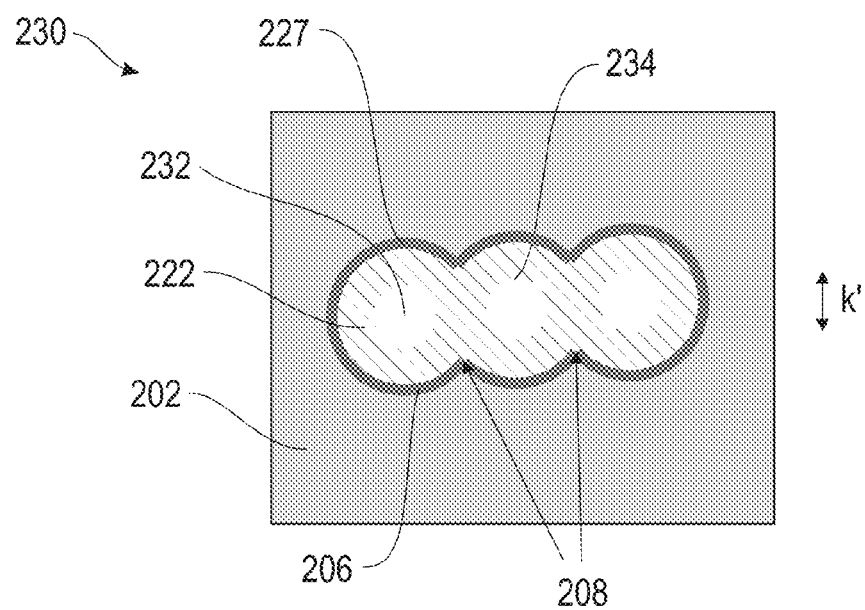

Selective removal of central block B domain 224 can occur without substantially removing peripheral block B domain 227, producing layered structure 230 of FIG. 2D (cross-sectional view) and FIG. 2E (plan view). Layered structure 230 comprises second openings 232 having critical dimension k' (diameter). It should be understood that second openings 232 are cylindrically shaped and have vertical or substantially vertical sidewalls 234 comprising block A domain 222. Central block B domain 224 can be selectively removed, for example, by using a development process (such as developing them in aqueous base developer), by dissolving them in solvent, or by etching them away with a plasma. The process selectively removes central block B domain 224, leaving behind block A domain 222 and peripheral block B domain 227. Second openings 232 can have a smaller percentage variation in their average diameters (the critical dimension, in this example) than do the initial openings 204.

Figure 2F:
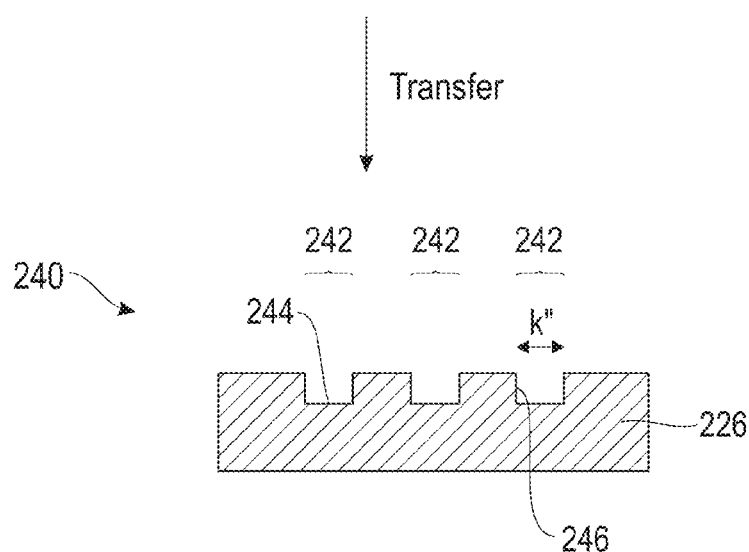
Figure 2G:
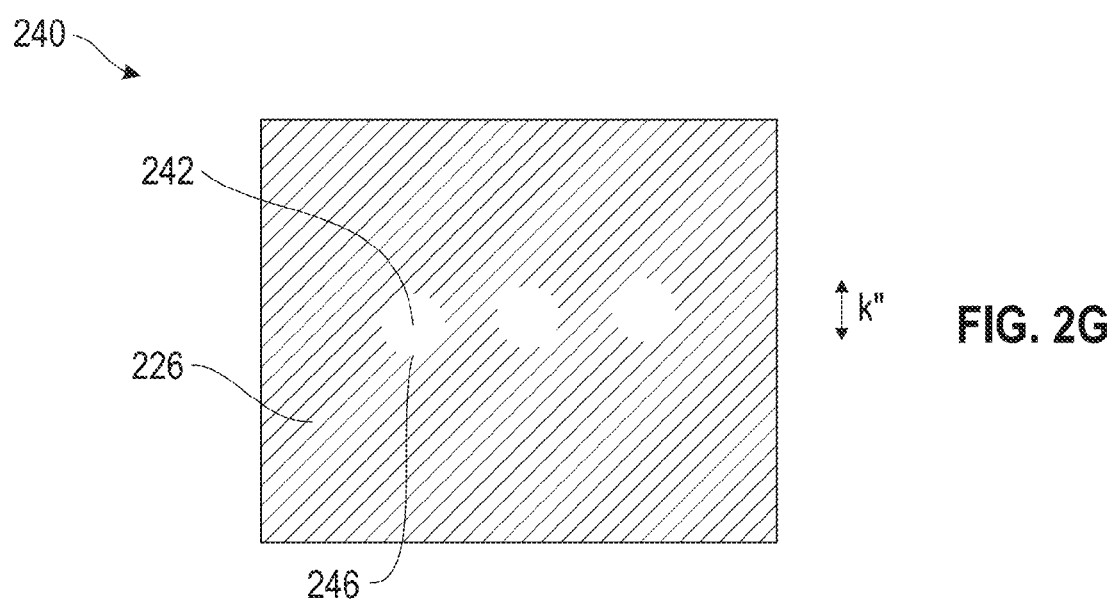

Second openings 232 can then be transferred to the underlying substrate 200, with concomitant or subsequent removal of topographic features 228, block A domain 222, and peripheral block B domain 227, forming layered structure 240 of FIG. 2F (cross-sectional view) and FIG. 2G (plan view). Layered structure 240 comprises a pattern of cylindrically shaped transfer openings 242 having critical dimension k" (diameter). Transfer openings 242 have a bottom surface 244 and sidewalls 246 comprising material of bottom layer 226 of substrate 200. Diameter k" is less than diameter d' of initial opening 204. It should be understood that bottom layer 226 can comprise one or more layers (not shown), and therefore sidewalls 246 can comprise materials from one or more layers of substrate 200.

The contoured sidewalls 206 and their protrusions 208 can be formed with optical lithography, so that the central block B domain 224 (and thus the corresponding transfer openings 242) can be positioned according to a preselected layout. In general, the discrete, segregated domains need not be necessarily aligned along a single axis, but rather they can be arranged in the form of "rows", "columns", "diagonals", etc. Because the adjacent discrete segregated cylinders of central block B domain 224 can be separated by a distance that is less than the sum of the average radii of curvature of the corresponding circles making up the segmented initial opening, the segregated cylinders comprising central block B domain 224 and corresponding second openings 232 can be formed at a desired aerial density with lower resolution lithography than would otherwise be needed. Accordingly, the segregated cylinders comprising the central block B domain 224 (and corresponding second openings 232) do not need to conform to any particular symmetry or natural periodicity of block copolymers.

Figure 3A:
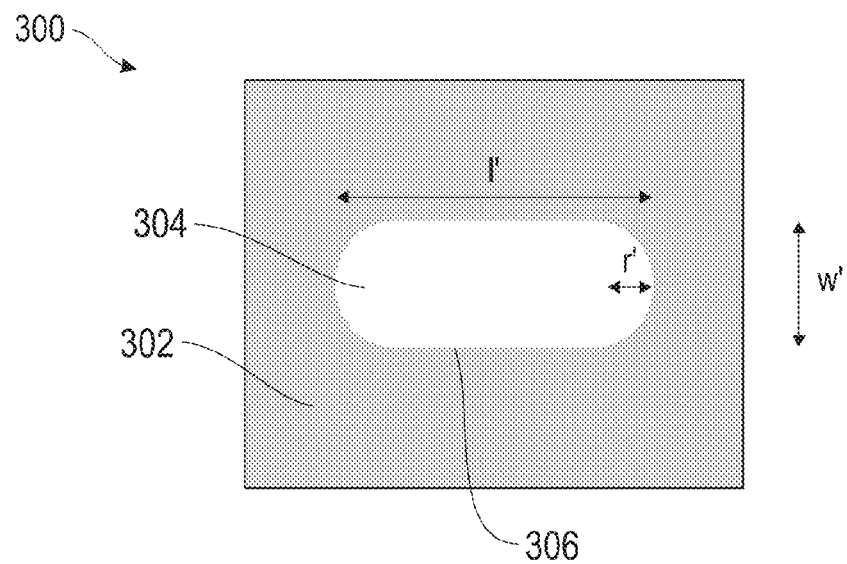
FIGS. 3A-3G are schematic diagrams showing a process of preparing transfer openings of reduced size using directed self-assembly of a BCP within initial openings of a topographically pre-patterned substrate, where the initial openings of the topographic pre-pattern are bar-shaped openings.

The next example illustrates a substrate having a pre-pattern comprising a bar-shaped opening. FIG. 3A is a plan view of a substrate 300 having a topographical top surface 302 that includes a bar-shaped initial opening 304 therein, whose geometry can be thought of as a rectangle having circular ends of radius r', a length l' (long axis), and a width w' (short axis), wherein l'>w', and w' is $CD_{Init}$ of the initial opening 304. The aspect ratio of the oval and bar-shaped openings can be between 1:1 and 100:1, more particularly between 1:1 and 10:1, and even more particularly between 1:1 and 5:1.

Initial opening 304 has sidewalls 306 that are vertical or substantially vertical (i.e., perpendicular to the main plane of the substrate). Sidewalls 306 can comprise material of one or more layers of substrate 300. Initial opening 304 also has bottom surface 307 (shown in FIG. 3C). The geometry of the initial opening 304 is compatible with the self-assembly properties of the block copolymer.

As in the previous examples, sidewalls 306 of this example are preferentially wetted by the selectively removable block B domain (polycarbonate or polyester block). In this instance, width w' can have a value of about 2Lo. When sidewalls 306 are preferentially wetted by the domain formed by the more etch-resistant block (block A, styrene-containing block), the width w' of initial opening 304 can be about 1Lo.

A formulation containing the block copolymer (and possibly other additives, as described below) is applied over the substrate 300, thereby forming a film layer comprising the BCP. As in the previous examples, the BCP is substantially or fully confined to initial opening 304. The block copolymer is then allowed or induced to self-assemble, thereby forming layered structure 320 (FIG. 3B, plan view) comprising a lamellar domain pattern of self-assembled block polymer within initial opening 304. The domain pattern comprises a bar-shaped central block B domain 324, which is surrounded by and in contact with block A domain 322. A peripheral block B domain 327 is in contact with sidewalls 306 and with block A domain 322. Central block B domain 324 has a length j'<l', a width w"<w' where w" is the critical dimension. The radius of curvature of the ends of central block B domain 324 is less than r' (not shown).

Figure 3B:
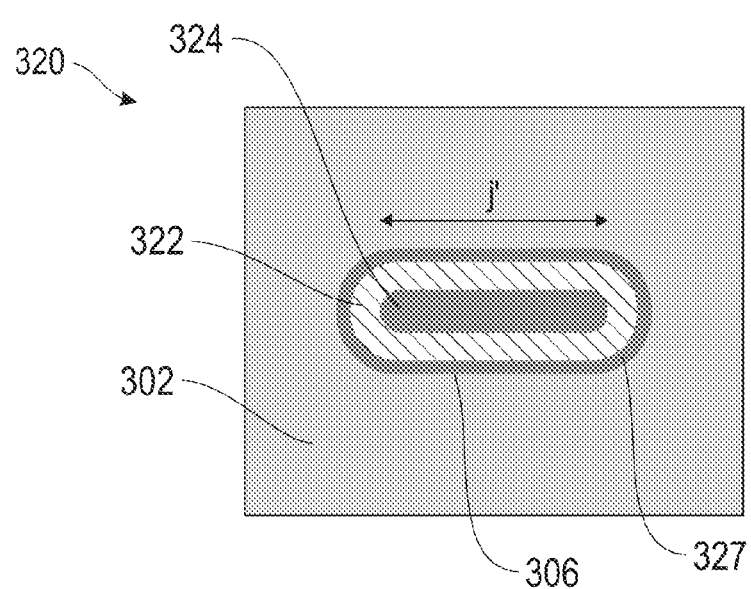
Figure 3C:
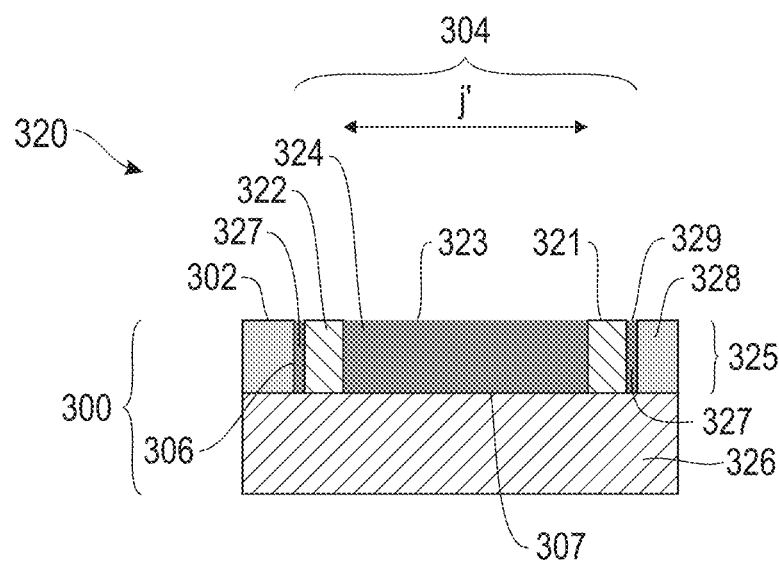

FIG. 3C is a cross-sectional view of FIG. 3B through the center of initial opening 304, showing peripheral block B domain 327, block A domain 322, and central block B domain 324 located in initial opening 304. Peripheral block B domain 327 is in contact with sidewalls 306, block A domain 322 is in contact with peripheral block B domain 327 and central block B domain 324. Also shown is bottom layer 326 of substrate 300 (e.g., a silicon wafer), and topographic features 328 (e.g., hardmask) of top layer 325 of substrate 300. Topographic features 328 have top surface 302. The domain pattern within initial opening 304 has a top surface in contact with the atmosphere. In this example, peripheral block B domain 327 has top surface 329, block A domain 322 has top surface 321, and central block B domain 324 has top surface 323, which are in contact with an atmosphere (e.g., air). Bottom surface 307 of initial openings 304 is also indicated.

Optionally, block A domain 322 can extend over peripheral block B domain 327 at the atmosphere interface, thereby providing an etch resistant topcoat over peripheral block B domain (not shown). In other words, top surface 321 of block A domain 322 can extend over peripheral block B domain 327 at the atmosphere interface.

Figure 3D:
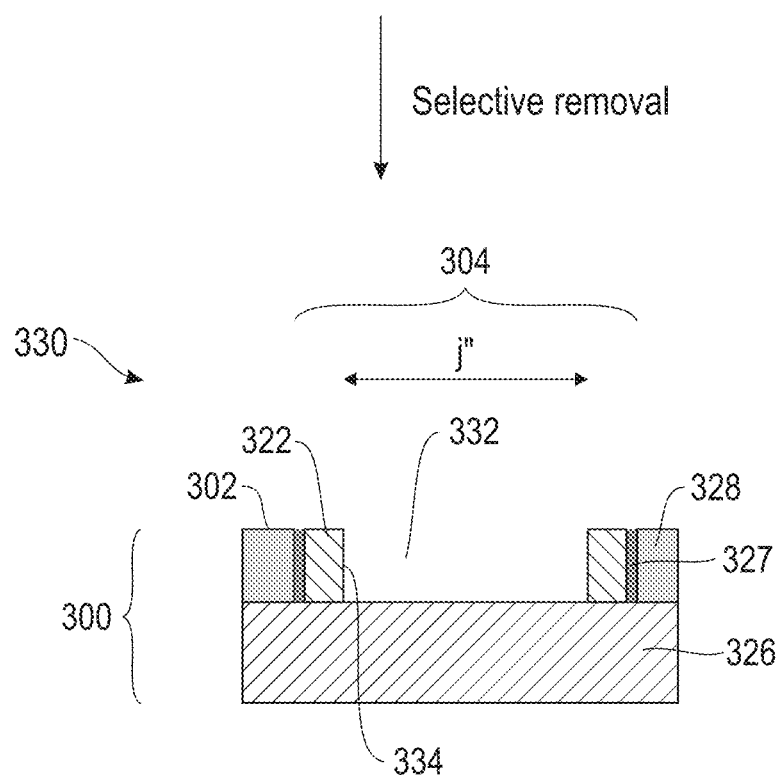
Figure 3E:
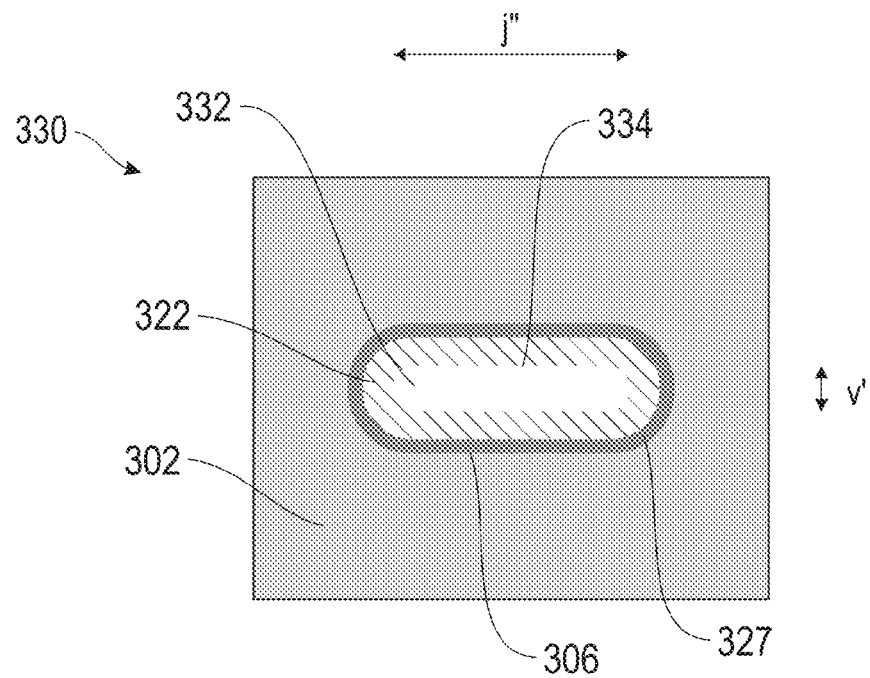

Selective removal of central block B domain 324 can occur without substantially removing peripheral block B domain 327, forming layered structure 330 of FIG. 3D (cross-sectional view) and FIG. 3E (plan view). Layered structure 330 comprises second openings 332 having length j" and width v' (shown in FIG. 3E), where v' is the critical dimension. It should be understood that second openings 332 are bar-shaped and have vertical or substantially vertical sidewalls 334 comprising block A domain 322. Central block B domain 324 can be selectively removed, for example, by using a development process (such as developing them in aqueous base developer), by dissolving them in solvent, or by etching them away with a plasma. The process selectively removes central block B domain 324 while leaving behind block A domain 322 and peripheral block B domain 327. Second opening 332 can have a smaller percentage variation in average length and width (the critical dimensions, in this example) compared to initial openings 304. The CDU calculation of bar openings is based on the variability of width v' (FIG. 3E).

Figure 3F:
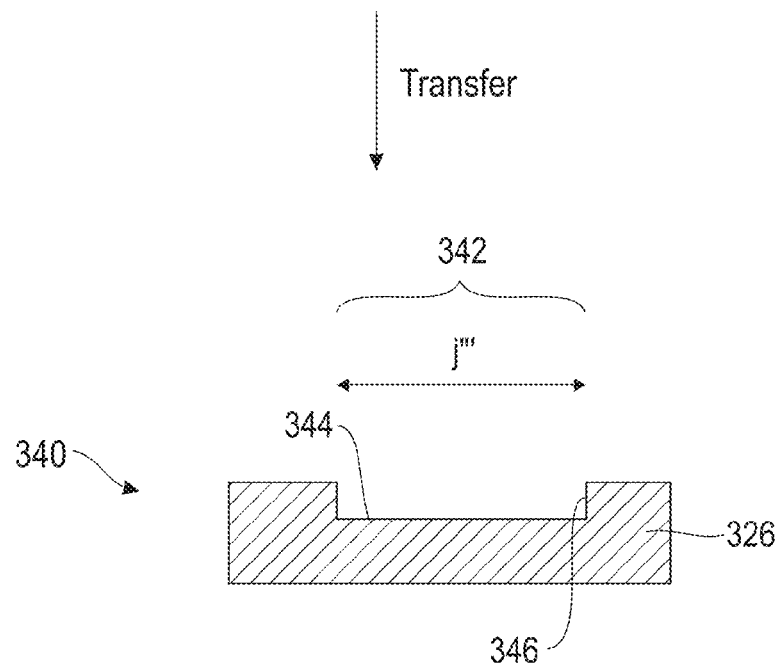
Figure 3G:
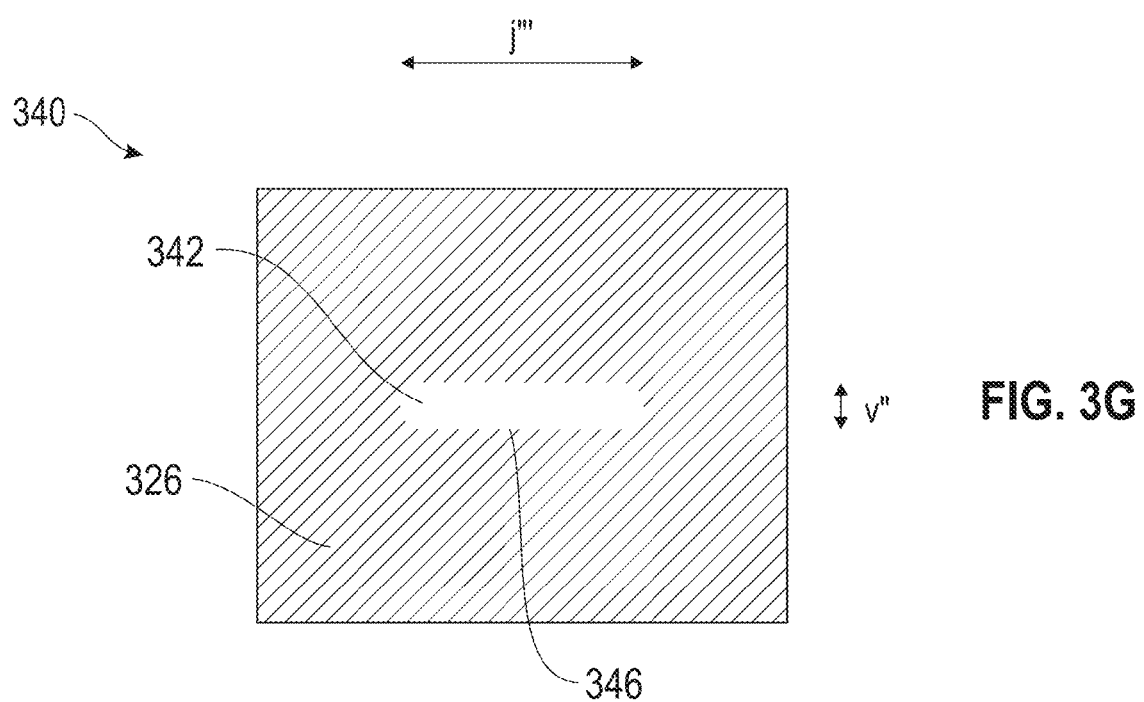
Figure 12A:
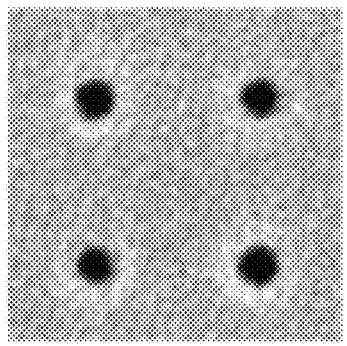
FIGS. 12A-12G are SEMs of the contact holes formed in Example 71, where the CD of the initial circular holes of the guiding pattern was varied from 40-52 nm. Hole shrink was observed. The DSA process window was 14 nm.
Figure 12B:
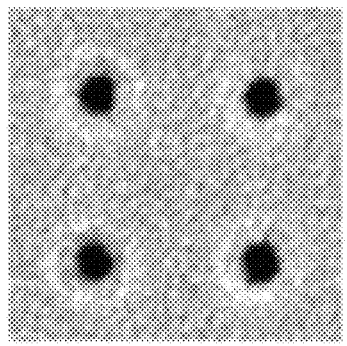
Figure 12C:
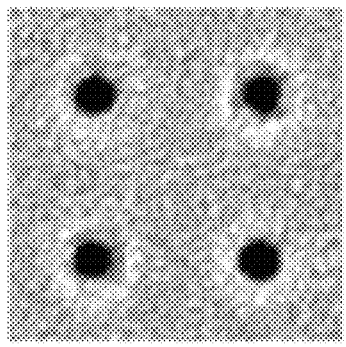
Figure 12D:
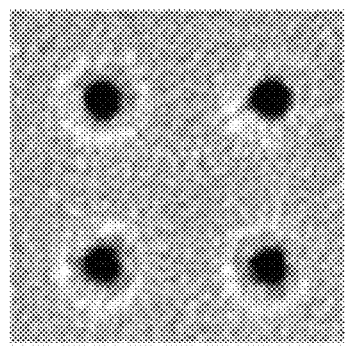
Figure 12E:
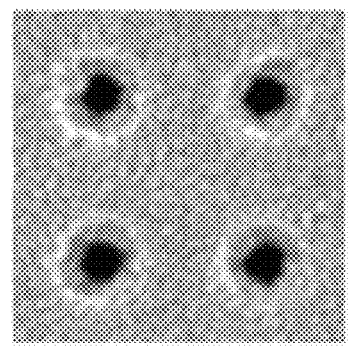
Figure 12F:
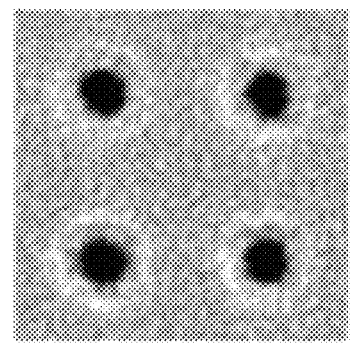
Figure 12G:
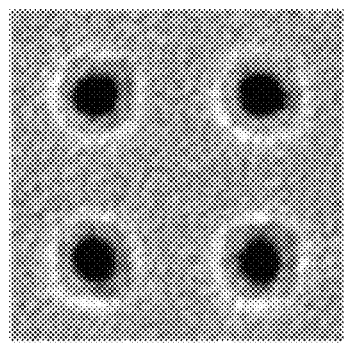

Second openings 332 can then be transferred to the underlying substrate 300, with concomitant or subsequent removal of topographic features 328, block A domain 322, and peripheral block B domain 327, forming layered structure 340 of FIG. 3F (cross-sectional view) and FIG. 3G (plan view). Layered structure 340 comprises bar-shaped transfer openings 342 having length j'" and width v" (FIG. 3G), where the critical dimension is v". Transfer openings 342 have a bottom surface 344 and sidewalls 346 comprising material of bottom layer 326 of substrate 300. Length j'" is less than length j' of initial openings 304. It should be understood that bottom layer 326 can comprise one or more layers (not shown), and therefore sidewalls 346 can comprise materials from one or more layers of substrate 300.

The next example illustrates a substrate having a pre-pattern comprising circular shaped initial openings whose sidewalls are preferential to the block A domain. FIG. 82A shows a plan view of a substrate 400 having a top surface 402 and circular initial openings 404 therein. Each of the initial openings 404 has sidewalls 406 that are vertical or substantially vertical relative to a main plane of the substrate (i.e., perpendicular to the top surface 402 of the substrate). Initial openings 404 also have a bottom surface 407 (shown in FIG. 82C). Top surface 402 can comprise a resist or another topographically patterned material. Substrate 400 can comprise multiple layers (not shown) that can include a topographically patterned resist layer as a top layer having top surface 402. The material of bottom surface 407 of initial openings 404 can be the same material as top surface 402 or a different material (i.e., material of another layer of substrate 400). The bottom surface of the initial openings can be preferential or non-preferential to the domains of the self-assembled BCP.

Initial openings 404 have diameter d', which is the critical dimension $CD_{Init}$. Because sidewalls 406 have surfaces that are preferentially wetted by block A (i.e., the styrene-containing block, the component of the less etchable domain), d' can be about 1Lo (FIG. 82A). Preferably, d' is less than 100 nm.

A directed self-assembly (DSA) formulation containing a disclosed block copolymer (and possibly other additives, as described below) is coated on substrate 400, followed by removal of any solvent, forming a BCP film layer within the initial openings. As in the previous examples, the BCP is substantially or wholly confined to the initial openings. The BCP film layer is allowed and/or induced to self-assemble, thereby forming layered structure 420 (FIG. 82B, plan view). Because the sidewalls 406 are preferentially wetted by the less etchable block A (styrene-containing block), within each initial opening 404 the block copolymer phase-segregates to form a domain pattern comprising a peripheral block A domain 422 (styrene-containing block) in contact with sidewalls 406, followed by cylinder-shaped central block B domain 424 (polycarbonate or polyester block, second domain) centrally located in initial openings 404.

The main plane of peripheral block A domain 422 and the main axis of the cylinder-shaped central block B domain 424 are oriented parallel to a main plane of sidewalls 406. Central block B domain 424 has a critical dimension (diameter d"), which is less than diameter d'.

FIG. 82C is a cross-sectional view of layered structure 420 of FIG. 82B through the center of initial openings 404, showing peripheral block A domain 422 and central block B domain 424 located in initial openings 404. Peripheral block A domain 422 is in contact with sidewalls 406 and central block B domain 424. Also shown is bottom layer 426 of substrate 400, which can comprise one or more layers, and topographic features 428 (e.g., resist) of top layer 425 of substrate 400. Topographic features 428 have top surface 402. Diameter d" of central block B domain 424 is less than diameter d' of initial openings 404. The sidewall height h' can be about 60 nm or more, preferably about 60 nm to about 100 nm. The domain pattern within initial openings 404 has a top surface in contact with the atmosphere. In this example, peripheral block A domain 422 has top surface 421, and central block B domain 424 has top surface 423, which are in contact with an atmosphere (e.g., air). Bottom surface 407 of initial openings 404 is also indicated.

Figure 82E:
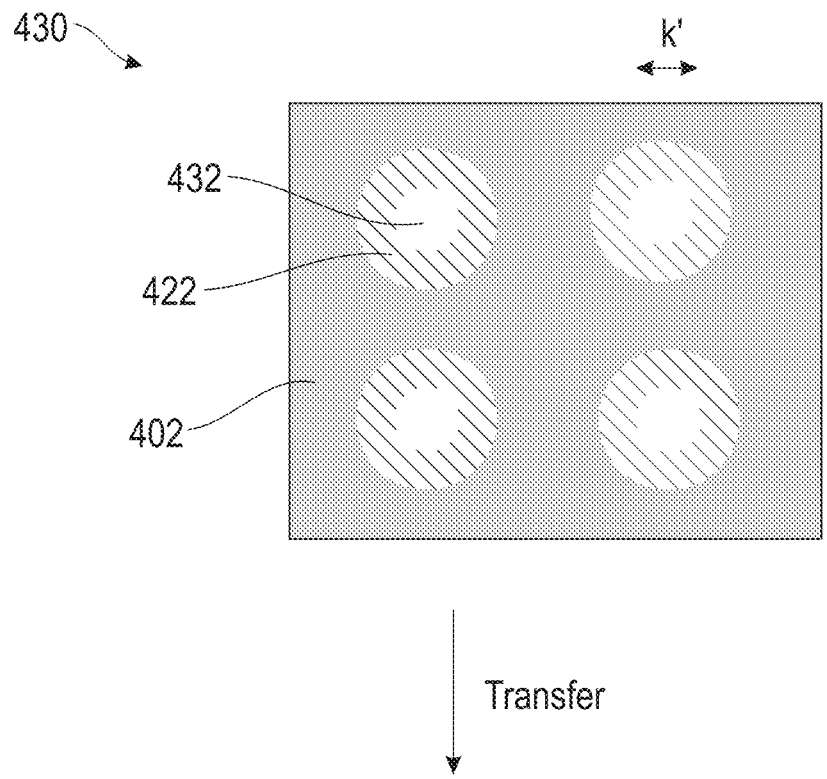

As in the previous examples, central block B domain 424 can be selectively removed leaving peripheral block A domain 422, forming layered structure 430 of FIG. 82D (cross-sectional view) and FIG. 82E (plan view). Layered structure 430 comprises second openings 432 formed within initial openings 404 as a result of the selective removal process. Second openings have critical dimension k' (diameter), which is less than d' of initial openings 404. In this example, second openings 432 are cylinder-shaped and have vertical or substantially vertical sidewalls comprising peripheral block A domain 422. Central block B domain 424 can be selectively removed, for example, by using a development process (such as developing domain pattern in aqueous base developer), by dissolving in solvent, or by etching with a plasma.

The resulting second openings 432 can have a smaller percentage variation in their average diameters (the critical dimension, in this example) than do the initial openings 404.

Figure 82F:
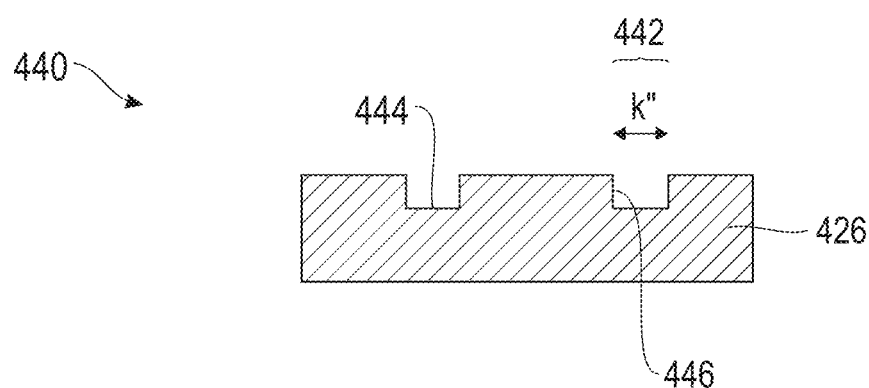
Figure 82G:
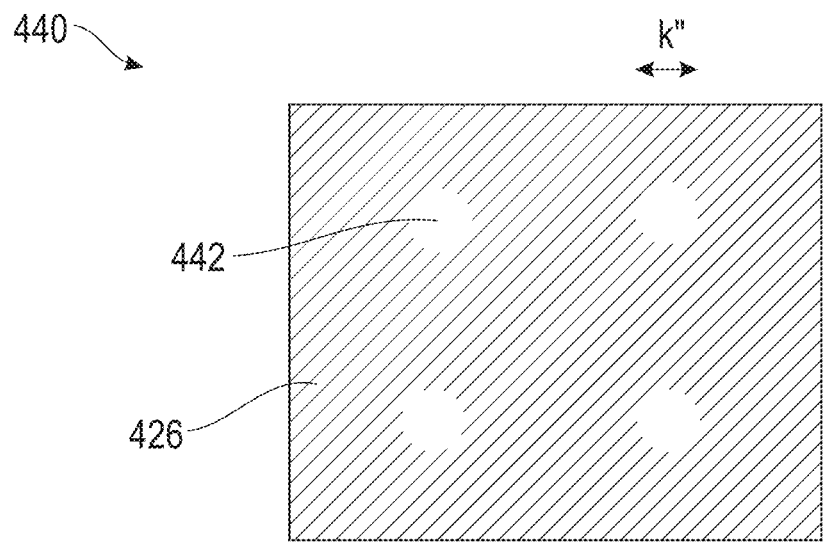

Second openings 432 can then be transferred to the underlying substrate 400, with concomitant or subsequent removal of topographic features 428 and peripheral block A domain 422, forming layered structure 440 of FIG. 82F (cross-sectional view) and FIG. 82G (plan view). Layered structure 440 comprises a pattern of transfer openings 442 having critical dimension k" (diameter) and having bottom surface 444 comprising material of bottom layer 426 of substrate 400. Diameter k" is less than diameter d' of initial openings 404. Transfer openings 442 also have sidewalls 446 comprising material of bottom layer 426. It should be understood that bottom layer 426 can comprise one or more layers (not shown), and therefore sidewalls 446 can comprise materials from one or more layers of substrate 400.

FIG. 83 is a plan view of a schematic diagram showing the arrangement of blocks of the self-assembled block copolymer in a portion of an initial opening in which the sidewalls are preferentially wetted by the more etchable block B domain. The critical dimension of the initial opening is about 2Lo. The peripheral block B domain is in contact with the sidewalls. The lamellar sheets are oriented substantially parallel to the sidewalls. It should be understood that within a given domain, blocks from different polymer macromolecules (e.g., B blocks) can be arranged end-to-end (shown) and/or interwoven (not shown). Each block can have a backbone that is rigid, non-rigid, or of intermediate rigidity. Each block can have any suitable coiling, rotational and/or flexural capability. It should also be understood that the block A domain can extend over the peripheral block B domain at the atmosphere interface.

FIG. 84 is a plan view of a schematic diagram showing the arrangement of blocks of the self-assembled block copolymer in a portion of an initial opening in which the sidewalls are preferentially wetted by the block A domain. The critical dimension of the initial opening is about 1Lo. The peripheral block A domain is in contact with the sidewalls. The lamellar sheets are oriented substantially parallel to the sidewalls.

Critical Dimension

The initial openings can have a critical dimension less than 100 nm. More particularly, the initial openings can have a critical dimension (diameter d' of FIG. 1A, FIG. 2A, and FIG. 82A, width w' of FIG. 3B) whose value is in the range of about 10 nm to about 100 nm, about 15 nm to about 60 nm, or about 20 nm to about 60 nm. The critical dimension of the circular hole and bar-shaped initial openings used in the examples further below is in the range of 26 nm to 54 nm.

The critical dimension of the central block B domain (e.g., diameter d" of FIG. 1B, FIG. 2B, and FIG. 82B, width w" of FIG. 3B) can have a value in the range of about 2 nm to about 40 nm, about 2 nm to about 20 nm, about 2 nm to about 15 nm, about 2 nm to about 10 nm, or more particularly about 2 nm to about 9 nm.

The critical dimension of the second openings formed by selective removal of the central block B domain (e.g., diameter k' of FIG. 1E, FIG. 2E, and FIG. 82E, width v' of FIG. 3E) can have a value in the range of about 2 nm to about 40 nm, about 2 nm to about 20 nm, about 2 nm to about 15 nm, about 2 nm to about 10 nm, or more particularly about 2 nm to about 9 nm.

The critical dimension of the transfer openings (e.g., diameter k" of FIG. 1G, FIG. 2G, and FIG. 82G, width v" of FIG. 3G) can have a value in the range of about 2 nm to about 40 nm, about 2 nm to about 20 nm, about 2 nm to about 15 nm, about 2 nm to about 10 nm, or more particularly about 2 nm to about 9 nm.

Block Copolymers

Herein, random copolymers are indicated by "-co-", or "-r-" in the name. Block copolymers are indicated by "-b-" or "-block-" in the name. Alternating block copolymers are indicated by "-alt-" in the name. Block copolymers can be represented also by "-L'-" between named blocks of the block copolymer, indicating that the blocks are joined by the disclosed L' group.

The block copolymers (BCPs) are linear diblock copolymers having a structure according to formula (A-1):

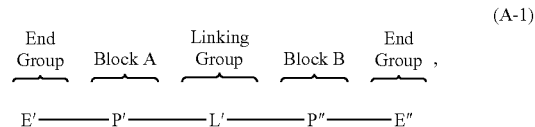

wherein

P' represents a first polymer block (block A) comprising a styrenic repeat unit, P" represents a second polymer block (block B) comprising a repeat unit selected from the group consisting of aliphatic carbonate, aliphatic ester, aliphatic ether, and combinations thereof, E' is a monovalent first end group linked to a peripheral end repeat unit of P', E" is a monovalent second end group linked a peripheral end repeat unit of P", and L' is a single bond or a divalent linking group comprising one or more carbons, wherein L' is covalently linked to a respective end repeat units of P' and P".

More specific styrenic repeat unit have a structure of formula (A-2):

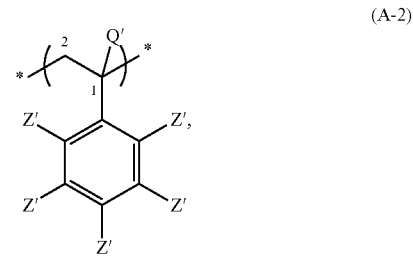

wherein, carbons 1 and 2 are atomic centers of the polymer backbone,

Q' is a monovalent radical selected from group consisting of hydrogen, methyl, and trifluoromethyl, and each Z' is an independent monovalent radical selected from group consisting of hydrogen, chloride, bromide, fluoride, iodide, methyl, t-butyl, methoxy, trimethylsilyl, and trifluoromethyl.

Herein, block A of the BCP is the low surface energy block, and block B (e.g., polycarbonate or polyester block) is the high surface energy block.

In an embodiment, L' comprises 1-25 fluorines.

An atomic center (e.g., carbon 1 or carbon 2 of (A-2) above) that is shown linked to a bond with an asterisk (also referred to herein as a starred bond) indicates the atomic center is covalently linked to another undefined portion of the chemical structure represented by the asterisk (e.g., the asterisk can be an atomic center of another repeat unit or an end group).

In an embodiment, block A comprises a styrene repeat unit, which has the structure:

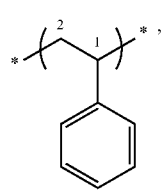

(A-2a)

wherein carbons 1 and 2 of (A-2) are atomic centers of the polymer backbone.

The repeat units of P' and/or P'' are independent and can be stereospecific or non-stereospecific. E', E'', and/or L' are also independent moieties that can be stereospecific or non-stereospecific.

P' can comprise a repeat unit formed by vinyl polymerization of 4-trimethysilyl styrene (TMSS), also referred to as a TMSS repeat unit (A-3):

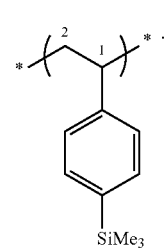

(A-3)

The TMSS repeat units can be present in amounts of 0-55 mol % based on total moles of repeat units of P'.

In an embodiment, P' is a styrene homopolymer (i.e., homopolymer of (A-2)), referred to as a "PS block".

Exemplary aliphatic carbonate repeat units are shown below as structures (A-4) to (A-7).

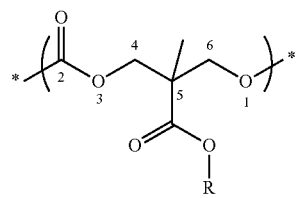

(A-4) R = Me
(A-5) R = Et
(A-6) R = Bz

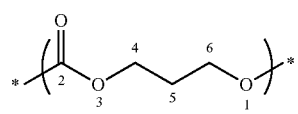

(A-7)

The numbered atomic centers are atomic centers of the polymer backbone.

The aliphatic carbonate repeat units are preferably formed by a ring opening polymerization of an aliphatic cyclic carbonate monomer, as illustrated in Scheme 1.

Scheme 1

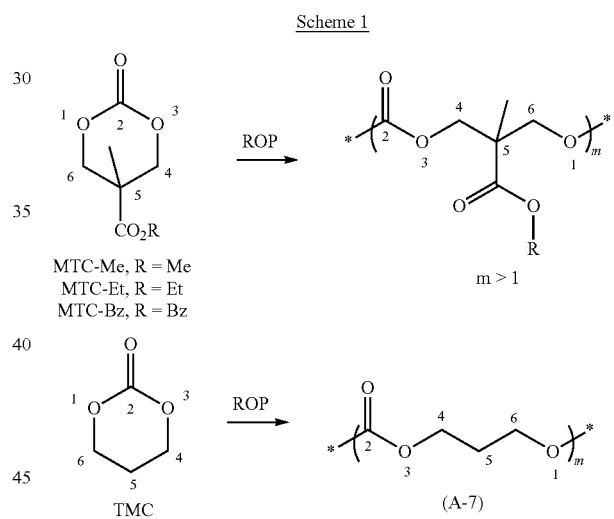

MTC-Me, R = Me
MTC-Et, R = Et
MTC-Bz, R = Bz

TMC (A-7)

The numbered atomic centers of the cyclic carbonate become atomic centers of the block copolymer backbone after the ring opening polymerization, as shown above.

A particularly preferred carbonate repeat unit for block B is (A-4):

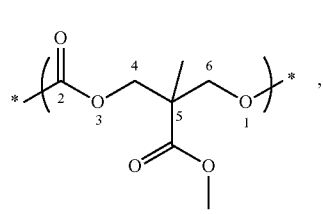

(A-4)

formed by ROP of MTC-Me. In an embodiment, block B is a homopolymer of (A-4), also referred to as PMTC-Me:

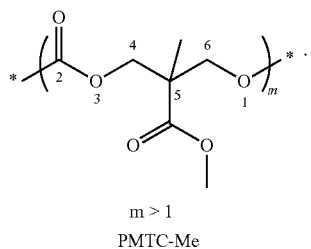

m > 1
PMTC-Me

A particularly preferred aliphatic ester repeat unit is a lactide repeat unit (A-8):

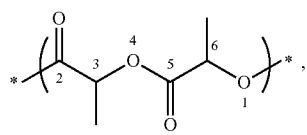

(A-8)

which can be prepared by ring opening polymerization (ROP) of lactide (Scheme 2):

Scheme 2

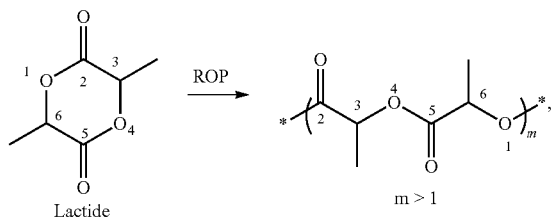

Lactide   m > 1

The numbered atomic centers of lactide become atomic centers of the polymer backbone after the ring opening reaction. The lactide can be in the form of D-lactide, L-lactide, or a mixture thereof (D,L-lactide). Accordingly, the ester repeat unit (A-8) can be stereospecific or non-stereospecific. In an embodiment, block B is a homopolymer of structure (A-8), referred to herein as PLA:

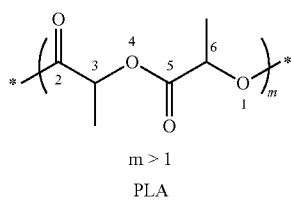

m > 1
PLA

Exemplary aliphatic ether repeat units, which can be prepared by ring opening polymerization (ROP) of cyclic ether monomers, are shown in Scheme 3.

Scheme 3

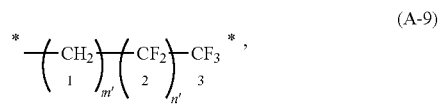

R = H
MeOCH$_2$-*
EtOCH$_2$-*
iPrOCH$_2$-*
PhOCH$_2$-* m > 1

The block copolymer, when disposed in an initial opening of a pre-pattern, is capable of self-assembly to form a domain pattern having a bulk periodicity (Lo) of less than 100 nm, more preferably less than 20 nm (half-pitch less than 10 nm). The critical dimension uniformity of the domain pattern can be substantially improved relative to poly(styrene)-b-poly(methyl methacrylate) block copolymer (PS-b-PMMA).

Block A and block B are covalently joined by respective end repeat units to divalent linking group L' (also referred to herein as a junction group) that can optionally comprise 1-25 fluorines. Preferably, L' is a low surface energy group that provides orientation control of phase-segregated domains formed during self-assembly of the block copolymer. The fluorines can be linked to carbons of the polymer backbone of L' and/or to a side chain of L' that is pendent to the block copolymer backbone. Preferably, L' is a non-charged group. Preferably, L' has a lower surface energy than each block of the block copolymer. More particularly, L' can have a surface energy of 0 to 30 mN/m.

As non-limiting examples of fluorinated groups, L' can comprise a fluorinated alkyl group of formula (A-9):

(A-9)

$$*\text{-}(\text{CH}_2)_{m'}(\text{CF}_2)_{n'}\text{-CF}_3 \text{*},$$

wherein
n' is an integer having a value of 0-11, and
m' is an integer having a value of 1-5.
The numbered carbons of formula (A-9) reside in a side chain pendent to the polymer backbone.

Other L' groups can comprise a fluorinated alkylene group of formula (A-10):

(A-10)

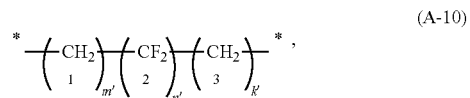

wherein
n' is an integer having a value of 1-12,
m' is an integer having a value of 1-5, and
k' is an integer having a value of 1-5.
The numbered carbons of (A-10) can be atomic centers of the polymer backbone or centers of a side chain pendent to the backbone.

Other L' groups comprise a divalent linear fluorinated ethylene oxide group in accordance with formula (A-11):

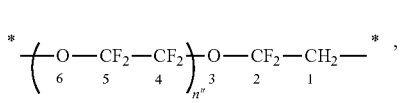 (A-11)

wherein n" is an integer having a value of 1-5.

The numbered atomic centers of (A-11) can be atomic centers of the polymer backbone or centers of a side chain pendent to the backbone.

Exemplary L' groups include those of Scheme 4. Subscripts a and z are positive integers, and atomic centers of the polymer backbone are numbered.

Scheme 4 single bond (*-*)

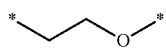

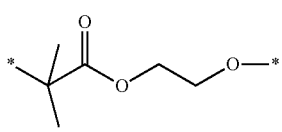

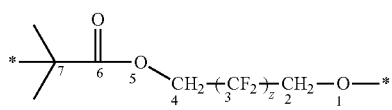

z = 1-12

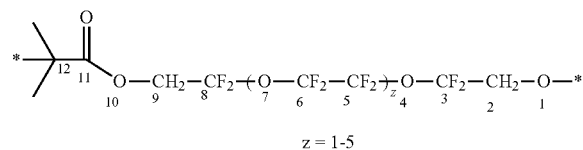

z = 1-5

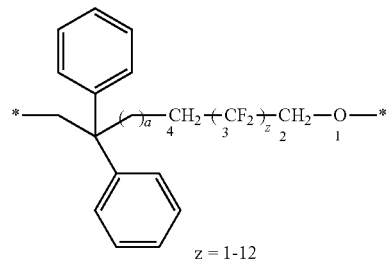

z = 1-12
a = 0-5

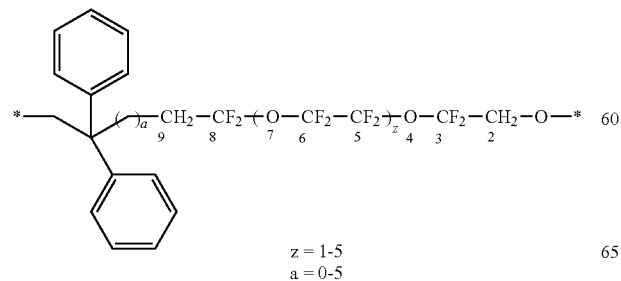

z = 1-5
a = 0-5

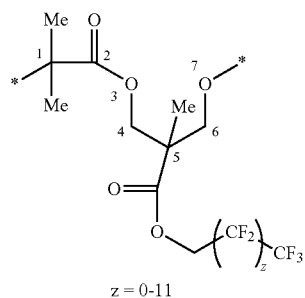

z = 0-11

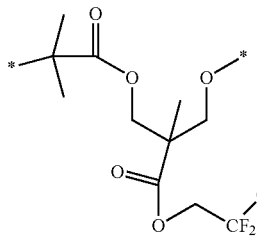

z = 1-5

L' preferably comprises 6-20 fluorines, and even more preferably 10-20 fluorines. In an embodiment, L' comprises 12-20 fluorines. In another embodiment, L' is selected from the group consisting of:

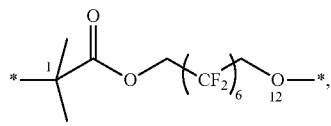

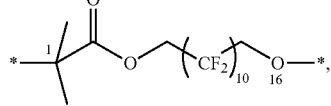

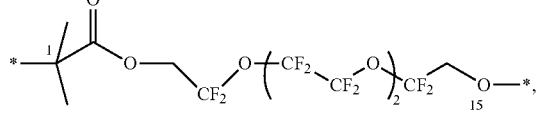

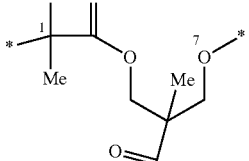

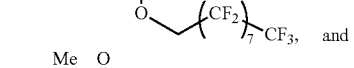, and

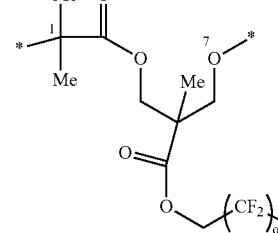

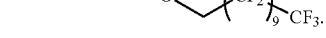.

The carbon shown linked to an asterisk can be linked to block A, and the oxygen shown linked to an asterisk can be linked to block B.

End groups E' and E" can be any suitable end groups. For example, E' and/or E" can be a hydrogen, a halide (e.g., fluoride, chloride, bromide, iodide), an alcohol hydroxyl group, a hydrocarbyl group (e.g., methyl, ethyl, benzyl, phenyl), an acyl group (e.g., acetyl, propionyl, benzoyl), an alkoxy group (e.g., methoxy, ethoxy), or another carbon bearing group.

Non-limiting examples of the diblock copolymers for forming interconnects include those of Scheme 5. In these examples, L' is linked to backbone carbon 2 of a styrene repeat unit, and the bromide end group is linked to carbon 1 of another styrene repeat unit.

Scheme 5

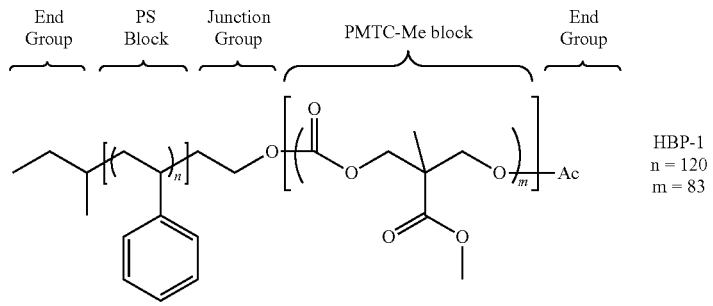

HBP-1
n = 120
m = 83

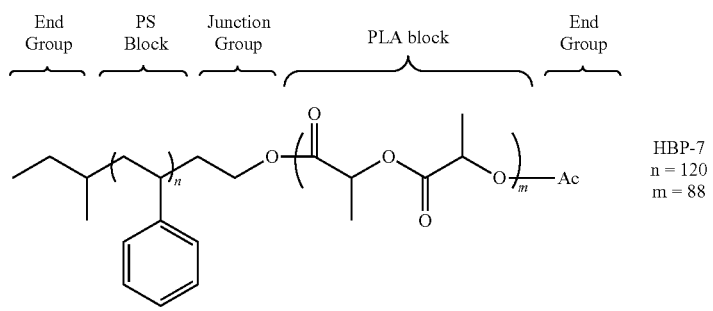

HBP-7
n = 120
m = 88

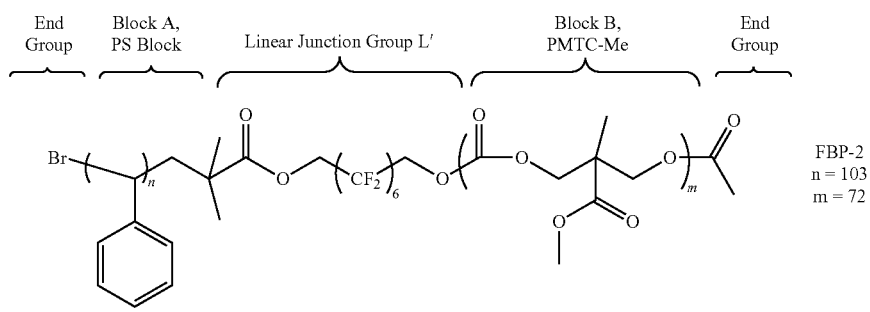

FBP-2
n = 103
m = 72

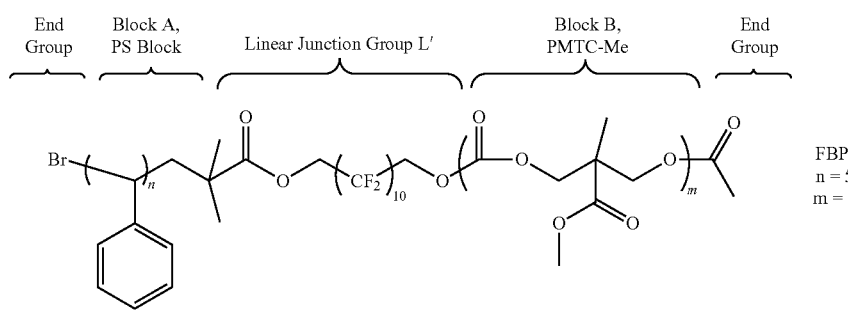

FBP-3
n = 58
m = 37

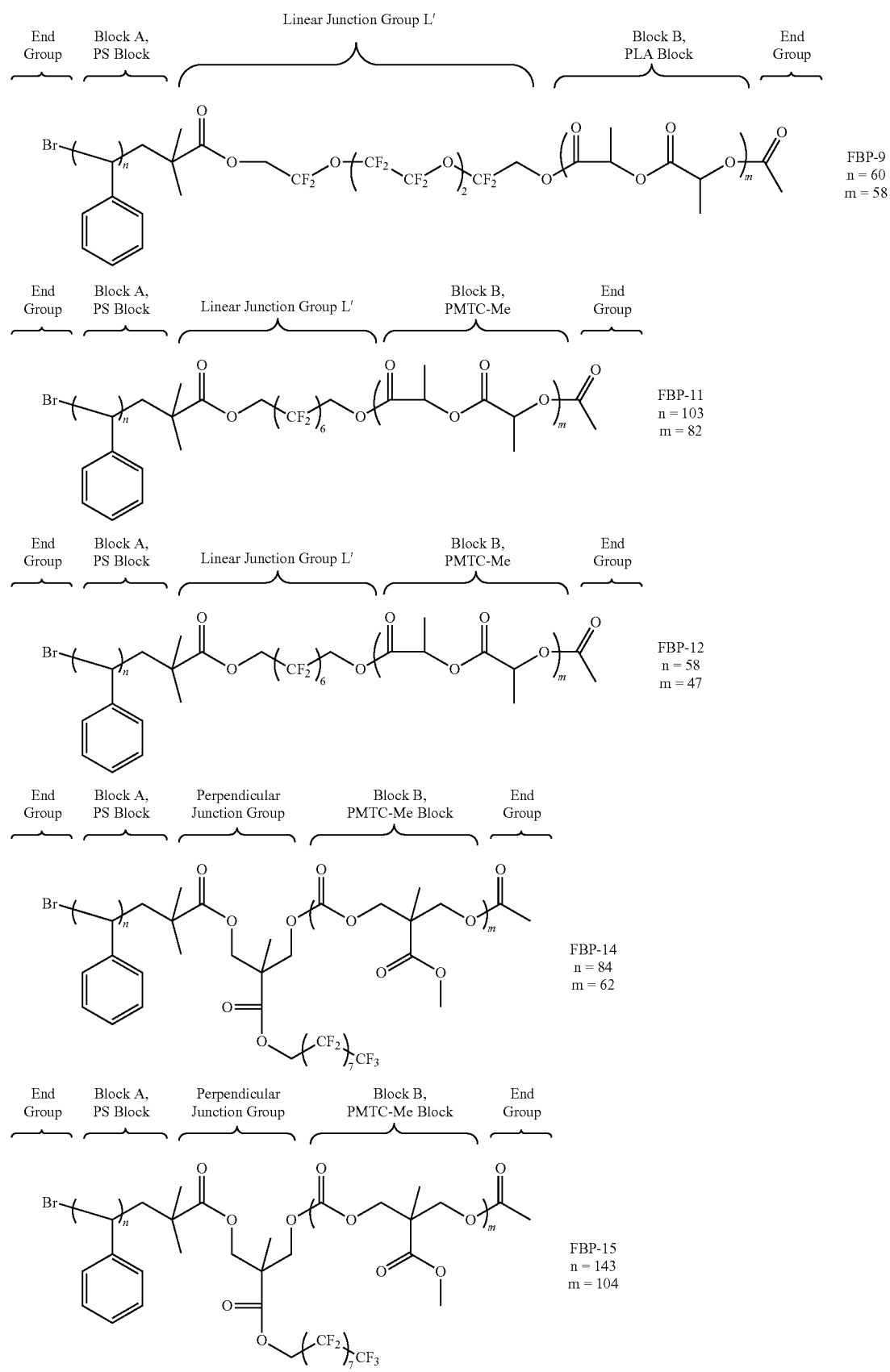

The SA layer containing the BCP, which is located in the initial openings, is capable of self-assembling to form a phase-segregated domain pattern in the initial openings. The domain pattern comprises a more etch-resistant domain comprising block A (P', styrene-containing block), and a domain comprising a block B (P', polycarbonate or polyester block), which can be selectively removed in the presence of the block A domain. The volume fractions of the blocks of the BCP are preferably in a ratio conducive to formation of lamellae.

The BCP has a block-to-block Flory Huggins interaction parameter (chi parameter) that is higher than the chi parameter of poly(styrene)-b-poly(methyl methacrylate) (PS-b-PMMA)).

The BCP can have a number average molecular weight (Mn) of 5000 to 50000, more preferably 5000 to 40000, and most preferably 7000 to 40000 based on gel permeation chromatography (GPC) of the BCP.

The BCP can have a weight average molecular weight (Mw) of 6000 to 60000, more preferably 10000 to 50000, and most preferably 10000 to 40000 based on gel permeation chromatography (GPC) of the BCP.

The BCP can have a polydispersity index (PDI) generally from 1.0 to 3.0, more particularly 1.0 to 2.0, and even more particularly 1.0 to 1.2. In the examples further below, the PDI is in the range of 1.01 to 1.16 (Table 8).

Block A can comprise 10-150, more preferably 10-120, and most preferably 10-100 styrene repeat units and optionally TMSS repeat units.

Preferably, Block B comprises 10-150, more preferably 10-100, and most preferably 10-80 carbonate repeat units of MTC-Me or ester repeat units of lactide.

In the examples further below (Table 8), the number average molecular weight (Mn) of the BCP is in the range of 10800 to 31600 as determined by GPC, and the weight average molecular weight (Mw) of the BCP is in the range of 11600 to 33700 as determined by GPC. The Mn of the low surface energy block A of the macroinitiator used to form the BCP is in the range of 4200 to 15600 as determined by GPC, and the Mn of the high surface energy block B (PMTC-Me or PLA) is in the range of 2850 to 18100, as determined by $^{1}$H NMR analysis.

Preparation of the Block Copolymers

The BCP can be produced using any suitable polymerization technique, including but not limited to free radical polymerization, anionic polymerization, cationic polymerization, atom transfer radical polymerization (ATRP), nitroxide mediated polymerization (NMP), reversible addition-fragmentation chain transfer (RAFT) polymerization, and/or ring opening polymerizations.

In a preferred embodiment, block B is prepared by a ring opening polymerization (ROP) of a cyclic carbonyl monomer (e.g., MTC-Me or lactide) using a ROP polymeric initiator (ROP macroinitiator).

Initiators for ring opening polymerizations generally include nucleophilic groups such as alcohols, primary amines, secondary amines, and thiols. The ROP polymeric initiator comprises i) block A of the block copolymer and ii) an L' precursor group comprising nucleophilic group (e.g., an alcohol group) capable of initiating a ROP of the cyclic carbonyl monomer.

The ROP polymeric initiator can be produced using any suitable polymerization technique, including but not limited to free radical polymerization, anionic polymerization, cationic polymerization, atom transfer radical polymerization (ATRP), nitroxide mediated polymerization (NMP), and/or reversible addition-fragmentation chain transfer (RAFT) polymerization.

Scheme 6 illustrates the formation of ROP macroinitiator PSI-11 of Example 20 further below using ATRP-6 (an ATRP initiator containing an L' precursor group), catalyst CuBr/PMDETA, and monomer styrene.

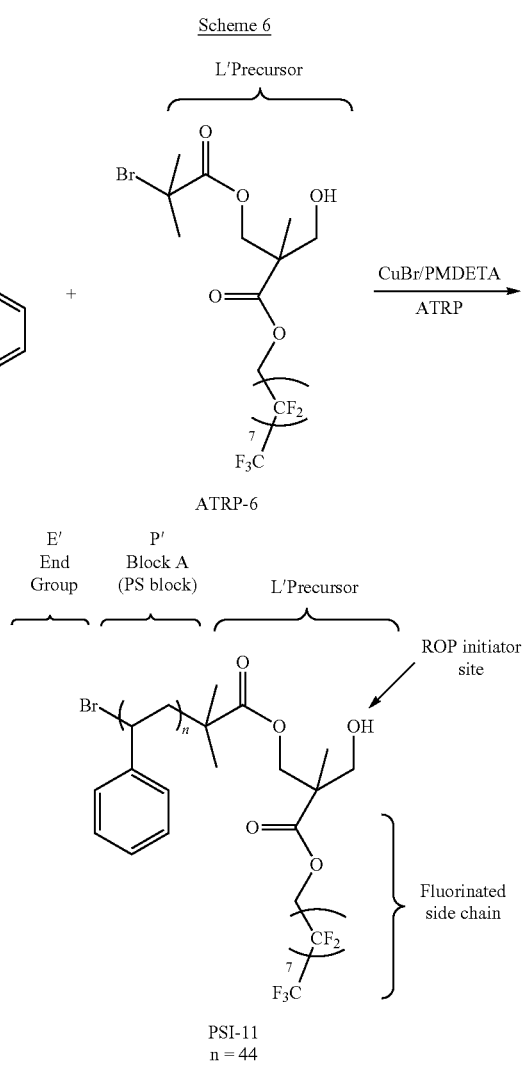

Other ATRP initiators (L' precursor compounds) include those of Scheme 7, where z is a positive integer.

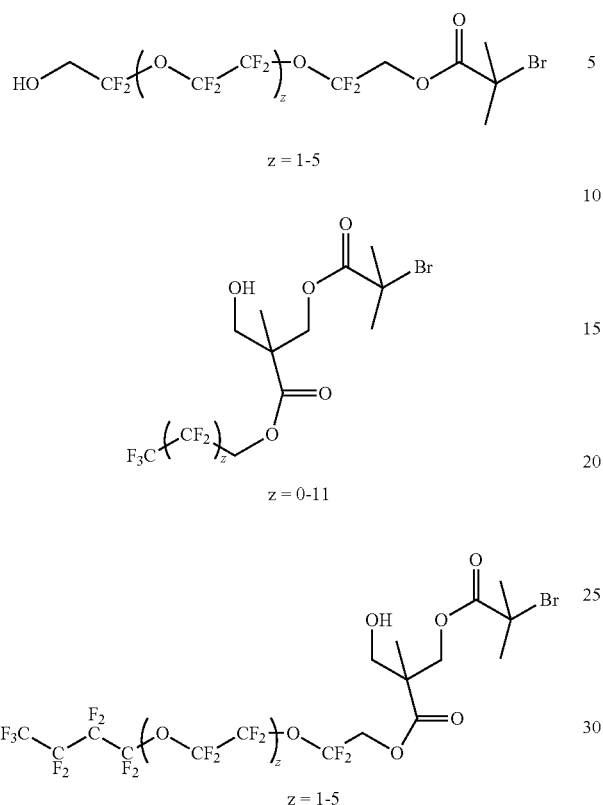

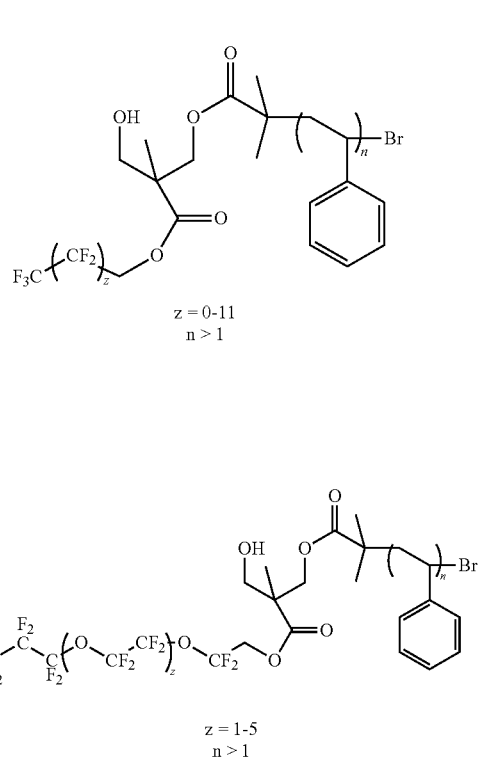

The above ATRP initiator compounds can be prepared by the reaction of the corresponding fluorinated monol or diol with 2-bromo-isobutyryl bromide, as shown in the examples further below.

Exemplary non-limiting ROP macroinitiators, which can be prepared by ATRP, include those shown in Scheme 8, where z is a positive integer.

Other ROP macroinitiators can be prepared by anionic polymerization of a vinyl polymerizable monomers as illustrated in Scheme 9, where z and k are positive integers.

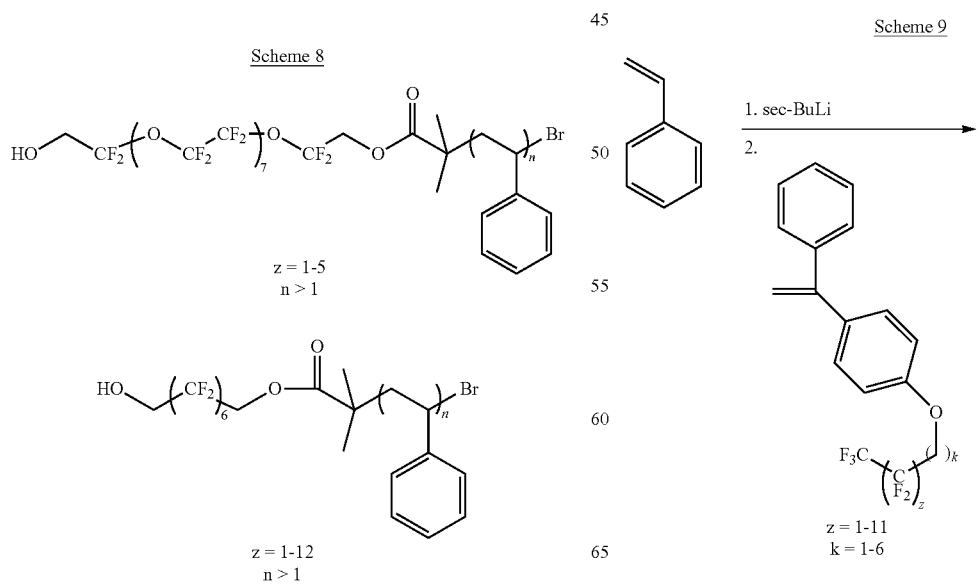

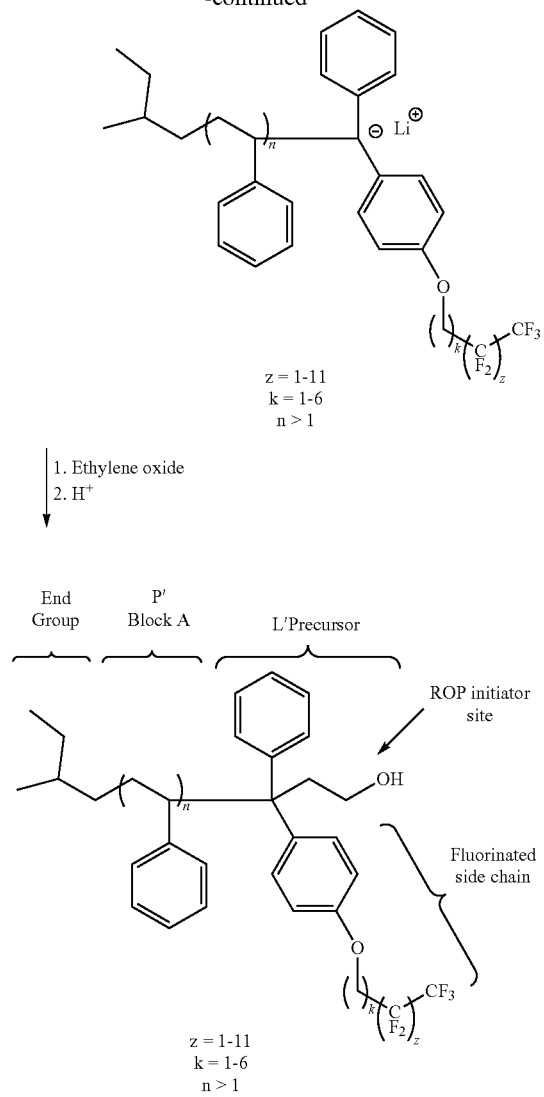

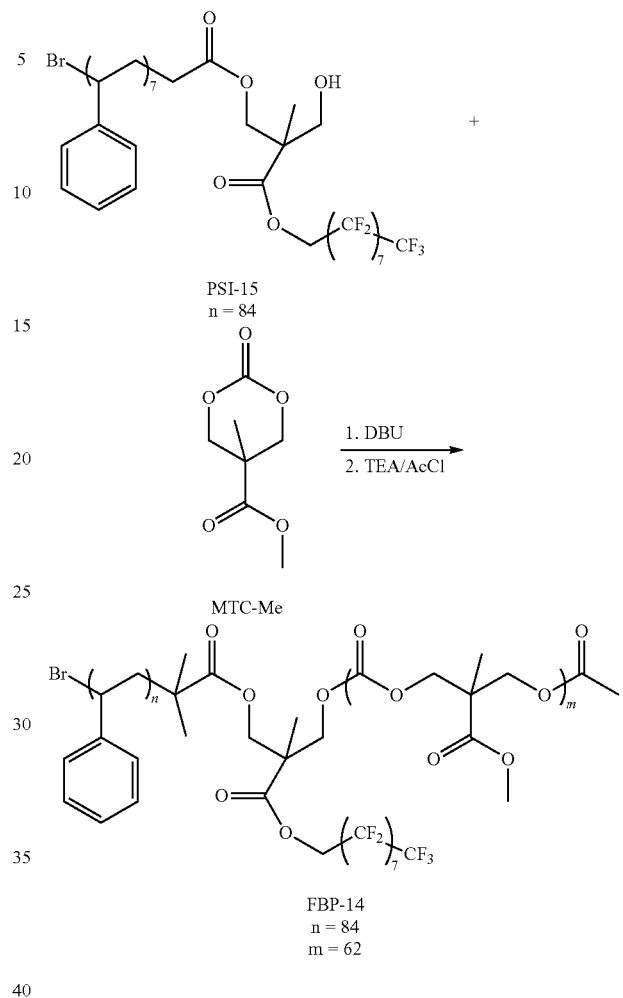

In this instance, the reaction utilizes a fluorinated diphenylethylene as a chain terminating agent of the polymerization. The resulting polymeric anion is treated with ethylene oxide and a protonic acid to form the ROP macroinitiator. The alcohol hydroxy group of the resulting polymer is an initiating site for ring opening polymerization of the cyclic carbonyl monomer.

The number average molecular weight Mn of the ROP macroinitiator can be about 500 to about 50,000, more specifically about 1000 to about 35,000.

The ROP reaction mixture comprises MTC-Me, a ROP catalyst, a solvent, and a ROP macroinitiator. The ROP catalyst can be a base or acid catalyst (e.g., 1,8-diazabicyclo[5.4.0]undec-7-ene (DBU), diphenyl phosphate (DPP)).

Scheme 10 illustrates the preparation of fluorinated block copolymer FBP-14 using ROP poly(styrene) initiator PSI-17, cyclic carbonyl monomer MTC-Me, and ROP base catalyst (DBU). Following the ROP, the initial block copolymer is endcapped with an acetyl group using acetyl chloride (AcCl)/triethylamine (TEA).

The initial block copolymer formed can be endcapped using any suitable end group, with the proviso the endcap group does not adversely affect self-assembly. The bromide end group can be removed (substituted) using known standard techniques if desired.

Ring Opening Polymerizations (ROP)

The following is a general description of methods, conditions and materials for ring opening polymerizations of cyclic carbonyl monomers, in particular cyclic carbonate monomer. The methods and conditions for preparing and purifying a diblock copolymer comprising a carbonate repeat unit provide a block copolymer that is substantially free of any polycarbonate polymer not connected to block A.

The cyclic carbonate monomer can be purified by recrystallization from a solvent such as ethyl acetate or by other known methods of purification, with particular attention being paid to removing as much water as possible from the monomer.

The ring-opening polymerization can be performed at a temperature that is about ambient temperature or higher, 15° C. to 100° C., and more specifically ambient temperature. Reaction times vary with solvent, temperature, agitation rate, pressure, and equipment, but in general the polymerizations are complete within about 1 hour to about 48 hours.

The ROP reaction can be performed with or without the use of a solvent, preferably with a solvent. Exemplary solvents include dichloromethane, chloroform, benzene, toluene, xylene, chlorobenzene, dichlorobenzene, benzotrifluoride, petroleum ether, acetonitrile, pentane, hexane, heptane, 2,2,4-trimethylpentane, cyclohexane, diethyl ether, t-butyl methyl ether, diisopropyl ether, dioxane, tetrahydrofuran, or a combination comprising one of the foregoing solvents. When a solvent is present, a suitable monomer concentration is about 0.1 to 5 moles per liter, and more particularly about 0.2 to 4 moles per liter.

The ROP polymerizations are conducted using an inert (i.e., dry) atmosphere, such as nitrogen or argon, and at a pressure of from 100 to 500 MPa (1 to 5 atm), more typically at a pressure of 100 to 200 MPa (1 to 2 atm). At the completion of the reaction, the solvent can be removed using reduced pressure.

ROP Catalysts

No restriction is placed on the ROP catalyst. Less preferred catalysts for the ROP polymerization include metal oxides such as tetramethoxy zirconium, tetra-iso-propoxy zirconium, tetra-iso-butoxy zirconium, tetra-n-butoxy zirconium, tetra-t-butoxy zirconium, triethoxy aluminum, tri-n-propoxy aluminum, tri-iso-propoxy aluminum, tri-n-butoxy aluminum, tri-iso-butoxy aluminum, tri-sec-butoxy aluminum, mono-sec-butoxy-di-iso-propoxy aluminum, ethyl acetoacetate aluminum diisopropylate, aluminum tris(ethyl acetoacetate), tetraethoxy titanium, tetra-iso-propoxy titanium, tetra-n-propoxy titanium, tetra-n-butoxy titanium, tetra-sec-butoxy titanium, tetra-t-butoxy titanium, tri-iso-propoxy gallium, tri-iso-propoxy antimony, tri-iso-butoxy antimony, trimethoxy boron, triethoxy boron, tri-iso-propoxy boron, tri-n-propoxy boron, tri-iso-butoxy boron, tri-n-butoxy boron, tri-sec-butoxy boron, tri-t-butoxy boron, tri-iso-propoxy gallium, tetramethoxy germanium, tetraethoxy germanium, tetra-iso-propoxy germanium, tetra-n-propoxy germanium, tetra-iso-butoxy germanium, tetra-n-butoxy germanium, tetra-sec-butoxy germanium and tetra-t-butoxy germanium; halogenated compounds such as antimony pentachloride, zinc chloride, lithium bromide, tin(IV) chloride, cadmium chloride and boron trifluoride diethyl ether; alkyl aluminum such as trimethyl aluminum, triethyl aluminum, diethyl aluminum chloride, ethyl aluminum dichloride and tri-iso-butyl aluminum; alkyl zinc such as dimethyl zinc, diethyl zinc and diisopropyl zinc; tertiary amines such as triallylamine, triethylamine, tri-n-octylamine and benzyldimethylamine; heteropolyacids such as phosphotungstic acid, phosphomolybdic acid, silicotungstic acid and alkali metal salts thereof; zirconium compounds such as zirconium acid chloride, zirconium octanoate, zirconium stearate and zirconium nitrate. More particularly, the zirconium catalyst can be zirconium octanoate, tetraalkoxy zirconium or a trialkoxy aluminum compound.

Preferred ROP catalysts are organocatalysts whose chemical formulas contain no metal. Base organocatalysts for ROPs of cyclic carbonyl monomers include tertiary amines such as triallylamine, triethylamine, tri-n-octylamine and benzyldimethylamine 4-dimethylaminopyridine (DMAP), phosphines, N-heterocyclic carbenes (NHC), bifunctional aminothioureas, phosphazenes, amidines, and guanidines.

Other ROP catalysts include thiourea organocatalysts N-bis(3,5-trifluoromethyl)phenyl-N'-cyclohexyl-thiourea (TU):

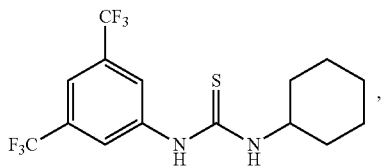

and bis-thiourea

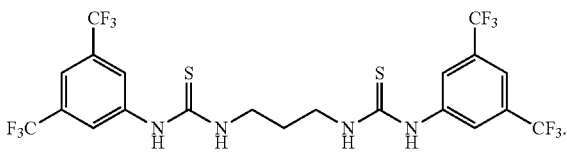 [SMILES: FC(F)(F)c1cc(NC(=S)NCCCNC(=S)Nc2cc(C(F)(F)F)cc(C(F)(F)F)c2)cc(C(F)(F)F)c1]

Other ROP organocatalysts comprise at least one 1,1,1,3,3,3-hexafluoropropan-2-ol-2-yl (HFA) group. Singly-donating hydrogen bond catalysts have the formula (E-1):

$$R^2\text{---}C(CF_3)_2OH \tag{E-1}$$

wherein $R^2$ represents a hydrogen or a monovalent radical having from 1 to 20 carbons, for example an alkyl group, substituted alkyl group, cycloalkyl group, substituted cycloalkyl group, heterocycloalkyl group, substituted heterocycloalklyl group, aryl group, substituted aryl group, or a combination thereof. Exemplary singly-donating hydrogen bonding catalysts are listed in Scheme 11

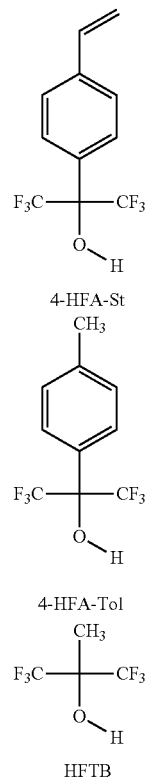

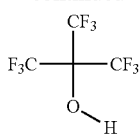

NFTB

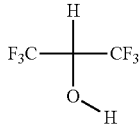

HFIP

Doubly-donating hydrogen bonding catalysts have two HFA groups, represented by the general formula (E-2):

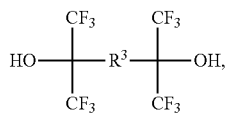

(E-2)

wherein R³ is a divalent radical bridging group containing from 1 to 20 carbons, such as an alkylene group, a substituted alkylene group, a cycloalkylene group, substituted cycloalkylene group, a heterocycloalkylene group, substituted heterocycloalkylene group, an arylene group, a substituted arylene group, or a combination thereof. Representative double hydrogen bonding catalysts of formula (E-2) include those listed in Scheme 12. In a specific embodiment, R² is an arylene or substituted arylene group, and the HFA groups occupy positions meta to each other on the aromatic ring.

Scheme 12

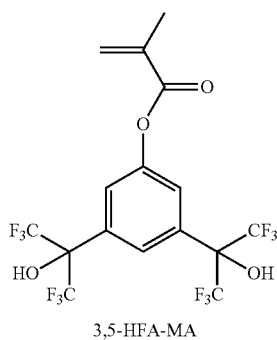

3,5-HFA-MA

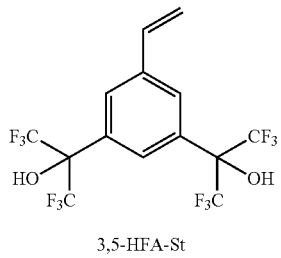

3,5-HFA-St

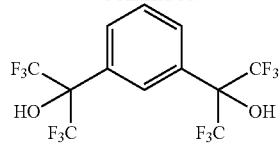

1,3-HFAB

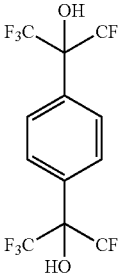

1,4-HFAB

Preferred hydrogen bonding catalysts include 4-HFA-St, 4-HFA-Tol, HFTB, NFTB, HPIP, 3,5-HFA-MA, 3,5-HFA-St, 1,3-HFAB, 1,4-HFAB, and combinations thereof The HFA catalyst can be bound to a support. In one embodiment, the support comprises a polymer, a crosslinked polymer bead, an inorganic particle, or a metallic particle. HFA-containing polymers can be formed by known methods including direct polymerization of an HFA-containing monomer (for example, the methacrylate monomer 3,5-HFA-MA or the styryl monomer 3,5-HFA-St). Functional groups in HFA-containing monomers that can undergo direct polymerization (or polymerization with a comonomer) include acrylate, methacrylate, alpha, alpha, alpha-trifluoromethacrylate, alpha-halomethacrylate, acrylamido, methacrylamido, norbornene, vinyl, vinyl ether, and other groups known in the art. Examples of linking groups include $C_1$-$C_{12}$ alkyl groups, $C_1$-$C_{12}$ heteroalkyl groups, ether groups, thioether groups, amino groups, ester groups, amide groups, and combinations thereof. Also contemplated are catalysts comprising charged HFA-containing groups bound by ionic association to oppositely charged sites on a polymer or a support surface.

Other ROP catalysts include acid organocatalysts (e.g., diphenylphosphate (DPP), triflic acid, and the like).

The ROP reaction mixture comprises at least one ROP catalyst and, when appropriate, several ROP catalysts together. The ROP catalyst is added in a proportion of 1/20 to 1/40,000 moles relative to the cyclic carbonyl monomers, and preferably in a proportion of 1/1,000 to 1/20,000 moles relative to the cyclic carbonyl monomers.

ROP Accelerators

The ROP polymerization can be conducted in the presence of an optional accelerator, in particular a nitrogen base. Exemplary nitrogen base accelerators are listed below and include pyridine (Py), N,N-dimethylaminocyclohexane (Me₂NCy), 4-N,N-dimethylaminopyridine (DMAP), trans 1,2-bis(dimethylamino)cyclohexane (TMCHD), 1,8-diazabicyclo[5.4.0]undec-7-ene (DBU), 1,5,7-triazabicyclo[4.4.0]dec-5-ene (TBD), 7-methyl-1,5,7-triazabicyclo[4.4.0]dec-5-ene (MTBD), (−)-sparteine, (Sp) 1,3-bis(2-propyl)-4,5-dimethylimidazol-2-ylidene (Im-1), 1,3-bis(2,4,6-trimethylphenyl)imidazol-2-ylidene (Im-2), 1,3-bis(2,6-di-i-propylphenyl(imidazol-2-ylidene (Im-3), 1,3-bis(1-adamantyl)imidazol-2-ylidene (Im-4), 1,3-di-i-propylimidazol-2-ylidene (Im-5), 1,3-di-t-butylimidazol-2- ylidene (Im-6), 1,3-bis(2,4,6-trimethylphenyl)-4,5-dihydroimidazol-2-ylidene (Im-7), 1,3-bis(2,6-di-i-propylphenyl)-4,5-dihydroimidazol-2-ylidene, 1,3-bis(2,6-di-i-propylphenyl)-4, 5-dihydroimidazol-2-ylidene (Im-8) or a combination thereof, shown in Scheme 13.

Scheme 13

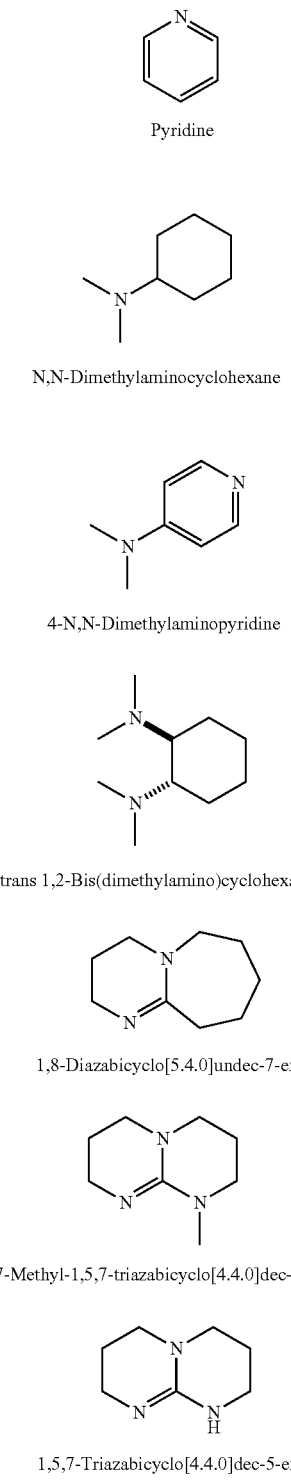

Pyridine (Py)

N,N-Dimethylaminocyclohexane (Me2NCy)

4-N,N-Dimethylaminopyridine (DMAP)

trans 1,2-Bis(dimethylamino)cyclohexane (TMCHD)

1,8-Diazabicyclo[5.4.0]undec-7-ene (DBU)

7-Methyl-1,5,7-triazabicyclo[4.4.0]dec-5-ene (MTBD)

1,5,7-Triazabicyclo[4.4.0]dec-5-ene (TBD)

-continued

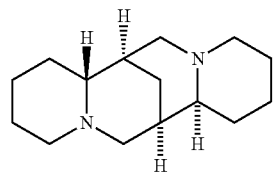

(-)-Sparteine (Sp)

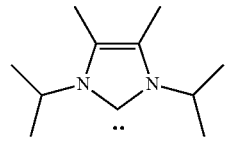

1,3-Bis(2-propyl)-4,5-dimethylimidazol-2-ylidene (Im-1)

1,3-Bis(2,4,6-trimethylphenyl)imidazol-2-ylidene (Im-2)

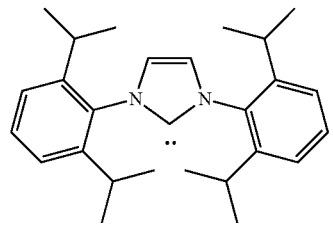

1,3-Bis(2,6-di-i-propylphenyl)imidazol-2-ylidene (Im-3)

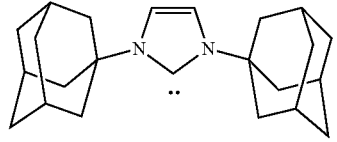

1,3-Bis(1-adamantyl)imidazol-2-yliden (Im-4)

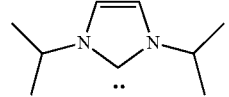

1,3-Di-i-propylimidazol-2-ylidene (Im-5)

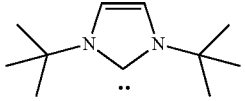

1,3-Di-t-butylimidazol-2-ylidene (Im-6)

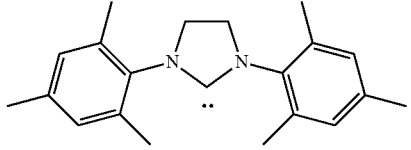

1,3-Bis(2,4,6-trimethylphenyl)-4,5-dihydroimidazol-2-ylidene (Im-7)

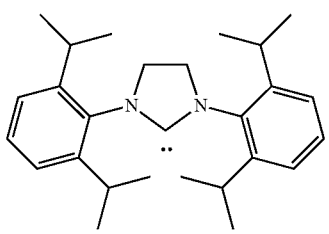

1,3-Bis(2,6-di-i-propylphenyl)-4,5-dihydroimidazol-2-ylidene (Im-8)

In an embodiment, the accelerator has two or three nitrogens, each capable of participating as a Lewis base, as for example in the structure (−)-sparteine. Stronger bases generally improve the polymerization rate.

The catalyst and the accelerator can be the same material. For example, some ring opening polymerizations can be conducted using 1,8-diazabicyclo[5.4.0]undec-7-ene (DBU) alone, with no another catalyst or accelerator present.

The catalyst is preferably present in an amount of about 0.2 to 20 mol %, 0.5 to 10 mol %, 1 to 5 mol %, or 1 to 2.5 mol %, based on total moles of cyclic carbonyl monomer.

The nitrogen base accelerator, when used, is preferably present in an amount of 0.1 to 5.0 mol %, 0.1 to 2.5 mol %, 0.1 to 1.0 mol %, or 0.2 to 0.5 mol %, based on total moles of cyclic carbonyl monomer. As stated above, in some instances the catalyst and the nitrogen base accelerator can be the same compound, depending on the particular cyclic carbonyl monomer.

The amount of ROP initiator is calculated based on the equivalent molecular weight per nucleophilic initiator group in the nucleophilic initiator. The initiator groups are preferably present in an amount of 0.001 to 10.0 mol %, 0.1 to 2.5 mol %, 0.1 to 1.0 mol %, and 0.2 to 0.5 mol %, based on total moles of cyclic carbonyl monomer. For example, if the molecular weight of the initiator is 100 g/mole and the initiator has 2 hydroxyl groups, the equivalent molecular weight per hydroxyl group is 50 g/mole. If the polymerization calls for 5 mol % hydroxyl groups per mole of monomer, the amount of initiator is 0.05×50=2.5 g per mole of monomer.

In a specific embodiment, the catalyst is present in an amount of about 0.2 to 20 mol %, the nitrogen base accelerator is present in an amount of 0.1 to 5.0 mol %, and the nucleophilic initiator groups of the initiator are present in an amount of 0.1 to 5.0 mol % based on the equivalent molecular weight per nucleophilic initiator group of the initiator.

The catalysts can be removed by selective precipitation or in the case of the solid supported catalysts, simply by filtration. The block copolymer can comprise residual catalyst in an amount of 0 wt % (weight percent) or more, based on total weight of the block copolymer and the residual catalyst. The amount of residual catalyst can also be less than 20 wt %, less than 15 wt %, less than 10 wt %, less than 5 wt %, less than 1 wt %, or most specifically less than 0.5 wt % based on the total weight of the block copolymer and the residual catalyst.

Endcap Agents

An endcap agent can prevent further chain growth and stabilize the reactive end groups from unwanted side reactions, such as chain scission. Endcap agents include, for example, compounds for converting terminal hydroxyl groups to esters, such as acid anhydrides (e.g., acetic anhydride), acid chlorides (acetyl chloride), and/or active esters (e.g., p-nitrophenyl esters). Other endcap agents include alkyl and aryl isocyanates, which form carbamates (urethanes) in reactions with terminal hydroxy groups. Other endcap agents include alkylating agents capable of forming alkyl ethers, aromatic ethers including benzyl ethers, silyl ethers, acetals, ketals, and the like. Still other endcap agents include perhalogenated (e.g., perfluorinated) derivatives of any of the foregoing endcap agents. In an embodiment, the endcap agent is acetic anhydride, which converts reactive hydroxy end groups to acetate ester groups.

The following sections describe different methods of purification of the diblock polymer.

Method 1

This method utilizes a solvent mixture to fractionate an initial diblock copolymer formed when the ROP is conducted for a duration time corresponding to about 50% to 100%, more particularly about 85% to 100% consumption of a cyclic carbonate monomer and/or a cyclic ester monomer. For a given set of reaction conditions (e.g., temperature, solvent, type of atmosphere, relative molar amounts, and other reaction parameters), the consumption of the cyclic carbonate monomer can be monitored using any suitable analytical technique (e.g., proton nuclear magnetic resonance ($^1$H NMR)).

The ROP produces an initial block copolymer containing a living end group (e.g., hydroxy group), which is a nucleophilic group capable of undergoing further chain growth and/or initiating a ROP of a different cyclic carbonyl monomer. Preferably, the active living end group is deactivated by addition of an endcapping agent to the reaction mixture, thereby terminating the polymerization and forming an endcapped initial block copolymer containing a protected nucleophilic end group. The endcapped initial block copolymer is not capable of initiating a ROP. As an example, a polycarbonate formed by ROP of a cyclic carbonate monomer has a living end containing a nucleophilic hydroxy group, which can be deactivated by addition of a suitable acylating agent (e.g., acetyl chloride, acetic anhydride) to form a protected hydroxy group (e.g., as an acetyl ester) as described above.

The isolated initial block copolymer or the endcapped initial block copolymer ("crude block copolymer") can contain polymeric impurities derived from the cyclic carbonyl monomer that are not covalently linked to the polymeric initiator. Polymeric impurities can include polycarbonate homopolymer initiated by traces of water, and cyclic polycarbonate formed by backbiting of the living hydroxy end group on the polycarbonate backbone of the initial block copolymer. These impurities can adversely affect the self-assembly properties of the initial block copolymer.

The polymeric impurities can be removed by the following fractionation process. A first solution is prepared containing the initial block copolymer dissolved in a minimal amount of a solvent (e.g., THF) capable of dissolving each block of the block copolymer. The first solution contains the initial block copolymer at a concentration of about 20 wt % based on total weight of the first solution. The first solution is then added to an excess amount (about 200 to 400 times the amount of crude polymer by weight) of a solvent mixture comprising a first solvent and a second solvent in a volume ratio of about 40:60 to about 60:40, respectively, wherein the first solvent is a non-solvent for the first block and the second block, and the second solvent is a non-solvent for the first block and a solvent for the second block. In an embodiment, the first solvent is MeOH and the second solvent is acetonitrile. The solvent mixture selectively dissolves the polymeric impurities, allowing the final block copolymer to precipitate as a solid that can be substantially free of the polymeric impurities. The fractionation procedure can be repeated one or more times as necessary to form the block copolymer used for self-assembly applications.

Method 2

In a second method, a trial ROP is performed using the given set of reaction conditions that includes the ROP polymeric initiator. The amount of consumed cyclic carbonyl monomer is monitored (e.g., % consumption) as a function of ROP duration time t as in Method 1, allowing the ROP to proceed to 85% to 100% consumption of the cyclic carbonyl monomer. A graph is plotted of the percent consumption of the cyclic carbonate as a function of ROP duration time t in minutes.

From the scatter plot of the collected data points, a second order polynomial function F(t) (i.e., a trendline) can be fitted to the plotted points, wherein F(t) expresses the amount of consumed cyclic carbonyl monomer as a function of ROP duration time t. The $R^2$ (R-squared) coefficient for F(t) preferably has a value of about 0.85 to 1.0, more preferably 0.9 to 1.0.

Using the expression of F(t), a time $t_1$ corresponding to 50% consumption of the cyclic carbonyl monomer can be calculated.

The first derivative of F(t), denoted F'(t), is then calculated for each measurement time t.

The value of F'(t) at 50% cyclic monomer conversion is then determined. Using the value of F'($t_1$) at 50% cyclic monomer conversion, ROP duration times $t_2$ and $t_3$ are determined corresponding to a slope change of −10% and -20% relative to the slope at 50% consumption of cyclic carbonyl monomer.

The ROP is then conducted using the given reaction conditions, stopping the ROP at duration time (t'), wherein $t_1 \leq t' \leq t_3$, and more preferably $t_2 \leq t' \leq t_3$. Using these modified reaction conditions, a block copolymer for self-assembly can be obtained directly that is free of, or substantially free of, polymer impurities that do not comprise a block derived from the polymeric initiator. Optionally, the block copolymer can be further treated with the solvent mixture as described above under Method 1 to remove any remaining polymeric impurities.

Method 3

In Method 3, the mathematical expression for F'(t) is obtained as described above under Method 2. The value of F'(t) is then calculated for each ROP duration time t. Using the values of F'(t), the change in F'(t) between adjacent ROP duration times is calculated for each ROP duration time greater than 0. For example, the change in F'(t) at duration time $t_n$, denoted as F'($t_n$), is equal to F'($t_n$)–F'($t_{n-1}$), where n is a positive integer and $t_n$>0.

A second order polynomial trendline D(t) is obtained for a scatter plot of F'(t) as a function of t having the shape of an inverted parabola. D(t) has a first derivative D'(t) equal to zero at some ROP duration time t''>0 that is less than the duration time corresponding to 100% consumption of the cyclic carbonyl monomer.

The ROP is repeated using the given reaction conditions, terminating the ROP at 0.8t'' to about t''. The resulting final block copolymer can be free of, or substantially free of, polymer impurities that do not comprise a block derived from the polymeric initiator. Optionally, the block copolymer can be further treated with the solvent mixture as described above under Method 1 to remove any polymeric impurities present.

Surface Modifying Materials

The bottom surface and/or sidewalls of the initial openings can comprise a surface-modifying material for controlling the wetting properties of their respective surfaces. As a non-limiting example, the bottom surface of the initial opening can comprise an organic polymer that can be non-preferential or preferential to the domains of the self-assembled SA material, as opposed to the sidewalls that are preferential to one of the domains.

The bottom surface of the initial opening can be a surface of a substrate layer that inherently possesses the desired wetting properties. Alternatively, the bottom surface of the initial opening can be a modified surface of a resist layer, substrate layer, or etched substrate layer that possesses the desired wetting properties as a result of the surface modification. Substrate layers can include self-assembled monolayers.

The pre-pattern sidewalls are preferential to one domain of the block copolymer. This preferential wetting property of the sidewalls can be inherent to the material (e.g., resist, hardmask) used to make the pre-pattern or can be a result of chemical modification of the sidewall surface (e.g., using a brush polymer).

Surface-modifying materials include homopolymers, random copolymers, and block copolymers. Surface modifying materials can be used singularly or in combination.

The surface modifying material can comprise a hydroxyl group. These materials include hydroxyl-terminated polymers (e.g., hydroxyl-terminated poly(styrene), hydroxyl-terminated poly(styrene-co-methyl methacrylate and blends of hydroxyl-terminated poly(styrene), hydroxyl-terminated poly(methyl methacrylate), and poly(styrene-b-methyl methacrylate)) and hydroxyl-functionalized polymers (e.g., poly(styrene-co-methyl methacrylate-co-2-hydroxyethyl methacrylate)).

Other surface modifying materials include polymers comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly (styrene-co-methyl methacrylate-co-vinyl benzocyclobutane), and poly(alpha-methyl styrene-co-methyl methacrylate)). The reactive polymers can react as a result of thermal or photochemical treatment either alone or in conjunction with an additional crosslinking agent. In particular, a catalytic species such as a strongly acidic species can be used to facilitate reaction. The strongly acidic species can be directly incorporated into the surface modifying material or the solution comprising the surface modifying material. Alternatively, a thermal acid generator or photoacid generator molecule can be used to generate an acidic species as a result of thermal or photochemical treatment, respectively.

Other non-limiting examples of surface modifying materials include materials used in anti-reflection coatings (ARC) layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (e.g., optical properties, surface energy, etch resistance). The polymer components also typically contain a plurality of reactive sites distributed along the polymer for reaction with a crosslinking component.

More specific materials used in ARC layers include poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl endcapped poly(bisphenol A-co-epichlorohydrin), and silicon-containing anti-reflection coating A940 from Shin Etsu. Another more specific surface modifying material comprises poly(styrene-co-epoxydicyclopentadiene methacrylate) random copolymer, P(S-r-EDCPMA):

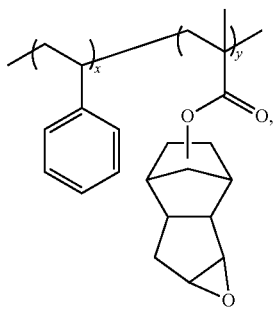

P(S-r-EDCPMSA)

wherein x and y are each integers greater than 1.

Other surface modifying materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI).

Other surface modifying materials comprise polymer brush materials, including hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing materials.

A layer comprising a surface-modifying material can include a thin dielectric material having a thickness from 1 nm to 20 nm.

In an embodiment, the surface modifying material is a polymer derived from methyl methacrylate. In another embodiment, the surface modifying material is a brush methacrylate homopolymer (e.g., hydroxyl-terminated poly(methyl methacrylate), (PMMA)). In another embodiment, the surface modifying material includes an etch-resistant material.

Modified surfaces possessing desirable wetting characteristics can comprise: cross linked organic polymer including an epoxy-based homopolymer or copolymer, organic homopolymers or copolymers; self-assembled monolayers, polymer brushes, cross-linked organosilicates, random copolymer brushes, random cross-linked copolymers, mixtures of polymer brushes or cross-linked polymers, ARC materials, oxidized silicon, and combinations of the foregoing materials.

Polymer brushes can provide a modified surface that is non-preferential or preferential to the SA material. A modified surface can be formed by reactively modifying a surface to a desired thickness and surface properties using polymeric brush precursors having a desired composition, often followed by an additional rinse step to remove non-bound material. The composition of a random copolymer brush layer can be tuned to afford the desired surface properties. This can be accomplished in some instances by randomly copolymerizing two monomers, for example the same monomers used in the preparation of a block copolymer for self-assembly, in a precise ratio. In instances where otherwise useful self-assembling materials (i.e., those that can form domains) exist for which it is unfeasible to synthesize random copolymers of repeating units of each polymeric block components (such as where different polymerization mechanisms would be required), end-group functionalization or incorporation of reactive-group containing monomers can be used to functionalize polymers to provide grafting sites. Thermally crosslinkable surface modifying agents based on, for example, vinyl benzocyclobutene, can also be used. Photo-patternable surface modifying agents based on random copolymers of the monomers of the self-assembling material with an appropriate functional monomer, for example, monomers having azide, glycidyl or acryloyl groups, can also be used.

The modified surface can also comprise a crosslinked epoxy-containing polymer prepared from monomers including glycidyl (meth)acrylate, 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and combinations including at least one of the foregoing. Herein, where "(meth)acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further containing at least one additional monomer in addition to the epoxy-containing monomer. Exemplary additional monomers include methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth)acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth)acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, a-methyl styrene, 4-hydroxy styrene, 4-acetoxy styrene, ethylene, propylene, 1-butene, 1,3-butadiene, vinyl acetate, dihydropyran, norbornene, maleic anhydride, or a combination including at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Specifically useful epoxy-containing polymers include poly(epoxydicyclopentadienyl methacrylate) homopolymer or poly(styrene-ran-epoxydicyclopentadienyl methacrylate), a random copolymer of styrene and epoxydicyclopentadienyl methacrylate.

Organosilicate or silicon oxide-based coatings of the substrate can also be used to provide a surface for the SA layer. Useful surfaces can be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials can be used to provide a surface, where such organosilicate coatings are advantageously crosslinkable to form a solid surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis(triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

A surface can comprise an etch-resistant material including, but not limited to, a material selected from hydrogen silsesquioxane, methyl silsesquioxane, an alkyl silsesquioxane, an alkene silsesquioxane, an aryl silsesquioxane, an arylene silsesquioxane, a silicon-based resist, an inorganic resist, a silicon-based ARC, a metal-based ARC, silicon oxide, a silicon oxynitride, a silicon-based spin-on-dielectric, a metal, a metal oxide, a metal nitride, a metal oxynitride, and a metal carbide, provided that a suitable etch chemistry exists for selectively removing a domain of a self-assembled material. In an embodiment, the etch-resistant material can include hydrogen silsesquioxane.

A layer of such etch-resistant material formed on the substrate can be deposited by any suitable method and is not particularly limited. Where the etch-resistant material is soluble in solutions, the application of an etch-resistant material layer to a surface of the substrate can be accomplished by a process including, for example, spin-casting, dip-coating, doctor blading, spray dispense, or other suitable coating method, which is compatible with the processes and equipment used in microelectronics fabrication assembly lines. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

In another example, the etch-resistant material can be deposited from the vapor phase by a process including chemical vapor deposition (CVD), plasma enhanced CVD, atomic layer deposition (ALD), sputtering, thermal evaporation, electron beam evaporation, pulsed laser deposition, or other suitable deposition method that is compatible with the processes and equipment used in microelectronics fabrication.

A surface-modifying material can be applied by any suitable method and is not particularly limited. Where polymer-based surface modifying material is desired, the application of such layers to a surface of the substrate can be accomplished by a process including, for example, spin-casting, dip-coating, doctor blading, spray dispense, or other suitable coating method, which is compatible with the processes and equipment used in microelectronics fabrication assembly lines.

Solvents that can be used to cast surface modifying materials on a substrate vary with the solubility requirements of these materials. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone.

Layered Structures

The substrate is a layered structure that comprises a topographic pre-pattern as a top surface. The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, silicon nitride, titanium nitride, hafnium oxide, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have an anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

A pre-pattern can comprise topographic features composed of resist material. The patterned resist layer can be prepared by disposing on a first layered structure (first substrate) a solution containing a resist material, a solvent, and optionally a member of the group consisting of thermal acid generators (TAGs), photo-acid generators (PAGs), catalysts, and combinations thereof, removing the solvent, and, optionally, treating the resulting resist layer with a thermal bake, thereby forming a second layered structure comprising an initial resist layer. The initial resist layer can be patterned using any suitable lithographic technique (e.g., image-wise e-beam writing, extreme UV exposure, immersion lithography, and so on). Development of the exposed resist layer using organic solvents, aqueous base, followed by an optional bake provides a topographic pre-pattern comprising resist features. A thermal bake can be performed at a temperature between about 80° C. and about 250° C. for between about 1 second and about 24 hours, more preferably between about 120° C. and about 250° C. for between about 1 minute and about 15 minutes.

Alternatively, the above-formed resist pre-pattern can be transferred to one or more layers of the substrate, thereby forming a pre-pattern comprising topographic features composed of materials of one or more substrate layers. For purposes of demonstrating the present invention, the substrate in the examples further below is a multi-layered stack having the following layers starting from the bottom: i) silicon, ii) organic hard mask (135 nm), iii) SiARC or other silicon oxide material (20 nm), iv) organic hard mask (50 nm or 80 nm), and v) SiARC (20 nm). The sidewalls are mainly organic hard mask with SiARC on top. The bottom surface of the initial openings is SiARC.

Also disclosed is a layered structure comprising a substrate that includes a topographical pre-pattern and a film of the self-assembled block copolymer disposed in the recessed areas (initial openings) of the pre-pattern, wherein the film comprises self-assembled domain pattern suitable for generation of conductive interconnects in a semiconductor device.

Formulations for SA Layers

Also disclosed are compositions for preparing the SA layers. The compositions comprise a solvent and 0.1-5 wt % of a disclosed block copolymer in contact with the solvent, wherein wt % is based on total weight of the composition. The block copolymer can be dissolved or dispersed in the solvent. The compositions are suitable for forming an SA layer comprising the block copolymer. Exemplary solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone.

The solution can be applied to a pre-pattern using any suitable coating technique (e.g., spin coating) followed by removal of the solvent, thereby forming a film layer comprising the BCP (SA layer). The SA layer has a top surface in contact with an atmosphere and a bottom surface in contact with the bottom surface of the initial openings and with the sidewalls of the pre-pattern.

In general, the SA layer can have a thickness of 50 to 10000 angstroms, more particularly 100 to 5000 angstroms, and even more particularly 100 to 200 angstroms.

Annealing Conditions

The morphology (e.g., shape, dimension, and orientation) of the self-assembled domains from block copolymer is a function of block copolymer architecture (diblock, triblock), composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement), and linking group L'. By adjusting one or more parameters, the morphology of the self-assembled domains can be adjusted to the need of a specific application.

Self-assembly of the SA layer can occur during film formation or during a post-application annealing step (e.g., a subsequent thermal annealing process or solvent annealing process). Thermal annealing processes include annealing at a constant temperature and thermal gradient annealing. More particularly, the SA layer is thermally annealed at a temperature that is above the glass transition temperature ($T_g$) of the block copolymer but below the decomposition or degradation temperature ($T_d$) of the block copolymer. The thermal annealing step can be carried out at a temperature of between about 80° C. and about 350° C., more preferably between about 120° C. and about 350° C. The thermal annealing can be performed for a period between about 1 second and about 24 hours, and more particularly, between about 1 minute to about 20 minutes. The thermally annealed block copolymer self-assembles to form ordered domains in the initial openings of the pre-pattern.

Selective Removal

The difference in the etch rates between two ordered domain regions of the block copolymer allows the selective removal of one the domains. The selective removal process can be carried out by any suitable process (e.g., a thermal bake for thermally decomposable materials, a reactive ion etch process, dissolution in a selective solvent, ultraviolet exposure, combinations of the foregoing). The selective removal can include dry-etching such as plasma etching and/or wet-etching using selective solvents and/or vapors. Typically, dry etching processes using a suitable gas ($O_2$) are employed for etching at sub-50 nm dimensions. For the contact hole applications, wet etch is preferred as dry etching increases the openings. Selectively removing one of the self-assembled domain, creates a relief pattern (i.e., a pattern of second openings) that can be transferred into the underlying substrate.

Prior to the selective removal and/or transfer, the self-assembled layer of SA material can be optionally chemically modified to improve properties necessary for pattern transfer, such as etch resistance or mechanical properties. Etch resistant materials can be applied to a substrate surface, surface of a resist feature, and/or a domain pattern of the block copolymer for control of relative etch rates. The etch-resistant material can be deposited from the vapor phase by a process including, chemical vapor deposition (CVD), plasma enhanced CVD, atomic layer deposition (ALD), sequential infiltration synthesis (SIS), sequential infiltration of metal salts, sputtering, thermal evaporation, electron beam evaporation, pulsed laser deposition, or other suitable deposition method that is compatible with the processes and equipment used in microelectronics fabrication.

A chemical modification can be accomplished by a variety of known methods. For example, domains can be selectively reacted with silanes or silyl chlorides to introduce silicon content into a domain and thereby increase its plasma etch resistance. Alternatively, chemical agents can be used to bind or chemically couple to functional groups that are exclusively located in one type of self-assembled domain, to effect, for example, increased solubility property differences that can advantageously be used to selectively remove one domain in the presence of the other domain.

Selective removal of one of the domains can remove an underlying material of the substrate and/or resist.

The relief pattern can be transferred to the substrate using any suitable technique, thereby forming layered structure comprising a transferred pattern of openings extending into one or more layers of the substrate. The pattern transfer process can further comprise removing of the remaining domain of the BCP.

Utility

The above-described methods can be used to form layered structures comprising interconnect holes and bars, metal wiring lines (e.g. damascene trenches), insulation sections (e.g., shallow trench isolation), and trenches for capacitor structures suitable for the design of integrated circuit devices. The methods are also useful in the context of creating patterned layers of oxides, nitrides or polysilicon. The methods advantageously provide self-assembled structures having reduced central domain feature size and good uniformity.

The following examples illustrate the preparation of the disclosed block copolymers and their use in forming hole and bar openings of smaller critical dimension compared to the initial openings. The SA layer is disposed in the initial openings of the pre-pattern and has a top surface in contact with an atmosphere.

EXAMPLES

Materials used in the following examples are listed in Table 1.

TABLE 1

| ABBRE-VIATION | DESCRIPTION | SUPPLIER |
| --- | --- | --- |
| A940 | Silicon containing anti-reflective coating (SiARC) | Shin-Etsu, Co. |
| AcCl | Acetyl Chloride | Sigma-Aldrich |
| ACN | Acetonitrile | Sigma Aldrich |
| AIBN | Azobisisobutyronitrile | Sigma-Aldrich |
| Anisole | Anisole | Sigma-Aldrich |
| BisMPA | Dimethylol propionic acid | Perstorp Chemicals |
| BriBr | α-Bromoisobutyryl bromide | Sigma-Aldrich |
| BzOH | Benzyl alcohol | Sigma-Aldrich |
| Chol | Cholesterol | Sigma Aldrich |
| CuBr | Copper (I) bromide | Sigma-Aldrich |
| DBU | 1,8-Diazabicyclo[5,4,0]undec-7-ene | Sigma-Aldrich |
| DCC | N,N'-Dicyclohexylcarbodiimide | Sigma Aldrich |
| DCM | Dichloromethane | Sigma-Aldrich |
| DfOD | 1H,1H,8H,8H,-Dodecafluoro-1,8-octanediol | Synquest Laboratories |
| DMAP | 4-Dimethylaminopyridine | Sigma Aldrich |
| DPP | Diphenylphosphate | Sigma Aldrich |
| EMD-PS-OH | Hydroxyl-end-functional polystyrene | EMD Performance Materials Corp. |
| EtAc | Ethyl acetate | Sigma Aldrich |
| GMA | Glycidyl methacrylate, MW 142.2 | Sigma-Aldrich |
| HfPD | 2,2,3,3,4,4-Hexafluoro-1,5-pentane diol | Synquest Laboratories |

TABLE 1-continued

| ABBRE-VIATION | DESCRIPTION | SUPPLIER |
| --- | --- | --- |
| LAC | D,L-lactide; 3,6-Dimethyl-1,4-dioxane-2,5-dione; also referred to as LA | Sigma-Aldrich |
| Me6TREN | Tris[2-(dimethylamino)ethyl]amine | Sigma-Aldrich |
| MeOH | Methanol | Sigma-Aldrich |
| MF13 | 1H,1H-Perfluoro-1-heptanol; C7H3F13O | Synquest |
| MF17 | 1H,1H-Perfluoro-1-nonanol; C9H3F17O | Synquest |
| MF19 | 1H,1H-Perfluoro triethylene glycol monobutyl ether; C10H3F19O4 | Exfluor |
| MF7 | 2,2,3,3,4,4,4-Heptafluoro-1-butanol; C4H3F7O | Sigma Aldrich |
| OD | 1,8-Octanediol | Sigma-Aldrich |
| EIBr | Eicosyl bromide, $CH_3(CH_2)_{18}CH_2Br$ | Sigma Aldrich |
| ODL401 | Organic hard mask material | Shin-Etsu, Co. |
| OH-PSI1-OH | Poly(styrene) diol, DP = 144 | Polymer Source Inc. |
| OH-PSI2-OH | Poly(styrene) diol, DP = 108 | Polymer Source Inc. |
| P(Sty-r-MMA)-OH | hydroxy-terminated poly(styrene-r-methyl methacrylate) random copolymer brush polymer | EMD Performance Materials Corp. |
| PfDD | 1H,1H,12H,12H,-Perfluoro-1,12-dodecandiol | Synquest Laboratories |
| PfE | 1H,1H,11H,11H,-3,6,9-trioxaundecane-1,11-diol | Synquest Laboratories |
| PFS | Pentafluorostyrene | Sigma-Aldrich |
| PLA | Poly(lactide) | |
| PMDETA | N,N,N',N',N''-pentamethyldiethylenetriamine | Sigma-Aldrich |
| PS-b-PMMA 3964 | Polystyrene-b-poly(methyl methacrylate), Mn(PS) = 21000, Mn(PMMA) = 21000, PDI 1.07 | Polymer Source, Inc. |
| PTFE | Poly(tetrafluoroethylene) | |
| Sty | Styrene; MW 104.15; also referred to as "S" | Sigma Aldrich |
| Si Gel | Silica Gel | Sigma-Aldrich |
| TEA | Triethylamine | Sigma-Aldrich |
| THF | Tetrahydrofuran | Sigma-Aldrich |
| TMC | Trimethylene carbonate | Richman Chemicals |
| TMSS | p-Trimethylsilylstyrene | Prepared below |
| Tol | Toluene | Sigma-Aldrich |

Herein, Mn is the number average molecular weight, Mw is the weight average molecular weight, and MW is the molecular weight of one molecule.

Instruments and Chemicals

Chemicals not specified in Table 1 were obtained from the Aldrich Chemical Company (Sigma-Aldrich Corp St. Louis, Mo., USA) and used as received. Unless otherwise indicated spinning and baking of films was done with Laurel WS-650-23B spin coater and a Tokyo Electron Ltd. Clean Track ACT-8. A Nordson (300 Nordson Dr. M/S 47 Amherst, Ohio 44001 U.S.A.) MARCH etcher was used for plasma etching of polycarbonate containing domain. Top down SEM images were taken on a ZEISS 1550VP FESEM (Carl Zeiss AG, Carl Zeiss Straße 22, 73447 Oberkochen, Germany). Table 1 gives a list of abbreviations for compounds and solvents used. In this Table "Sigma-Aldrich" refers to the "Sigma-Aldrich Corporation" located at 3050 Spruce St., St. Louis, Mo. 63103. "Synquest" refers to "SynQuest Laboratories, Inc." located at 13201 Rachael Blvd, Rt 2054, Alachua Fla. 32615. "Exfluor" refers to "Exfluor Research Corporation" located at 2350 Double Creek Dr, Round Rock, Tex. 78664. "Perstorp Chemicals" refers to "Perstorp Specialty Chemicals" located at Neptunigatan 1, 211 20 Malmö, Sweden. "Richman Chemicals" refers to "Richman Chemicals Custom Solutions" located at 768 North Bethlehem Pike, Pa.

19002. The coating SiArc solution (Shin Etsu SHB A-940 L35) was obtained from the Shin-Etsu Chemical Co., Ltd (Tokyo 100-0004, Japan).

N-bis(3,5-trifluoromethyl)phenyl-N'-cyclohexyl-thiourea (TU) was prepared as described by R. C. Pratt, et al., Macromolecules, 2006, 39 (23), pages 7863-7871, and dried by stirring in dry THF over $CaH_2$, filtering, and removing solvent under vacuum.

Cyclic carbonate monomer MTC-Me (MW=174) was prepared as previously reported (Y. ZHOU et al., Polymer, 45(16), 5459-5463; 2004).

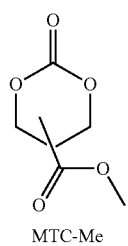

MTC-Me

Cyclic carbonate monomer MTC-Et (MW 188) was prepared according to the general procedure of J. Hedrick, et al., US 20110151566 A1, published Jun. 23, 2011.

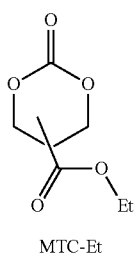

MTC-Et

Cyclic carbonate monomer MTC-Pr (MW 202) was prepared according to the general procedure of J. Hedrick, et al., US 20110151566 A1, published Jun. 23, 2011.

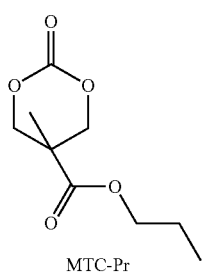

MTC-Pr

4-Trimethylsilylstyrene (TMSS) was prepared according to the general procedure of J. Rathore, et al., "A Photocurable, Photoluminescent, Polycarbosilane Obtained by Acyclic Diene Metathesis (ADMET) Polymerization", Macromolecules, 2009, 42, 4614-4621.

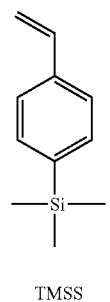

TMSS

Acetal-protected BisMPA monomer C-1 was prepared as previously reported by W. Thongsomboon, et al., ACS Macro Letters, 2(1), 19-22; 2013).

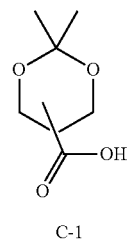

C-1

The following commercially available fluorinated diol compounds were used to prepare block copolymers containing linear fluorinated junction groups.

DF6

DF10

DF12

DF20

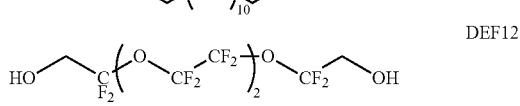
DEF12

The following commercially available fluorinated monoalcohol compounds were used to prepare block copolymers containing perpendicular fluorinated junction groups.

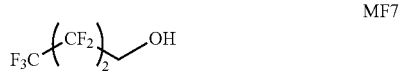
MF7

MF13

MF17

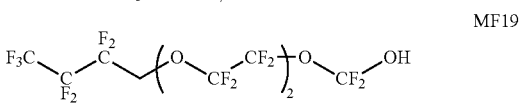
MF19

Preparation of ATRP Initiators Having Latent Linear Fluorinated Junction Groups

Example 1

Synthesis of mono-hydroxy functional ATRP initiator ATRP-1 (MW=361.1).

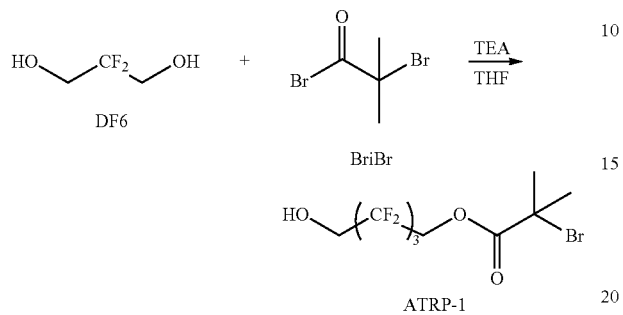

To a 100 mL round bottom flask (RBF) equipped with a magnetic stir bar, DF6 (3.0 g, 14.14 mmol) was dissolved in dry THF (50 mL). To this solution, TEA (2 mL, 14.14 mmol) was added. The reaction was stirred under $N_2$ for 10 minutes at room temperature (r.t.) after which BriBr (0.85 mL, 7.07 mmol) was added dropwise over 10 minutes. The reaction was stirred for 24 hours and was stopped the solution was filtered to remove the TEA.HCL salt. The THF was evaporated under vacuum and the resulting crude product was purified by passing through a silica gel column with hexane:EtOAc 90:10 as the eluant to obtain the mono-hydroxy functional ATRP initiator MH-1 (1.2 g, 50% yield). The product was confirmed by $^1$H NMR and $^{19}$F NMR. $^1$H NMR (400 MHz, CDCl$_3$, 23° C.): delta 1.21 (3H), 1.46 (6H), 3.71 (2H), 4.21 (2H), and 4.69 (2H). $^{19}$F NMR (400 MHz, CDCl$_3$, 23° C.): delta −81.00, −120.48, −127.79.

Example 2

Mono-hydroxy functional initiator ATRP-2 (MW=511.1) was prepared according to the general procedure of Example 1 using DF12 (1H,1H,8H,8H,-dodecafluoro-1,8-octanediol).

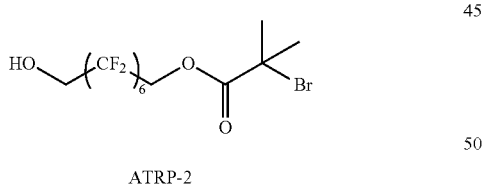

Example 3

Mono-hydroxy functional initiator ATRP-3 (MW=711.1) was prepared according to the general procedure of Example 1 using DF20 (1H,1H,12H,12H-perfluoro-1,12-dodecandiol).

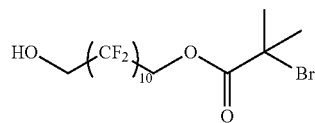

Example 4

Mono-hydroxy functional initiator ATRP-4 (MW=591) was prepared according to the general procedure of Example 1 using DEF12.

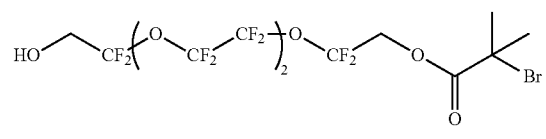

Example 5

Mono-hydroxy functional initiator ATRP-5 (MW=295.2) was prepared according to the general procedure of Example 1 using OD (1,8-octanediol).

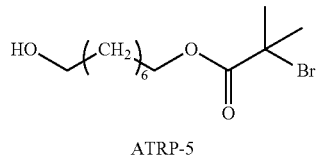

Tables 2 and 3 summarize the ATRP initiator preparations of Examples 1-5.

TABLE 2

| Example | Name | THF (mL) | Diol | Diol (g, mmol) | TEA (mL, mmol) | BriBr (mL, mmol) | Rxn time (hours) | Rxn temp |
|---|---|---|---|---|---|---|---|---|
| 1 | ATRP-1 | 50 | DF6 | 3.0, 14.14 | 2, 14.4 | 0.85, 7.07 | 24 | r.t. |
| 2 | ATRP-2 | 30 | DF12 | 1.50, 4.11 | 0.7, 4.96 | 0.40, 3.10 | 24 | r.t. |
| 3 | ATRP-3 | 100 | DF20 | 2.5, 4.44 | 0.63, 4.44 | 0.25, 2.0 | 24 | r.t. |
| 4 | ATRP-4 | 200 | DEF12 | 2.0, 4.8 | 1.70, 12.20 | 0.45, 0.83 | 24 | r.t. |
| 5 | ATRP-5 | 100 | OD | 5.73, 146.23 | 2, 14.4 | 1.60, 13.08 | 24 | r.t. | r.t. = room temperature

TABLE 3

| Example | Name | MW | Diol | Ester Groups |
|---|---|---|---|---|
| 1 | ATRP-1 | 361.1 | DF6 | 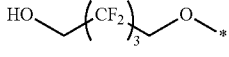 |
| 2 | ATRP-2 | 511.1 | DF12 | 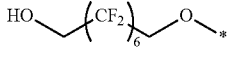 |
| 3 | ATRP-3 | 711.1 | DF20 | 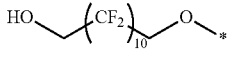 |
| 4 | ATRP-4 | 591.0 | DEF12 | 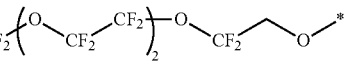 |
| 5 | ATRP-5 | 295.2 | OD | 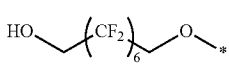 |

Preparation of ATRP Initiators with Latent Perpendicular Junction Groups

Example 6

ATRP-6 (MW 615.2) was prepared in three steps as follows.

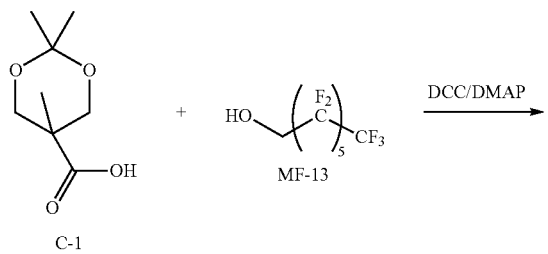

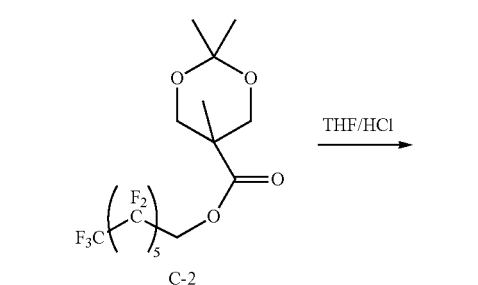

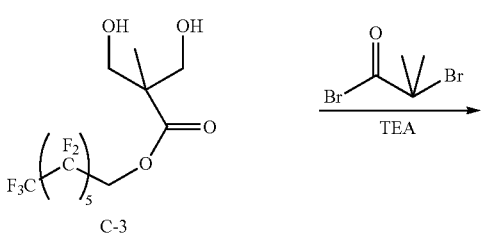

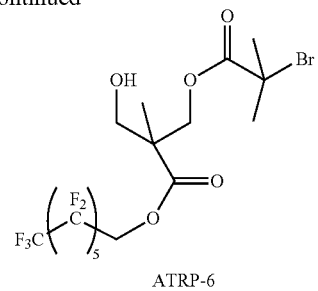

I) To a 100 mL round bottom flask (RBF) equipped with a magnetic stir bar were added C-1 (1.0 g, 5.74 mm), mono-alcohol MF13 (1.15 g, 5.74 mm), DMAP (0.7 g, 5.74 mm), and dry DCM (30 mL). The reaction was stirred under $N_2$ for 10 minutes at room temperature after which DCC (1.18 g, 5.74 mm) in DCM (10 mL) was added drop wise over 10 minutes. The reaction was stirred for 24 hours and the mixture was filtered to remove the dicyclohexylurea. DCM was evaporated under vacuum and the resulting crude product was purified by passing through a silica gel column with hexane: EtOAc (90:10 v/v) as the eluent to obtain the cyclic acetal ester C-2. The product was confirmed by $^1$H NMR (400 MHz, $CDCl_3$, 23° C.): delta 1.21 (3H), 1.46 (6H), 3.71 (2H), 4.21 (2H), and 4.69 (2H).

II) In the next step, cyclic acetal C-2 (1.5 g) was added to THF (15 mL) in a 250 mL RBF equipped with a magnetic stir bar. To this solution, 1 M HCl (20 mL) was added and the reaction was allowed to stir for 24 hours at room temperature. After this time, THF was removed under vacuum and 50 mL of EtOAc was added to the acidic water solution. The organic layer was washed with saturated $K_2CO_3$ and brine and collected over magnesium sulfate. Pure diol ester C-3 was collected by filtering the magnesium sulfate and evaporating the EtOAc under vacuum. The product was confirmed by $^1$H NMR (400 MHz, $CDCl_3$, 23° C.): delta 1.08 (3H), 2.54 (2H), 3.77 (2H), 3.94 (2H), and 4.51 (2H).

III) In the third step, diol ester C-3 (1.0 g, 3.16 mmol) from the above step was dissolved in DCM (20 mL) in a 100 mL RBF equipped with a magnetic stir bar. To this solution, TEA (0.32 g, 3.16 mmol) was added and the reaction mixture was stirred under $N_2$ flow for 10 minutes at room temperature (r.t.). BriBr (0.54 g, 2.37 mmol) in DCM (10 mL) was then added dropwise over 30 minutes. The resulting mixture was further stirred at r.t. for 24 hours at which point the reaction was stopped by filtering the solution to remove the TEA.HCl salt. The filtrate was collected and washed sequentially with saturated $K_2CO_3$, 1 M HCl, deionized water, and brine solution. The organic layer was collected over magnesium sulfate and the crude product was obtained by filtering the DCM solution and evaporating the DCM layer under vacuum. The crude product was purified by column chromatography using Silica gel column with Hexane: EtOAC 90:10 as the eluant. The product ATRP-6 was confirmed by $^1$H NMR (400 MHz, $CDCl_3$, 23° C.): delta 1.28 (3H), 1.94 (6H), 2.36 (1H), 2.53 (2H), 3.77 (2H), 4.33 (1H), and 4.45-4.50 (3H).

Example 7

ATRP-7 (MW 715.2) was prepared according to the general procedure of Example 6 using C-1 and mono-alcohol MF17.

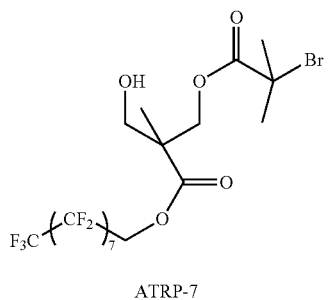

ATRP-7

In the first step, the corresponding cyclic acetal ester was confirmed by $^1$H NMR (400 MHz, $CDCl_3$, 23° C.): delta 1.21 (3H), 1.46 (6H), 3.69 (2H), 4.20 (2H), and 4.71 (2H). In the second step, the corresponding diol ester was confirmed by $^1$H NMR (400 MHz, $CDCl_3$, 23° C.): delta 1.14 (3H), 3.81 (2H), 3.97 (2H), and 4.71 (2H). In the third step, ATRP-8 was confirmed by $^1$H NMR and $^{19}$F NMR. $^1$H NMR (400 MHz, $CDCl_3$, 23° C.): delta 1.32 (3H), 1.94 (6H), 2.24 (1H), 3.80 (2H), 4.37-4.46 (2H), 4.69 (2H). $^{19}$F NMR (400 MHz, $CDCl_3$, 23° C.): delta −199.41, −121.93, −122.72, −123.21, and −126.11.

Example 8

ATRP-8 (MW 813.2) was prepared according to the general procedure of Example 14 using C-1 and mono-alcohol MF19.

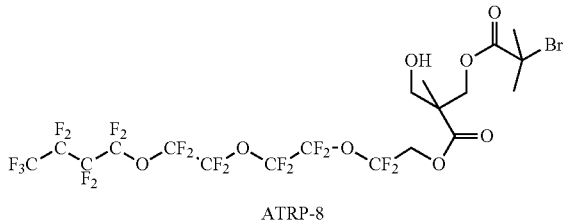

ATRP-8

In the first step, the corresponding cyclic acetal ester was confirmed by $^1$H NMR. $^1$H NMR (400 MHz, $CDCl_3$, 23° C.): delta 1.21 (3H), 1.46 (6H), 3.71 (2H), 4.23 (2H), and 4.57 (2H). In the second step the corresponding diol ester was confirmed by $^1$H NMR. $^1$H NMR (400 MHz, $CDCl_3$, 23° C.): delta 1.12 (3H), 2.63 (2H), 3.81 (2H), 3.95 (2H), and 4.58 (2H). In the third step ATRP-9 was confirmed by $^1$H NMR and $^{19}$F NMR. $^1$H NMR (400 MHz, $CDCl_3$, 23° C.): delta 1.32 (3H), 1.94 (6H), 2.24 (1H), 3.80 (2H), 4.37-4.46 (2H), 4.69 (2H). $^{19}$F NMR (400 MHz, $CDCl_3$, 23° C.): delta −199.41, −121.93, −122.72, −123.21, and −126.11.

Example 9

ATRP-9 (MW 535.2) was prepared in two steps using BisMPA and mono-alcohol eicosyl bromide (EIBr) as follows.

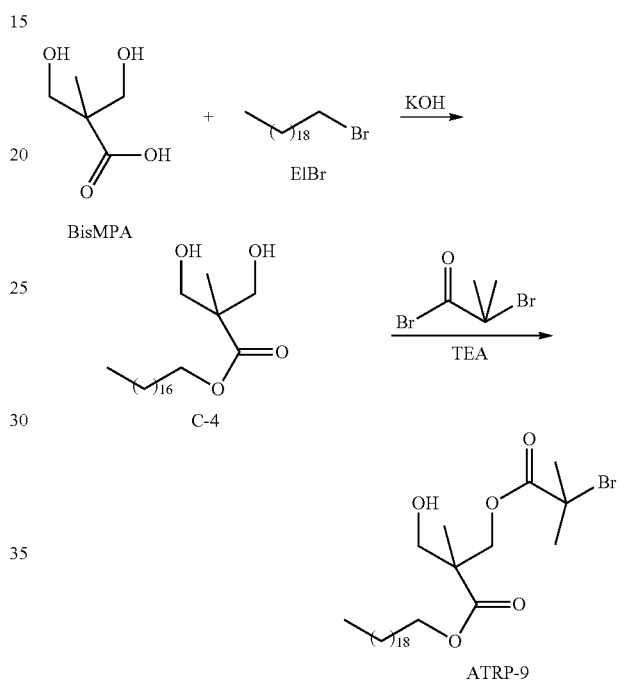

I) To a 100 mL RBF equipped with a magnetic stir bar and a condenser were added BisMPA (2.0 g, 14.91 mmol), EIBr (5.22 g, 15.65 mmol), KOH (1.0 g, 17.90 mmol) and DMF (50 mL). The reaction was stirred at 100° C. for 16 hours. The reaction was then cooled to room temperature and DMF was removed under vacuum. EtOAc (100 mL) was added to the remaining mixture and the solution was rinsed twice with deionized water (100 mL) and once with saturated brine solution (50 mL). The organic layer was dried over magnesium sulfate and the crude solids were obtained by evaporating the solvent under vacuum. Pure ester diol C-4 was obtained by passing the compound through a Silica gel column with hexane:EtOAc 60:40 as the eluent. The product C-4 was confirmed by $^1$H NMR. $^1$H NMR (400 MHz, $CDCl_3$, 23° C.): delta 0.9 (3H), 1.08 (3H), 1.19-1.46 (30H), 1.69 (2H), 2.83 (2H), 3.76 (2H), 3.92 (2H), 4.19 (2H).

II) In the next step, the ester diol C-4 (1.5 g, 3.88 mmol) from the above step was dissolved in DCM (30 mL) in a 250 mL RBF equipped with a magnetic stir bar. To this solution, TEA (0.78 g, 7.76 mmol) was added and the reaction mixture was stirred under $N_2$ flow for 10 minutes at room temperature. BriBr (0.89 g, 3.88 mmol) in DCM (10 mL) was then added dropwise over 30 minutes. The resulting mixture was further stirred at r.t. for 48 hours at which point the reaction was stopped by filtering the solution to remove the TEA.HCl salt. The filtrate was collected and washed with saturated $K_2CO_3$, 1 M HCl, deionized water, and brine solution. The organic layer was collected over magnesium sulfate and the crude product was obtained by filtering the DCM solution and evaporating the DCM layer under vacuum. The crude product was purified by column chromatography using Silica gel column with Hexane: EtOAC 80:20 as the eluent. The product ATRP-10 was confirmed by $^1$H NMR. $^1$H NMR (400 MHz, $CDCl_3$, 23° C.): delta 0.9 (3H), 1.21-1.42 (33H), 1.68 (2H), 1.94 (6H), 2.45 (1H), 3.74 (2H), 4.16 (2H), 4.27-4.46 (2H).

Table 4 summarizes the ATRP initiators prepared in Examples 6 to 9.

TABLE 4

| Example | Name | MW | Mono-alcohol Precursor | Pendent Ester Group |
|---|---|---|---|---|
| 6 | ATRP-6 | 615.2 | MF13 | $F-(CF_2)_5-O-*$ |
| 7 | ATRP-7 | 715.2 | MF17 | $F-(CF_2)_7-O-*$ |
| 8 | ATRP-8 | 813.2 | MF19 | $C_4H_9-(O-CF_2-CF_2)_2-O-CF_2-O-*$ |
| 9 (comp) | ATRP-9 | 535.2 | EIBr | $H_3C-(CH_2)_{18}-O-*$ |

Preparation of ROP Macroinitiators Having Latent Non-Fluorinated and Linear Fluorinated Junction Groups

Example 10

Synthesis of macroinitiator PSI-1.

rubber septum and was purged by bubbling nitrogen for one hour. At this point, PMDETA (40 mg, 0.227 mmol) was added and the reaction flask was heated by oil-bath at 100° C. for 30 minutes. The reaction was stopped by placing the Schlenk flask in an ice-water bath. The flask was opened to air at which time the reaction mixture turned dark green. The mixture was diluted by adding THF (100 mL) and was passed through a short silica-gel column to remove copper catalyst. The resulting solution was concentrated under vacuum and precipitated twice in methanol from THF. The polymer was collected in a frit funnel and was dried under vacuum for 24 hours at 50° C. Mn=8200, Mw=9000, PDI=1.09. Subscript n is about 46 based on Mn, after subtracting the ATRP initiator Mw.

Example 11

Synthesis of macroinitiator PSI-2.

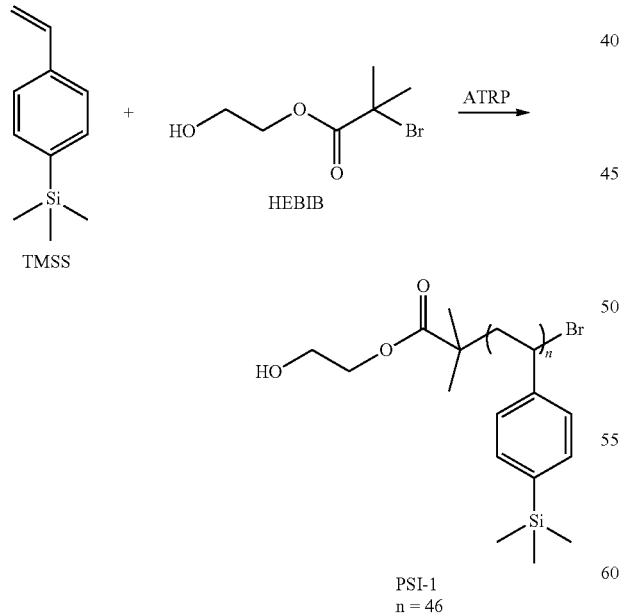

PSI-1
n = 46

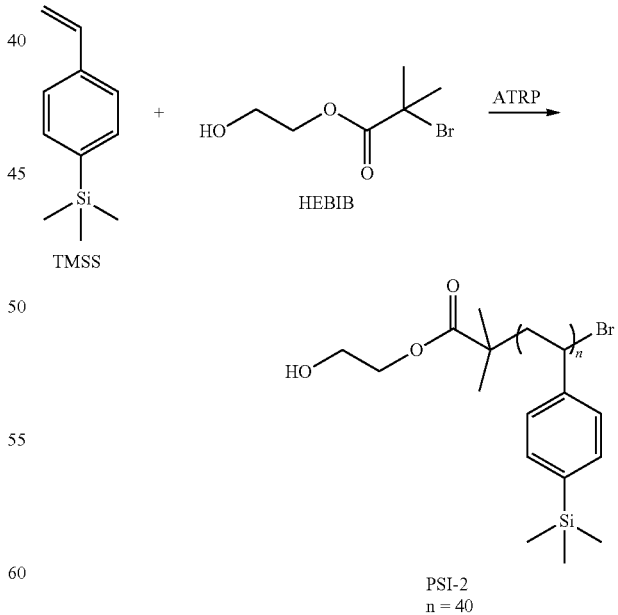

PSI-2
n = 40

To a 50 mL Schlenk flask equipped with a stir bar trimethylsilyl styrene (TMSS, 3.00 g, 17.01 mmol), initiator HEBIB (48 mg, 0.227 mmol), CuBr (32 mg, 0.227 mmol), and anisole (3.0 g) were added. The flask was sealed with a Trimethylsilyl styrene (TMSS, 3.0 g, 17.01 mmol, MW 176.3), ATRP initiator HEBIB (72 mg, 0.340 mmol, MW 211.1), CuBr (49 mg, 0.340 mmol), and anisole (3.0 g) were added to a 50 ml Schlenk flask equipped with a stir bar. The flask was sealed with a rubber septum and was purged by bubbling nitrogen for one hour. At this point, PMDETA (59 mg, 0.340 mmol) of was added and the reaction flask was placed in an oil-bath set at 100° C. for 25 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, Poly (PTMSS)-OH, was collected in a fit funnel and was dried under vacuum for 24 hours at 50° C. Mn=7000, PDI=1.10, n=40.

Preparation of Polystyrene ROP Initiators with Latent Linear Fluorinated Junction Groups

Example 12

Synthesis of polystyrene initiator PSI-3 from ATRP initiator ATRP-1.

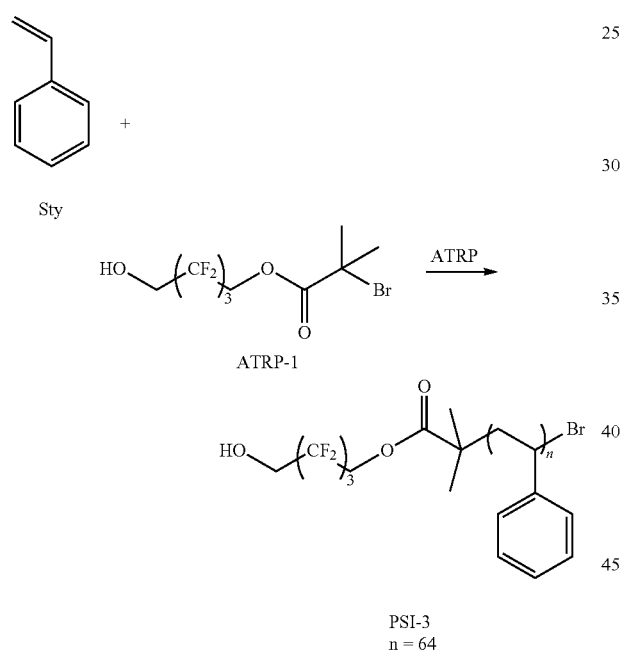

Examples 13-16

Polystyrene ROP initiators PSI-4 to PSI-7 were prepared according to the general procedure of Example 12 using from ATRP-2 to ATRP-5, respectively.

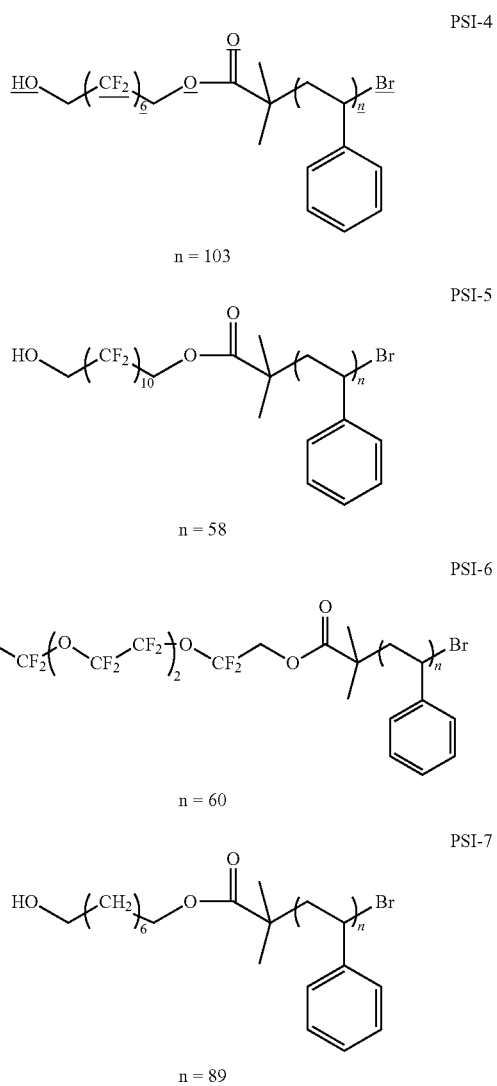

To a 50 mL Schlenk flask equipped with a stir bar, styrene (Sty, 9.80 g, 94 mmol), ATRP initiator ATRP-1 (0.20 g, 0.554 mmol, Example 1), CuBr (79 mg, 0.554 mmol), and anisole (10.0 g) were added. The flask was sealed with a rubber septum and was purged by bubbling nitrogen for one hour. At this point, PMDETA (0.96 mg, 0.554 mmol) was added and the reaction flask was placed in an oil-bath set at 100° C. for four hours. The reaction was stopped by placing the Schlenk flask in an ice-water bath. The flask was opened to air at which time the reaction mixture turned dark green. The mixture was diluted by adding THF (100 mL) and was passed through a short silica-gel column to remove copper catalyst. The resulting solution was concentrated under vacuum and was precipitated twice in methanol from THF. The polymer PSI-3 was collected in a fit funnel and was dried under vacuum for 24 hours at 50° C. Mn=7000, Mw=7500, PDI=1.06, n=64.

Example 17-18

Polystyrene ROP initiator PSI-8 and PSI-9 were prepared from ATRP-2 according to the general procedure of Example 12. PSI-8 and PSI-9 are duplicates of PSI-4 in which n=132 and n=50, respectively.

Example 19

Poly(trimethylsilyl styrene) ROP initiator PSI-10 was synthesized according to the general procedure of Example 12 using trimethylsilyl styrene (TMSS, MW=176.3) and ATRP-3.

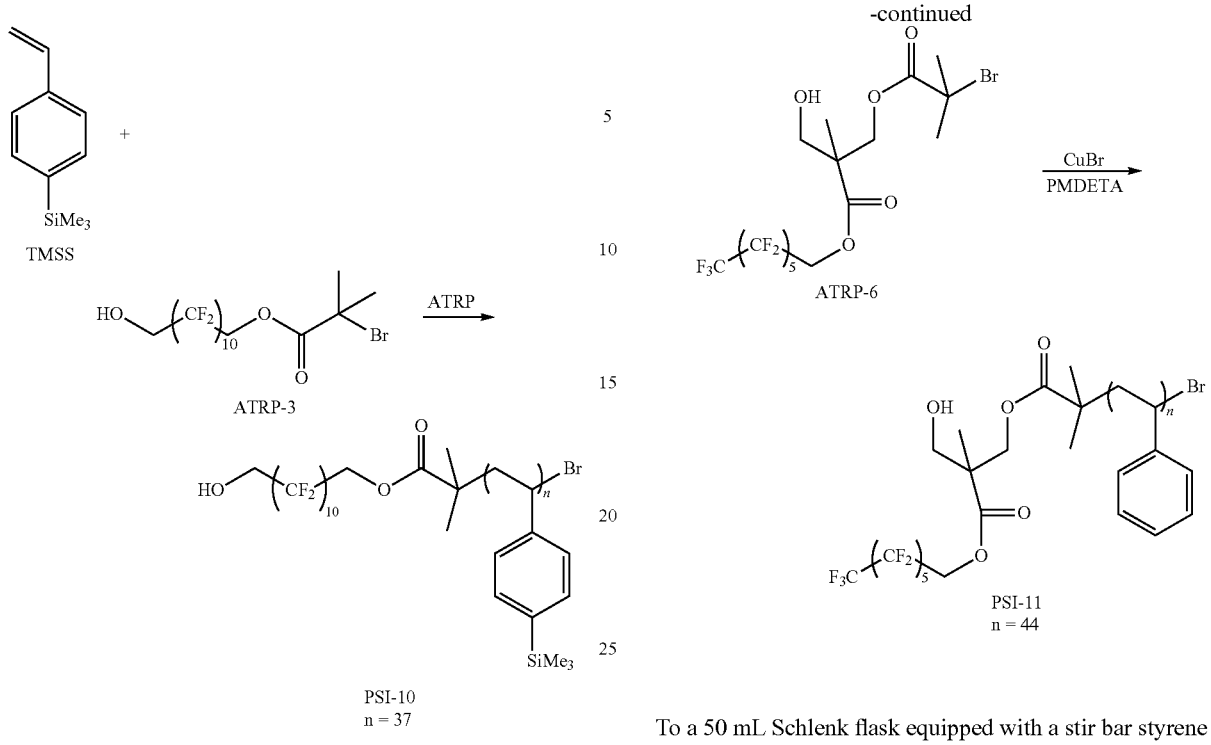

Table 5 summarizes the polystyrene ROP initiators formed in Examples 10-19 prepared by ATRP and catalyzed by CuBr/PMDETA. PDI is the polydispersity index, and DP is the average degree of polymerization n of block A.

TABLE 5

| Ex. | Name | Monomer | ATRP Initiator | Ester group | Temp °C. | Time (hours) | DP (n) | Mn | Mw | PDI |
|---|---|---|---|---|---|---|---|---|---|---|
| 10 | PSI-1 | TMSS | HEBIB | HOCH$_2$CH$_2$O—* | 100 | 0.5 | 46 | 8200 | 9000 | 1.09 |
| 11 | PSI-2 | TMSS | HEBIB | HOCH$_2$CH$_2$O—* | 100 | 25 min | 40 | 7000 | 7700 | 1.10 |
| 12 | PSI-3 | Styrene | ATRP-1 | HOCH$_2$(CF$_2$)$_3$CH$_2$O—* | 100 | 4.5 | 64 | 7000 | 7500 | 1.06 |
| 13 | PSI-4 | Styrene | ATRP-2 | HOCH$_2$(CF$_2$)$_6$CH$_2$O—* | 100 | 4.5 | 103 | 11300 | 12300 | 1.08 |
| 14 | PSI-5 | Styrene | ATRP-3 | HOCH$_2$(CF$_2$)$_{10}$CH$_2$O—* | 100 | 3 | 58 | 6800 | 7400 | 1.09 |
| 15 | PSI-6 | Styrene | ATRP-4 | HOCH$_2$CF$_2$(OCF$_2$CF$_2$)$_2$OCF$_2$CH$_2$O—* | 100 | 100 | 60 | 6800 | 7200 | 1.06 |
| 16 | PSI-7 | Styrene | ATRP-5 | HOCH$_2$(CH$_2$)$_6$CH$_2$O—* | 100 | 3.5 | 89 | 9600 | 10300 | 1.07 |
| 17 | PSI-8 | Styrene | ATRP-2 | HOCH$_2$(CF$_2$)$_6$CH$_2$O—* | 100 | 9 | 132 | 14200 | 15300 | 1.06 |
| 18 | PSI-9 | Styrene | ATRP-2 | HOCH$_2$(CF$_2$)$_6$CH$_2$O—* | 100 | 2.5 | 50 | 5700 | 6100 | 1.06 |
| 19 | PSI-10 | TMSS | ATRP-3 | HOCH$_2$(CF$_2$)$_{10}$CH$_2$O—* | 100 | 1.5 | 37 | 7200 | 7900 | 1.10 |

Preparation of ROP Macroinitiators Having Latent Perpendicular Fluorinated Junction Groups Example 20

Synthesis of polystyrene ROP macroinitiator PSI-11 from ATRP-6.

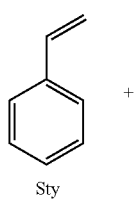

Sty

To a 50 mL Schlenk flask equipped with a stir bar styrene (Sty, 7.53 g, 7.25 mmol), initiator ATRP-6 (0.30 g, 0.657 mmol), CuBr (94 mg, 0.657 mmol), and anisole (7.5 g) were added. The flask was sealed with a rubber septum and was purged by bubbling nitrogen for one hour. At this point, PMDETA (0.12 g, 0.657 mmol) was added and the reaction flask was heated by oil-bath at 100° C. for 150 minutes. The reaction was stopped by placing the Schlenk flask in an ice-water bath. The flask was opened to air at which time the reaction mixture turned dark green. The mixture was diluted by adding THF (100 mL) and was passed through a short silica-gel column to remove copper catalyst. The resulting solution was concentrated under vacuum and precipitated twice in methanol from THF. The polymer was collected in a frit funnel and was dried under vacuum for 24 hours at 50° C. Mn=5200, Mw=5600, PDI=1.07, n=44.

Examples 21-23

Polystyrene ROP initiators PSI-12 to PSI-14 were prepared according to the general procedure of Example 20 using from ATRP-7 to ATRP-9, respectively.

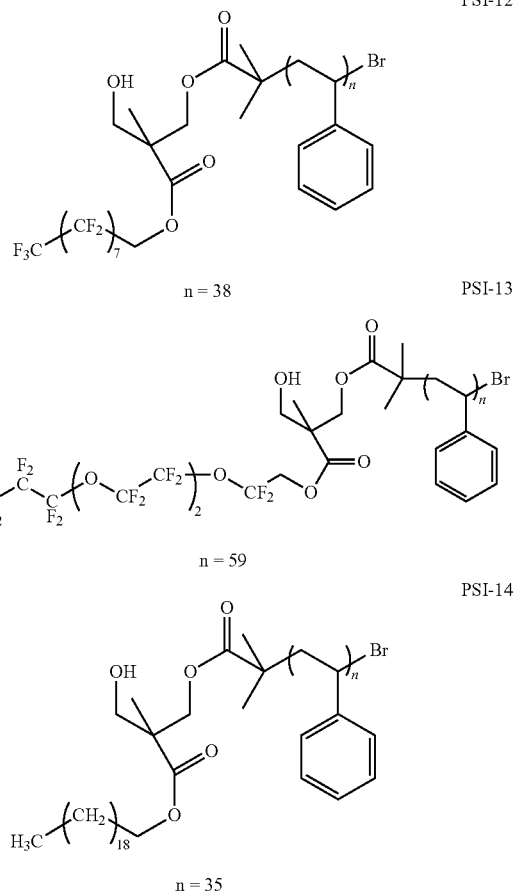

Example 24-26

Polystyrene ROP initiator PSI-15 to PSI-17 were prepared from ATRP-7 according to the general procedure of Example 20. PSI-15 to PSI-17 are duplicates of PSI-12 in which n=84, n=143, and n=75, respectively.

Example 27

Synthesis of poly(trimethylsilyl styrene) ROP macroinitiator PSI-18.

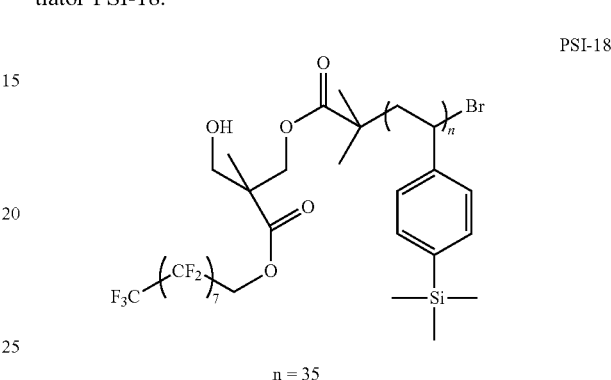

PSI-18 was prepared according to the general procedure of Example 20 using trimethylsilyl styrene (TMSS) and ATRP-7 in the following amounts: TMSS (3.0 g, 17.0 mmol), ATRP-7 (0.13 g, 0.170 mmol), CuBr (24 mg, 0.170 mmol), anisole (3.0 g), and PMDETA (30 mg, 0.170 mmol). Mn=6800, Mw=7400, PDI=1.09, n=35.

Table 6 summarizes the preparations of the macroinitiators of Examples 20-27 formed by ATRP and catalyzed by CuBr/PMDETA.

TABLE 6

| Ex. | Macro initiator Name | Vinyl Monomer | ATRP Initiator | Sidechain Ester Group | Temp °C. | Time (hrs) | DP (n) | Mn (kDa) | Mw (kDa) | PDI |
|---|---|---|---|---|---|---|---|---|---|---|
| 20 | PSI-11 | Styrene | ATRP-6 | $F_3C{-}(CF_2)_5{-}\diagup{-}O{-}*$ | 100 | 1 | 44 | 5.2 | 5.6 | 1.07 |
| 21 | PSI-12 | Styrene | ATRP-7 | $F_3C{-}(CF_2)_7{-}\diagup{-}O{-}*$ | 100 | 3 | 38 | 4.7 | 5.0 | 1.07 |
| 22 | PSI-13 | Styrene | ATRP-8 | $C_4F_9{-}(O{-}CF_2{-}CF_2)_2{-}O{-}CF_2{-}O{-}*$ | 100 | 2.5 | 59 | 6.9 | 7.4 | 1.07 |
| 23 | PSI-14 | Styrene | ATRP-9 | $H_3C{-}(CH_2)_{18}{-}O{-}*$ | 100 | 2 | 35 | 4.2 | 4.5 | 1.07 |
| 24 | PSI-15 | Styrene | ATRP-7 | $F_3C{-}(CF_2)_7{-}\diagup{-}O{-}*$ | 100 | 3 | 84 | 9.5 | 10.1 | 1.07 |
| 25 | PSI-16 | Styrene | ATRP-7 | $F_3C{-}(CF_2)_7{-}\diagup{-}O{-}*$ | 100 | 2.33 | 143 | 15.6 | 16.9 | 1.08 |
| 26 | PSI-17 | Styrene | ATRP-7 | $F_3C{-}(CF_2)_7{-}\diagup{-}O{-}*$ | 100 | 2.33 | 75 | 8.5 | 9.2 | 1.08 |
| 27 | PSI-18 | TMSS | ATRP-7 | $F_3C{-}(CF_2)_7{-}\diagup{-}O{-}*$ | 100 | 0.5 | 35 | 6.8 | 7.4 | 1.09 |

Preparation of Block Copolymers

In the examples that follow, non-fluorinated diblock polymers have a name beginning with a prefix "HBP" followed by a number. Fluorinated diblock copolymers have a prefix beginning with "FBP" followed by a number. Triblock copolymers, which are BAB type, have a name beginning with a prefix "TBP" followed by a number. In each instance, block A is a styrene based block, and block B is a cyclic carbonate, and/or cyclic ester based block.

All block copolymers made with cyclic carbonate monomers (e.g., MTC-Me, MTC-Et, MTC-Bz, DMC, and TMC) were purified by fractionating the BCP in MeOH:MeCN 80:20 v/v. All block copolymers made with cyclic ester monomer lactide were purified by fractionating the BCP in MeOH:MeCN 75:25 v/v.

In the examples below, the term Vf refers to the volume fraction of a referenced block, which appears as a subscript to Vf (e.g., $Vf_{PMTC-Me}$ refers to the volume fraction of the PMTC-Me block, a polycarbonate block formed by ring opening polymerization of MTC-Me).

Preparation of Diblock Copolymers Having Non-Fluorinated Junction Group

Example 28

Synthesis of HBP-1, a non-fluorinated polystyrene-b-poly (MTC-Me) block copolymer, by ring opening polymerization (ROP) of MTC-Me using EMD-PS-OH (Mn 12500) as initiator and DBU as the ROP base catalyst.

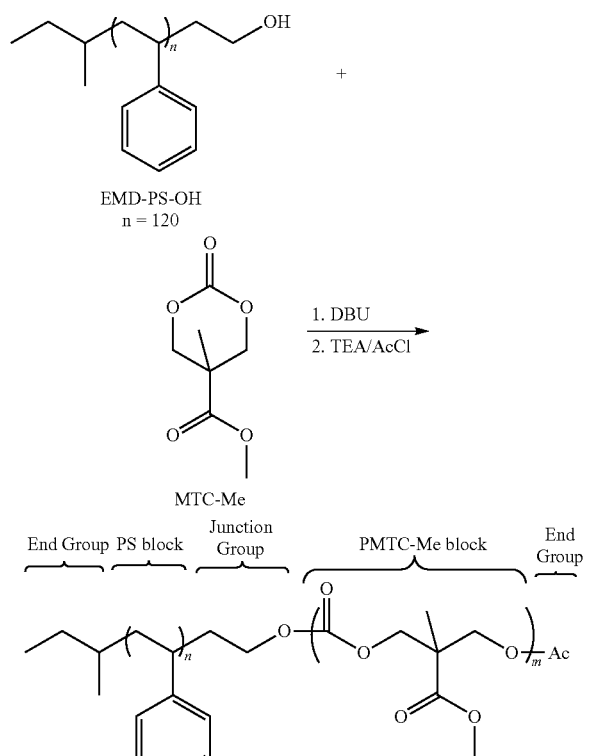

Non-fluorinated diblock copolymer HBP-1, n=120, m=83, was prepared by ring opening polymerization (ROP) of cyclic carbonate MTC-Me using mono-alcohol polystyrene macroinitiator EMD-PS-OH and DBU as the ROP base catalyst. To an oven dried 4 mL glass vial equipped with a magnetic stir bar were added EMD-PS-OH (0.10 g, 0.01 mmol, Mn=12500, PDI=1.05, n=120), obtained from EMD Performance Materials Corp, Branchburg, N.J.), MTC-Me (0.31 g, 1.80 mmol), and dichloromethane (DCM, 1.80 mL). The reaction mixture was stirred until the EMD-PS-OH macroinitiator and MTC-Me were completely dissolved in DCM, upon which catalyst (DBU, 1.5 mg, 0.01 mmol, 10 wt % solution in toluene) was added. The reaction mixture was stirred at room temperature (r.t.) for 2.5 hours in a glove box. The reaction vial brought out of the glove box and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol: acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. This polymer was further purified by stirring it over cyclohexane for 24 hours followed by decanting and drying the solid at 40° C. for 24 hours to give the final polymer HBP-1. Mn (GPC)=30300, Mw=30800, PDI=1.01; Mn of each block: PS block (GPC)=12500, PMTC-Me block (NMR)=14400, n=120, m=83. The volume fraction of the PMTC-Me block is: $Vf_{PMTC-Me}$~0.48.

Example 29

Synthesis of HBP-2, a non-fluorinated PS-b-PMTC-Et block copolymer, by ring opening polymerization (ROP) of MTC-Et and EMD-PS-OH (Mn 12500) as macroinitiator using the general procedure of Example 28 with DBU as the ROP base catalyst. This polymer was then further purified by stirring it over cyclohexane for 24 hours followed by decanting and drying the solid at 40° C. for 24 hours.

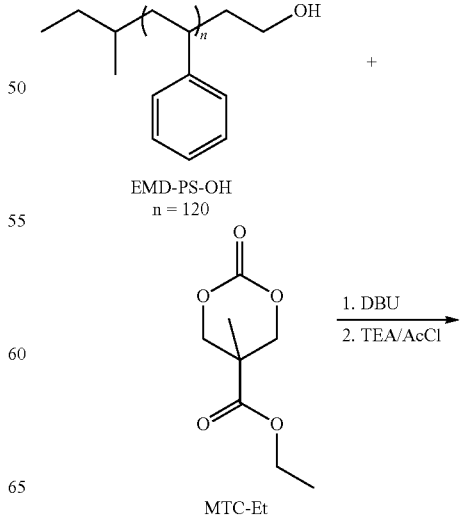

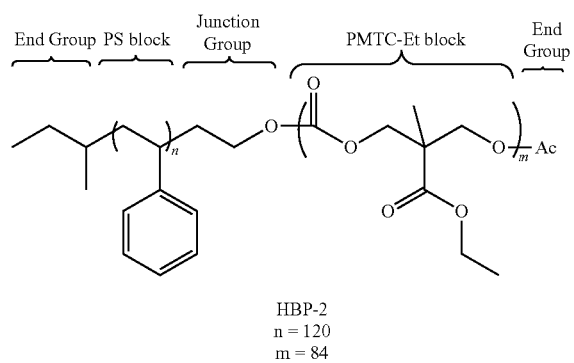

HBP-2
n = 120
m = 84

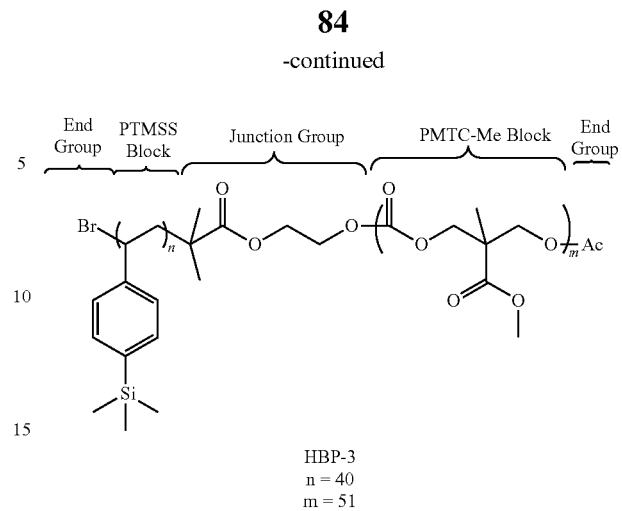

HBP-3
n = 40
m = 51

The final polymer HBP-2 had Mn (GPC)=31600, Mw=32000, PDI=1.01; Mn of each block: PS block (GPC)=125000, PMTC-Et block (NMR)=15750, n=120, m=84, $Vf_{PMTC\text{-}Et}$~0.50.

The final polymer HBP-3 had Mn (GPC)=15400, Mw=16000, PDI=1.05; Mn of each block: PTMSS block (GPC)=7000, PMTC-Me block (NMR)=8900, n=40, m=51, $Vf_{PMTC\text{-}Me}$~0.50.

Example 30

Synthesis of HBP-3, a non-fluorinated PTMSS-b-PMTC-Me block copolymer, by ring opening polymerization (ROP) of MTC-Me and macroinitiator PSI-2 using the general procedure of Example 28 with DBU as the ROP base catalyst.

Example 31

Synthesis of HBP-4, a non-fluorinated PTMSS-b-PMTC-Bz block copolymer, by ring opening polymerization (ROP) of MTC-Bz and macroinitiator PSI-1 using the general procedure of Example 28 with DBU as the ROP base catalyst.

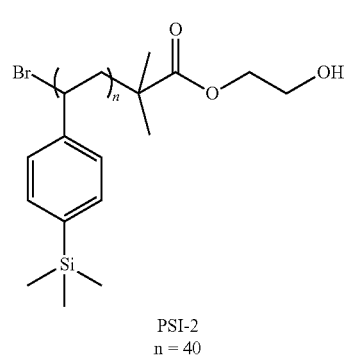

PSI-2
n = 40

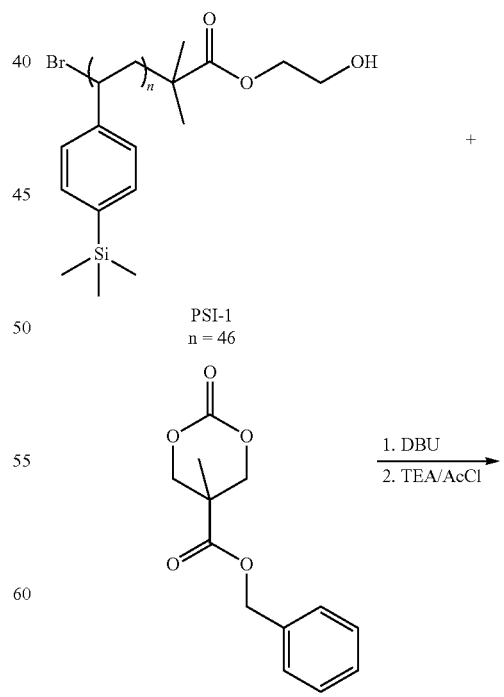

PSI-1
n = 46

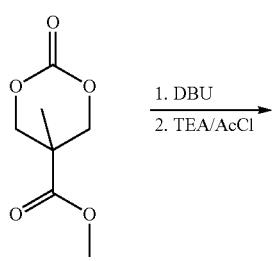

MTC-Me

MTC-Bz

-continued

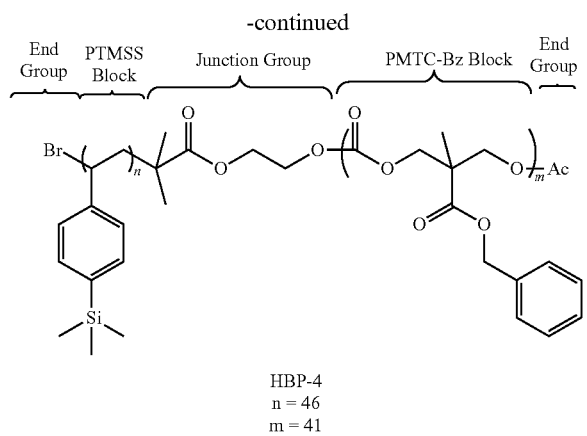

HBP-4
n = 46
m = 41

The final polymer HBP-4 had Mn (GPC)=18100, Mw=20000, PDI=1.10; Mn of each block: PTMSS block (GPC)=8200, PMTC-Bz block (NMR)=10200, n=46, m=41, $Vf_{PMTC-Bz}$~0.48.

Example 32

Synthesis of HBP-5, a non-fluorinated polystyrene-b-poly(TMC) block copolymer, by ring opening polymerization (ROP) of TMC using EMD-PS-OH (Mn 6200) as macroinitiator using the general procedure of Example 28 with diphenylphosphate (DPP) as the ROP base catalyst.

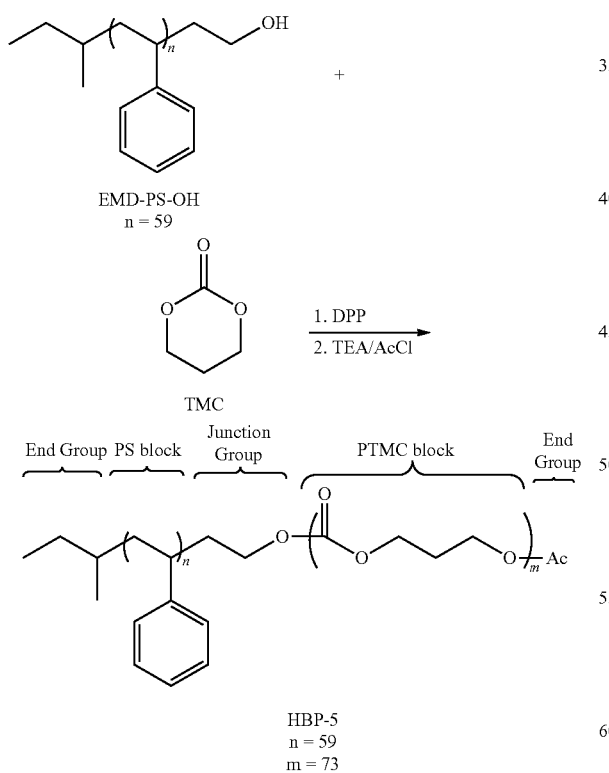

HBP-5
n = 59
m = 73

The final polymer HBP-5 had Mn (GPC)=20300, Mw=21000, PDI=1.03; Mn of each block: PS block (GPC)=6200, PTMC block (NMR)=7400, n=59, m=73. The volume fraction of the PTMC block ($Vf_{PTMC}$)~0.48.

Example 33

Synthesis of HBP-6, a non-fluorinated poly(styrene)-b-poly(DMC) block copolymer, by ring opening polymerization (ROP) of DMC and EMD-PS-OH (Mn 6600) as macroinitiator using the general procedure of Example 28 with DPP as the ROP base catalyst.

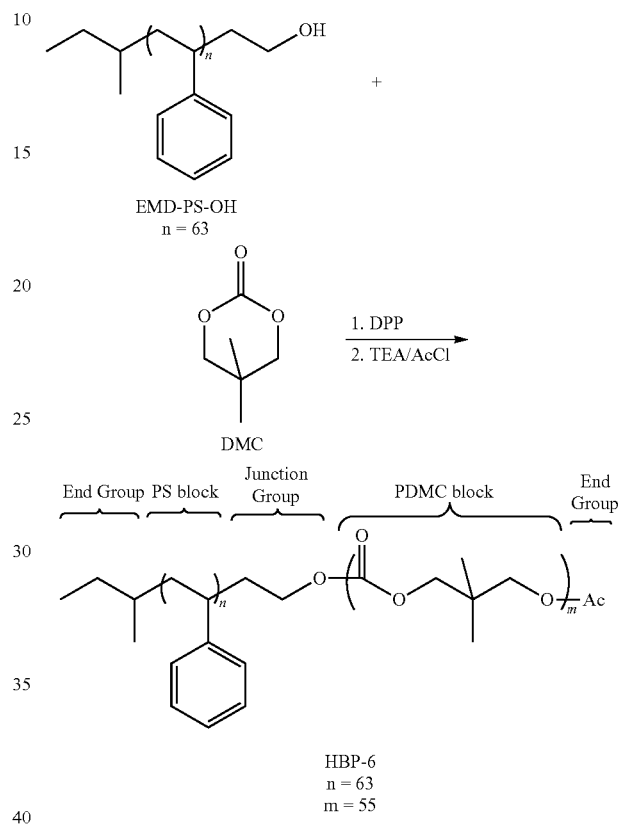

HBP-6
n = 63
m = 55

The final polymer HBP-6 had Mn (GPC)=26100, Mw=26900, PDI=1.03; Mn of each block: PS block (GPC)=6600, PDMC block (NMR)=7200, n=63, m=55 $Vf_{PDMC}$~0.50.

Example 34

Synthesis of HBP-7, a non-fluorinated polystyrene-b-polylactide block copolymer, by ring opening polymerization (ROP) of D,L-lactide (LAC) initiated by EMD-PS-OH (Mn=12500) using the general procedure of Example 28, with M6TREN and TU as the ROP base catalyst and cocatalyst.

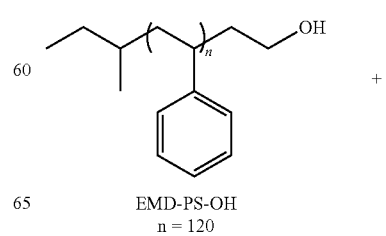

EMD-PS-OH
n = 120

+

-continued

[Reaction scheme: LAC with 1. TU/M6TREN, 2. TEA/AcCl → HBP-7]

HBP-7
n = 120
m = 88

(Structure: End Group — PS block — Junction Group — PLA block — End Group)

The final polymer HBP-7 had Mn (GPC)=29500, Mw=31300, PDI=1.05; Mn of each block: PS block (GPC)=12500, PLA block (NMR)=12700, n=120, m=88 $Vf_{PLA}$~0.46.

Preparation of Triblock Copolymers without Junction Group

Example 35

Synthesis of TBP-1, a non-fluorinated PMTC-Me-b-PS-b-PMTC-Me (BAB) triblock copolymer, by ring opening polymerization (ROP) of MTC-Me and macroinitiator OH-PSI1-OH (Mn=15000, n=144, obtained from Polymer Source Incorporated, Montreal, Canada) using the general procedure of Example 28 with DBU as the ROP base catalyst.

[Reaction scheme: OH-PSI1-OH (n=144) + MTC-Me → TBP-1]

TBP-1
n = 144
m = 92

(Structure: End Group — PMTC-Me block — Junction Group — PS block — Junction Group — PMTC-Me block — End Group)

The final polymer TBP-1 had Mn (GPC)=26700, Mw=28000, PDI=1.04; Mn of each block by NMR: PMTC-Me blocks=8000, PS block=15000, n=144, m=92. The volume fraction of the PMTC-Me blocks $Vf_{PMTC-Me}$ was 0.46.

Example 36

Synthesis of TBP-2, a non-fluorinated PTMC-b-PS-b-PTMC (BAB) triblock copolymer, by ring opening polymerization (ROP) of TMC and macroinitiator OH-PS12-OH (Mn=11500, n=108, obtained from Polymer Source Incorporated, Montreal, Canada) using the general procedure of Example 28 with DBU as the ROP base catalyst.

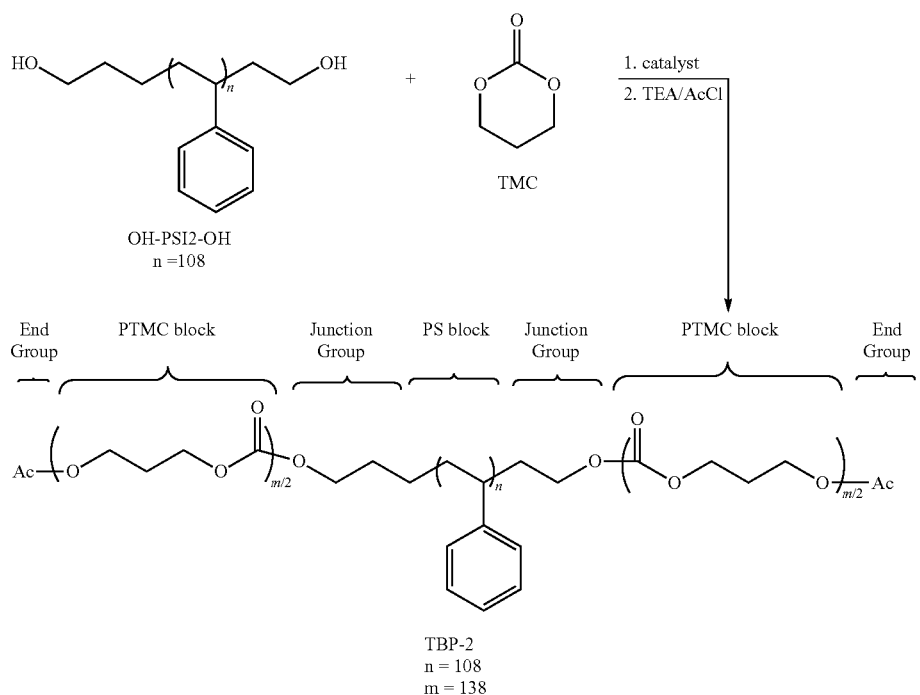

The final polymer TBP-2 had Mn (GPC)=27900, Mw=30300, PDI=1.09; Mn of each block: PTMC blocks (NMR)=7000, PS block (NMR)=11500, n=108, m=138. The volume fraction of the PTMC blocks $Vf_{PTMC}$ was about 0.49.

Preparation of Diblock Copolymers with Linear Junction Group

Example 37

Synthesis of FBP-1, a PS-b-PMTC-Me block copolymer with linear fluorinated junction group, by ring opening polymerization (ROP) of MTC-Me and macroinitiator PSI-3 using the general procedure of Example 28 with DBU as the ROP base catalyst.

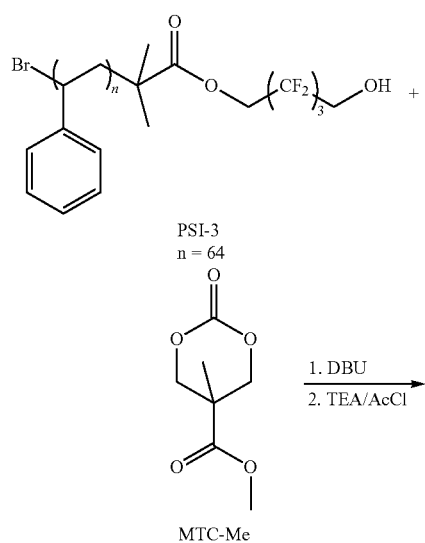

-continued

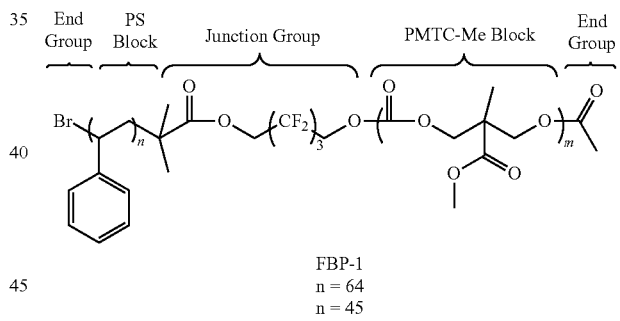

FBP-1
n = 64
n = 45

The final polymer FBP-1 had Mn (GPC)=18200, Mw=19600, PDI=1.08; Mn of each block: PS block (GPC)=7000, PMTC-Me block (NMR)=7900, n=64, m=45, $Vf_{PMTC\text{-}Me}$~0.50.

Example 38

Synthesis of FBP-2, a PS-b-PMTC-Me block copolymer with linear fluorinated junction group, by ring opening polymerization (ROP) of MTC-Me and macroinitiator PSI-4 using the general procedure of Example 28 with DBU as the ROP base catalyst.

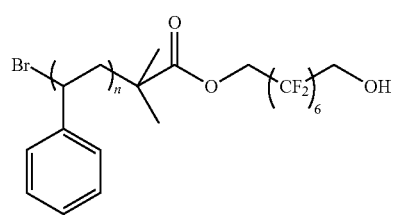

PSI-4
n = 103

+

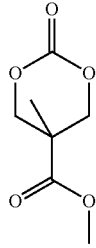

MTC-Me $\xrightarrow{\text{1. DBU} \\ \text{2. TEA/AcCl}}$

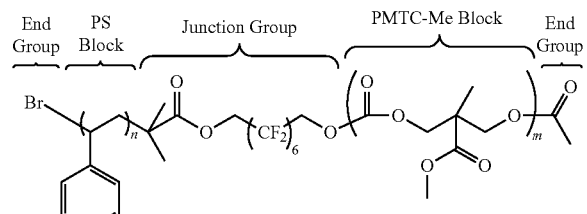

FBP-2
n = 103
m = 72

The final polymer FBP-2 had Mn (GPC)=22400, Mw=24500, PDI=1.09; Mn of each block: PS block (GPC)=11300, PMTC-Me block (NMR)=12500, n=103, m=72, $Vf_{PMTC\text{-}Me}$~0.48.

Example 39

Synthesis of FBP-3, a PS-b-PMTC-Me block copolymer with linear fluorinated junction group, by ring opening polymerization (ROP) of MTC-Me and macroinitiator PSI-5 using the general procedure of Example 28 with DBU as the ROP base catalyst.

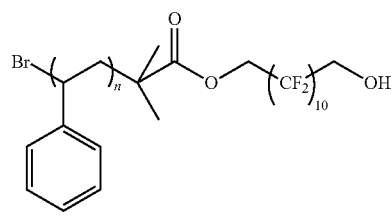

PSI-5
n = 58

+

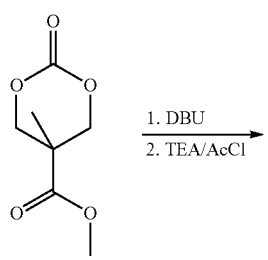

MTC-Me $\xrightarrow{\text{1. DBU} \\ \text{2. TEA/AcCl}}$

-continued

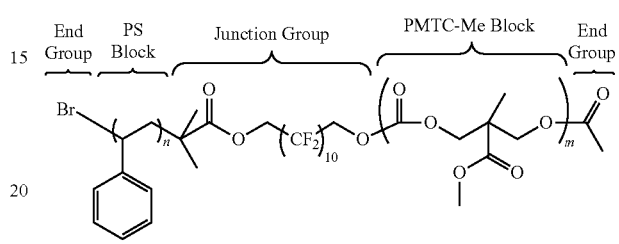

FBP-3
n = 58
m = 37

The final polymer FBP-3 had Mn (GPC)=13400, Mw=15500, PDI=1.16; Mn of each block: PS block (GPC)=6800, PMTC-Me block (NMR)=6440, n=58, m=37, $Vf_{PMTC\text{-}Me}$~0.46.

Example 40

Synthesis of FBP-4, a PS-b-PMTC-Me block copolymer with linear fluorinated junction group, by ring opening polymerization (ROP) of MTC-Me and macroinitiator PSI-8 using the general procedure of Example 28 with DBU as the ROP base catalyst.

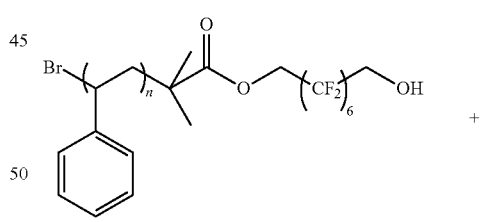

PSI-8
n = 132

+

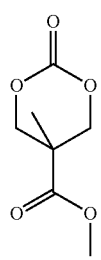

MTC-Me $\xrightarrow{\text{1. DBU} \\ \text{2. TEA/AcCl}}$

-continued

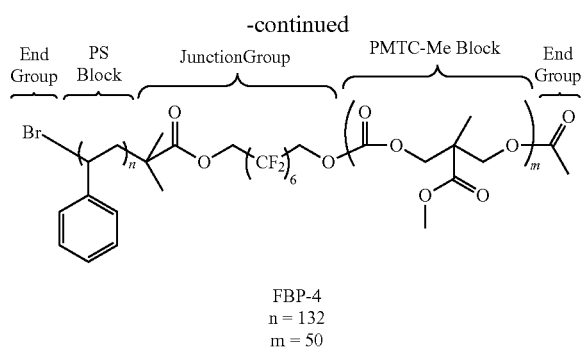

FBP-4
n = 132
m = 50

The final polymer FBP-4 had Mn (GPC)=25600, Mw=26000, PDI=1.04; Mn of each block: PS block (GPC)=14200, PMTC-Me block (NMR)=8700, n=132, m=50, $Vf_{PMTC-Me}$~0.33.

Example 41

Synthesis of FBP-5, a PS-b-PMTC-Et block copolymer with linear fluorinated junction group, by ring opening polymerization (ROP) of MTC-Et and macroinitiator PSI-4 using the general procedure of Example 28 with DBU as the ROP base catalyst.

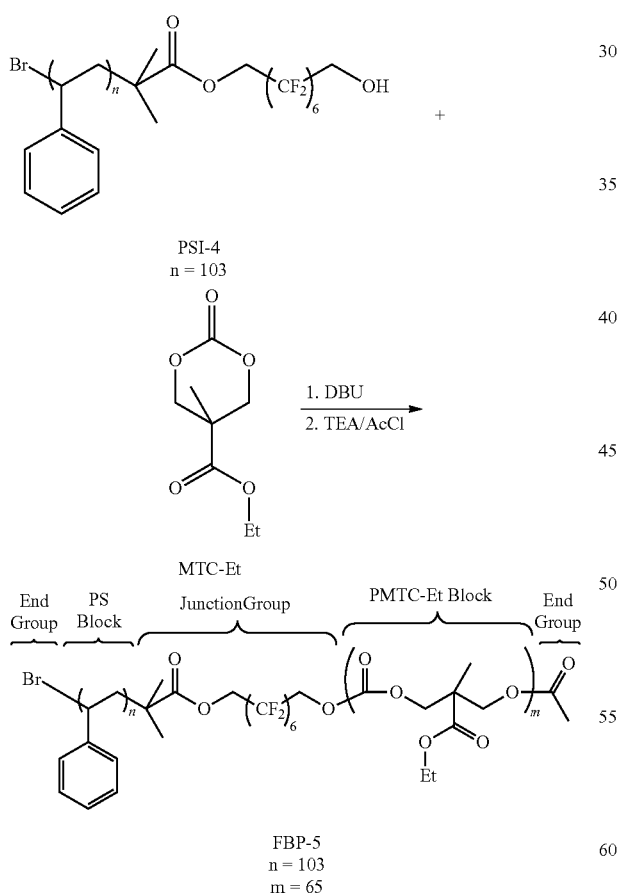

FBP-5
n = 103
m = 65

The final polymer FBP-5 had Mn (GPC)=29700, Mw=31200, PDI=1.05; Mn of each block: PS block (GPC)=11300, PMTC-Et block (NMR)=12200, n=103, m=65, $Vf_{PMTC-Et}$~0.48.

Example 42

Synthesis of FBP-6, a PS-b-PMTC-Et block copolymer with linear fluorinated junction group, by ring opening polymerization (ROP) of MTC-Et and macroinitiator PSI-5 using the general procedure of Example 28 with DBU as the ROP base catalyst.

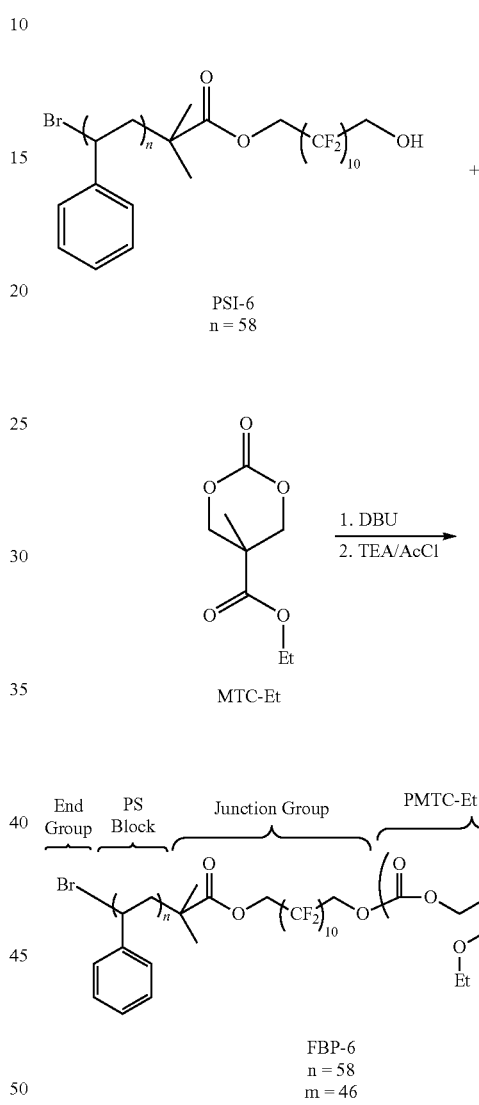

FBP-6
n = 58
m = 46

The final polymer FBP-6 had Mn (GPC)=15900, Mw=17100, PDI=1.07; Mn of each block: PS block (GPC)=6800, PMTC-Et block (NMR)=8700, n=58, m=46, $Vf_{PMTC-Et}$~0.52.

Example 43

Synthesis of FBP-7, a PTMSS-b-PMTC-Me block copolymer with linear fluorinated junction group, by ring opening polymerization (ROP) of MTC-Me and macroinitiator PSI-10 using the general procedure of Example 28 with DBU as the ROP base catalyst.

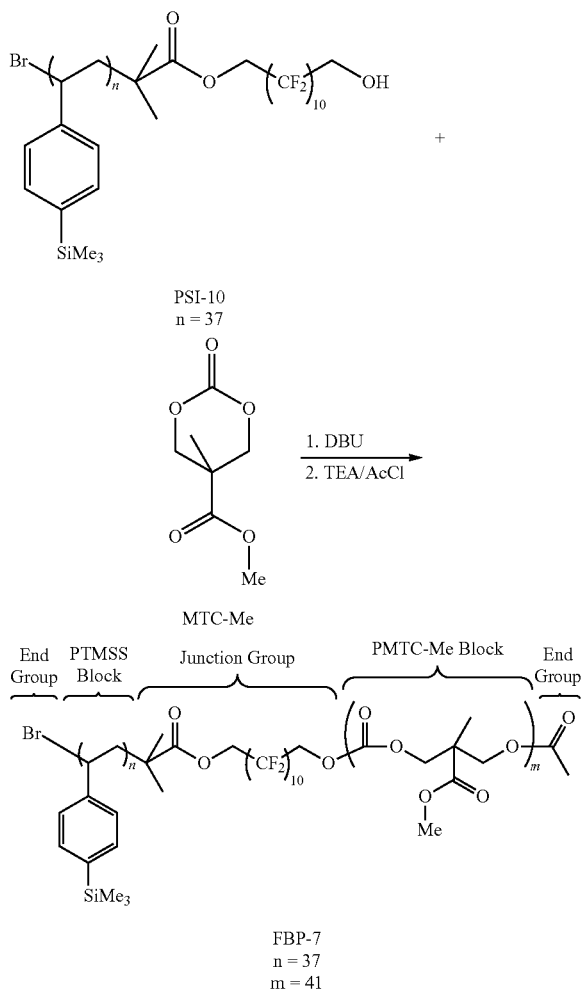

The final polymer FBP-7 had Mn (GPC)=21800, Mw=23600, PDI=1.08; Mn of each block: PTMSS block (GPC)=7200, PMTC-Me block (NMR)=7140, n=37, m=41, Vf$_{PMTC-Me}$~0.44.

Example 44

Synthesis of FBP-8, a PTMSS-b-PMTC-Bz block copolymer with linear fluorinated junction group, by ring opening polymerization (ROP) of MTC-Bz and macroinitiator PSI-10 using the general procedure of Example 28 with DBU as the ROP base catalyst.

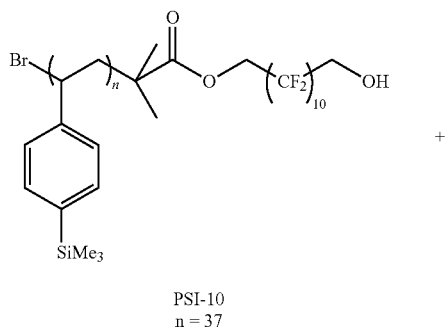

The final polymer FBP-8 had Mn (GPC)=19700, Mw=22400, PDI=1.14; Mn of each block: PTMSS block (GPC)=7200, PMTC-Bz block (NMR)=8900, n=37, m=26, Vf$_{PMTC-Bz}$~0.52.

Example 45

Synthesis of FBP-9, a polystyrene-b-polylactide block copolymer with linear fluorinated junction group, by ring opening polymerization (ROP) of D,L-lactide (LAC) and macroinitiator PSI-6 using the general procedure of Example 28 with M6TREN and TU as the ROP base catalyst and cocatalyst.

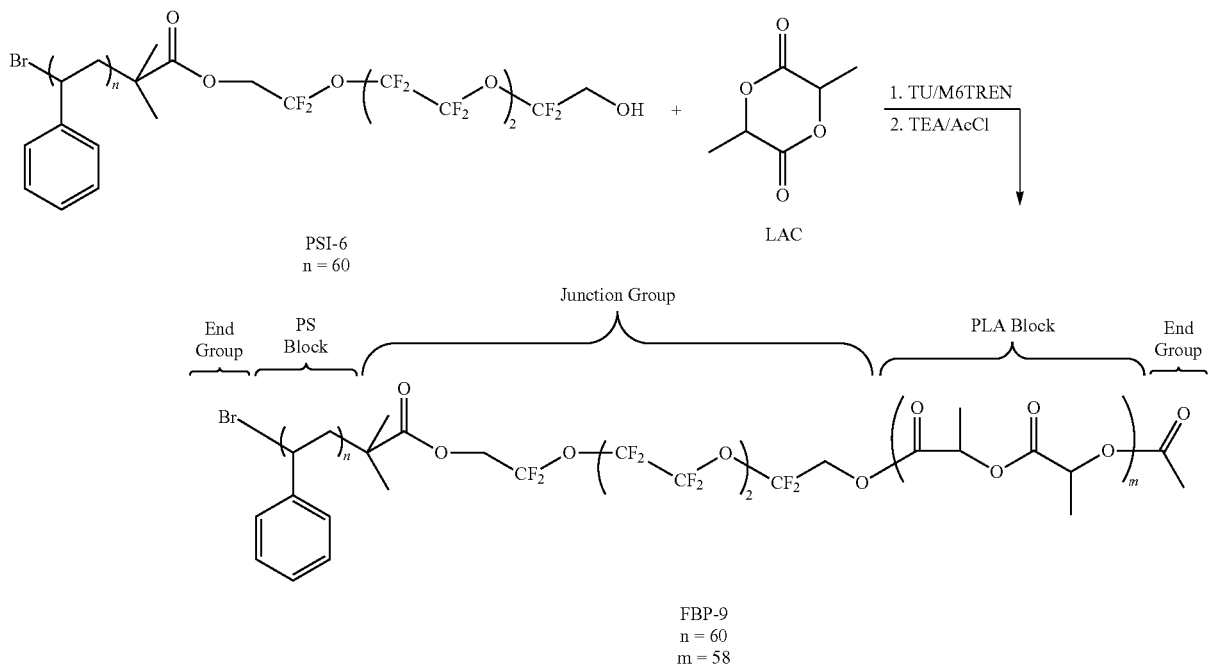

The final polymer FBP-9 had Mn (GPC)=26600, Mw=28000, PDI=1.05; Mn of each block: PS block (GPC)=6800, PLA block (NMR)=8450, n=60, m=58, Vf$_{PLA}$~0.53.

Example 46

Synthesis of FBP-10, a polystyrene-b-polylactide block copolymer with linear fluorinated junction group, by ring opening polymerization (ROP) of D,L-lactide (LAC) and macroinitiator PSI-9 using the general procedure of Example 28 with M6TREN and TU as the ROP base catalyst and cocatalyst.

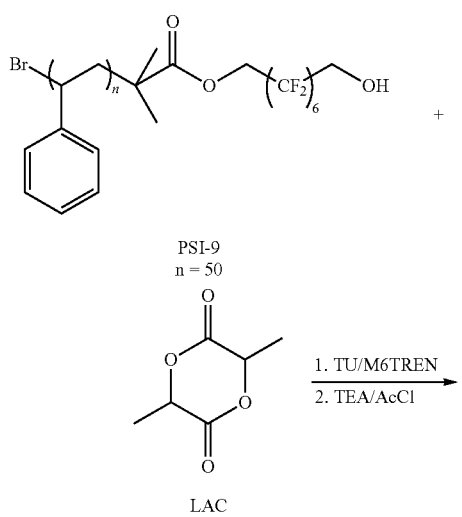

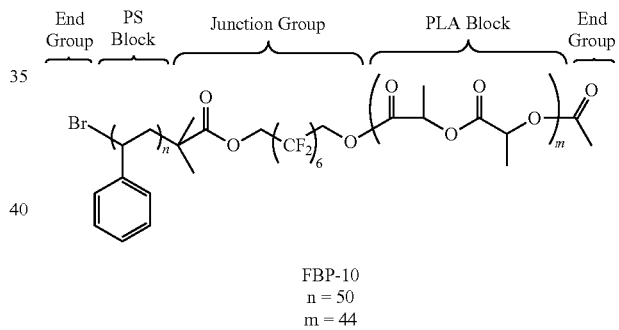

The final polymer FBP-10 had Mn (GPC)=20200, Mw=22800, PDI=1.12; Mn of each block: PS block (GPC)=5700, PLA block (NMR)=6300, n=50, m=44, Vf$_{PLA}$~0.51.

Example 47

Synthesis of FBP-11, a polystyrene-b-polylactide block copolymer with linear fluorinated junction group, by ring opening polymerization (ROP) of D,L-lactide (LAC) and macroinitiator PSI-4 using the general procedure of Example 28 with M6TREN and TU as the ROP base catalyst and cocatalyst.

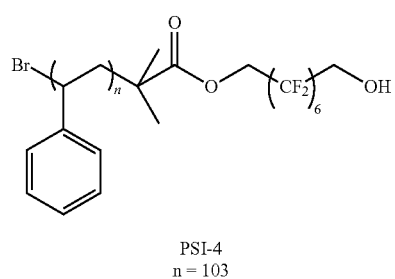

PSI-4
n = 103

+

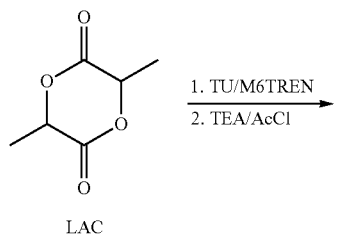

LAC

1. TU/M6TREN
2. TEA/AcCl →

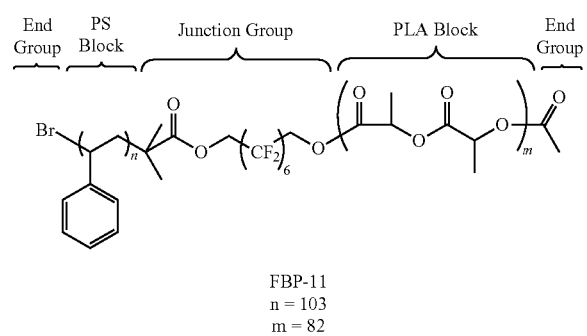

FBP-11
n = 103
m = 82

The final polymer FBP-11 had Mn (GPC)=23900, Mw=25900, PDI=1.08; Mn of each block: PS block (GPC)=11300, PLA block (NMR)=10300, n=103, m=82, $Vf_{PLA}$~0.48.

Example 48

Synthesis of FBP-12, a polystyrene-b-polylactide block copolymer with linear fluorinated junction group, by ring opening polymerization (ROP) of D,L-lactide (LAC) and macroinitiator PSI-5 using the general procedure of Example 28 with M6TREN and TU as the ROP base catalyst and cocatalyst.

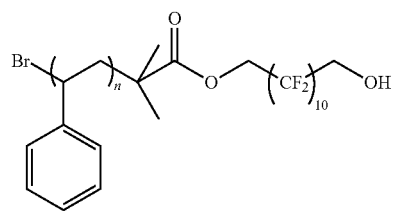

PSI-5
n = 58

+

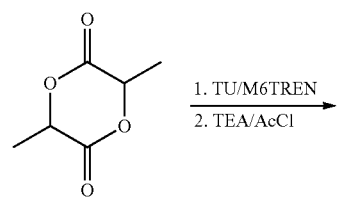

LAC

1. TU/M6TREN
2. TEA/AcCl →

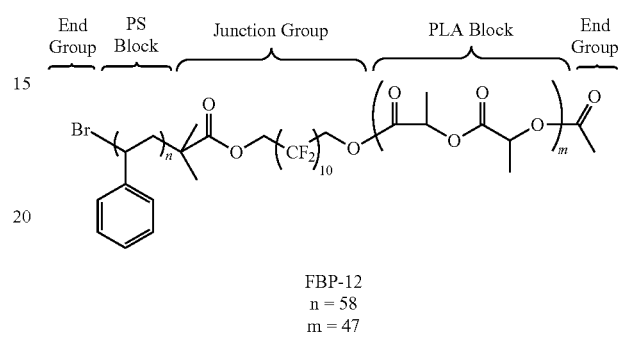

FBP-12
n = 58
m = 47

The final polymer FBP-12 had Mn (GPC)=20200, Mw=22200, PDI=1.09; Mn of each block: PS block (GPC)=6800, PLA block (NMR)=6840, n=58, m=47, $Vf_{PLA}$~0.49.

Example 49

Synthesis of HBP-8, a PS-b-PMTC-Me block copolymer with linear non-fluorinated junction group, by ring opening polymerization (ROP) of MTC-Me and macroinitiator PSI-7 using the general procedure of Example 28 with DBU as the ROP base catalyst.

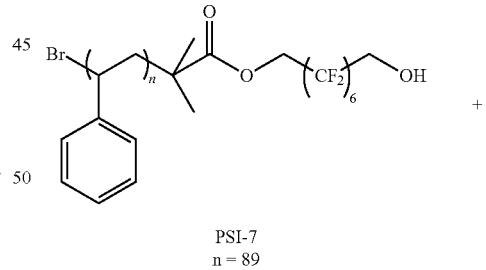

PSI-7
n = 89

+

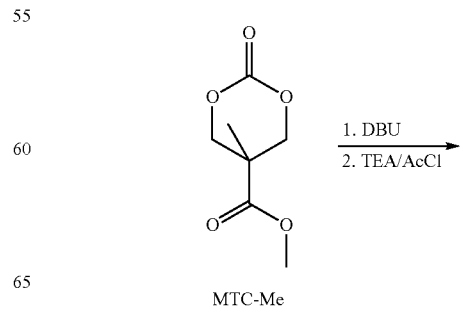

MTC-Me

1. DBU
2. TEA/AcCl →

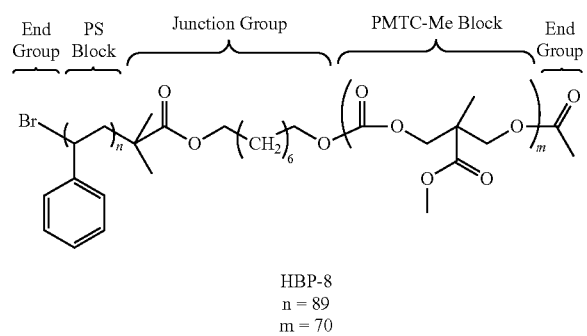

HBP-8
n = 89
m = 70

The final polymer HBP-8 had Mn (GPC)=23200, Mw=24500, PDI=1.05; Mn of each block: PS block (GPC)=9600, PMTC-Me block (NMR)=12200, n=89, m=70, $Vf_{PMTC\text{-}Me}$~0.51.

Preparation of Diblock Copolymers with Perpendicular Junction Group

Example 50

Synthesis of FBP-13, a PS-b-PMTC-Me block copolymer with perpendicular fluorinated junction group, by ring opening polymerization (ROP) of MTC-Me and macroinitiator PSI-17 using the general procedure of Example 28 with DBU as the ROP base catalyst.

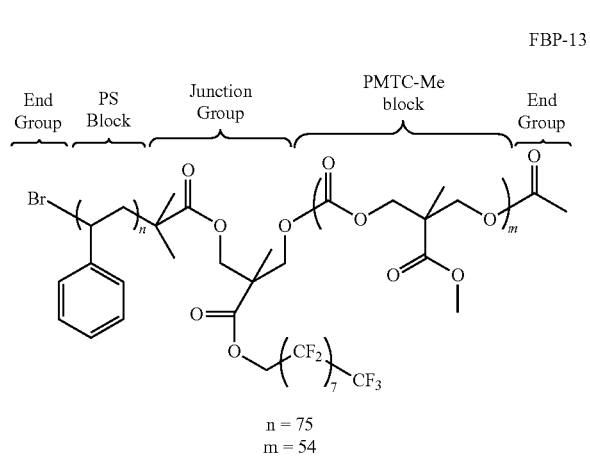

FBP-13 n = 75
m = 54

The final polymer FBP-13 had Mn (GPC)=17200, Mw=18500, PDI=1.07; Mn of each block: PS block (GPC)=8500, PMTC-Me block (NMR)=9370, n=75, m=54, $Vf_{PMTC\text{-}Me}$~0.49.

Example 51

Synthesis of FBP-14, a PS-b-PMTC-Me block copolymer with perpendicular fluorinated junction group, by ring opening polymerization (ROP) of MTC-Me and macroinitiator PSI-15 using the general procedure of Example 28 with DBU as the ROP base catalyst.

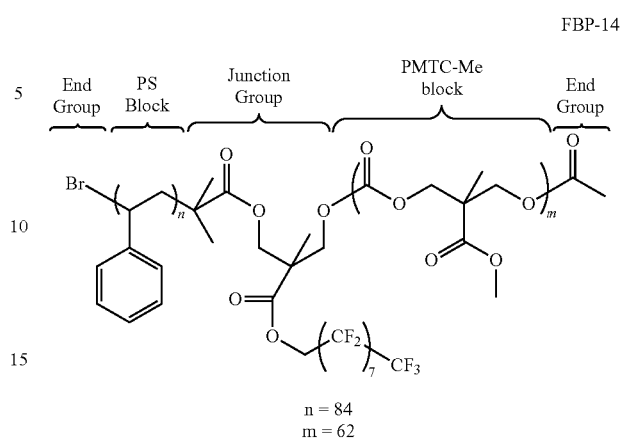

FBP-14 n = 84
m = 62

The final polymer FBP-14 had Mn (GPC)=21500, Mw=23500, PDI=1.09; Mn of each block: PS block (GPC)=9400, PMTC-Me block (NMR)=10800, n=84, m=62, $Vf_{PMTC\text{-}Me}$~0.5.

Example 52

Synthesis of FBP-15, a PS-b-PMTC-Me block copolymer with perpendicular fluorinated junction group, by ring opening polymerization (ROP) of MTC-Me and macroinitiator PSI-16 using the general procedure of Example 28 with DBU as the ROP base catalyst.

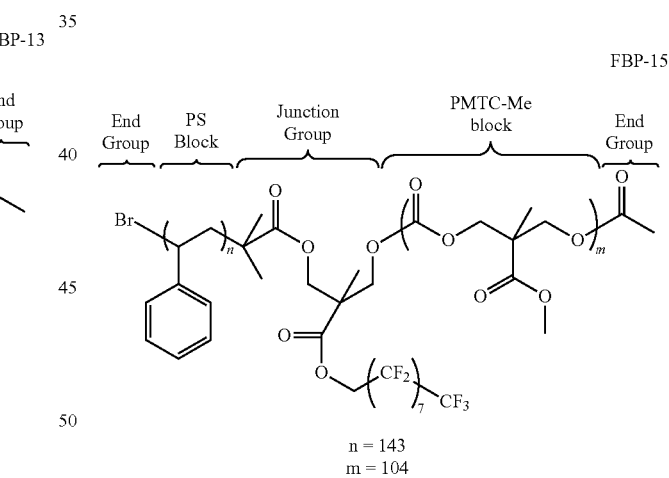

FBP-15 n = 143
m = 104

The final polymer FBP-15 had Mn (GPC)=30100, Mw=32700, PDI=1.08; Mn of each block: PS block (GPC)=15600, PMTC-Me block (NMR)=18100, n=143, m=104, $Vf_{PMTC\text{-}Me}$~0.49.

Example 53

Synthesis of FBP-16, a PS-b-PMTC-Et block copolymer with perpendicular fluorinated junction group, by ring opening polymerization (ROP) of MTC-Et and macroinitiator PSI-16 using the general procedure of Example 28 with DBU as the ROP base catalyst.

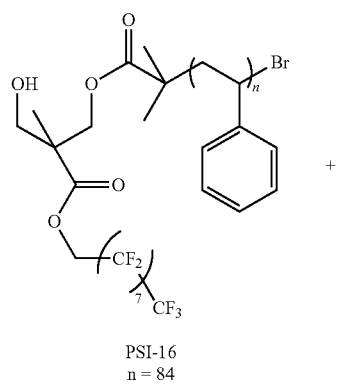

PSI-16
n = 84

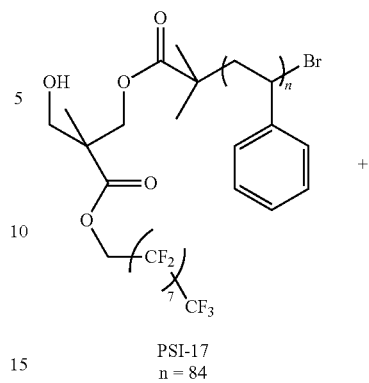

PSI-17
n = 84

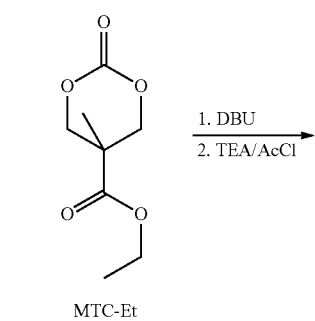

MTC-Et

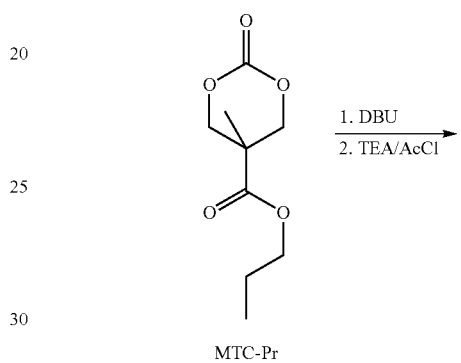

MTC-Pr

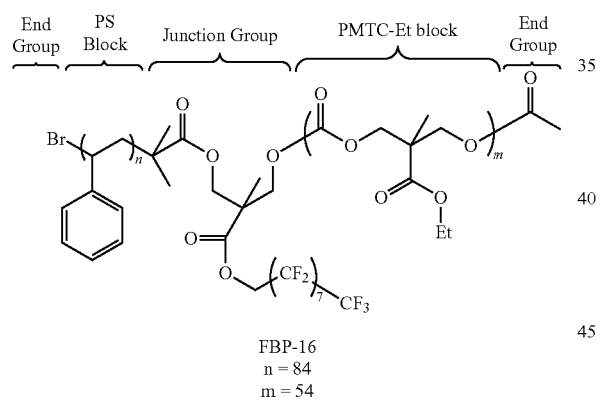

FBP-16
n = 84
m = 54

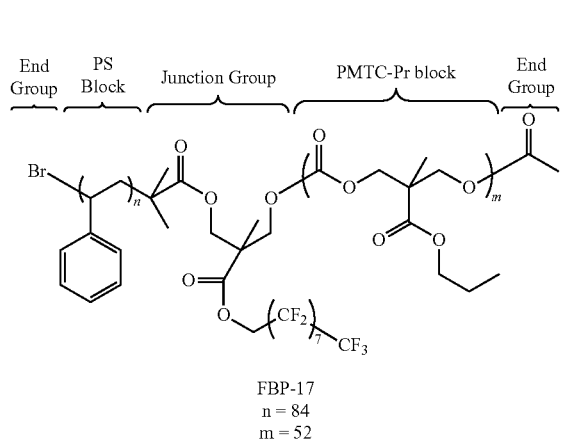

FBP-17
n = 84
m = 52

The final polymer FBP-16 had Mn (GPC)=23300, Mw=26700, PDI=1.14; Mn of each block: PS block (GPC)=9400, PMTC-Me block (NMR)=10200, n=84, m=54, $Vf_{PMTC-Et}$~0.48.

The final polymer FBP-17 had Mn (GPC)=23300, Mw=25700, PDI=1.10; Mn of each block: PS block (GPC)=9400, PMTC-Me block (NMR)=10600, n=84, m=52, $Vf_{PMTC-Pr}$~0.49.

Example 54

Synthesis of FBP-17, a PS-b-PMTC-Pr block copolymer with perpendicular fluorinated junction group, by ring opening polymerization (ROP) of MTC-Pr and macroinitiator PSI-17 using the general procedure of Example 28 with DBU as the ROP base catalyst.

Example 55

Synthesis of FBP-18, a PS-b-PMTC-Pr block copolymer with perpendicular fluorinated junction group, by ring opening polymerization (ROP) of MTC-Pr and macroinitiator PSI-18 using the general procedure of Example 28 with DBU as the ROP base catalyst.

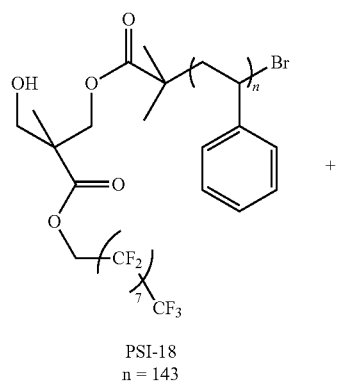

PSI-18
n = 143

+

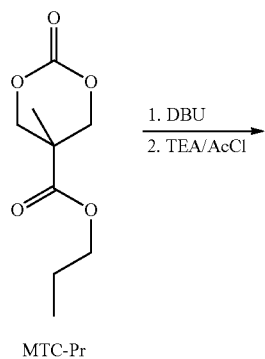

MTC-Pr

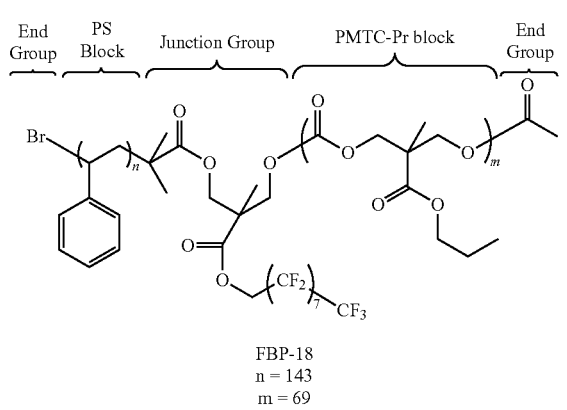

FBP-18
n = 143
m = 69

The final polymer FBP-18 had Mn (GPC)=30200, Mw=33700, PDI=1.11; Mn of each block: PS block (GPC)=15600, PMTC-Me block (NMR)=13900, n=143, m=69, $Vf_{PMTC-Pr}$~0.47.

Example 56

Synthesis of FBP-19, a PTMSS-b-PMTC-Me block copolymer with perpendicular fluorinated junction group, by ring opening polymerization (ROP) of MTC-Me and macroinitiator PSI-18 using the general procedure of Example 28 with DBU as the ROP base catalyst.

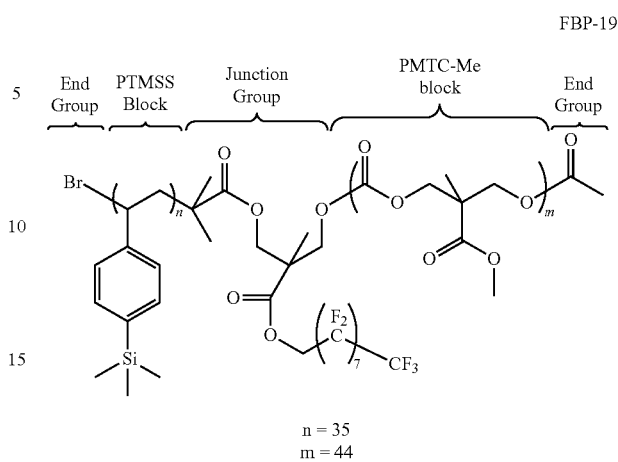

FBP-19 n = 35
m = 44

The final polymer FBP-19 had Mn (GPC)=14100, Mw=15100, PDI=1.10; Mn of each block: PTMSS block (GPC)=6800, PMTC-Me block (NMR)=8350, n=35, m=44, $Vf_{PMTC-Me}$~0.49.

Example 57

Synthesis of FBP-20, a polystyrene-b-poly(TMC) block copolymer with perpendicular fluorinated junction group, by ring opening polymerization (ROP) of TMC and macroinitiator PSI-11 using the general procedure of Example 28 with DBU as the ROP base catalyst.

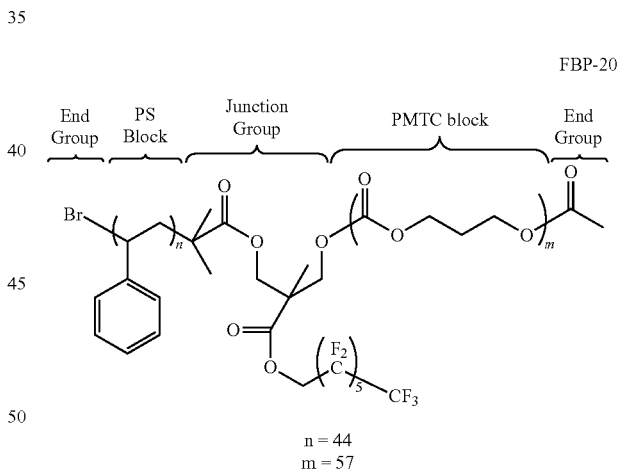

FBP-20 n = 44
m = 57

The final polymer FBP-20 had Mn (GPC)=14600, Mw=15500, PDI=1.16; Mn of each block: PS block (GPC)=5200, PTMC block (NMR)=5820, n=44, m=57, $Vf_{PTMC}$~0.50.

Example 58

Synthesis of FBP-21, a polystyrene-b-poly(TMC) block copolymer with perpendicular fluorinated junction group, by ring opening polymerization (ROP) of TMC and macroinitiator PSI-15 using the general procedure of Example 28 with DBU as the ROP base catalyst.

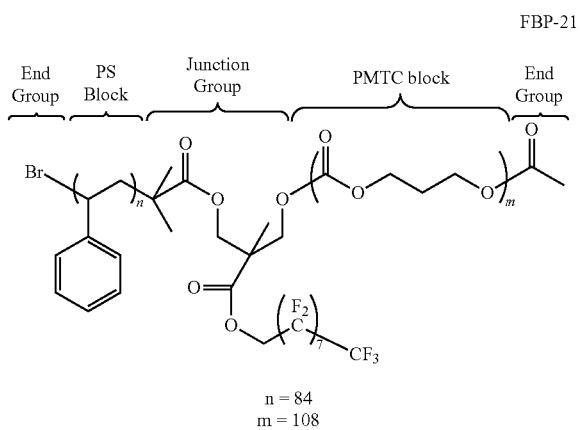

FBP-21
n = 84
m = 108

The final polymer FBP-21 had Mn (GPC)=24300, Mw=27600, PDI=1.13; Mn of each block: PS block (GPC)=9400, PTMC block (NMR)=11000, n=84, m=108, $Vf_{PTMC}$~0.49.

Example 59

Synthesis of FBP-22, a polystyrene-b-poly(TMC) block copolymer with perpendicular fluorinated junction group, by ring opening polymerization (ROP) of TMC and macroinitiator PSI-15 using the general procedure of Example 28 with DBU as the ROP base catalyst.

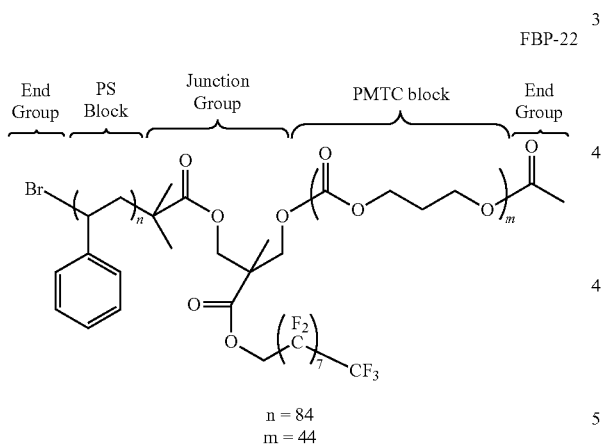

FBP-22
n = 84
m = 44

The final polymer FBP-22 had Mn (GPC)=18000, Mw=20000, PDI=1.11; Mn of each block: PS block (GPC)=9400, PTMC block (NMR)=4470, n=84, m=44, $Vf_{PTMC}$~0.28. This volume fraction (Vf) is in a range conducive to formation of cylindrical PTMC domains.

Example 60

Synthesis of FBP-23, a polystyrene-b-poly(TMC) block copolymer with perpendicular fluorinated junction group, by ring opening polymerization (ROP) of TMC and macroinitiator PSI-12 using the general procedure of Example 28 with DBU as the ROP base catalyst.

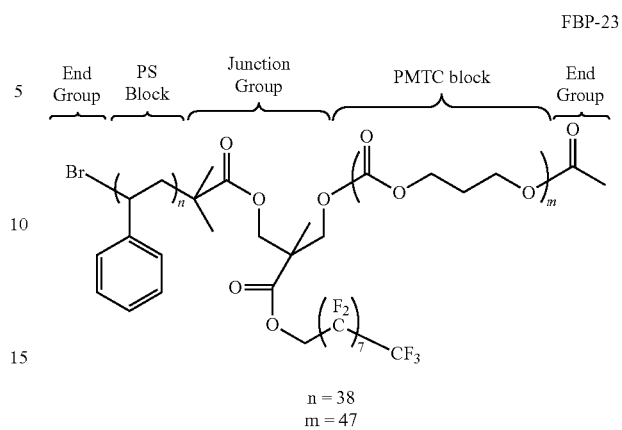

FBP-23
n = 38
m = 47

The final polymer FBP-23 had Mn (GPC)=15300, Mw=16700, PDI=1.08; Mn of each block: PS block (GPC)=4700, PTMC block (NMR)=4800, n=38, m=47, $Vf_{PTMC}$~0.49.

Example 61

Synthesis of FBP-24, a polystyrene-b-poly(TMC) block copolymer with perpendicular fluorinated junction group, by ring opening polymerization (ROP) of TMC and macroinitiator PSI-13 using the general procedure of Example 28 with DBU as the ROP base catalyst.

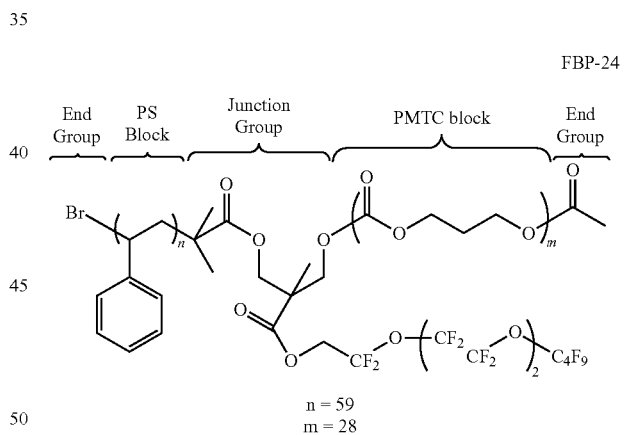

FBP-24
n = 59
m = 28

The final polymer FBP-24 had Mn (GPC)=12400, Mw=13700, PDI=1.11; Mn of each block: PS block (GPC)=6900, PTMC block (NMR)=2850, n=59, m=28, $Vf_{PTMC}$~0.27. This volume fraction (Vf) is in a range conducive to formation of cylindrical PTMC domains.

Example 62

Synthesis of FBP-25, a polystyrene-b-poly(TMC) block copolymer with perpendicular fluorinated junction group, by ring opening polymerization (ROP) of TMC and macroinitiator PSI-13 using the general procedure of Example 28 with DBU as the ROP base catalyst.

FBP-25

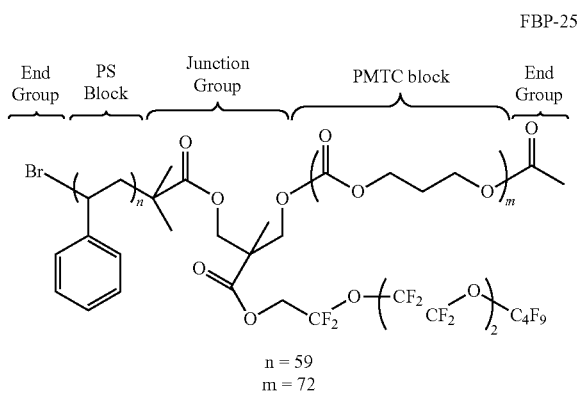

n = 59
m = 72

The final polymer FBP-25 had Mn (GPC)=19300, Mw=21000, PDI=1.09; Mn of each block: PS block (GPC)=6900, PTMC block (NMR)=7400, n=59, m=72, $Vf_{PTMC}$~0.49.

Example 63

Synthesis of FBP-26, a polystyrene-b-polylactide block copolymer with perpendicular fluorinated junction group, by ring opening polymerization (ROP) of D,L-lactide (LAC) and macroinitiator PSI-17 using the general procedure of Example 28 with M6TREN and TU as the ROP base catalyst and cocatalyst.

FBP-26

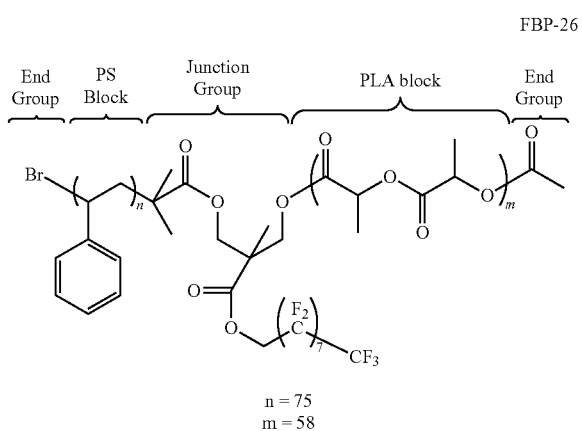

n = 75
m = 58

The final polymer FBP-26 had Mn (GPC)=19900, Mw=21400, PDI=1.07; Mn of each block: PS block (GPC)=8500, PLA block (NMR)=8450, n=75, m=58, $Vf_{PLA}$~0.48.

Example 64

Synthesis of FBP-27, a PTMSS-b-polylactide block copolymer with perpendicular fluorinated junction group, by ring opening polymerization (ROP) of D,L-lactide (LAC) and macroinitiator PSI-18 using the general procedure of Example 28 with M6TREN and TU as the ROP base catalyst and cocatalyst.

FBP-27

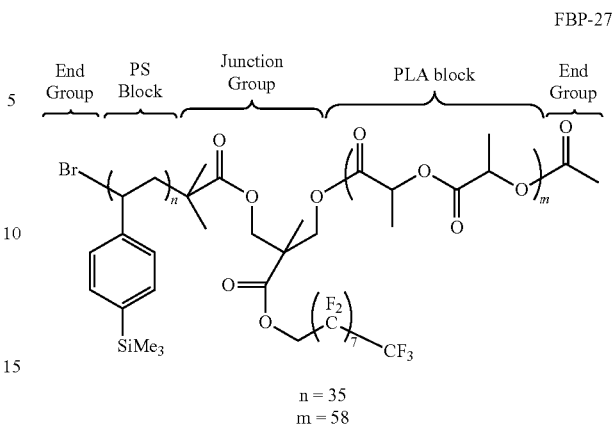

n = 35
m = 58

The final polymer FBP-27 had Mn (GPC)=17600, Mw=18900, PDI=1.07; Mn of each block: PS block (GPC)=6800, PLA block (NMR)=8350, n=35, m=58, $Vf_{PLA}$ 0.53.

Example 65

Synthesis of HBP-9, a polystyrene-b-poly(TMC) block copolymer with perpendicular non-fluorinated junction group, by ring opening polymerization (ROP) of TMC and macroinitiator PSI-14 using the general procedure of Example 28 with DBU as the ROP base catalyst.

HBP-9

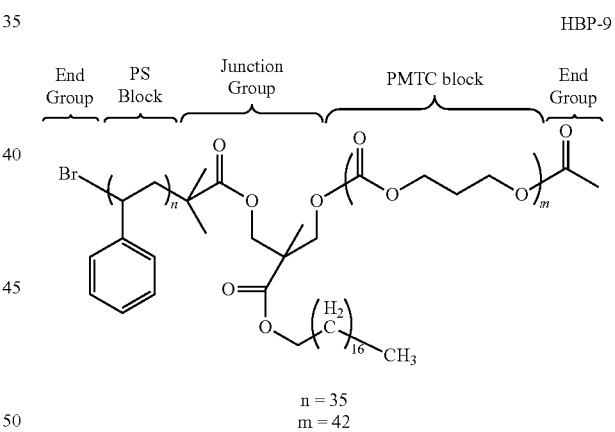

n = 35
m = 42

The final polymer HBP-9 had Mn (GPC)=10800, Mw=11600, PDI=1.06; Mn of each block: PS block (GPC)=4200, PTMC block (NMR)=4340, n=35, m=42, $Vf_{PTMC}$~0.48.

The preparations and characterization of block copolymer Examples 28-65 are summarized in Table 7 and 8.

TABLE 7

| BCP Ex. Name | Macro Initiator Name | Block A Monomer | Block A DP (n) | Block B Monomer | Block B DP (m) | Vf Block B | Junction Group Type | Junction Group (# Fluorines) |
|---|---|---|---|---|---|---|---|---|
| 28 | HBP-1 | EMD-PS-OH (Mn 12500) | Styrene | 120 | MTC-Me | 83 | 0.48 | non-F | 0 |

TABLE 7-continued

| BCP Ex. Name | Macro Initiator Name | Block A Monomer | Block A DP (n) | Block B Monomer | Block B DP (m) | Vf Block B | Junction Group Type | Junction Group (# Fluorines) |
|---|---|---|---|---|---|---|---|---|
| 29 HBP-2 | EMD-PS-OH (Mn 12500) | Styrene | 120 | MTC-Et | 84 | 0.50 | non-F | 0 |
| 30 HBP-3 | PSI-2 | TMSS | 40 | MTC-Me | 51 | 0.50 | non-F | 0 |
| 31 HBP-4 | PSI-1 | TMSS | 46 | MTC-Bz | 41 | 0.48 | non-F | 0 |
| 32 HBP-5 | EMD-PS-OH (Mn 6200) | Styrene | 59 | TMC | 73 | 0.48 | non-F | 0 |
| 33 HBP-6 | EMD-PS-OH (Mn 6600) | Styrene | 63 | DMC | 55 | 0.50 | non-F | 0 |
| 34 HBP-7 | EMD-PS-OH (Mn 12500) | Styrene | 120 | LAC | 88 | 0.46 | non-F | 0 |
| 35 TBP-1 | OH-PSI1-OH (Mn 15000) | Styrene | 144 | MTC-Me | 92 | 0.46 | non-F | 0 |
| 36 TBP-2 | OH-PSI2-OH (Mn 11500) | Styrene | 108 | TMC | 138 | 0.49 | non-F | 0 |
| 37 FBP-1 | PSI-3 | Styrene | 64 | MTC-Me | 45 | 0.50 | linear | 6 |
| 38 FBP-2 | PSI-4 | Styrene | 103 | MTC-Me | 72 | 0.48 | linear | 12 |
| 39 FBP-3 | PSI-5 | Styrene | 58 | MTC-Me | 37 | 0.46 | linear | 20 |
| 40 FBP-4 | PSI-8 | Styrene | 132 | MTC-Me | 50 | 0.33 | linear | 12 |
| 41 FBP-5 | PSI-4 | Styrene | 103 | MTC-Et | 65 | 0.48 | linear | 12 |
| 42 FBP-6 | PSI-5 | Styrene | 58 | MTC-Et | 46 | 0.52 | linear | 20 |
| 43 FBP-7 | PSI-10 | TMSS | 37 | MTC-Me | 41 | 0.44 | linear | 20 |
| 44 FBP-8 | PSI-10 | TMSS | 37 | MTC-Bz | 26 | 0.52 | linear | 20 |
| 45 FBP-9 | PSI-6 | Styrene | 60 | LAC | 58 | 0.53 | linear | 12 |
| 46 FBP-10 | PSI-9 | Styrene | 50 | LAC | 44 | 0.51 | linear | 12 |
| 47 FBP-11 | PSI-4 | Styrene | 103 | LAC | 82 | 0.48 | linear | 12 |
| 48 FBP-12 | PSI-5 | Styrene | 58 | LAC | 47 | 0.49 | linear | 20 |
| 49 HBP-8 | PSI-7 | Styrene | 89 | MTC-Me | 70 | 0.51 | non-F | 0 |
| 50 FBP-13 | PSI-17 | Styrene | 75 | MTC-Me | 54 | 0.49 | perpendicular | 17 |
| 51 FBP-14 | PSI-15 | Styrene | 84 | MTC-Me | 62 | 0.50 | perpendicular | 17 |
| 52 FBP-15 | PSI-16 | Styrene | 143 | MTC-Me | 104 | 0.49 | perpendicular | 17 |
| 53 FBP-16 | PSI-15 | Styrene | 84 | MTC-Et | 54 | 0.48 | perpendicular | 17 |
| 54 FBP-17 | PSI-15 | Styrene | 84 | MTC-Pr | 52 | 0.49 | perpendicular | 17 |
| 55 FBP-18 | PSI-16 | Styrene | 143 | MTC-Pr | 69 | 0.47 | perpendicular | 17 |
| 56 FBP-19 | PSI-18 | TMSS | 35 | MTC-Me | 44 | 0.49 | perpendicular | 17 |
| 57 FBP-20 | PSI-11 | Styrene | 44 | TMC | 57 | 0.50 | perpendicular | 13 |
| 58 FBP-21 | PSI-15 | Styrene | 84 | TMC | 108 | 0.49 | perpendicular | 17 |
| 59 FBP-22 | PSI-15 | Styrene | 84 | TMC | 44 | 0.28 | perpendicular | 17 |
| 60 FBP-23 | PSI-12 | Styrene | 38 | TMC | 47 | 0.49 | perpendicular | 17 |
| 61 FBP-24 | PSI-13 | Styrene | 59 | TMC | 28 | 0.27 | perpendicular | 19 |
| 62 FBP-25 | PSI-13 | Styrene | 59 | TMC | 72 | 0.49 | perpendicular | 19 |
| 63 FBP-26 | PSI-17 | Styrene | 75 | LAC | 58 | 0.48 | perpendicular | 17 |
| 64 FBP-27 | PSI-18 | TMSS | 35 | LAC | 58 | 0.53 | perpendicular | 17 |
| 65 HBP-9 | PSI-14 | Styrene | 35 | TMC | 42 | 0.48 | non-F | 0 |

TABLE 8

| BCP Ex. Name | Macro initiator (g, mmol) | Monomer B (g, mmol) | DCM (g) | Catalyst type | Catalyst (mg) | Time (hrs) | Mn (GPC) Block A | Mn (NMR) Block B | GPC Mn | GPC Mw | PDI |
|---|---|---|---|---|---|---|---|---|---|---|---|
| 28 HBP-1 | 0.1 0.01 | 0.31 1.80 | 2.4 | DBU | 1.5 | 2.5 | 12500 | 14400 | 30300 | 30800 | 1.01 |
| 29 HBP-2 | 0.2 0.0165 | 0.51 2.72 | 3.5 | DBU | 3 | 3.5 | 12500 | 15750 | 31600 | 32000 | 1.01 |
| 30 HBP-3 | 0.15 0.0214 | 0.5 2.89 | 3.8 | DBU | 3.3 | 2.3 | 7000 | 8900 | 15400 | 16000 | 1.05 |
| 31 HBP-4 | 0.15 0.0183 | 0.29 0.915 | 1.2 | DBU | 2.8 | 1.5 | 8200 | 10200 | 18100 | 20000 | 1.10 |
| 32 HBP-5 | 0.4 0.0645 | 1 9.87 | 3.5 | DPP | 161 | 20 | 6200 | 7400 | 20300 | 21000 | 1.03 |
| 33 HBP-6 | 0.15 0.0227 | 0.384 2.95 | 1.1 | DPP | 57 | 49 | 6600 | 7200 | 26100 | 26900 | 1.03 |
| 34 HBP-7 | 0.2 0.016 | 0.254 1.76 | 1.8 | M6TREN TU | 23 37 | 1.5 | 12500 | 12700 | 29500 | 31300 | 1.05 |
| 35 TBP-1 | 0.15 0.01 | 0.52 2.98 | 3.9 | DBU | 3.1 | 5.0 | 15000 | 8000 | 26700 | 28000 | 1.04 |
| 36 TBP-2 | 0.15 0.013 | 0.378 3.7 | 2.4 | DPP | 65 | 15 | 11500 | 7000 | 27900 | 30300 | 1.09 |
| 37 FBP-1 | 0.15 0.0214 | 0.5 2.9 | 3.8 | DBU | 3.3 | 2.0 | 7000 | 7900 | 18200 | 19600 | 1.08 |
| 38 FBP-2 | 0.15 0.022 | 0.26 1.5 | 2.0 | DBU | 1.3 | 2.0 | 11300 | 12500 | 22400 | 24500 | 1.09 |

TABLE 8-continued

| Ex. | BCP Name | Macro initiator (g, mmol) | Monomer B (g, mmol) | DCM (g) | Catalyst type | Catalyst (mg) | Time (hrs) | Mn (GPC) Block A | Mn (NMR) Block B | GPC Mn | GPC Mw | GPC PDI |
|---|---|---|---|---|---|---|---|---|---|---|---|---|
| 39 | FBP-3 | 0.15 0.022 | 0.51 2.9 | 3.8 | DBU | 3.3 | 2.0 | 6800 | 6440 | 13400 | 15500 | 1.16 |
| 40 | FBP-4 | 0.15 0.0105 | 0.51 2.96 | 3.8 | DBU | 1.4 | 3.5 | 14200 | 8700 | 25600 | 26000 | 1.04 |
| 41 | FBP-5 | 0.15 0.0132 | 0.49 2.6 | 3.4 | DBU | 2.0 | 5.5 | 11300 | 12200 | 29700 | 31200 | 1.05 |
| 42 | FBP-6 | 0.15 0.022 | 0.58 3.08 | 3.8 | DBU | 3.3 | 2.8 | 6800 | 8700 | 15900 | 17100 | 1.07 |
| 43 | FBP-7 | 0.10 0.013 | 0.31 1.81 | 2.4 | DBU | 2.0 | 3.0 | 7200 | 7140 | 21800 | 23600 | 1.08 |
| 44 | FBP-8 | 0.10 0.0141 | 0.32 1.297 | 1.6 | DBU | 2.2 | 1.0 | 7100 | 8900 | 19700 | 22400 | 1.14 |
| 45 | FBP-9 | 0.15 0.022 | 0.225 1.57 | 2.0 | M6TREN TU | 26 41 | 1.5 | 6800 | 8450 | 26600 | 28000 | 1.05 |
| 46 | FBP-10 | 0.1 0.0175 | 0.146 1.01 | 1.3 | M6TREN TU | 20 32 | 1.0 | 5700 | 6300 | 20200 | 22800 | 1.12 |
| 47 | FBP-11 | 0.15 0.01327 | 0.24 1.66 | 2.2 | M6TREN TU | 18 25 | 1.0 | 11300 | 10300 | 23900 | 25900 | 1.08 |
| 48 | FBP-12 | 0.15 0.022 | 0.33 2.29 | 3.0 | M6TREN TU | 20 32 | 1.5 | 6800 | 6840 | 20200 | 22200 | 1.09 |
| 49 | HBP-8 | 0.15 0.0105 | 0.31 1.79 | 2.3 | DBU | 1.6 | 1.5 | 9600 | 12200 | 23200 | 24500 | 1.05 |
| 50 | FBP-13 | 0.25 0.029 | 0.8 4.6 | 6.5 | DBU | 4.5 | 1.8 | 8500 | 9370 | 17200 | 18500 | 1.07 |
| 51 | FBP-14 | 0.10 0.0105 | 0.44 2.52 | 3.4 | DBU | 1.6 | 2.5 | 9400 | 10800 | 21500 | 23500 | 1.09 |
| 52 | FBP-15 | 0.10 0.0064 | 0.23 1.32 | 1.8 | DBU | 1.0 | 4.2 | 15600 | 18100 | 30100 | 32700 | 1.08 |
| 53 | FBP-16 | 0.10 0.0105 | 0.22 1.17 | 1.5 | DBU | 1.6 | 3.5 | 9400 | 10200 | 23300 | 26700 | 1.14 |
| 54 | FBP-17 | 0.1 0.0105 | 0.34 1.68 | 2.2 | DBU | 1.6 | 3.5 | 9400 | 10600 | 23300 | 25700 | 1.10 |
| 55 | FBP-18 | 0.10 0.0064 | 0.33 1.64 | 2.2 | DBU | 1.0 | 8.5 | 15600 | 13900 | 30200 | 33700 | 1.11 |
| 56 | FBP-19 | 0.10 0.0147 | 0.135 0.882 | 1.2 | DBU | 2.5 | 1.3 | 6800 | 7620 | 14100 | 15100 | 1.10 |
| 57 | FBP-20 | 0.3 0.0577 | 0.78 7.64 | 2.6 | DBU | 12 | 7.3 | 5200 | 5820 | 14600 | 15500 | 1.16 |
| 58 | FBP-21 | 0.2 0.021 | 0.515 5.05 | 1.7 | DBU | 12 | 8.0 | 9400 | 11000 | 24300 | 27600 | 1.13 |
| 59 | FBP-22 | 0.15 0.0158 | 0.167 1.64 | 0.7 | DBU | 12 | 3.5 | 9400 | 4470 | 18000 | 20000 | 1.11 |
| 60 | FBP-23 | 0.3 0.0577 | 0.78 7.64 | 2.6 | DBU | 12 | 6.0 | 4700 | 4800 | 15300 | 16700 | 1.08 |
| 61 | FBP-24 | 0.2 0.029 | 0.212 2.08 | 1.1 | DBU | 12 | 3.0 | 6900 | 2850 | 12400 | 13700 | 1.11 |
| 62 | FBP-25 | 0.2 0.0029 | 0.502 4.93 | 1.6 | DBU | 12 | 7.0 | 6900 | 7400 | 19300 | 21000 | 1.09 |
| 63 | FBP-26 | 0.15 0.0176 | 0.23 1.58 | 2.1 | M6TREN TU | 20 32 | 2.0 | 8500 | 8450 | 19900 | 21400 | 1.07 |
| 64 | FBP-27 | 0.1 0.0147 | 0.145 1.0 | 1.1 | M6TREN TU | 18 29 | 2.0 | 6800 | 8350 | 17600 | 18900 | 1.07 |
| 65 | HBP-9 | 0.15 0.0357 | 0.382 3.75 | 1.2 | DBU | 12 | 3.5 | 4200 | 4340 | 10800 | 11600 | 1.06 |

Example 66 (Comparative)

Preparation of "Control" block copolymer PS-b-PMMA. To a 500 ml round bottom flask equipped with a magnetic stir bar, methyl methacrylate (MMA, 40.0 g, 0.4 moles), cyanoisopropyldithiobenzoate (0.44 g, 2 mmol), and AIBN (33 mg, 0.2 mmol) were added. The reaction mixture was purged with nitrogen for 10 minutes followed by four freeze-pump-thaw cycles. The degassed reaction mixture was backfilled with nitrogen and was heated at 110° C. for 12 hours, at which point the reaction was stopped by cooling it an ice bath. The resulting polymer was diluted by adding THF (20 ml) and was precipitated two times in methanol followed by drying overnight in a vacuum oven at 40° C. to obtain PMMA (Mn=15.7K, PDI=1.06, 21.6 g) macroinitiator. In the next step, to a 50 ml round bottom flask equipped with a magnetic stir bar, PMMA obtained above (0.2 g, 0.00127 mmol), styrene (0.64 g, 6.1 mmol), and benzene (0.55 g) were added. The reaction mixture was stirred to completely dissolve the PMMA macroinitiator and was subjected to four freeze-pump-thaw cycles. The reaction was carried out at 110° C. for 21 hours followed by immediately cooling in an ice bath. The resulting polymer was dissolved in THF (5 ml) and was precipitated twice in methanol followed by drying overnight in a vacuum oven at 40° C. to obtain PS-b-PMMA, Mw=36700, Mn=33400, PDI=1.10. Mn of the PS block=17700 (DP=170), Mn of the PMMA block=15700 (DP=157).

Grapho-Epitaxy Directed Self-Assembly (DSA) in Contact Holes and Bar Openings

The following representative procedure was used for creating a contact hole or bar shape pattern. The guiding pattern was prepared using production-like semiconductor fabrication tools. The silicon substrate was first coated with an organic hard mask (ODL-401) and baked at 250° C. for 2 minutes to obtain a 135 nm thick film, forming an organic planarization layer (OPL). Secondly, SiARC (A940) was coated on top of the OPL layer and subsequently baked at 220° C. for 2 minutes to obtain a 20 nm thick film. The steps were repeated to obtain a double stack of OPL and SiARC with another 50 nm OPL layer and 20 nm SiARC film. Finally, a positive-tone resist was applied on top of the SiARC, patterned with extreme ultraviolet (EUV) lithography at 13.4 nm, and then pattern-transferred to the top layer of the SiARC and OPL to form the desired circular and bar shape guiding patterns (GP).

The block copolymer formulation was prepared as follows. The block copolymer (0.01 g) was dissolved in PGMEA (1.24 g, 10,000 parts by weight) to form a 0.8 wt % stock solution of the block copolymer based on total weight of the solution. The solution was passed through a 0.2 micrometer polytetrafluoroethylene (PTFE) filter. The resulting solution containing block copolymer was spin coated on the patterned substrate described above. The BCP was confined to the recessed areas of the resist pattern. After spin coating, the coated wafer was baked at 200° C. for 20 minutes, and subsequently etched with reactive ion oxygen etch for 8 seconds to improve contrast between the domains. The central domain was still present after this etch.

The directed self-assembly was characterized by SEM. Measurements of the central domain shape (i.e., circular or bar-shaped) were taken by using the region props function in Matlab after smoothing and binarizing the image data.

The critical dimension uniformity (CDU) is a measure of how widely the CD values are dispersed from the average value. When fabricating structures for integrated circuits, the CD and CDU of the features are critical for device functioning. During the device design, a tolerance is specified. Typically, the allowed tolerance is 10% of the nominal CD and is expressed as $3\sigma$. In other words, 89% of the CDs need to have less than 10% deviation from the target CD. The CDU was calculated by the standard deviation $\sigma$ averaged over 2000 circular central domains or 250 bar-shaped central domain and then divided by the mean via CD. Values are given for $1\sigma$. A lower CDU is desired. The terms "multiplication pattern" or "no shrink" in the tables below indicate no central domain having a circular shape or bar shape was formed.

The placement error (PE) is defined as the standard deviation of the distance between the openings and calculated from the average of 2000 circular shaped central domains or 250 bar-shaped central domains, respectively. A placement error of less than 1 nm is desired for high volume manufacturing (HVM).

The process window (PW) with respect to hole shrink is defined as the range of diameters in nanometers of initial circular openings for which more than 80% of the pre-pattern openings in the field of view (~100 holes) are filled with self-assembled BCP having a central domain of smaller diameter. The process window (PW) with respect to bar shrink is the range of widths in nanometers of the bar opening for which more than 80% of pre-pattern bar shapes in the field of view (~25 bars) are filled with self-assembled BCP having a central bar-shaped domain of smaller width. The process window determines the guiding pattern CD range in which the block copolymer forms the circular or bar-shaped central domain. A wider window is more desirable. For smaller nodes, moving to smaller guiding pattern CDs is necessary.

Examples 67-76

Table 9 shows contact hole shrink and bar shrink DSA performance of various non-fluorinated di- and triblock copolymers having a non-fluorinated junction group. The composition column provides only the block compositions (i.e., end groups and junction groups are not shown). PS=polystyrene block, PMMA=poly(methyl methacrylate) block, PLA=poly(D,L-lactide) block, PMTC-Me=poly(MTC-Me) block, PTMC=poly(trimethylene carbonate) block, PMTC-Et=poly(MTC-Et) block, PDMC=poly(DMC) block, PTMSS=poly(trimethylsilyl styrene) block, and PMTC-Bz=poly(MTC-Bz) block.

TABLE 9

| | | | | Contact hole shrink | | | Contact bar shrink | | |
|---|---|---|---|---|---|---|---|---|---|
| | | BCP | | | | PW | | | PW |
| Ex | Name | Composition[a] | Mw (GPC) | CDU ($1\sigma$) | PE (nm) | (GP CD nm) | CDU ($1\sigma$) | PE (nm) | (GP CD nm) |
| 67 (comp) | Control | $(PS)_{170}$-b-$(PMMA)_{157}$ | 36700 | 5.80 | 1.41 | 10 | multiplication pattern | | |
| 68 | HBP-1 | $(PS)_{120}$-b-$(PMTC\text{-}Me)_{83}$ | 30800 | 2.94 | 0.88 | 6 | 4.06 | 0.5 | 6 |
| 69 | HBP-7 | $(PS)_{120}$-b-$(PLA)_{88}$ | 31300 | 4.21 | 0.95 | 6 | 4.12 | 0.61 | 8 |
| 70 | HBP-5 | $(PS)_{59}$-b-$(PTMC)_{73}$ | 21000 | 3.60 | 1.04 | 12 | no shrink | | |
| 71 | HBP-2 | $(PS)_{120}$-b-$(PMTC\text{-}Et)_{84}$ | 32000 | 6.24 | 1.13 | 14 | no shrink | | |
| 72 | HBP-6 | $(PS)_{63}$-b-$(PDMC)_{55}$ | 26900 | 5.85 | 1.12 | 0 | no shrink | | |
| 73 | HBP-3 | $(PTMSS)_{40}$-b-$(PMTC\text{-}Me)_{51}$ | 16000 | 4.85 | 1.08 | 14 | no shrink | | |
| 74 | HBP-4 | $(PTMSS)_{46}$-b-$(PMTC\text{-}Bz)_{41}$ | 20000 | 4.86 | 1.13 | 8 | no shrink | | |
| 75 | TBP-1 | $(PMTC\text{-}Me)_{46}$-b-$(PS)_{144}$-b-$(PMTC\text{-}Me)_{46}$ | 28000 | 4.10 | 1.02 | 4 | 7.76 | 0.63 | 0 |
| 76 | TBP-2 | $(PTMC)_{69}$-b-$(PS)_{108}$-b-$(PTMC)_{69}$ | 30300 | 4.78 | 0.96 | 12 | no shrink | | |

[a] numerical subscript is the average degree of polymerization (DP) of the parenthesized block.

FIGS. 4A-4E are scanning electron micrographs (SEMs) of the contact holes formed in Example 67 (PS-b-PMMA control), where the CD of the initial circular holes of the guiding pattern (GP) was varied from 46-54 nm. Hole shrink was observed. The DSA process window was 10 nm. FIG.

Figure 13:
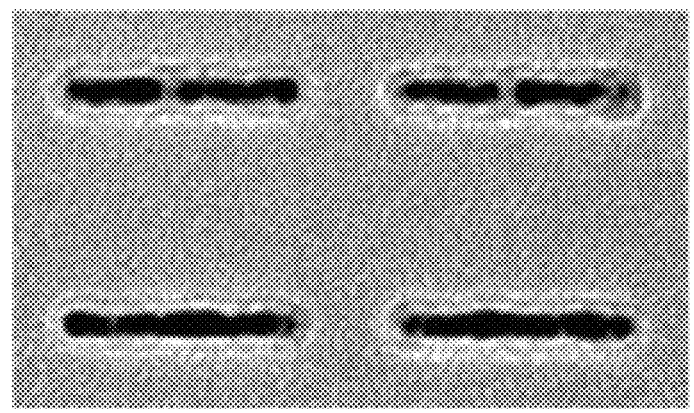
FIG. 13 is an SEM of the bar openings formed with Example 71, where the CD of the guiding pattern was 46 nm. No bar shrink was observed.
Figure 14:
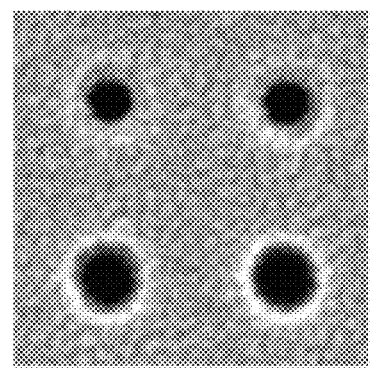
FIG. 14 is an SEM of the contact hole formed in Example 72, where the critical dimension (CD) of the initial circular holes of the guiding pattern is 46 nm (diameter). No DSA process window with more than 80% open holes was observed (which is undesirable).
Figure 20A:
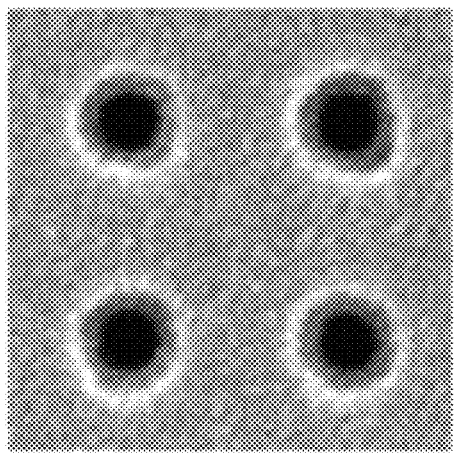
FIGS. 20A-20B are SEMs of the contact holes formed in Example 75, where the CD of the initial circular holes of the guiding pattern was varied from 48-50 nm. Hole shrink was observed. The DSA process window was 4 nm.
Figure 20B:
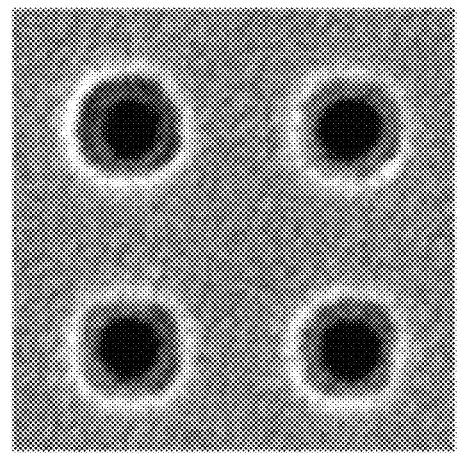
Figure 21:
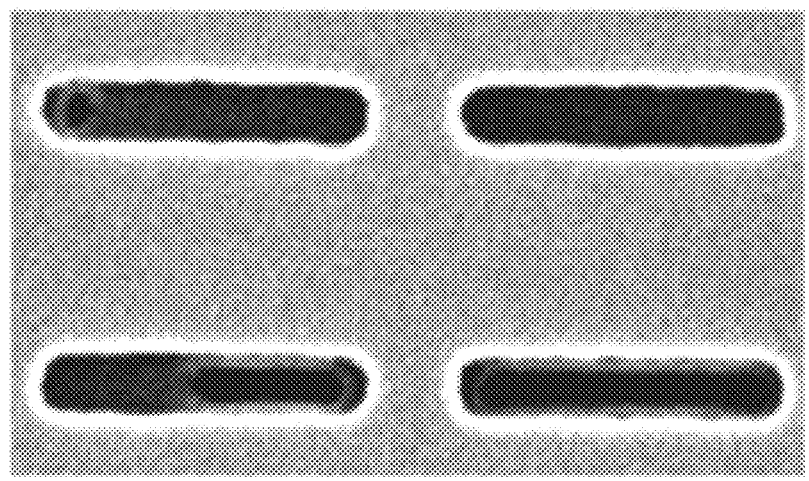
FIG. 21 is an SEM of the bar openings formed with Example 75, where the CD of the guiding pattern was 50 nm. No bar shrink was observed.
Figure 27A:
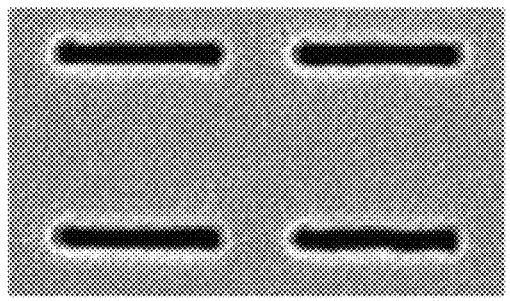
FIGS. 27A-27E are SEMs of the bar openings formed with Example 78, where the CD of the guiding pattern is in the range of 40-48 nm. Bar shrink was observed. The DSA process window was 10 nm.
Figure 27B:
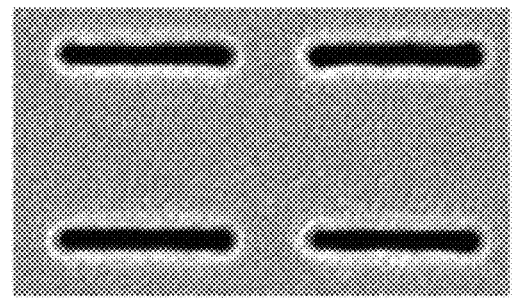
Figure 27C:
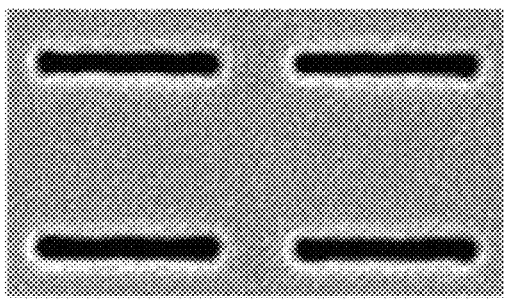
Figure 27D:
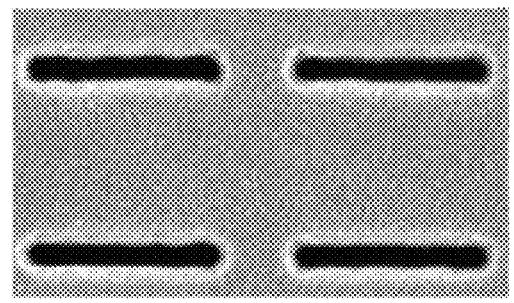
Figure 27E:
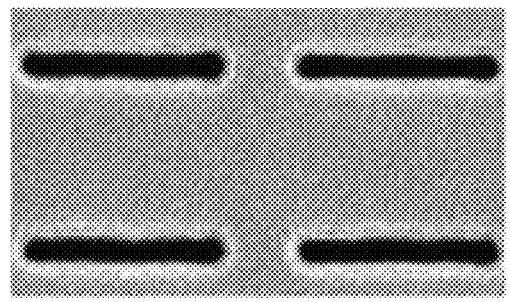
Figure 30A:
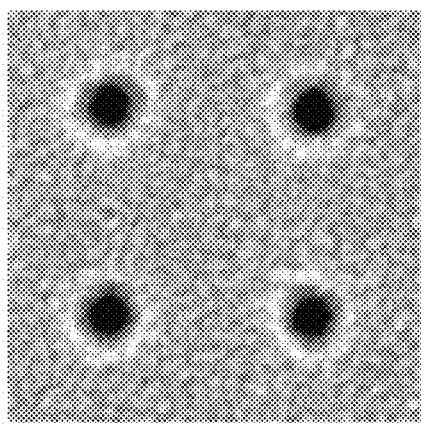
FIGS. 30A-30F are SEMs of the contact holes formed in Example 80, where the CD of the initial circular holes was varied from 34-44 nm. Hole shrink was observed. The DSA process window was 12 nm.
Figure 30B:
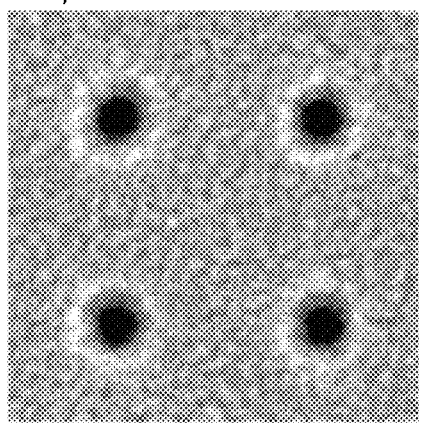
Figure 30C:
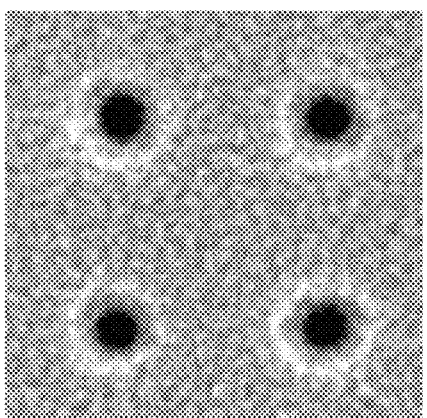
Figure 30D:
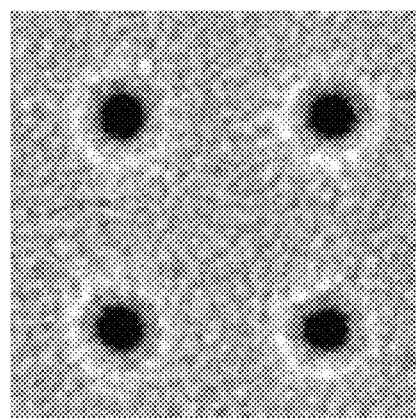
Figure 30E:
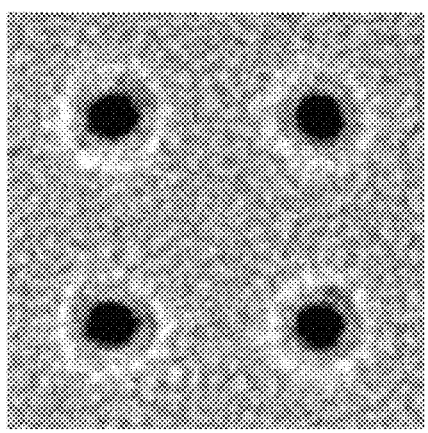
Figure 30F:
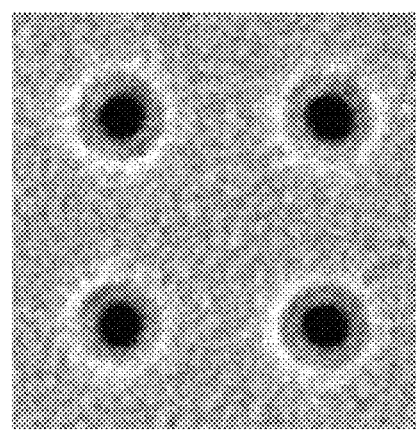

5 is an SEM of the bar openings formed with Example 67, where the CD of the guiding pattern was 52 nm (i.e., the width or short axis of the bar). A multiplication pattern and no bar shrink was observed (which is undesirable). FIGS. 6A-6C are SEMs of the contact holes formed in Example 68, where the CD of the initial circular holes of the guiding pattern was varied from 48-52 nm. Hole shrink was observed. The DSA process window was 6 nm. FIGS. 7A-7C are SEMs of the bar openings formed with Example 68, where the CD of the guiding pattern is in the range of 42-46 nm. Bar shrink was observed. The DSA process window was 10 nm. FIGS. 8A-8C are SEMs of the contact holes formed in Example 69, where the CD of the initial circular holes of the guiding pattern was varied from 46-50 nm. Hole shrink was observed. The DSA process window was 6 nm. FIGS. 9A-9D are SEMs of the bar openings formed with Example 69, where the CD of the guiding pattern is in the range of 40-46 nm. Bar shrink was observed. The DSA process window was 8 nm. FIGS. 10A-10F are SEMs of the contact holes formed in Example 70, where the CD of the initial circular holes of the guiding pattern was varied from 44-54 nm. Hole shrink was observed. The DSA process window was 12 nm. FIG. 11 is an SEM of the bar openings formed with Example 70, where the CD of the guiding pattern was 48 nm. No bar shrink was observed (which is undesirable). FIGS. 12A-12G are SEMs of the contact holes formed in Example 71, where the CD of the initial circular holes of the guiding pattern was varied from 40-52 nm. Hole shrink was observed. The DSA process window was 14 nm. FIG. 13 is an SEM of the bar openings formed with Example 71, where the CD of the guiding pattern was 46 nm. No bar shrink was observed. FIG. 14 is an SEM of the contact hole formed in Example 72, where the critical dimension (CD) of the initial circular holes of the guiding pattern is 46 nm (diameter). No DSA process window with more than 80% open holes was observed (which is undesirable). FIG. 15 is an SEM of the bar openings formed with Example 72, where the CD of the guiding pattern was 46 nm. No bar shrink was observed. FIGS. 16A-16G are SEMs of the contact holes formed in Example 73, where the CD of the initial circular holes of the guiding pattern was varied from 36-48 nm. Hole shrink was observed. The DSA process window was 14 nm. FIG. 17 is an SEM of the bar openings formed with Example 73, where the CD of the guiding pattern was 38 nm. No bar shrink was observed. FIGS. 18A-18D are SEMs of the contact holes formed in Example 74, where the CD of the initial circular holes of the guiding pattern was varied from 42-48 nm. Hole shrink was observed. The DSA process window was 8 nm. FIG. 19 is an SEM of the bar openings formed with Example 74, where the CD of the guiding pattern was 46 nm. No bar shrink was observed. FIGS. 20A-20B are SEMs of the contact holes formed in Example 75, where the CD of the initial circular holes of the guiding pattern was varied from 48-50 nm. Hole shrink was observed. The DSA process window was 4 nm. FIG. 21 is an SEM of the bar openings formed with Example 75, where the CD of the guiding pattern was 50 nm. No bar shrink was observed. FIGS. 22A-22F are SEMs of the contact holes formed in Example 76, where the CD of the initial circular holes of the guiding pattern was varied from 36-46 nm. Hole shrink was observed. The DSA process window was 12 nm. FIG. 23 is an SEM of the bar openings formed with Example 76, where the CD of the guiding pattern was 40 nm. No bar shrink was observed.

Examples 68-70 show improved performance in contact hole shrink in comparison with the control block copolymer PS-b-PMMA (Example 67) by a lower CDU and a smaller placement error. PTMSS containing diblock copolymers (Example 73 and 74) show improved performance over PS-b-PMMA by a lower CDU and smaller placement error. Triblock copolymers, Examples 75-76, showed improved performance in contact hole shrink in comparison with PS-b-PMMA. However, the performance of the corresponding diblock copolymers is generally better than the triblock copolymers. Examples 71-72 showed increased CDU compared with PS-b-PMMA for contact hole shrink.

Examples 68 and 69 show improved performance in bar shrink in comparison with PS-b-PMMA with a low CDU, whereas PS-b-PMMA forms multiplication patterns in the guiding pattern bar shape, which are not useful for self-aligned via approaches. Triblock copolymer TBP-1 also shows bar shrink behavior, however, with a much higher CDU and a poor hole open yield compared to the corresponding diblock copolymer HBP-1.

Examples 77-89, listed in Table 10, show the contact hole shrink and bar shrink DSA performance of various above-prepared diblock copolymers containing a linear fluorinated junction group. In the composition column of Table 10, the block components and the fluorinated portion of the junction group are indicated. "$C_3F_6$"=*—$(CF_2)_3$—*, "$C_6F_{12}$"=*—$(CF_2)_6$—*, "$C_{10}F_{20}$"=*—$(CF_2)_{10}$—*, and "$C_6F_{12}O_3$"=*—$CF_2O(CF_2CF_2O)_2CF_2$—*. The results for non-fluorinated block copolymer HBP-8 (Example 89) are also included, where "$C_6H_{12}$" is *—$(CH_2)_6$—* portion of the non-fluorinated junction group.

TABLE 10

| | | BCP | | Contact hole shrink | | | Contact bar shrink | | |
|---|---|---|---|---|---|---|---|---|---|
| Ex | Name | Composition[a] | Mw (GPC) | CDU (1σ) | PE (nm) | PW (GP CD nm) | CDU (1σ) | PE (nm) | PW (GP CD nm) |
| 77 | FBP-1 | $(PS)_{64}$-$C_3F_6$-$(PMTC-Me)_{45}$ | 19600 | | No DSA | | 6.40 | 1.06 | 8 |
| 78 | FBP-2 | $(PS)_{103}$-$C_6F_{12}$-$(PMTC-Me)_{72}$ | 24500 | 2.86 | 0.94 | 10 | 3.93 | 0.45 | 10 |
| 79 | FBP-3 | $(PS)_{58}$-$C_{10}F_{20}$-$(PMTC-Me)_{37}$ | 15500 | 2.90 | 0.78 | 18 | 3.97 | 0.85 | 6 |
| 80 | FBP-4 | $(PS)_{132}$-$C_6F_{12}$-$(PMTC-Me)_{50}$ | 26000 | 2.91 | 0.92 | 12 | multiplication pattern | | |
| 81 | FBP-5 | $(PS)_{103}$-$C_6F_{12}$-$(PMTC-Et)_{65}$ | 31200 | 5.90 | 0.94 | 0 | no shrink | | |
| 82 | FBP-6 | $(PS)_{58}$-$C_{10}F_{20}$-$(PMTC-Et)_{46}$ | 17100 | 5.43 | 1.07 | 14 | no shrink | | |
| 83 | FBP-9 | $(PS)_{60}$-$C_6F_{12}O_3$-$(PLA)_{58}$ | 28000 | 3.51 | 0.92 | 16 | 3.84 | 0.59 | 6 |
| 84 | FBP-10 | $(PS)_{50}$-$C_6F_{12}$-$(PLA)_{44}$ | 22800 | 4.81 | 0.97 | 14 | no shrink | | |
| 85 | FBP-11 | $(PS)_{103}$-$C_6F_{12}$-$(PLA)_{82}$ | 25900 | 4.97 | 1.16 | 14 | 4.98 | 0.44 | 10 |
| 86 | FBP-12 | $(PS)_{58}$-$C_6F_{12}$-$(PLA)_{47}$ | 22200 | 5.06 | 1.17 | 18 | 5.53 | 0.63 | 6 |
| 87 | FBP-7 | $(PTMSS)_{37}$-$C_{10}F_{20}$-$(PMTC-Me)_{41}$ | 23600 | 3.77 | 1.07 | 14 | no shrink | | |
| 88 | FBP-8 | $(PTMSS)_{37}$-$C_{10}F_{20}$-$(PMTC-Bz)_{26}$ | 22400 | 5.93 | 1.50 | 0 | no shrink | | |

TABLE 10-continued

| | | | | Contact hole shrink | | | Contact bar shrink | | |
|---|---|---|---|---|---|---|---|---|---|
| | | BCP | | | | | | | |
| Ex | Name | Composition[a] | Mw (GPC) | CDU (1σ) | PE (nm) | PW (GP CD nm) | CDU (1σ) | PE (nm) | PW (GP CD nm) |
| 89 | HBP-8 (comp) | $(PS)_{89}$-$C_6H_{12}$-$(PMTC\text{-}Me)_{70}$ | 24500 | 10.12 | 1.45 | 0 | 4.42 | 1.3 | 0 |

[a]numerical subscript is the DP of the parenthesized block

Figure 31:
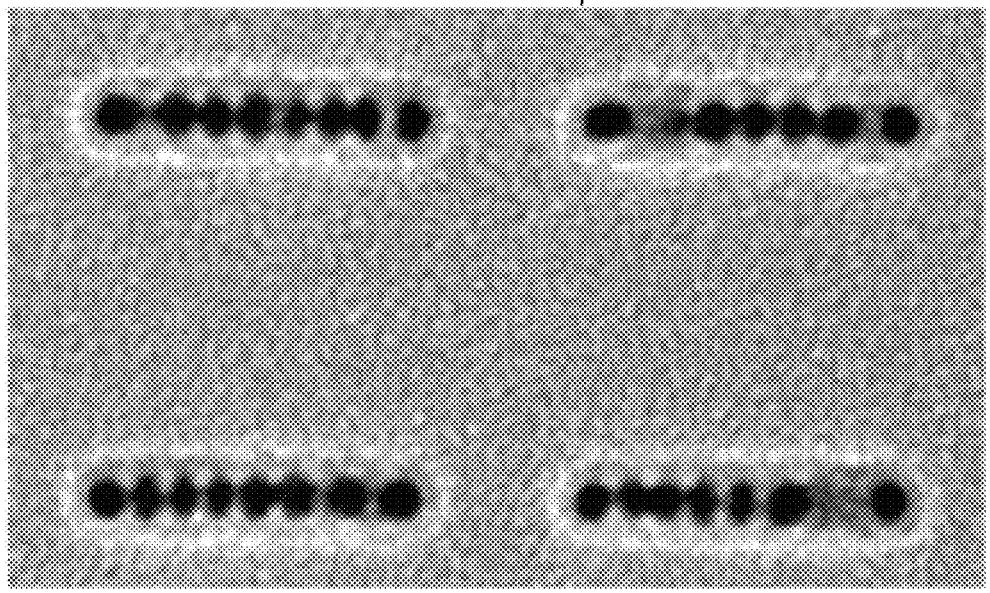
FIG. 31 is an SEM of the bar openings formed with Example 80, where the CD of the guiding pattern was 40 nm. A multiplication pattern was observed (which is undesirable).
Figure 32:
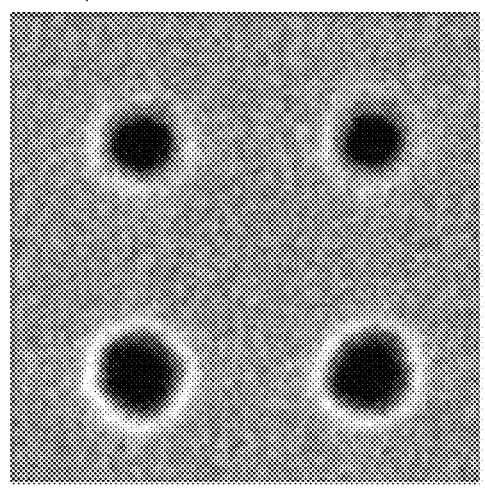
FIG. 32 is an SEM of the hole openings formed with Example 81, where the CD of the guiding pattern was 40 nm. There was no DSA process window with more than 80% open holes (which is undesirable).
Figure 36A:
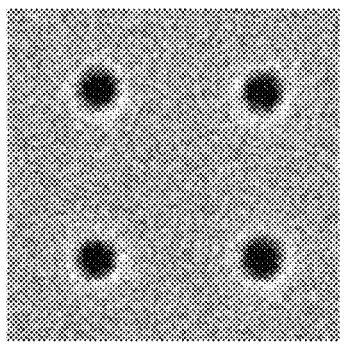
FIGS. 36A-36H are SEMs of the hole openings formed with Example 83, where the CD of the guiding pattern is in the range of 30-44 nm. Hole shrink was observed. The DSA process window was 14 nm.
Figure 36B:
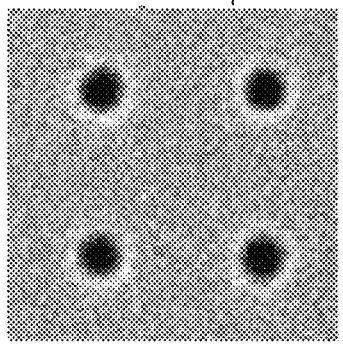
Figure 36C:
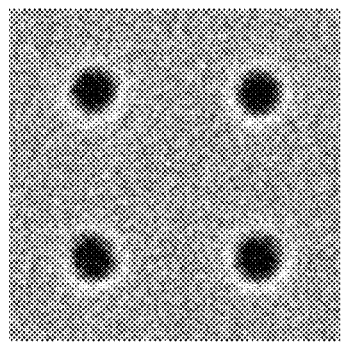
Figure 36D:
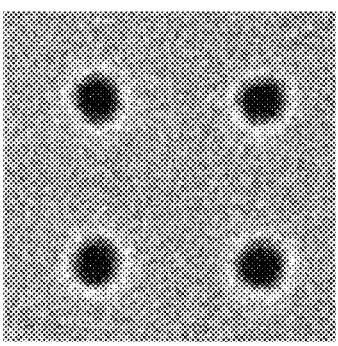
Figure 36E:
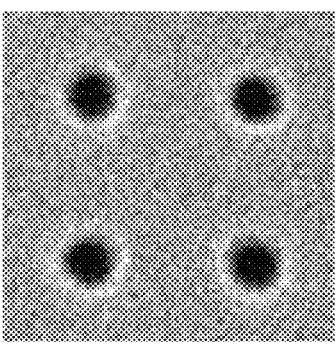
Figure 36F:
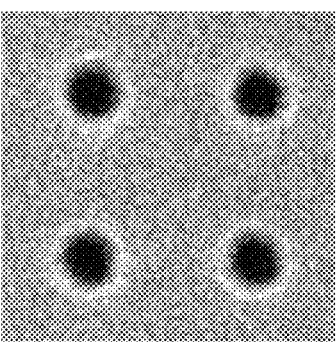
Figure 36G:
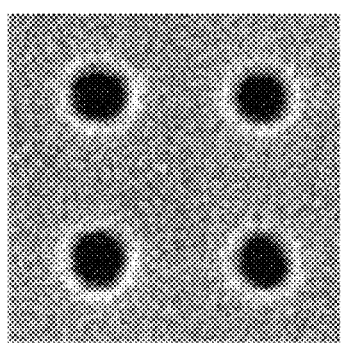
Figure 36H:
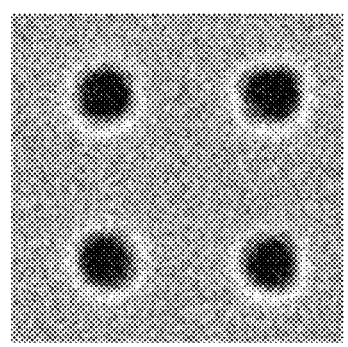
Figure 37A:
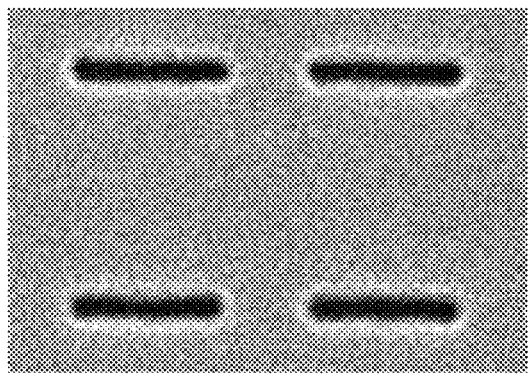
FIGS. 37A-37C are SEMs of the bar openings formed with Example 83, where the CD of the guiding pattern is in the range of 28-40 nm. Bar shrink was observed. The DSA process window was 14 nm.
Figure 37B:
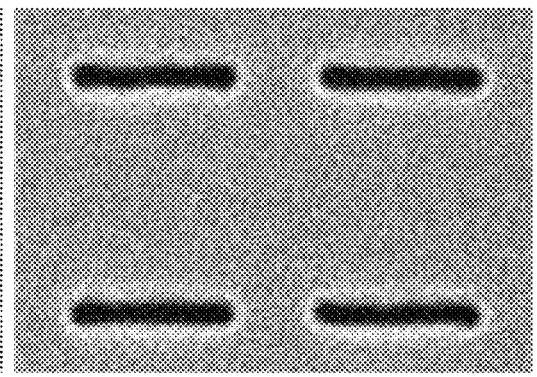
Figure 37C:
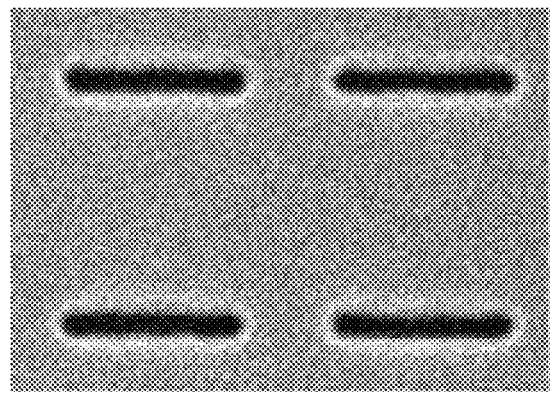
Figure 41C:
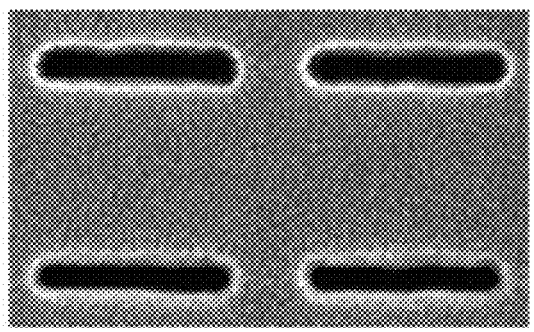
Figure 41D:
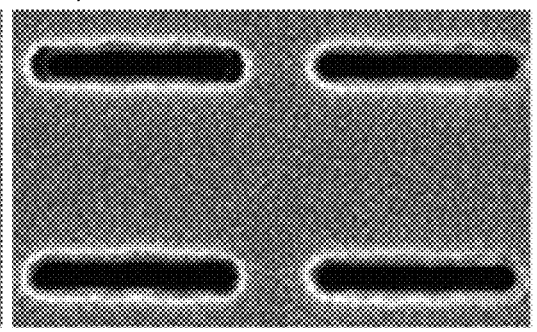
Figure 41E:
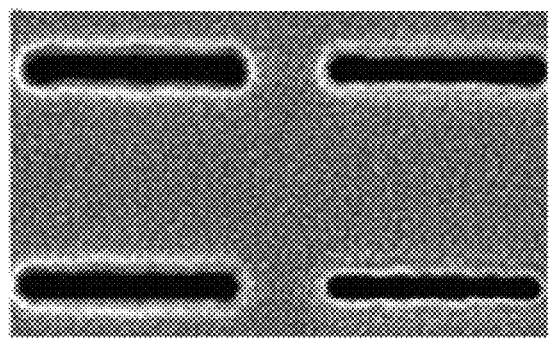

FIG. 24 is an SEM of the contact hole formed in Example 77, where the critical dimension (CD) of the initial circular holes of the guiding pattern is 36 nm (diameter). No hole shrink was observed. FIGS. 25A-25D are SEMs of the bar openings formed with Example 77, where the CD of the guiding pattern is in the range of 24-30 nm. Bar shrink was observed. The DSA process window was 8 nm. FIGS. 26A-26E are SEMs of the contact holes formed in Example 78, where the CD of the initial circular holes was varied from 42-50 nm. Hole shrink was observed. The DSA process window was 10 nm. FIGS. 27A-27E are SEMs of the bar openings formed with Example 78, where the CD of the guiding pattern is in the range of 40-48 nm. Bar shrink was observed. The DSA process window was 10 nm. FIGS. 28A-28I are SEMs of the contact holes formed in Example 79, where the CD of the initial circular holes was varied from 26-42 nm. Hole shrink was observed. The DSA process window was 18 nm. FIGS. 29A-29C are SEMs of the bar openings formed with Example 79, where the CD of the guiding pattern is in the range of 26-30 nm. Bar shrink was observed. The DSA process window was 6 nm. FIGS. 30A-30F are SEMs of the contact holes formed in Example 80, where the CD of the initial circular holes was varied from 34-44 nm. Hole shrink was observed. The DSA process window was 128 nm. FIG. 31 is an SEM of the bar openings formed with Example 80, where the CD of the guiding pattern was 40 nm. A multiplication pattern was observed (which is undesirable). FIG. 32 is an SEM of the hole openings formed with Example 81, where the CD of the guiding pattern was 40 nm. There was no DSA process window with more than 80% open holes (which is undesirable). FIG. 33 is an SEM of the bar openings formed with Example 81, where the CD of the guiding pattern was 40 nm. No shrink was observed. FIGS. 34A-34G are SEMs of the hole openings formed with Example 82, where the CD of the guiding pattern is in the range of 28-40 nm. Hole shrink was observed. The DSA process window was 14 nm. FIG. 35 is an SEM of the bar openings formed with Example 82, where the CD of the guiding pattern was 34 nm. No bar shrink was observed. FIGS. 36A-36H are SEMs of the hole openings formed with Example 83, where the CD of the guiding pattern is in the range of 30-44 nm. Hole shrink was observed. The DSA process window was 14 nm. FIGS. 37A-37C are SEMs of the bar openings formed with Example 83, where the CD of the guiding pattern is in the range of 28-40 nm. Bar shrink was observed. The DSA process window was 14 nm. FIGS. 38A-38G are SEMs of the hole openings formed with Example 84, where the CD of the guiding pattern is in the range of 28-44 nm. Hole shrink was observed. The DSA process window was 14 nm. FIG. 39 is an SEM of the bar openings formed with Example 84, where the CD of the guiding pattern was 34 nm. No bar shrink was observed. FIGS. 40A-40G are SEMs of the hole openings formed with Example 85, where the CD of the guiding pattern is in the range of 40-52 nm. Hole shrink was observed. The DSA process window was 14 nm.

Figure 43A:
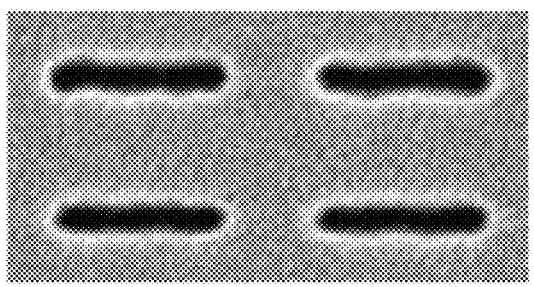
FIGS. 43A-43C are SEMs of the bar openings formed with Example 86, where the CD of the guiding pattern is in the range of 26-30 nm. Bar shrink was observed. The DSA process window was 6 nm.
Figure 43B:
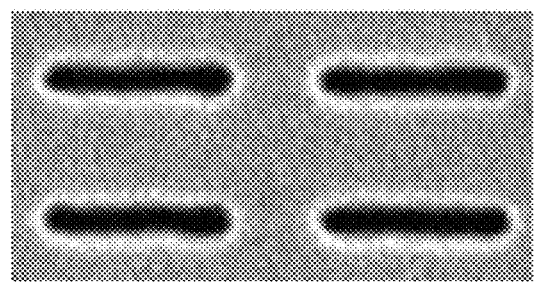
Figure 43C:
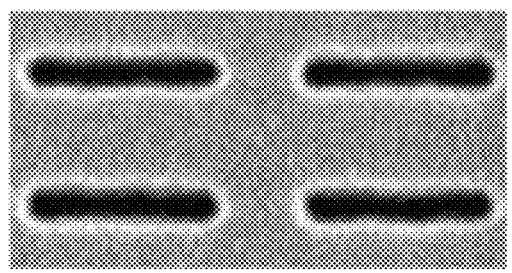
Figure 45:
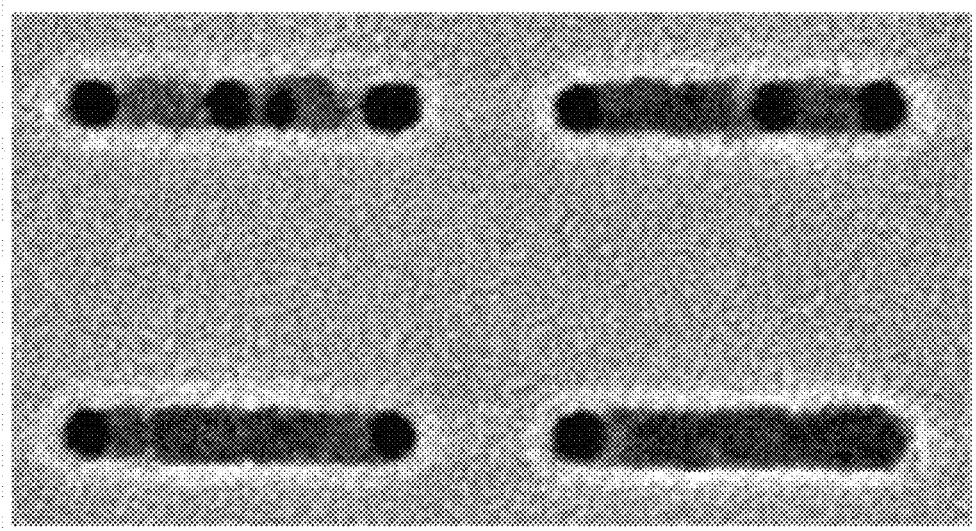
FIG. 45 is an SEM of the bar openings formed with Example 87, where the CD of the guiding pattern was 48 nm. No bar shrink was observed.
Figure 46:
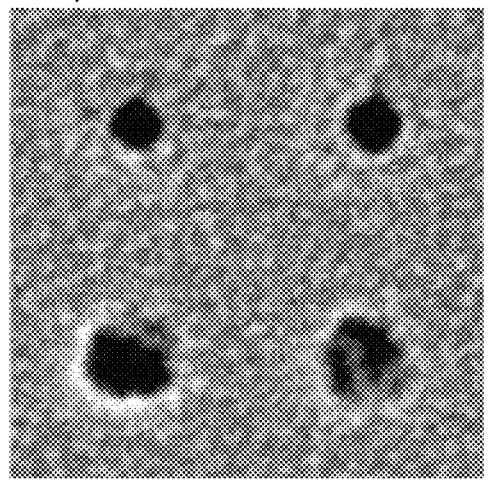
FIG. 46 is an SEM of the hole openings formed with Example 88, where the CD of the guiding pattern was 42 nm. No hole shrink was observed.
Figure 47:
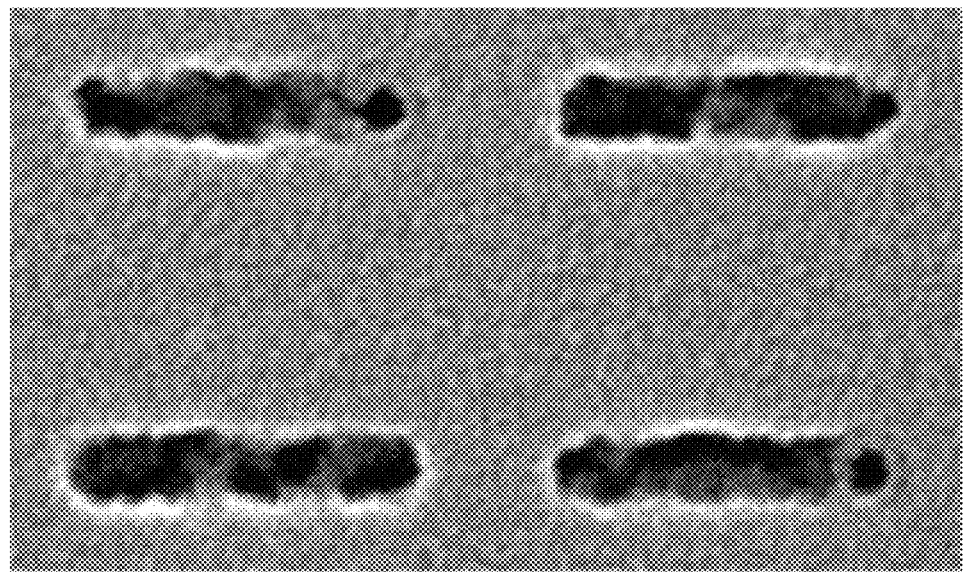
FIG. 47 is an SEM of the bar openings formed with Example 88, where the CD of the guiding pattern was 42 nm. No bar shrink was observed.
Figure 48:
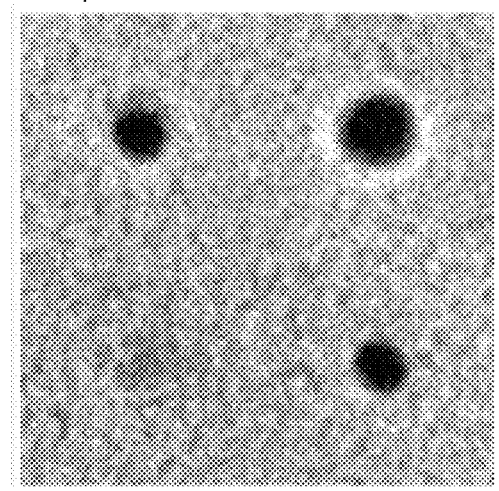
FIG. 48 is an SEM of the hole openings formed with Example 89, where the CD of the guiding pattern was 40 nm. No hole shrink was observed.
Figure 52D:
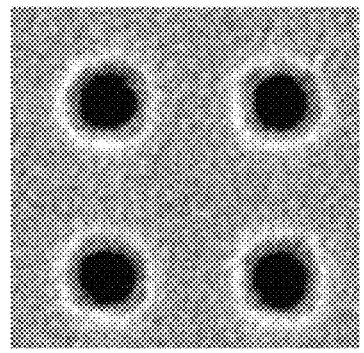
Figure 52E:
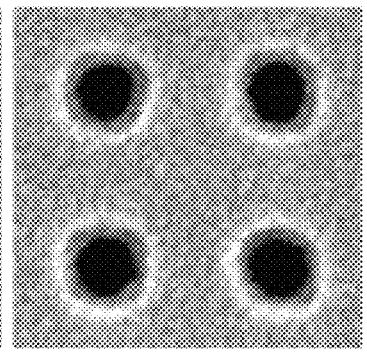
Figure 53A:
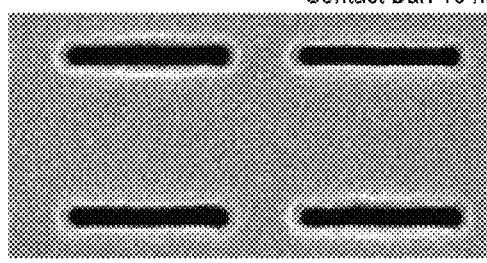
FIGS. 53A-53H are SEMs of the bar openings formed with Example 92, where the CD of the guiding pattern is in the range of 46-60 nm. Bar shrink was observed. The DSA process window was 16 nm.
Figure 53B:
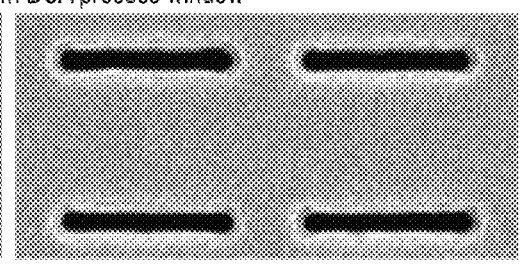
Figure 53C:
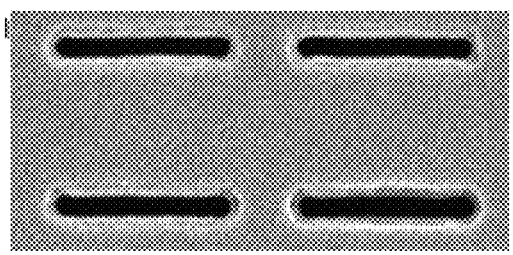
Figure 53D:
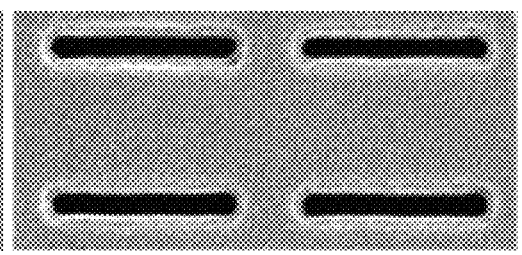
Figure 53E:
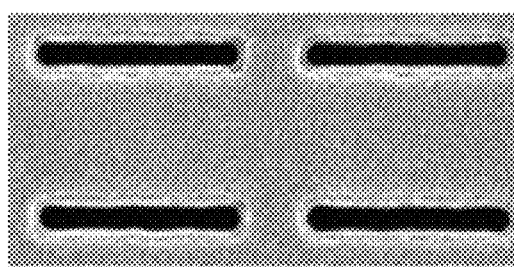
Figure 53F:
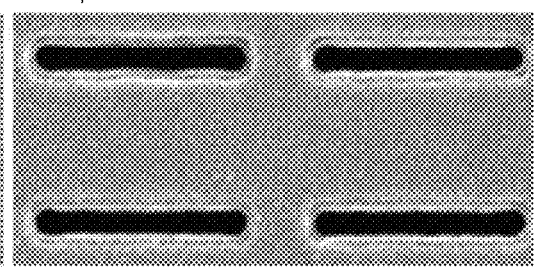
Figure 53G:
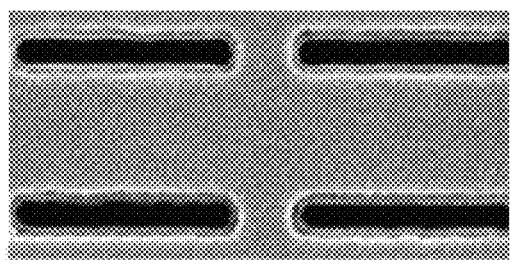
Figure 53H:
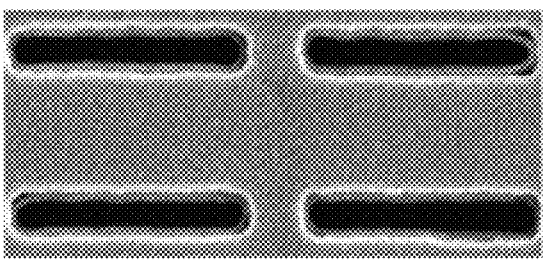
Figure 56A:
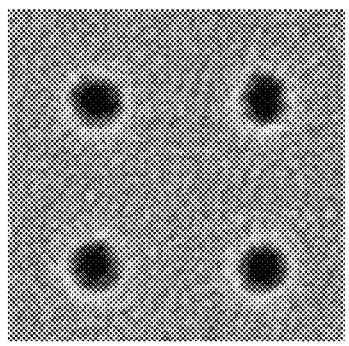
FIGS. 56A-56G are SEMs of the hole openings formed with Example 94, where the CD of the guiding pattern is in the range of 34-46 nm. Hole shrink was observed. The DSA process window was 14 nm.
Figure 56B:
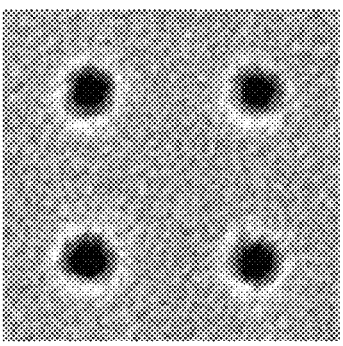
Figure 56C:
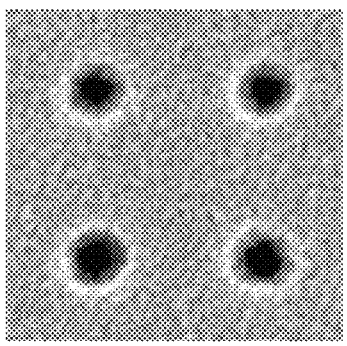
Figure 56D:
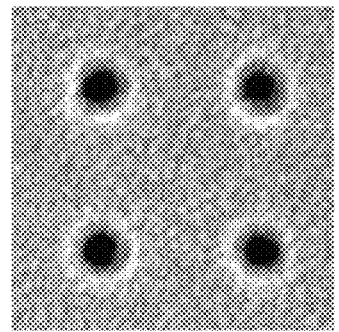
Figure 56E:
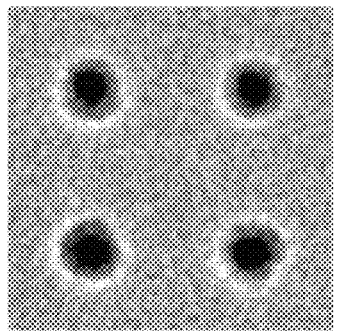
Figure 56F:
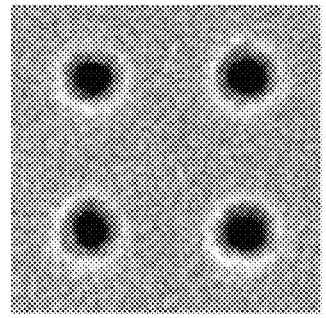
Figure 56G:
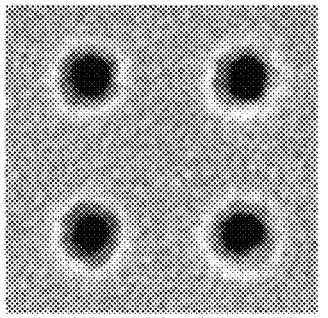

FIGS. 41A-41E are SEMs of the bar openings formed with Example 85, where the CD of the guiding pattern is in the range of 36-44 nm. Bar shrink was observed. The DSA process window was 10 nm. FIGS. 42A-42I are SEMs of the hole openings formed with Example 86, where the CD of the guiding pattern is in the range of 26-42 nm. Hole shrink was observed. The DSA process window was 18 nm. FIGS. 43A-43C are SEMs of the bar openings formed with Example 86, where the CD of the guiding pattern is in the range of 26-30 nm. Bar shrink was observed. The DSA process window was 6 nm. FIGS. 44A-44G are SEMs of the hole openings formed with Example 87, where the CD of the guiding pattern is in the range of 42-54 nm. Hole shrink was observed. The DSA process window was 14 nm. FIG. 45 is an SEM of the bar openings formed with Example 87, where the CD of the guiding pattern was 48 nm. No bar shrink was observed. FIG. 46 is an SEM of the hole openings formed with Example 88, where the CD of the guiding pattern was 42 nm. No hole shrink was observed. FIG. 47 is an SEM of the bar openings formed with Example 88, where the CD of the guiding pattern was 42 nm. No bar shrink was observed. FIG. 48 is an SEM of the hole openings formed with Example 89, where the CD of the guiding pattern was 40 nm. No hole shrink was observed. FIG. 49 is an SEM of the bar openings formed with Example 89, where the CD of the guiding pattern was 40 nm. There was no DSA process window with more than 80% open holes.

Examples 78-80 and 87, containing a PMTC-Me block and a fluorinated linear junction group with more than 6 fluorines in the junction group, showed improved performance for contact hole shrink compared to the control block copolymer PS-b-PMMA (Example 67) by a lower CDU and a smaller placement error. BCPs having a linear fluorinated junction generally showed improved performance (i.e., lower CDU and wider process window) compared with the corresponding diblock copolymer containing a non-fluorinated junction group (Example 68). In contrast, Example 77, containing a fluorinated linear junction with only 6 fluorines, showed no hole shrink for all GP CDs. Bar shrink was observed, as indicated in Table 10. Examples 81 and 82 with a 12-fluorine linear junction group, showed improved performance over the corresponding diblock copolymer containing a non-fluorinated junction group (Example 71), and had a slightly lower CDU and placement error than PS-b-PMMA. Of Examples 83-86, which contain a PLA block, Example 83 (which had a fluoroether linear junction group) showed significantly lower CDU and had a wider process window, whereas the linear fluoroalkylene junction group impaired the DSA performance and increased CDU. Example 88, which contained a PTMSS block, showed no improvement over the corresponding diblock copolymers having a non-fluorinated junction group, and exhibited higher CDU values than PS-b-PMMA. The comparative triblock copolymer of Example 89, which had a non-fluorinated linear junction group, showed worse DSA performance and had significantly increased CDU and placement error.

Examples 78-79, which had linear fluorinated junction groups containing more than 6 fluorines, and Example 83, with a fluoroether linear junction group, show improved performance in bar shrink by a lower CDU and smaller placement error compared to PS-b-PMMA and the corresponding diblock copolymers (Example 68 and 69, respectively) having a non-fluorinated junction group. PS-b-PMMA forms multiplication patterns in the guiding pattern bar shape, which are not useful for forming self-aligned vias. Example 77, which had a 6-fluorine linear junction, showed impaired DSA behavior with higher CDU in the bar guiding pattern in comparison to the diblock copolymer Example 68, which had a non-fluorinated junction. Example 80 is a cylinder-forming block copolymer, which formed also formed undesirable multiplication patterns in the bar guiding pattern. Examples 84-86 (block copolymers with a fluoroalkene junction group) had higher CDU values compared to the diblock copolymer of Example 69, which had a non-fluorinated junction group. The fluorinated linear junction group did not enable DSA for the PTMSS containing block copolymers (Example 87 and 88). Example 89, which had a non-fluorinated linear junction group, showed worse DSA performance by increased CDU.

Figure 57:
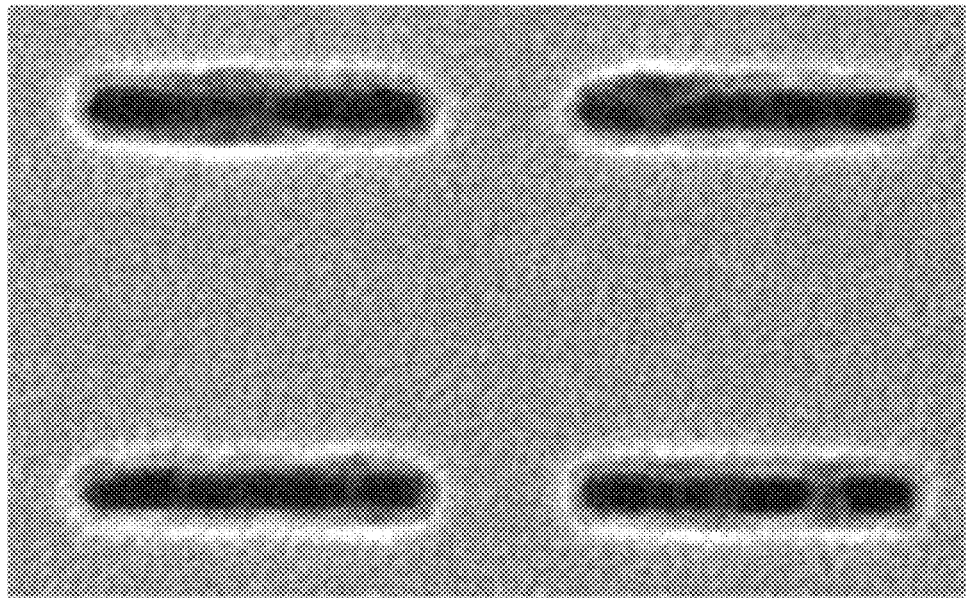
FIG. 57 is an SEM of the bar openings formed with Example 94, where the CD of the guiding pattern was 42 nm. No bar shrink was observed.
Figure 58:
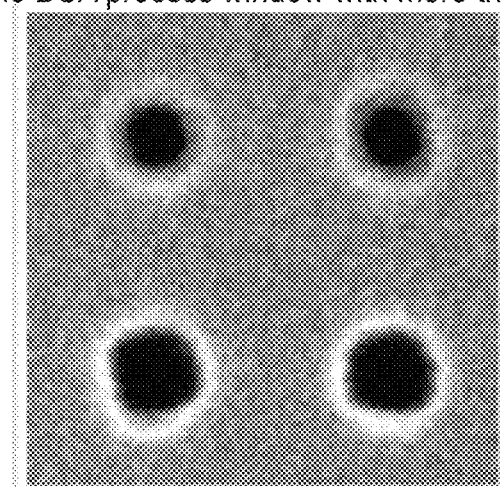
FIG. 58 is an SEM of the hole openings formed with Example 95, where the CD of the guiding pattern was 48 nm. No hole shrink was observed.
Figure 60:
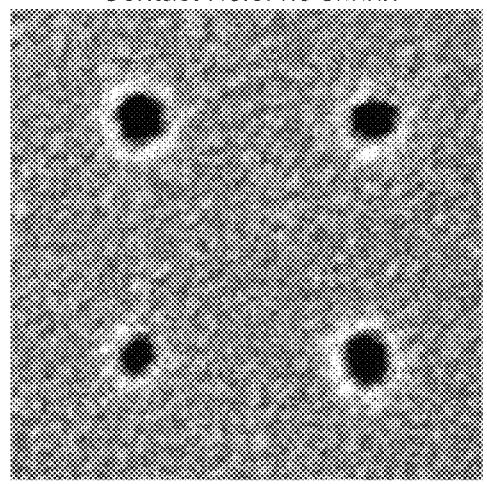
FIG. 60 is an SEM of the hole openings formed with Example 96, where the CD of the guiding pattern was 30 nm. No hole shrink was observed.
Figure 61:
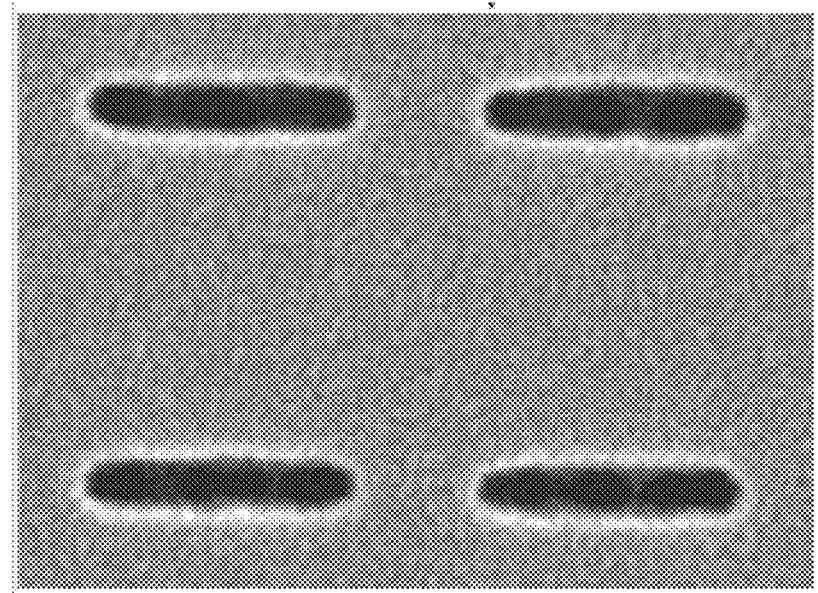
FIG. 61 is an SEM of the bar openings formed with Example 96, where the CD of the guiding pattern was 30 nm. There was no DSA process window with more than 80% open holes.

Examples 90-105, listed in Table 11, shows contact hole shrink and bar shrink DSA performance of various above-prepared diblock copolymers having a perpendicular fluorinated junction group. In the compositions of Table 11, the block components and the fluorinated portion of the junction group are indicated. "$C_8F_{17}$"=*—$(CF_2)_7CF_3$, "$C_6F_{13}$"=*—$(CF_2)_5CF_3$, and "$C_9F_{19}O_3$"=*—$CF_2O(CF_2CF_2O)_2C_4F_9$. The results for non-fluorinated block copolymer HBP-9 (Example 105) are also included in Table 11, where "$C_{18}H_{37}$" is *—$CH_2(CH_2)_{16}CH_3$ portion of the non-fluorinated junction group.

process window was 14 nm. FIGS. 51A-51E are SEMs of the bar openings formed with Example 91, where the CD of the guiding pattern is in the range of 32-40 nm. Bar shrink was observed. The DSA process window was 10 nm. FIGS. 52A-52E are SEMs of the hole openings formed with Example 92, where the CD of the guiding pattern is in the range of 46-54 nm. Hole shrink was observed. The DSA process window was 10 nm. FIGS. 53A-53H are SEMs of the bar openings formed with Example 92, where the CD of the guiding pattern is in the range of 46-60 nm. Bar shrink was observed. The DSA process window was 16 nm. FIGS. 54A-54F are SEMs of the hole openings formed with Example 93, where the CD of the guiding pattern is in the range of 38-48 nm. Hole shrink was observed. The DSA process window was 12 nm. FIG. 55 is an SEM of the bar openings formed with Example 93, where the CD of the guiding pattern was 42 nm. No bar shrink was observed. FIGS. 56A-56G are SEMs of the hole openings formed with Example 94, where the CD of the guiding pattern is in the range of 34-46 nm. Hole shrink was observed. The DSA process window was 14 nm. FIG. 57 is an SEM of the bar openings formed with Example 94, where the CD of the guiding pattern was 42 nm. No bar shrink was observed. FIG. 58 is an SEM of the hole openings formed with Example 95, where the CD of the guiding pattern was 48 nm. No hole shrink was observed. FIGS. 59A-59F are SEMs of the bar openings formed with Example 95, where the CD of the guiding pattern is in the range of 42-52 nm. Bar shrink was observed. The DSA process window was 12 nm. FIG. 60 is an SEM of the hole openings formed with Example 96, where the CD of the guiding pattern was 30 nm. No hole shrink was observed. FIG. 61 is an SEM of the bar openings formed with Example 96, where the CD of the guiding pattern was 30 nm. There was no DSA process window with more than 80% open holes. FIGS. 62A-62E are SEMs of the hole openings formed with Example 97, where the CD of the guiding pattern is in the range of 38-46 nm. Hole shrink was

TABLE 11

| | | | Contact hole shrink | | | Contact bar shrink | | |
|---|---|---|---|---|---|---|---|---|
| | BCP | | | | PW | | | PW |
| Ex | Name | Composition | Mw (GPC) | CDU (1σ) | PE (nm) | (GP CD nm) | CDU (1σ) | PE (nm) | (GP CD nm) |
| 91 | FBP-14 | $(PS)_{84}$-$C_8F_{17}$-$(PMTC-Me)_{62}$ | 23500 | 2.82 | 0.89 | 14 | 3.88 | 1.29 | 10 |
| 92 | FBP-15 | $(PS)_{143}$-$C_8F_{17}$-$(PMTC-Me)_{104}$ | 32700 | 2.86 | 1.02 | 10 | 3.77 | 0.57 | 16 |
| 93 | FBP-16 | $(PS)_{84}$-$C_8F_{17}$-$(PMTC-Et)_{54}$ | 26700 | 5.57 | 1.08 | 12 | no shrink | | |
| 94 | FBP-17 | $(PS)_{84}$-$C_8F_{17}$-$(PMTC-Pr)_{52}$ | 25700 | 7.04 | 1.17 | 14 | no shrink | | |
| 95 | FBP-18 | $(PS)_{143}$-$C_8F_{17}$-$(PMTC-Pr)_{69}$ | 33700 | 6.60 | 0.74 | 0 | 4.78 | 0.38 | 12 |
| 96 | FBP-26 | $(PS)_{75}$-$C_8F_{17}$-$(PLA)_{58}$ | 21400 | | no DSA | | 4.37 | 0.61 | 0 |
| 97 | FBP-20 | $(PS)_{44}$-$C_6F_{13}$-$(PTMC)_{57}$ | 15500 | 3.81 | 1.03 | 10 | no shrink | | |
| 98 | FBP-21 | $(PS)_{84}$-$C_8F_{17}$-$(PTMC)_{108}$ | 27600 | 5.08 | 1.09 | 6 | no shrink | | |
| 99 | FBP-22 | $(PS)_{84}$-$C_8F_{17}$-$(PTMC)_{44}$ | 20000 | 10.23 | 1.12 | 0 | multiplication | | |
| 100 | FBP-23 | $(PS)_{38}$-$C_8F_{17}$-$(PTMC)_{47}$ | 16700 | | no DSA | | no shrink | | |
| 101 | FBP-24 | $(PS)_{59}$-$C_{10}F_{19}O_3$-$(PTMC)_{28}$ | 13700 | 12.88 | 1.25 | 12 | multiplication | | |
| 102 | FBP-25 | $(PS)_{59}$-$C_{10}F_{19}O_3$-$(PTMC)_{72}$ | 21000 | 3.95 | 0.94 | 12 | no shrink | | |
| 103 | FBP-19 | $(PTMSS)_{35}$-$C_8F_{17}$-$(PMTC-Me)_{44}$ | 15100 | 6.11 | 1.02 | 0 | no shrink | | |
| 104 | FBP-27 | $(PTMSS)_{35}$-$C_8F_{17}$-$(PLA)_{58}$ | 18900 | 6.51 | 0.96 | 0 | no shrink | | |
| 105 | HBP-9 | $(PS)_{35}$-$C_{18}H_{37}$-$(PTMC)_{42}$ | 11600 | 11.38 | 1.11 | 0 | no shrink | | |

[a] numerical subscript is the DP of the parenthesized block

Figure 64A:
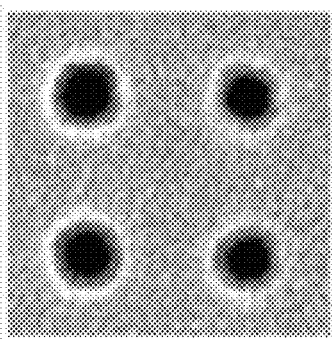
FIGS. 64A-64C are SEMs of the hole openings formed with Example 98, where the CD of the guiding pattern is in the range of 50-54 nm. Hole shrink was observed. The DSA process window was 6 nm.
Figure 64B:
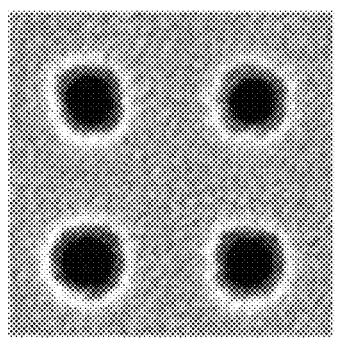
Figure 64C:
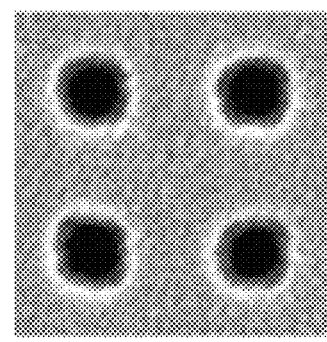
Figure 65:
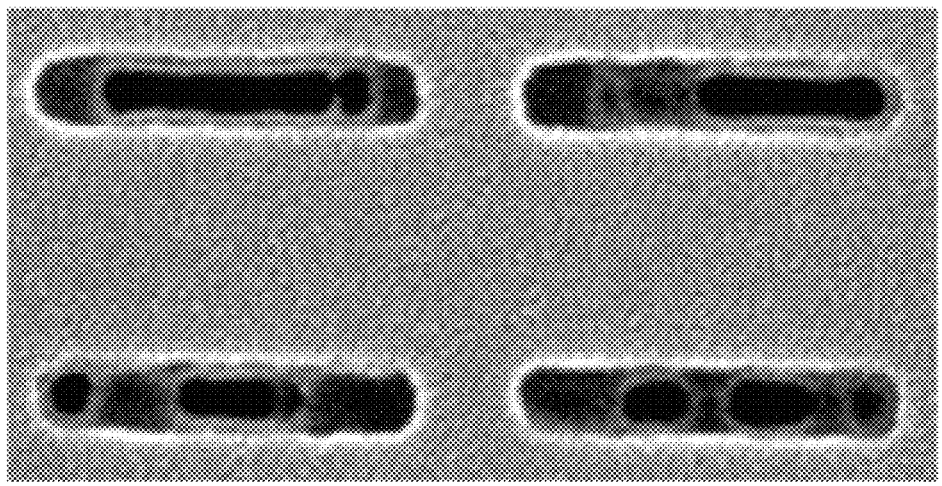
FIG. 65 is an SEM of the bar openings formed with Example 98, where the CD of the guiding pattern was 52 nm. No bar shrink was observed.
Figure 66:
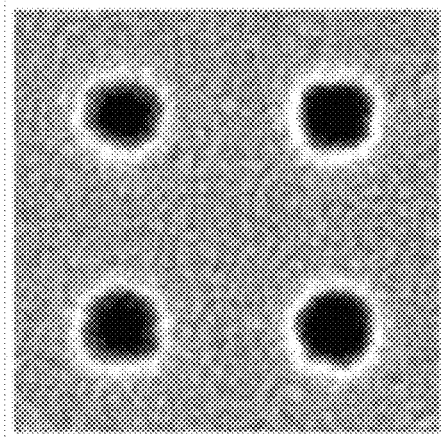
FIG. 66 is an SEM of the hole openings formed with Example 99, where the CD of the guiding pattern was 44 nm. There was no DSA process window with more than 80% open holes.
Figure 67:
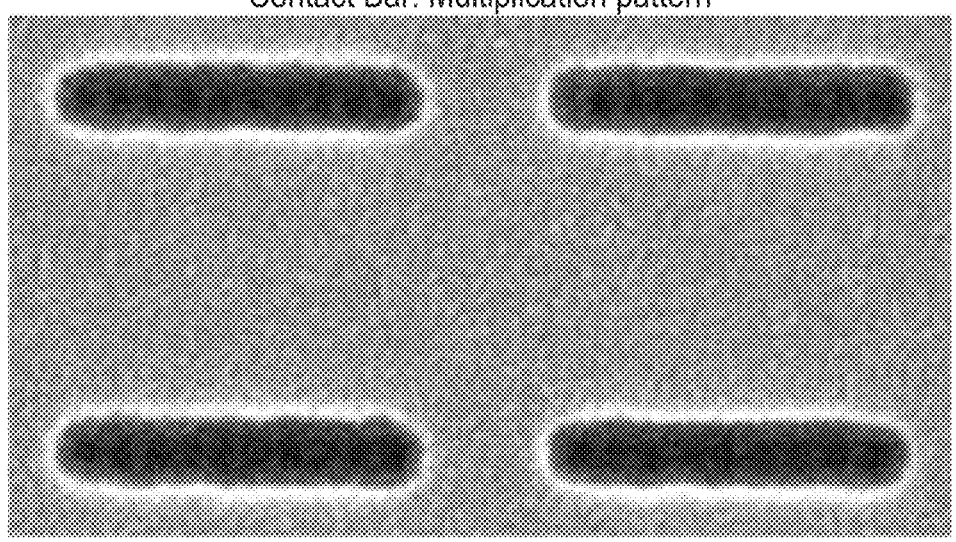
FIG. 67 is an SEM of the bar openings formed with Example 99, where the CD of the guiding pattern was 44 nm. A multiplication pattern was observed.
Figure 68:
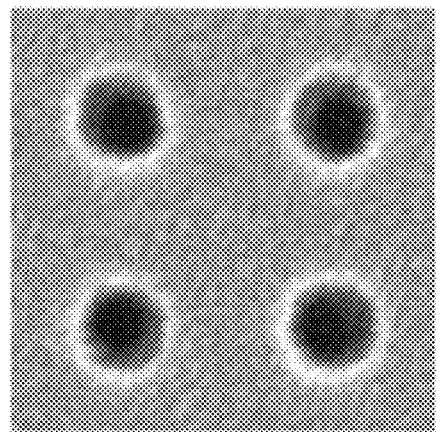
FIG. 68 is an SEM of the hole openings formed with Example 100, where the CD of the guiding pattern was 46 nm. No hole shrink was observed.
Figure 69:
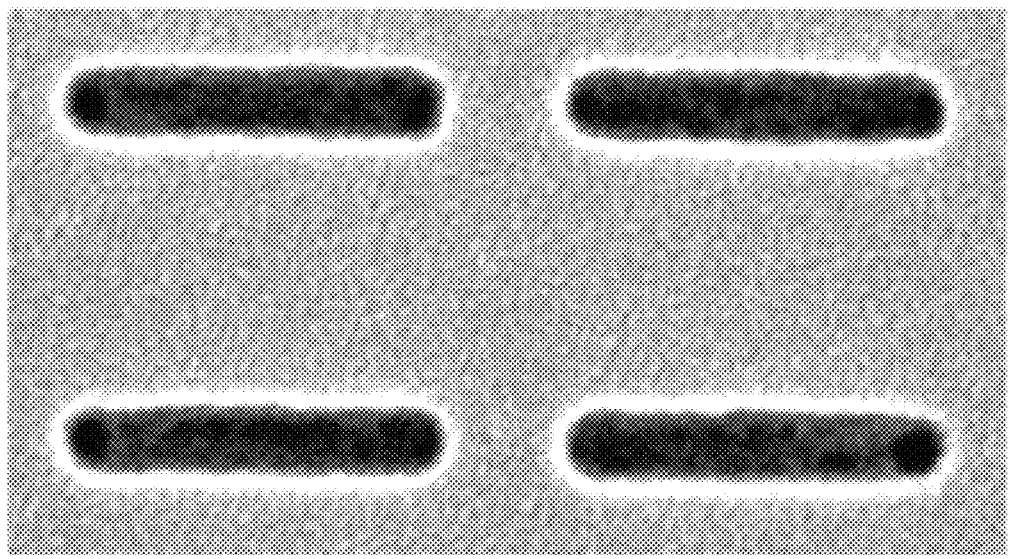
FIG. 69 is an SEM of the bar openings formed with Example 100, where the CD of the guiding pattern was 46 nm. No bar shrink was observed.
Figure 74:
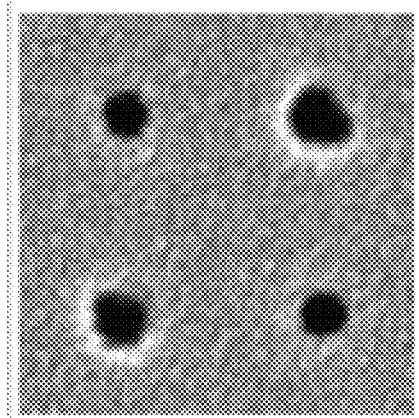
FIG. 74 is an SEM of the hole openings formed with Example 103, where the CD of the guiding pattern was 40 nm. No hole shrink was observed.
Figure 75:
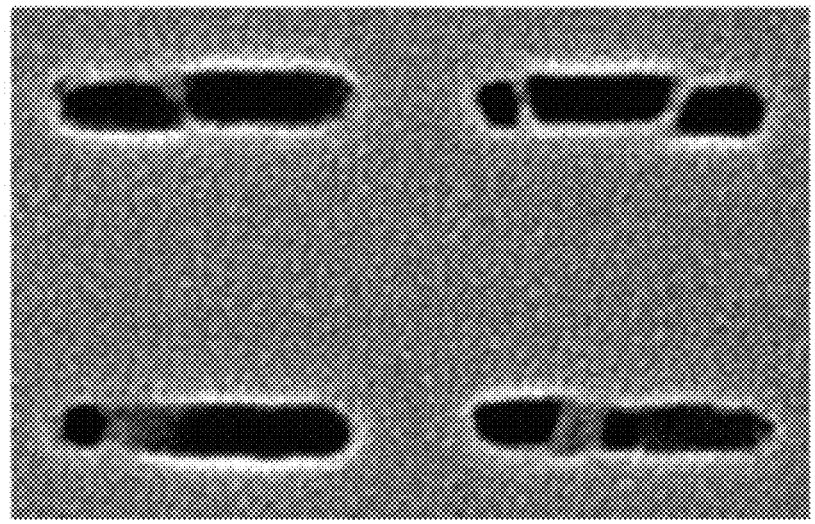
FIG. 75 is an SEM of the bar openings formed with Example 103, where the CD of the guiding pattern was 40 nm. No bar shrink was observed.
Figure 76:
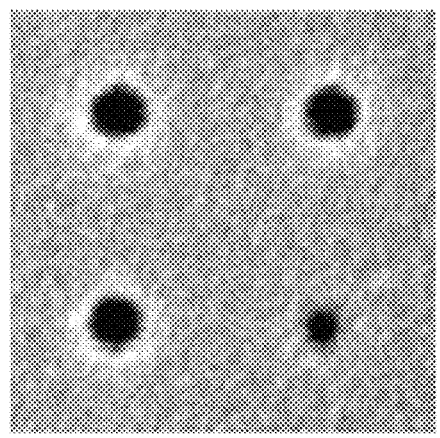
FIG. 76 is an SEM of the hole openings formed with Example 104, where the CD of the guiding pattern was 42 nm. There was no DSA process window with more than 80% open holes.
Figure 77:
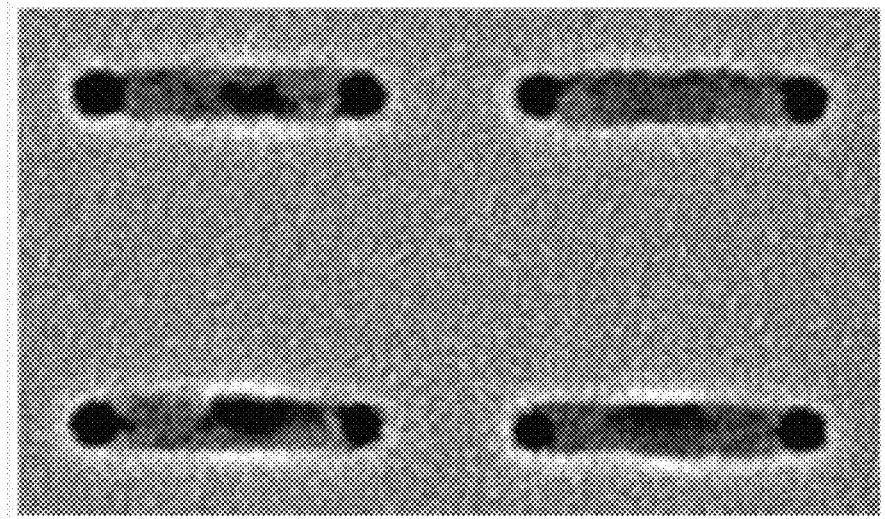
FIG. 77 is an SEM of the bar openings formed with Example 104, where the CD of the guiding pattern was 42 nm. No bar shrink was observed.
Figure 78:
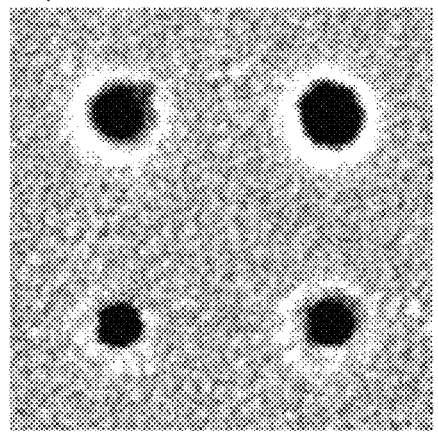
FIG. 78 is an SEM of the hole openings formed with Example 105, where the CD of the guiding pattern was 40 nm. There was no DSA process window with more than 80% open holes.
Figure 79:
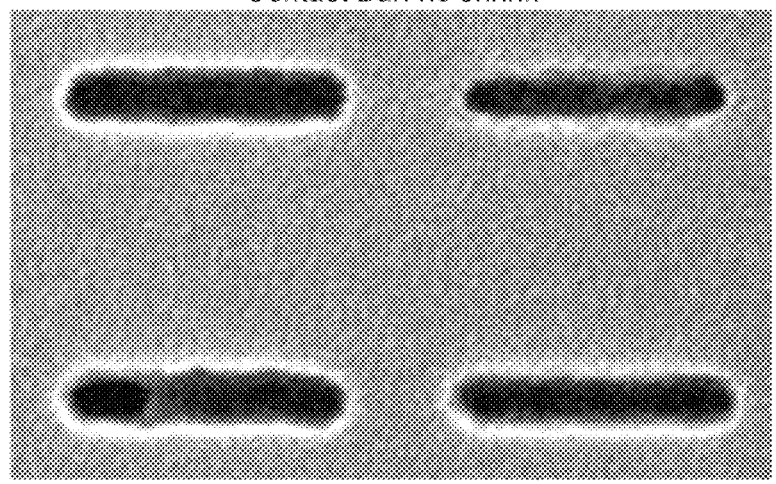
FIG. 79 is an SEM of the bar openings formed with Example 105, where the CD of the guiding pattern was 40 nm. No bar shrink was observed.

FIGS. 50A-50G are SEMs of the hole openings formed with Example 91, where the CD of the guiding pattern is in the range of 36-48 nm. Hole shrink was observed. The DSA observed. The DSA process window was 10 nm. FIG. 63 is an SEM of the bar openings formed with Example 97, where the CD of the guiding pattern was 42 nm. There was no DSA process window with more than 80% open holes. FIGS. 64A-64C are SEMs of the hole openings formed with Example 98, where the CD of the guiding pattern is in the range of 50-54 nm. Hole shrink was observed. The DSA process window was 6 nm. FIG. 65 is an SEM of the bar openings formed with Example 98, where the CD of the guiding pattern was 52 nm. No bar shrink was observed. FIG. 66 is an SEM of the hole openings formed with Example 99, where the CD of the guiding pattern was 44 nm. There was no DSA process window with more than 80% open holes. FIG. 67 is an SEM of the bar openings formed with Example 99, where the CD of the guiding pattern was 44 nm. A multiplication pattern was observed. FIG. 68 is an SEM of the hole openings formed with Example 100, where the CD of the guiding pattern was 46 nm. No hole shrink was observed. FIG. 69 is an SEM of the bar openings formed with Example 100, where the CD of the guiding pattern was 46 nm. No bar shrink was observed. FIGS. 70A-70F are SEMs of the hole openings formed with Example 101, where the CD of the guiding pattern is in the range of 28-38 nm. Hole shrink was observed. The DSA process window was 12 nm. FIG. 71 is an SEM of the bar openings formed with Example 101, where the CD of the guiding pattern was 32 nm. No bar shrink was observed. FIGS. 72A-72F are SEMs of the hole openings formed with Example 102, where the CD of the guiding pattern is in the range of 36-46 nm. Hole shrink was observed. The DSA process window was 12 nm. FIG. 73 is an SEM of the bar openings formed with Example 102, where the CD of the guiding pattern was 42 nm. No bar shrink was observed. FIG. 74 is an SEM of the hole openings formed with Example 103, where the CD of the guiding pattern was 40 nm. No hole shrink was observed. FIG. 75 is an SEM of the bar openings formed with Example 103, where the CD of the guiding pattern was 40 nm. No bar shrink was observed. FIG. 76 is an SEM of the hole openings formed with Example 104, where the CD of the guiding pattern was 42 nm. There was no DSA process window with more than 80% open holes. FIG. 77 is an SEM of the bar openings formed with Example 104, where the CD of the guiding pattern was 42 nm. No bar shrink was observed. FIG. 78 is an SEM of the hole openings formed with Example 105, where the CD of the guiding pattern was 40 nm. There was no DSA process window with more than 80% open holes. FIG. 79 is an SEM of the bar openings formed with Example 105, where the CD of the guiding pattern was 40 nm. No bar shrink was observed.

Examples 91 and 92, which had a fluorinated perpendicular junction group, showed improved DSA performance for contact hole shrink (i.e., a lower CDU and wider process window) compared to the control material PS-b-PMMA, the corresponding diblock copolymer (Example 68) having a non-fluorinated junction group, and the corresponding fluorinated diblock copolymer having a linear junction group (Example 78). All other block copolymers having a perpendicular junction group showed impaired DSA performance in comparison with PS-b-PMMA and the corresponding diblock copolymers having a non-fluorinated junction group.

Examples 91 and 92, which had the fluorinated perpendicular junction group, showed improved DSA performance (i.e., a lower CDU and wider process window) for bar shrink compared to PS-b-PMMA (Example 67), the corresponding diblock copolymer containing a fluorinated linear junction (Example 78), and the corresponding diblock copolymer (Example 68) containing a non-fluorinated junction group. All other block copolymers containing a fluorinated perpendicular junction group showed impaired or no DSA in bar shrink compared to their corresponding diblock copolymers having non-fluorinated, junction groups.

Summary of Results

Table 12 lists the BCPs from Tables 9-11 that showed improved performance for contact hole shrink relative to the control sample PS-b-PMMA (Example 67). The criteria for improvement are CDU<=5.80 and PE<1.31.

TABLE 12

| | | | | Contact hole shrink | | | Contact bar shrink | | |
|---|---|---|---|---|---|---|---|---|---|
| | | BCP | | | | PW | | | PW |
| Ex | Name | Composition | Mw (GPC) | CDU (1σ) | PE (nm) | (GP CD nm) | CDU (1σ) | PE (nm) | (GP CD nm) |
| 67 (comp) | Control | PS-b-PMMA | | 5.80 | 1.31 | 16 | multiplication pattern | | |
| 68 | HBP-1 | $(PS)_{120}$-b-$(PMTC-Me)_{83}$ | 30800 | 2.94 | 0.88 | 6 | 4.06 | 0.5 | 6 |
| 69 | HBP-7 | $(PS)_{120}$-b-$(PLA)_{88}$ | 31300 | 4.21 | 0.95 | 6 | 4.12 | 0.61 | 8 |
| 70 | HBP-5 | $(PS)_{59}$-b-$(PTMC)_{73}$ | 21000 | 3.60 | 1.04 | 12 | no shrink | | |
| 73 | HBP-3 | $(PTMSS)_{40}$-b-$(PMTC-Me)_{51}$ | 16000 | 4.85 | 1.08 | 14 | no shrink | | |
| 74 | HBP-4 | $(PTMSS)_{46}$-b-$(PMTC-Bz)_{41}$ | 20000 | 4.86 | 1.13 | 8 | no shrink | | |
| 75 | TBP-1 | $(PMTC-Me)_{46}$-b-$(PS)_{144}$-b-$(PMTC-Me)_{46}$ | 28000 | 4.10 | 1.02 | 4 | 7.76 | 0.63 | 0 |
| 76 | TBP-2 | $(PTMC)_{69}$-b-$(PS)_{108}$-b-$(PTMC)_{69}$ | 30300 | 4.78 | 0.96 | 12 | no shrink | | |
| 78 | FBP-2 | $(PS)_{193}$-$C_6F_{12}$-$(PMTC-Me)_{72}$ | 24500 | 2.86 | 0.94 | 10 | 3.93 | 0.45 | 10 |
| 79 | FBP-3 | $(PS)_{58}$-$C_{10}F_{20}$-$(PMTC-Me)_{37}$ | 15500 | 2.90 | 0.78 | 18 | 3.97 | 0.85 | 6 |
| 80 | FBP-4 | $(PS)_{132}$-$C_6F_{12}$-$(PMTC-Me)_{50}$ | 26000 | 2.91 | 0.92 | 12 | multiplication pattern | | |
| 82 | FBP-6 | $(PS)_{58}$-$C_{10}F_{20}$-$(PMTC-Et)_{46}$ | 17100 | 5.43 | 1.07 | 14 | no shrink | | |
| 83 | FBP-9 | $(PS)_{60}$-$C_6F_{12}O_3$-$(PLA)_{58}$ | 28000 | 3.51 | 0.92 | 16 | 3.84 | 0.59 | 6 |
| 84 | FBP-10 | $(PS)_{50}$-$C_6F_{12}$-$(PLA)_{44}$ | 22800 | 4.81 | 0.97 | 14 | no shrink | | |
| 85 | FBP-11 | $(PS)_{103}$-$C_6F_{12}$-$(PLA)_{82}$ | 25900 | 4.97 | 1.16 | 14 | 4.98 | 0.44 | 10 |
| 86 | FBP-12 | $(PS)_{58}$-$C_6F_{12}$-$(PLA)_{47}$ | 22200 | 5.06 | 1.17 | 18 | 5.53 | 0.63 | 6 |
| 87 | FBP-7 | $(PTMSS)_{37}$-$C_{10}F_{20}$-$(PMTC-Me)_{41}$ | 23600 | 3.77 | 1.07 | 14 | no shrink | | |
| 91 | FBP-14 | $(PS)_{84}$-$C_8F_{17}$-$(PMTC-Me)_{62}$ | 23500 | 2.82 | 0.89 | 14 | 3.88 | 1.29 | 10 |
| 92 | FBP-15 | $(PS)_{143}$-$C_8F_{17}$-$(PMTC-Me)_{104}$ | 32700 | 2.86 | 1.02 | 10 | 3.77 | 0.57 | 16 |
| 93 | FBP-16 | $(PS)_{84}$-$C_8F_{17}$-$(PMTC-Et)_{54}$ | 26700 | 5.57 | 1.08 | 12 | no shrink | | |

TABLE 12-continued

| | BCP | | | Contact hole shrink | | | Contact bar shrink | | |
|---|---|---|---|---|---|---|---|---|---|
| Ex | Name | Composition | Mw (GPC) | CDU (1σ) | PE (nm) | PW (GP CD nm) | CDU (1σ) | PE (nm) | PW (GP CD nm) |
| 97 | FBP-20 | $(PS)_{44}-C_6F_{13}-(PTMC)_{57}$ | 15500 | 3.81 | 1.03 | 10 | no shrink | | |
| 98 | FBP-21 | $(PS)_{84}-C_8F_{17}-(PTMC)_{108}$ | 27600 | 5.08 | 1.09 | 6 | no shrink | | |
| 102 | FBP-25 | $(PS)_{59}-C_{10}F_{19}O_3-(PTMC)_{72}$ | 21000 | 3.95 | 0.94 | 12 | no shrink | | |

Block A of three of the BCPs was a homopolymer of TMSS (Examples 73, 74, and 87). However, no bar shrink was observed with these BCPs. All other BCPs of Table 12 have a block A that is poly(styrene) (PS).

Seven BCPs had a non-fluorinated junction group (Examples 68-76). Only three of these showed bar shrink (Examples 68-69 and 75). Block A of Examples 68-69 and 75 also had a DP in the range of 120-144. Examples 70-74 and 76 had a block A DP in the range of 40-108.

Table 13 lists the BCPs of Table 12 that also showed improved performance in contact bar shrink, where the criteria for bar shrink improvement was CDU<5.0 and PE<1.31 nm. Table 13 also includes the performance of the control block copolymer PS-b-PMMA (Example 67).

group. Examples 78-79, 83, and 85-86 have a linear fluorinated junction group containing 12-20 fluorines. Examples 91-92 have a perpendicular fluorinated junction group having 17 fluorines. Examples 68, 78-79, and 91-92 have a polycarbonate block B based on MTC-Me. Examples 69, 83, and 85-86 have a polyester block B based on lactide.

Table 14 lists the BCPs of Table 13 that show the most improved performance based on the criteria of CDU<4 and PE less than 1.1 for both contact hole shrink and contact bar shrink. Table 14 also includes the performance of the control block copolymer PS-b-PMMA (Example 67).

TABLE 13

| | BCP | | | Contact hole shrink | | | Contact bar shrink | | |
|---|---|---|---|---|---|---|---|---|---|
| Ex | Name | Composition | Mw (GPC) | CDU (1σ) | PE (nm) | PW (GP CD nm) | CDU (1σ) | PE (nm) | PW (GP CD nm) |
| 67 (comp) | Control | PS-b-PMMA | | 5.80 | 1.31 | 16 | multiplication pattern | | |
| 68 | HBP-1 | $(PS)_{120}-b-(PMTC-Me)_{83}$ | 30800 | 2.94 | 0.88 | 6 | 4.06 | 0.5 | 6 |
| 69 | HBP-7 | $(PS)_{120}-b-(PLA)_{88}$ | 31300 | 4.21 | 0.95 | 6 | 4.12 | 0.61 | 8 |
| 78 | FBP-2 | $(PS)_{103}-C_6F_{12}-(PMTC-Me)_{72}$ | 24500 | 2.86 | 0.94 | 10 | 3.93 | 0.45 | 10 |
| 79 | FBP-3 | $(PS)_{58}-C_{10}F_{20}-(PMTC-Me)_{37}$ | 15500 | 2.90 | 0.78 | 18 | 3.97 | 0.85 | 6 |
| 83 | FBP-9 | $(PS)_{60}-C_6F_{12}O_3-(PLA)_{58}$ | 28000 | 3.51 | 0.92 | 16 | 3.84 | 0.59 | 6 |
| 85 | FBP-11 | $(PS)_{103}-C_6F_{12}-(PLA)_{82}$ | 25900 | 4.97 | 1.16 | 14 | 4.98 | 0.44 | 10 |
| 91 | FBP-14 | $(PS)_{84}-C_8F_{17}-(PMTC-Me)_{62}$ | 23500 | 2.82 | 0.89 | 14 | 3.88 | 1.29 | 10 |
| 92 | FBP-15 | $(PS)_{143}-C_8F_{17}-(PMTC-Me)_{104}$ | 32700 | 2.86 | 1.02 | 10 | 3.77 | 0.57 | 16 |

Each of BCPs of Table 13 is a diblock copolymer, and each of BCPs has a PS block having a DP in the range of 58-143. Examples 68-69 have no fluorine in the junction

TABLE 14

| | BCP | | | Contact hole shrink | | | Contact bar shrink | | |
|---|---|---|---|---|---|---|---|---|---|
| Ex | Name | Composition | Mw (GPC) | CDU (1σ) | PE (nm) | PW (GP CD nm) | CDU (1σ) | PE (nm) | PW (GP CD nm) |
| 67 (comp) | Control | PS-b-PMMA | | 5.80 | 1.31 | 16 | multiplication pattern | | |
| 78 | FBP-2 | $(PS)_{103}-C_6F_{12}-(PMTC-Me)_{72}$ | 24500 | 2.86 | 0.94 | 10 | 3.93 | 0.45 | 10 |
| 79 | FBP-3 | $(PS)_{58}-C_{10}F_{20}-(PMTC-Me)_{37}$ | 15500 | 2.90 | 0.78 | 18 | 3.97 | 0.85 | 6 |
| 83 | FBP-9 | $(PS)_{60}-C_6F_{12}O_3-(PLA)_{58}$ | 28000 | 3.51 | 0.92 | 16 | 3.84 | 0.59 | 6 |
| 92 | FBP-15 | $(PS)_{143}-C_8F_{17}-(PMTC-Me)_{104}$ | 32700 | 2.86 | 1.02 | 10 | 3.77 | 0.57 | 16 |

Each of the BCPs meeting the above criteria have a linear or perpendicular junction group comprising 12-20 fluorines, and each has a PS block (block A) having an average degree of polymerization of 58-143. Examples 78-79 and 92 have a PMTC-Me block (block B) having an average DP of 37-104, and Example 83 has a PLA block (block B) having an average DP of 58. In Tables 13 and 14, the volume ratio of block A:block B is in the range of 45:55 to 55:45, which favors formation of lamellae. Two of the BCPs (Examples 78 and 92) have a process window (PW) of at least 10 nm in both contact hole shrink and contact bar shrink. This makes the high-chi BCPs of Table 14 attractive candidates for preparing interconnects having a wider range of shapes, smaller critical dimensions, and fewer defects compared to the present industry standard PS-b-PMMA. Of the different block B compositions, PMTC-Me performed best, followed by PLA, followed by PTMC.

Demonstration of Selective Etch to Remove Central Block B Domain

The central polycarbonate domain (PMTC-Me) of FBP-2 (Example 78) in a contact hole was etched away in a Lam Research 4520 XLe dielectric etch tool for 13 seconds under the following conditions: pressure=300 mT, oxygen flow rate=136 sccm, lower electrode power=50 W, upper electrode power=0 W, and the gap between the electrodes was 2.25 cm.

The central poly(methyl methacrylate) domain (PMMA) of PS-b-PMMA (comparison) in a contact hole was etched away for 15 seconds under following conditions: pressure=6 mT, oxygen flow rate=136 sccm, lower electrode power=20 W, upper electrode power=0 W, and the gap between the electrodes was 2.25 cm.

For better contrast, the samples were coated with aluminum oxide using atomic layer deposition which was done on an Ultratech Fiji F200LL. A low temperature (75° C.) deposition of $Al_2O_3$ was done from water and trimethylaluminum (TMA) precursors using 100 cycles to achieve a uniform coating.

Figure 80:
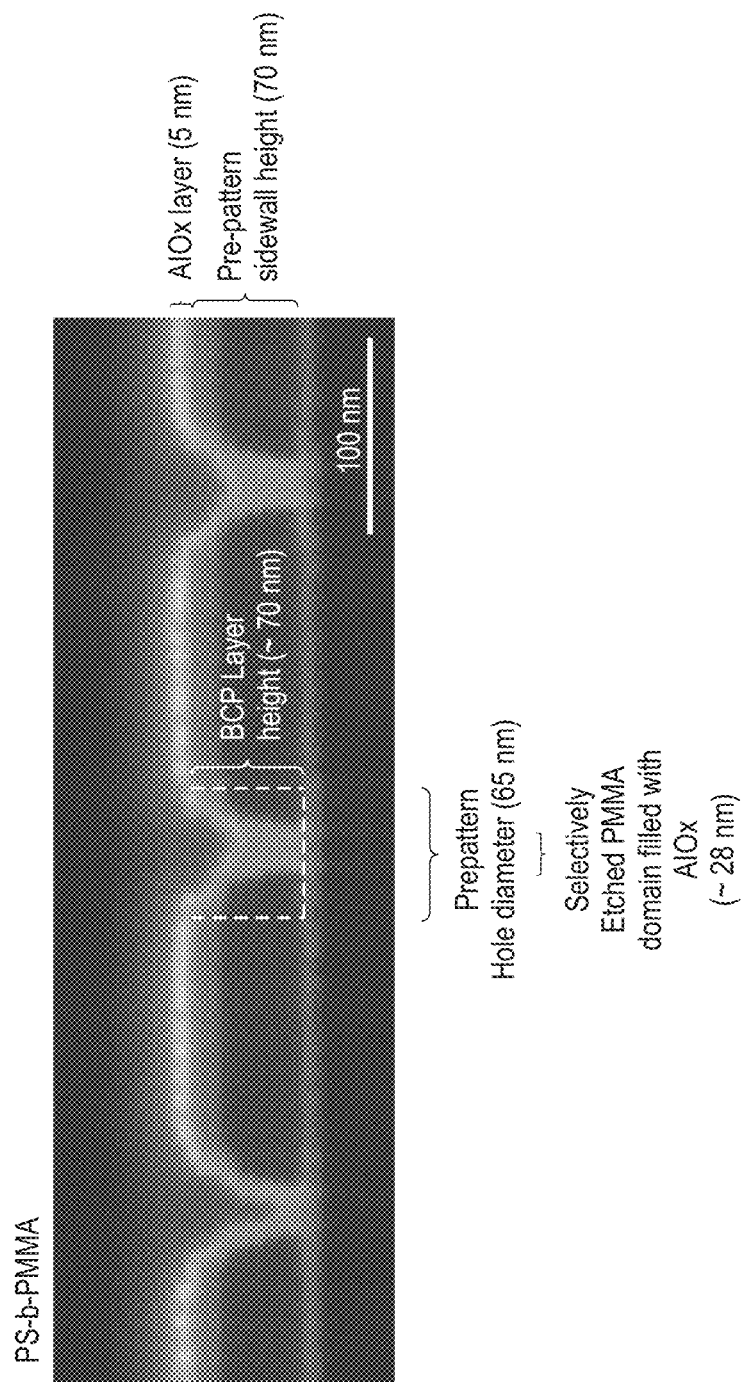
FIG. 80 is a cross-sectional view of a focused ion beam (FIB) image of the hole pattern formed by PS-b-PMMA (Example 67) after a selective oxygen ion etch of the central PMMA domain. A layer of $AlO_x$ was deposited onto the resulting relief pattern for contrast enhancement.

FIG. 80 is a cross-sectional view of a focused ion beam (FIB) image of the hole pattern formed by PS-b-PMMA (Example 67) after a selective oxygen ion etch of the central PMMA domain followed by sputtering $AlO_x$ onto the resulting relief pattern for contrast enhancement. In this instance the coating of the PS-b-PMMA and the etch conditions had been optimized. The $AlO_x$ layer, the pre-pattern sidewall height, the diameter of the pre-pattern hole (prior to self-assembly), and the diameter of the resulting hole after selective removal of the PMMA domain are indicated. The image shows the holes formed by the selective etch of the central PMMA domain are partially filled with $AlO_x$. The dashed border in the image outlines the initial holes of the pre-pattern. The darker shade region adjacent to the sidewalls indicates the PMMA domain adjacent to the sidewalls and the PS domain are intact after the selective etch.

Figure 81:
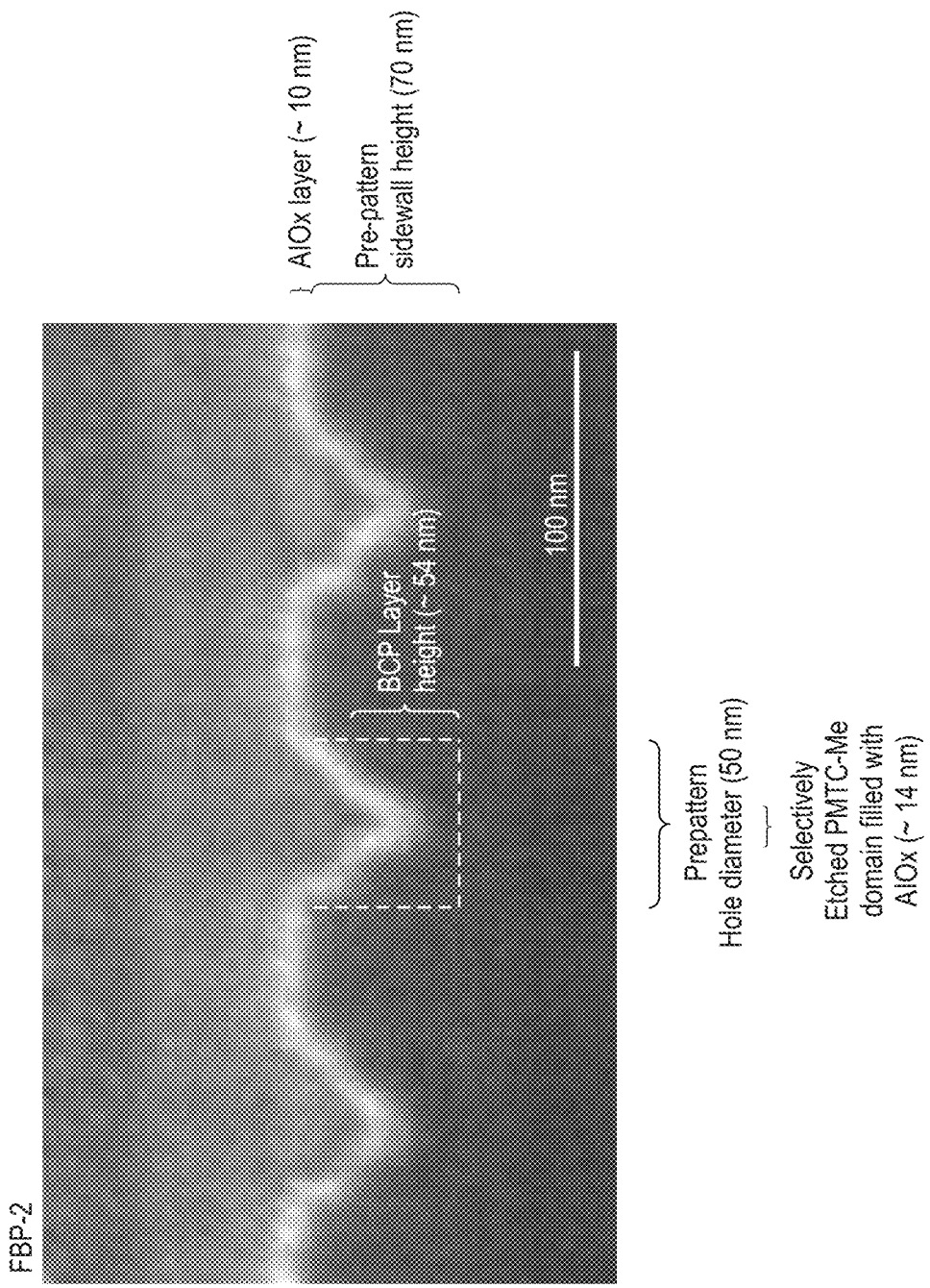
FIG. 81 is a cross-sectional view of a FIB image of the hole pattern formed by FBP-2 (Example 78) after a selective oxygen ion etch of the central PMTC-Me domain. A layer of $AlO_x$ was deposited onto the resulting relief pattern for contrast enhancement.

FIG. 81 is a cross-sectional view of a focused ion beam (FIB) image of the hole pattern formed by FBP-2 (Example 78). In this instance, neither the coating conditions nor the etch were optimized. The FBP-2 film layer did not completely fill the pre-pattern hole, and the selective etch did not reach the bottom of the central PMTC-Me domain. An $AlO_x$ layer was deposited onto the etched domain pattern for contrast enhancement. The $AlO_x$ layer, the pre-pattern sidewall height, the diameter of the pre-pattern hole (prior to self-assembly), and the diameter of the resulting hole after selective removal of the PMMA domain are indicated. The image shows a stepped sidewall due to the FBP-2 film partially filling the initial pre-pattern hole. The image also shows a shallower central etched hole due to the non-optimized etch conditions. Nevertheless, the results demonstrate that the oxygen ion etch selectively removes the central PMTC-Me domain while leaving intact the peripheral PMTC-Me domain adjacent to the sidewall. The dashed border in the image indicates the hole dimensions of the pre-pattern. The darker shaded region adjacent to the sidewalls indicates the PMTC-Me domain adjacent to the sidewalls and the PS domain are intact after the selective etch.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method, comprising:
providing a substrate having a top surface comprising a topographic pre-pattern of discrete initial openings, the initial openings comprising respective sidewalls and bottom surfaces, the initial openings having a critical dimension $CD_{Init}$;
forming a film layer disposed within each of the initial openings, the film layer having a top surface in contact with an atmosphere, the film layer comprising a linear diblock copolymer (BCP) comprising a block A and a block B, wherein
i) block A comprises a styrene repeat unit (A-2a):

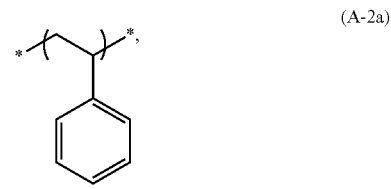

(A-2a)

ii) block B is an aliphatic polycarbonate or an aliphatic polyester,
iii) block A and block B are covalently linked by respective end repeat units to a divalent linking group L', wherein L' is a single bond or a group comprising at least one carbon,
iv) the BCP is capable of self-assembling to form a phase-segregated domain pattern comprising alternating domains of respective chemically distinct blocks of the block copolymer, and v) the sidewalls of the initial openings are preferentially wetted by block B;

allowing or inducing the BCP disposed in the initial openings to self-assemble, thereby forming the domain pattern within each of the initial openings, the domain pattern comprising: a) a central block B domain comprising block B which is centrally located within the initial openings and b) a peripheral block B domain comprising block B which is in contact with the sidewalls, wherein the central block B domain and the peripheral block B domain are separated by, and in contact with, a block A domain comprising block A, and wherein the domain pattern within the initial openings has a top surface in contact with the atmosphere; and selectively removing the central block B domain without substantially removing the block A domain and without substantially removing the peripheral block B domain, thereby forming an etched domain pattern comprising second openings, the second openings centrally located within the initial openings and having sidewalls comprising the block A domain, the second openings having a critical dimension $CD_{2nd}$ corresponding to $CD_{Init}$ and smaller than $CD_{Init}$;

wherein the method is suitable for forming openings for conductive interconnects that contact two or more layers of a multi-layered structure.

2. The method of claim 1, comprising transferring the etched domain pattern to the substrate, thereby forming the openings for the conductive interconnects.

3. The method of claim 1, wherein the domain pattern has a bulk periodicity Lo, and $CD_{Init}$ is about 2Lo.

4. The method of claim 1, wherein the bulk periodicity Lo has a value in the range of 4 nm to 100 nm.

5. The method of claim 1, wherein the initial openings include circular openings having a diameter of length d', and $CD_{Init}$ is d'.

6. The method of claim 1, wherein the initial openings include bar-shaped openings having a long axis of length l', a short axis of length w', and an aspect ratio of l':w' between 1:1 and 100:1, and wherein $CD_{Init}$ is w'.

7. The method of claim 1, wherein the block copolymer is capable of forming a lamellar domain pattern.

8. The method of claim 1, wherein block A is a homopolymer of styrene.

9. The method of claim 1, wherein block B is a polycarbonate comprising the carbonate repeat unit (A-4):

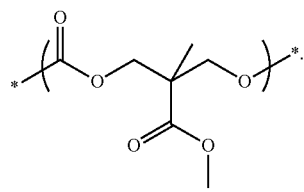
(A-4)

10. The method of claim 9, wherein block B is a homopolymer of the carbonate repeat unit (A-4).

11. The method of claim 1, wherein block B is a polyester comprising the ester repeat unit (A-8):

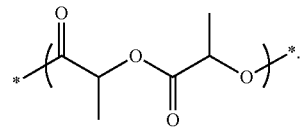
(A-8)

12. The method of claim 11, wherein block B is a homopolymer of the ester repeat unit (A-8).

13. The method of claim 1, wherein block A comprises a 4-(trimethylsilyl)styrene (TMSS) repeat unit (A-3):

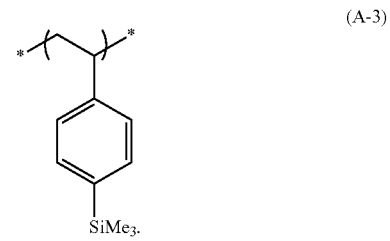
(A-3)

14. The method of claim 1, wherein L' comprises 1-25 fluorine atoms.

15. The method of claim 1, wherein the block copolymer has a block A:block B volume ratio in the range of 45:55 to 55:45.

16. A method, comprising:

providing a substrate having a top surface comprising a topographic pre-pattern of discrete initial openings, the initial openings comprising respective sidewalls and bottom surfaces, the initial openings having a critical dimension $CD_{Init}$;

forming a film layer disposed within each of the initial openings, the film layer having a top surface in contact with an atmosphere, the film layer comprising a linear diblock copolymer (BCP) comprising a block A, a block B, and a divalent linking group L', wherein i) block A comprises a styrene repeat unit (A-2a):

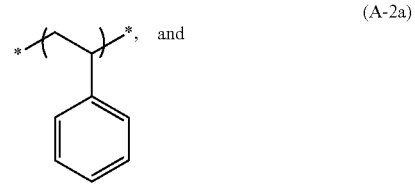
(A-2a), and ii) block B comprises a repeat unit selected from the group consisting of carbonate repeat unit (A-4):

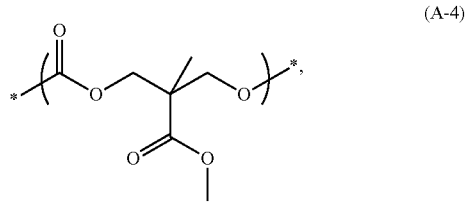
(A-4)

and ester repeat unit (A-8):

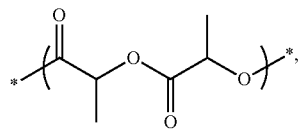

(A-8)

iii) L' comprises at least one carbon and 1-25 fluorine atoms,
iv) block A and block B are covalently linked by respective end repeat units to L',
v) the BCP is capable of self-assembling to form a phase-segregated domain pattern comprising alternating domains of respective chemically distinct blocks of the block copolymer, and
vi) the sidewalls of the initial openings are preferentially wetted by block B;

allowing or inducing the BCP disposed in the initial openings to self-assemble, thereby forming the domain pattern within each of the initial openings, the domain pattern comprising: a) a central block B domain comprising block B which is centrally located within the initial openings and b) a peripheral block B domain comprising block B which is in contact with the sidewalls, wherein the central block B domain and the peripheral block B domain are separated by, and in contact with, a block A domain comprising block A, and wherein the domain pattern within the initial openings has a top surface in contact with the atmosphere; and selectively removing the central block B domain without substantially removing the block A domain and without substantially removing the peripheral block B domain, thereby forming an etched domain pattern comprising second openings, the second openings centrally located within the initial openings and having sidewalls comprising the block A domain, the second openings having a critical dimension $CD_{2nd}$ corresponding to $CD_{Init}$ and smaller than $CD_{Init}$;

wherein
the method is suitable for forming openings for conductive interconnects that contact two or more layers of a multi-layered structure.

17. The method of claim 16, comprising transferring the etched domain pattern to the substrate, thereby forming the openings for the conductive interconnects.

18. The method of claim 16, wherein L' comprises a fluorinated alkyl group of formula (A-9):

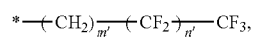

(A-9)

wherein
n' is an integer having a value of 0-11, and
m' is an integer having a value of 1-5.

19. The method of claim 16, wherein L' comprises a fluorinated alkylene group of formula (A-10):

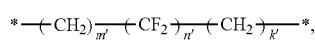

(A-10)

wherein
n' is an integer having a value of 1-12,
m' is an integer having a value of 1-5, and
k' is an integer having a value of 1-5.

20. The method of claim 16, wherein L' comprises a divalent linear fluorinated ethylene oxide group in accordance with formula (A-10):

(A-10)

wherein
n" is an integer having a value of 1-5.

21. A method, comprising:
providing a substrate having a top surface comprising a topographic pre-pattern of discrete initial openings, the initial openings comprising respective sidewalls and bottom surfaces, the initial openings having a critical dimension $CD_{Init}$;
forming a film layer disposed within each of the initial openings, the film layer having a top surface in contact with an atmosphere, the film layer comprising a linear diblock copolymer (BCP) comprising a block A, a block B, and a divalent linking group L', wherein
i) block A comprises an styrene repeat unit (A-2a):

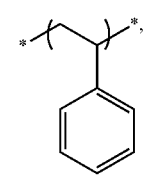

(A-2a)

and
ii) block B comprises a repeat unit selected from the group consisting of carbonate repeat unit (A-4):

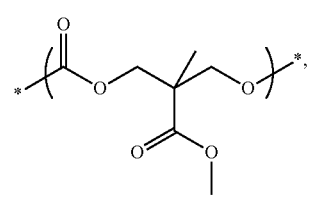

(A-4)

and
ester repeat unit (A-8):

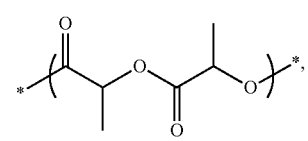

(A-8)

iii) L' comprises at least one carbon and 1-25 fluorine atoms,
iv) block A and block B are covalently linked by respective end repeat units to L', v) the BCP is capable of self-assembling to form a phase-segregated domain pattern comprising alternating domains of respective chemically distinct blocks of the block copolymer, and vi) the sidewalls of the initial openings are preferentially wetted by block A;

allowing or inducing the BCP disposed in the initial openings to self-assemble, thereby forming the domain pattern within each of the initial openings, the domain pattern comprising a central block B domain which is centrally located within the initial openings and a peripheral block A domain which is in contact with the sidewalls and the central block B domain, wherein the central block B domain and the peripheral block A domain have respective top surfaces in contact with the atmosphere; and selectively removing the central block B domain without substantially removing the peripheral block A domain, thereby forming an etched domain pattern comprising second openings, the second openings centrally located within the initial openings and having sidewalls comprising the block A domain, the second openings having a critical dimension $CD_{2nd}$ corresponding to $CD_{Init}$ and smaller than $CD_{Init}$;

wherein the method is suitable for forming openings for conductive interconnects that contact two or more layers of a multi-layered structure.

22. The method of claim 21, wherein block B comprises a repeat unit selected from the group consisting of carbonate repeat unit (A-4):

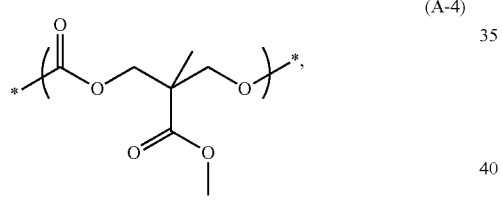

(A-4)

and ester repeat unit (A-8):

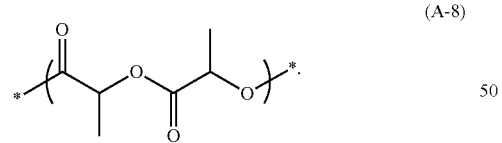

(A-8)

23. The method of claim 21, comprising transferring the etched domain pattern to the substrate, thereby forming the openings for the conductive interconnects.

24. The method of claim 21, wherein the domain pattern has a bulk periodicity Lo, and $CD_{Init}$ is about 1Lo.

25. The method of claim 21, wherein the initial openings include circular openings having a diameter of length d', and $CD_{Init}$ is d'.

26. The method of claim 21, wherein the initial openings include bar-shaped openings having a long axis of length l' and a short axis of length w', wherein the bar-shaped openings have an aspect ratio of l':w' between 1:1 and 100:1, and $CD_{Init}$ is w'.

27. The method of claim 21, wherein the substrate includes at least one of: a resist layer, a hardmask layer, and an antireflection layer (ARC).

28. The method of claim 21, wherein L' comprises 1-25 fluorine atoms.

29. A method, comprising:

providing a substrate having a top surface comprising a topographic pre-pattern of discrete initial openings, the initial openings comprising respective sidewalls and bottom surfaces, the initial openings having a critical dimension $CD_{Init}$;

forming a film layer disposed within each of the initial openings, the film layer having a top surface in contact with an atmosphere, the film layer comprising a linear block copolymer (BCP) comprising a block A and a block B, wherein i) block A and block B are covalently linked by respective end repeat units to a divalent linking group L', wherein L' is a single bond or a group comprising at least one carbon, ii) the BCP is capable of self-assembling to form a phase-segregated domain pattern comprising alternating domains of respective chemically distinct blocks of the block copolymer, and iii) the sidewalls of the initial openings are preferentially wetted by block B;

allowing or inducing the BCP disposed in the initial openings to self-assemble, thereby forming the domain pattern within each of the initial openings, the domain pattern comprising: a) a central block B domain comprising block B which is centrally located within the initial openings and b) a peripheral block B domain comprising block B which is in contact with the sidewalls, wherein the central block B domain and the peripheral block B domain are separated by, and in contact with, a block A domain comprising block A, and wherein the domain pattern within the initial openings has a top surface in contact with the atmosphere; and selectively removing the central block B domain without substantially removing the block A domain and without substantially removing the peripheral block B domain, thereby forming an etched domain pattern comprising second openings, the second openings centrally located within the initial openings and having sidewalls comprising the block A domain, the second openings having a critical dimension $CD_{2nd}$ corresponding to $CD_{Init}$ and smaller than $CD_{Init}$;

wherein the method is suitable for forming openings for conductive interconnects that contact two or more layers of a multi-layered structure.

30. The method of claim 29, wherein the BCP is a diblock copolymer.

31. The method of claim 29, wherein block A comprises a styrenic repeat unit.

32. The method of claim 29, wherein block B is an aliphatic polycarbonate or an aliphatic polyester.

* * * * *